US010230051B2

(12) United States Patent
Kim et al.

(10) Patent No.: US 10,230,051 B2
(45) Date of Patent: Mar. 12, 2019

(54) ORGANIC LIGHT-EMITTING DEVICE

(71) Applicant: SAMSUNG DISPLAY CO., LTD., Yongin, Gyeonggi-Do (KR)

(72) Inventors: Myeong-Suk Kim, Yongin (KR); Sung-Wook Kim, Yongin (KR); Jae-Hong Kim, Yongin (KR); Jin-Soo Hwang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 805 days.

(21) Appl. No.: 14/522,472

(22) Filed: Oct. 23, 2014

(65) Prior Publication Data

US 2015/0236264 A1 Aug. 20, 2015

(30) Foreign Application Priority Data

Feb. 20, 2014 (KR) ........................ 10-2014-0019691

(51) Int. Cl.

| | |
|---|---|
| ***H01L 51/54*** | (2006.01) |
| ***H01L 51/00*** | (2006.01) |
| ***C09B 57/00*** | (2006.01) |
| ***C09B 23/14*** | (2006.01) |
| ***C09B 57/10*** | (2006.01) |
| ***C09B 1/00*** | (2006.01) |
| *H01L 51/50* | (2006.01) |

(52) U.S. Cl.

CPC ............ *H01L 51/0054* (2013.01); *C09B 1/00* (2013.01); *C09B 23/148* (2013.01); *C09B 57/00* (2013.01); *C09B 57/001* (2013.01); *C09B 57/008* (2013.01); *C09B 57/10* (2013.01); *H01L 51/006* (2013.01); *H01L 51/0052* (2013.01); *H01L 51/0058* (2013.01); *H01L 51/0059* (2013.01); *H01L 51/0061* (2013.01); *H01L 51/0067* (2013.01); *H01L 51/0072* (2013.01); *H01L 51/5056* (2013.01); *H01L 51/5072* (2013.01)

(58) Field of Classification Search

CPC ............... H01L 51/0032; H01L 51/005; H01L 51/0052; H01L 51/0054; H01L 51/0058; H01L 51/0059; H01L 51/006; H01L 51/0061; H01L 51/0067; H01L 51/0072; H01L 51/50; H01L 51/5056; H01L 51/5072

USPC ....... 428/690, 691, 411.4, 917, 336; 427/58, 427/66; 313/500–512; 257/40, 88–104, 257/E51.001–E51.052; 252/301.16–301.35

See application file for complete search history.

(56) References Cited

U.S. PATENT DOCUMENTS

2006/0186796 A1* 8/2006 Yabe .................... C07D 213/06 313/504
2009/0108746 A1 4/2009 Park et al.
(Continued)

FOREIGN PATENT DOCUMENTS

CN 102448946 A 5/2012
EP 2468731 A1 † 6/2012
(Continued)

OTHER PUBLICATIONS

Machine translation of JP2013-0060157. Date of publication: Jun. 7, 2013.*
(Continued)

*Primary Examiner* — Andrew K Bohaty
(74) *Attorney, Agent, or Firm* — Lewis Roca Rothgerber Christie LLP

(57) ABSTRACT

An organic light-emitting device includes a first electrode, a second electrode facing the first electrode, and an emission layer disposed between the first electrode and the second electrode; an electron transport region disposed between the emission layer and the second electrode; and a hole transport region disposed between the first electrode and the emission layer, wherein the electron transport region comprises at least one of an electron transport material represented by Formula 1 below; and the hole transport region comprises at least one of a hole transport material represented by Formula 2 or 3 below:

Formula 1

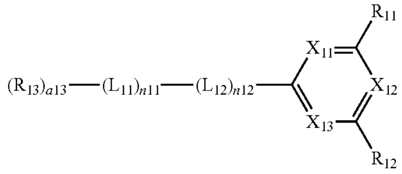

Formula 2

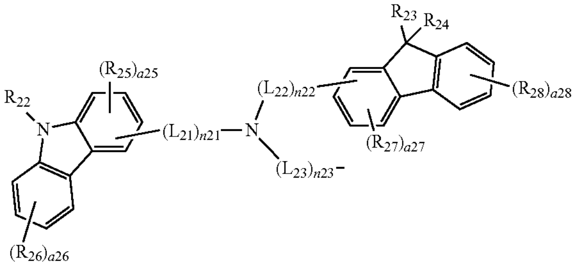

Formula 3

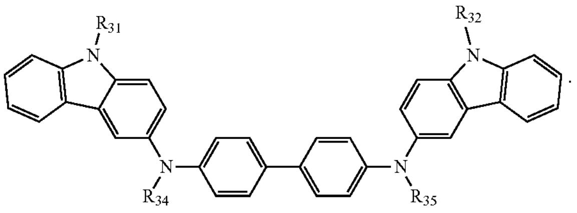

20 Claims, 1 Drawing Sheet

(56) References Cited

U.S. PATENT DOCUMENTS

| | | | |
|---|---|---|---|
| 2012/0068170 A1 | 3/2012 | Pflumm et al. | |
| 2012/0326137 A1* | 12/2012 | Song | H01L 51/5064 257/40 |
| 2013/0153865 A1 | 6/2013 | Kho et al. | |
| 2014/0014927 A1† | 1/2014 | Kim | |
| 2014/0027723 A1† | 1/2014 | Kim | |

FOREIGN PATENT DOCUMENTS

| | | | | |
|---|---|---|---|---|
| JP | 2009184987 A | * | 8/2009 | |
| JP | 2012-126717 | | 7/2012 | |
| JP | 2013-251480 A | | 12/2013 | |
| KR | 10-2009-0044975 | | 5/2009 | |
| KR | 10-2011-0018195 | | 2/2011 | |
| KR | 10-2011-0084797 | | 7/2011 | |
| KR | 10-2011-0085178 A | | 7/2011 | |
| KR | 2012-0092550 A | † | 8/2012 | |
| KR | 10-2013-0060157 | | 6/2013 | |
| KR | 10-2013-0070201 | | 6/2013 | |
| KR | 2013-0060157 A | † | 6/2013 | |
| KR | 10-2013-0083817 | | 7/2013 | |
| KR | 10-2014-0008126 | | 1/2014 | |
| KR | 2014-0008126 A | † | 1/2014 | |
| WO | WO-2012088192 A1 | * | 6/2012 | C07D 239/26 |
| WO | WO 2013/105747 A1 | | 7/2013 | |

OTHER PUBLICATIONS

Machine translation of JP2011-0018195. Date of publication: Feb. 23, 2011.*

Machine translation of JP2009-184987 (Year: 2009).*

KIPO Notice of Allowance dated Jul. 21, 2016 issued in Korean Patent Application No. 10-2014-0019691 (6 pages).

KIPO Office action dated Nov. 5, 2015, for Korean priority Patent application 10-2014-0019691, (13 pages).

* cited by examiner
† cited by third party

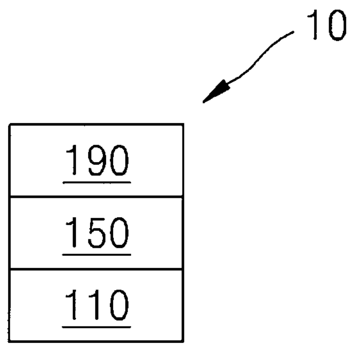
10
190
150
110

ORGANIC LIGHT-EMITTING DEVICE

CROSS-REFERENCE TO RELATED APPLICATION

This application claims priority to and the benefit of Korean Patent Application No. 10-2014-0019691, filed on Feb. 20, 2014, in the Korean Intellectual Property Office, the disclosure of which is incorporated herein in its entirety by reference.

BACKGROUND

1. Field

The following description relates to an organic light-emitting device.

2. Description of the Related Art

Organic light emitting devices are self-emission devices that have wide viewing angles, high contrast ratios, short response time, and excellent brightness, driving voltage, and response speed characteristics; and produce full-color images.

An organic light-emitting device may include a first electrode disposed on a substrate, and a hole transport region, an emission layer, an electron transport region, and a second electrode, sequentially disposed on the first electrode. Holes provided from the first electrode may move toward the emission layer through the hole transport region, and electrons provided from the second electrode may move toward the emission layer through the electron transport region. Carriers, such as holes and electrons, are recombined in the emission layer to produce excitons. These excitons change from an excited state to a ground state, thereby generating light.

SUMMARY

Aspects of one or more embodiments of the present invention are directed toward an organic light-emitting device.

Additional aspects will be set forth in part in the description which follows and, in part, will be apparent from the description, or may be learned by practice of the presented embodiments.

According to one or more embodiments of the present invention, an organic light-emitting device includes a first electrode; a second electrode facing the first electrode; an emission layer between the first electrode and the second electrode;

an electron transport region between the emission layer and the second electrode; and a hole transport region between the first electrode and the emission layer, wherein the electron transport region includes at least one of an electron transport material represented by Formula 1 below, and the hole transport region includes at least one of a hole transport material represented by Formula 2 or 3 below:

Formula 1

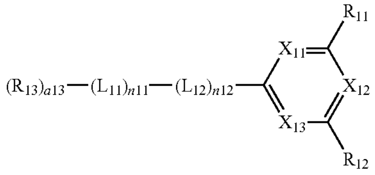

-continued

Formula 2

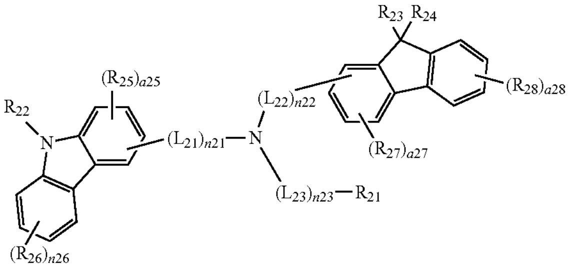

Formula 3

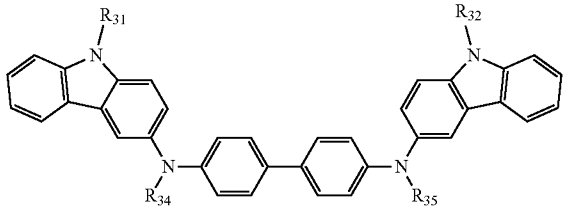

wherein in Formulae 1 to 3, $X_{11}$, $X_{12}$, and $X_{13}$ may be each independently CH or N;

at least one of $X_{11}$, $X_{12}$, and $X_{13}$ may be N;

$L_{11}$, $L_{12}$, and $L_{21}$ to $L_{23}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

n11, n12 and n21 to n23 may be each independently an integer selected from 0 to 3;

the sum of n11 and n12 is 1 or more;

$R_{11}$ to $R_{13}$, $R_{21}$ to $R_{24}$, $R_{31}$, $R_{32}$, $R_{34}$ and $R_{35}$ may be each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

a13 may be an integer selected from 1 to 3;

$R_{25}$ to $R_{28}$ may be each independently selected from a hydrogen atom, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$;

a25 and a27 may be each independently an integer selected from 1 to 3;

a26 and a28 may be each independently an integer selected from 1 to 4;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arythio group, the substituted $C_1$-$C_{60}$ heteroaryl group, the substituted monovalent non-aromatic condensed polycyclic group, the substituted monovalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group and the substituted $C_1$-$C_{60}$ alkoxy group is selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{31})(Q_{32})$, —$Si(Q_{33})(Q_{34})(Q_{35})$ and —$B(Q_{36})(Q_{37})$; and $Q_1$ to $Q_7$, $Q_{11}$ to $Q_{17}$, $Q_{21}$ to $Q_{27}$ and $Q_{31}$ to $Q_{37}$ may be each independently selected from a hydrogen, a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWING

These and/or other aspects will become apparent and more readily appreciated from the following description of the embodiments, taken in conjunction with the drawing which is a schematic cross-sectional view of an organic light-emitting device according to an embodiment.

DETAILED DESCRIPTION

Reference will now be made in more detail to embodiments, examples of which are illustrated in the accompanying drawing, wherein like reference numerals refer to like elements throughout. In this regard, the present embodiments may have different forms and should not be construed as being limited to the descriptions set forth herein. Accordingly, the embodiments are merely described below, by referring to the drawing, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

Hereinafter, embodiments are described in more detail by referring to the attached drawing, and in the drawing, like reference numerals denote like elements, and a redundant explanation thereof will not be provided herein.

It will be further understood that the terms "comprises" and/or "comprising" used herein specify the presence of stated features or components, but do not preclude the presence or addition of one or more other features or components.

It will be understood that when a layer, region, or component is referred to as being "formed on" an other layer, region, or component, it can be directly or indirectly formed on the other layer, region, or component. That is, for example, intervening layers, regions, or components may be present.

Sizes of elements in the drawing may be exaggerated for convenience of explanation. In other words, since sizes and thicknesses of the components in the drawings are arbitrarily illustrated for convenience of explanation, the following embodiments are not limited thereto.

The expression "(an organic layer) includes at least one compound represented by Formula 1" used herein may include a case in which "(an organic layer) includes one compound represented by Formula 1 or two or more different compounds represented by Formula 1."

The term "organic layer" used herein refers to a single layer and/or a plurality of layers disposed between a first electrode and a second electrode of an organic light-emitting device. A material included in the "organic layer" is not limited to an organic material.

The drawing is a schematic view of an organic light-emitting device 10 according to an embodiment. The organic light-emitting device 10 includes a first electrode 110, an organic layer 150, and a second electrode 190.

Hereinafter, the structure of an organic light-emitting device according to an embodiment and a method of manufacturing an organic light-emitting device according to an embodiment will be described in connection with the drawing.

In the drawing, a substrate may be additionally disposed under the first electrode 110 or above the second electrode 190. The substrate may be a glass substrate or transparent plastic substrate, each with excellent mechanical strength, thermal stability, transparency, surface smoothness, ease of handling, and water repellency.

The first electrode 110 may be formed by depositing or sputtering a material for forming the first electrode on the substrate. When the first electrode 110 is an anode, the material for the first electrode 110 may be selected from materials with a high work function to make holes easily injected. The first electrode 110 may be a reflective electrode or a transmissive electrode. The material for the first electrode 120 may be a transparent and highly conductive material, and examples of such a material are indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode, at least one of magnesium (Mg), aluminum (Al), aluminum-lithium (Al—Li), calcium (Ca), magnesium-indium (Mg—In), and magnesium-silver (Mg—Ag) may be used (utilized).

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

The organic layer 150 is disposed on the first electrode 110. The organic layer 150 may include an emission layer.

The organic layer 150 may further include a hole transport region disposed between the first electrode and the emission layer. The organic layer 150 may further include an electron transport region disposed between the emission layer and the second electrode.

The hole transport region may include at least one selected from a hole injection layer (HIL), a hole transport layer (HTL), a buffer layer, and an electron blocking layer (EBL); and the electron transport region may include at least one selected from a hole blocking layer (HBL), an electron transport layer (ETL), and an electron injection layer (EIL), but they are not limited thereto.

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, wherein layers of each structure are sequentially stacked from the first electrode 110 in this stated order, but are not limited thereto.

When the hole transport region includes a hole injection layer, the hole injection layer may be formed on the first electrode 110 by using (utilizing) various suitable methods, such as vacuum deposition, spin coating casting, a Langmuir-Blodgett (LB) method, ink-jet printing, laser-printing, or laser-induced thermal imaging.

When a hole injection layer is formed by vacuum deposition, for example, the vacuum deposition may be performed at a temperature of about 100 to about 500° C., at a vacuum degree of about $10^{-8}$ to about $10^{-3}$ torr, and at a deposition rate of about 0.01 to about 100 Å/sec in consideration of a compound for a hole injection layer to be deposited, and the structure of a hole injection layer to be formed.

When a hole injection layer is formed by spin coating, the spin coating may be performed at a coating rate of about 2000 rpm to about 5000 rpm and at a temperature of about 80° C. to 200° C. in consideration of a compound for a hole injection layer to be deposited, and the structure of a hole injection layer to be formed.

The hole injection layer may include at least one selected from m-MTDATA, TDATA, 2-TNATA, NPB, β-NPB, TPD, Spiro-TPD, Spiro-NPB, α-NPB, TAPC, HMTPD, and 4,4',4"-tris(N-carbazolyl)triphenylamine (TCTA):

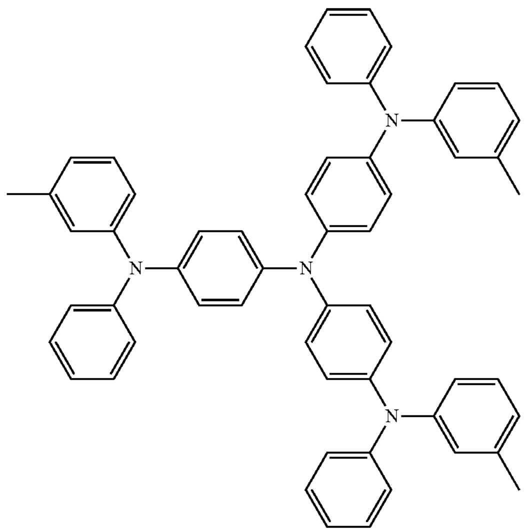

m-MTDATA

-continued
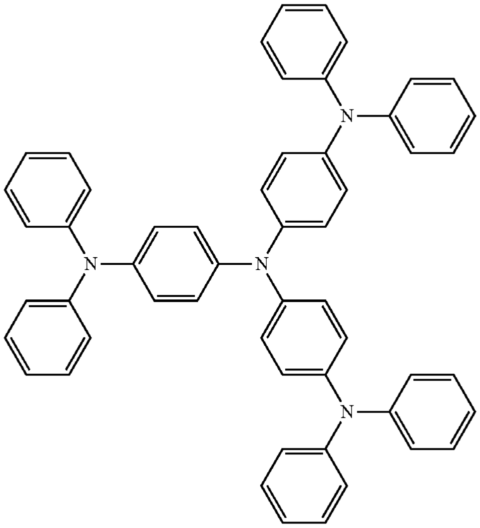
TDATA
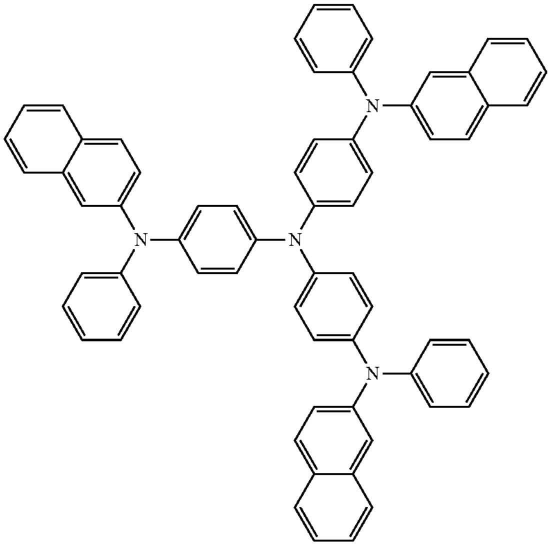
2-TNATA
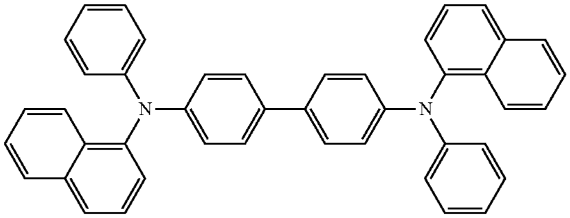
NPB
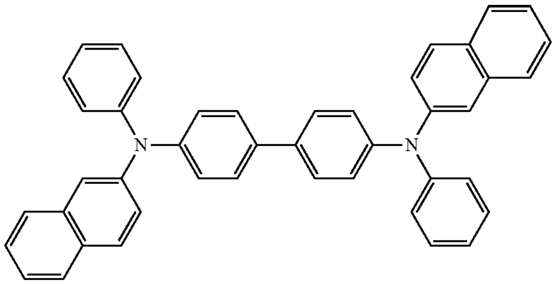
β-NPB
-continued
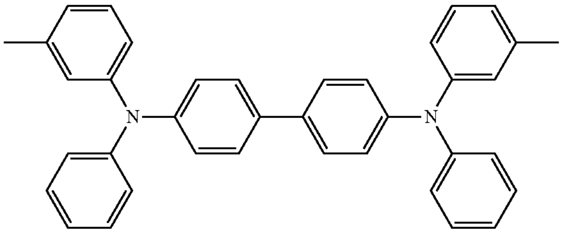
TPD
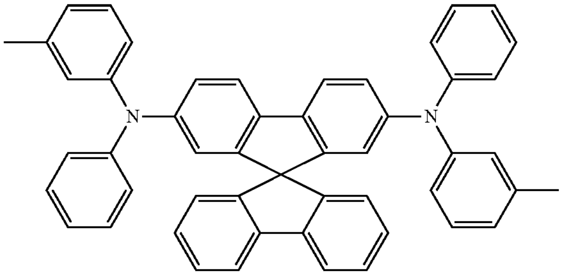
Spiro-TPD
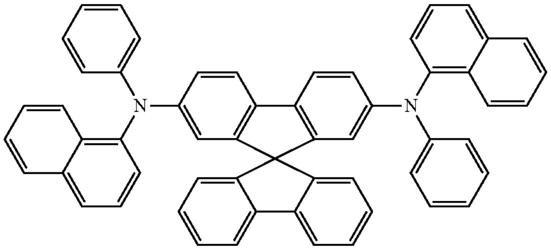
Spiro-NPB
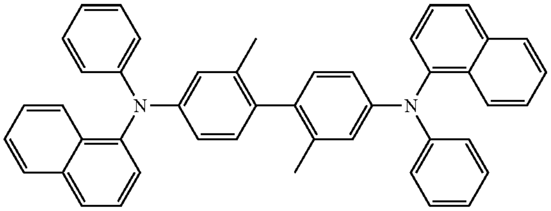
α-NPB
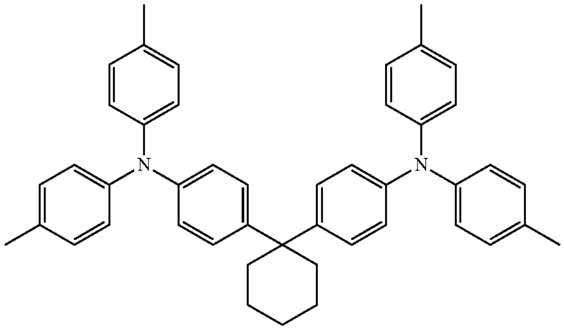
TAPC -continued

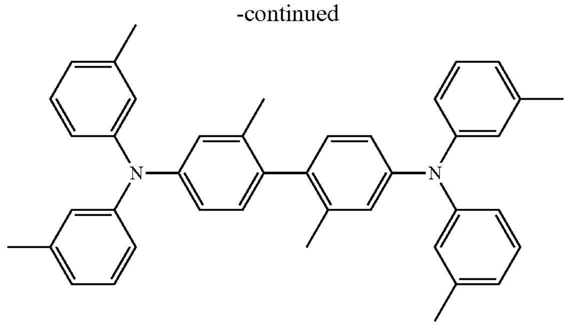

HMTPD

When the hole transport region includes a hole transport layer, the hole transport layer may be formed on the first electrode 110 or the hole injection layer by using (utilizing) various suitable methods, such as vacuum deposition, spin coating, casting, an LB method, ink-jet printing, laser-printing, or laser-induced thermal imaging. When the hole transport layer is formed by vacuum deposition or spin coating, the deposition and coating conditions for the hole transport layer may be determined by referring to the deposition and coating conditions for the hole injection layer.

The hole transport region may include at least one of a hole transport material represented by Formula 2 or 3 below. For example, the hole transport material represented by Formula 2 or 3 may be included in a hole transport layer.

Formula 2

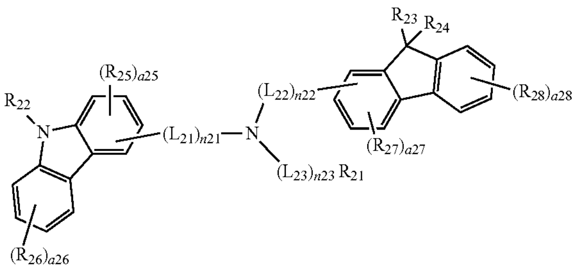

Formula 3

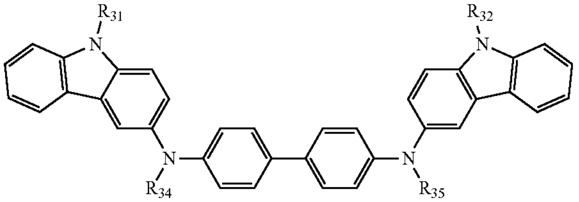

wherein in Formulae 2 and 3, $L_{21}$ to $L_{23}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

n21 to n23 may be each independently an integer selected from 0 to 3;

$R_{21}$ to $R_{24}$ and $R_{31}$ to $R_{35}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_{25}$ to $R_{28}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$;

a25 and a27 may be each independently an integer selected from 1 to 3;

a26 and a28 may be each independently an integer selected from 1 to 4;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arythio group, the substituted $C_1$-$C_{60}$ heteroaryl group, the substituted monovalent non-aromatic condensed polycyclic group, the substituted monovalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group and the substituted $C_1$-$C_{60}$ alkoxy group is selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$ and —$B(Q_{26})(Q_{27})$; and —$N(Q_{31})(Q_{32})(Q_{33})$, —$Si(Q_{34})(Q_{35})(Q_{36})$, and —$B(Q_{37})(Q_{38})$; and $Q_1$ to $Q_7$, $Q_{11}$ to $Q_{17}$, $Q_{21}$ to $Q_{27}$ and $Q_{31}$ to $Q_{38}$ may be each independently selected from a hydrogen, a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

$L_{21}$ and $L_{23}$ in Formula 2 may be each independently selected from:

a phenylene, a pentalenylene, an indenylene, a naphthylene, an azulenylene, a heptalenylene, an indacenylene, an acenaphthylene, a fluorenylene, a spiro-fluorenylene, a benzofluorenylene, a dibenzofluorenylene, a phenalenylene, a phenanthrenylene, an anthracenylene, a fluoranthenylene, a triphenylenylene, a pyrenylene, a chrysenylene, a naphthacenylene, a picenylene, a perylenylene, a pentaphenylene, a hexacenylene, a pentacenylene, a rubicenylene, a coronenylene, an ovalenylene, a pyrrolylene, a thienylene, a furanylene, a silolylene, an imidazolylene, a pyrazolylene, a thiazolylene, an isothiazolylene, an oxazolylene, an isooxazolylene, a pyridinylene, a pyrazinylene, a pyrimidinylene, a pyridazinylene, an isoindolylene, an indolylene, an indazolylene, a purinylene, a quinolinylene, an isoquinolinylene, a benzoquinolinylene, a phthalazinylene, a naphthyridinylene, a quinoxalinylene, a quinazolinylene, a cinnolinylene, a carbazolylene, a phenanthridinylene, an acridinylene, a phenanthrolinylene, a phenazinylene, a benzoimidazolylene, a benzofuranylene, a benzothienylene, a benzosilolylene, a benzooxazolylene, an isobenzooxazolylene, a triazolylene, a tetrazolylene, an oxadiazolylene, a triazinylene, a dibenzofuranylene, a dibenzothiophenylene, a benzocarbazolylene, a dibenzocarbazolylene, and a dibenzosilolylene; and a phenylene, a pentalenylene group, an indenylene, a naphthylene, an azulenylene, a heptalenylene, an indacenylene, an acenaphthylene, a fluorenylene, a spiro-fluorenylene, a benzofluorenylene, a dibenzofluorenylene, a phenalenylene, a phenanthrenylene, an anthracenylene, a fluoranthenylene, a triphenylenylene, a pyrenylene, a chrysenylene, a naphthacenylene, a picenylene, a perylenylene, a pentaphenylene, a hexacenylene, a pentacenylene, a rubicenylene, a coronenylene, an ovalenylene, a pyrrolylene, a thienylene, a furanylene, a silolylene, an imidazolylene, a pyrazolylene, a thiazolylene, an isothiazolylene, an oxazolylene, an isooxazolylene, a pyridinylene, a pyrazinylene, a pyrimidinylene, a pyridazinylene, an isoindolylene, an indolylene, an indazolylene, a purinylene, a quinolinylene, an isoquinolinylene, a benzoquinolinylene, a phthalazinylene, a naphthyridinylene, a quinoxalinylene, a quinazolinylene, a cinnolinylene, a carbazolylene, a phenanthridinylene, an acridinylene, a phenanthrolinylene, a phenazinylene, a benzoimidazolylene, a benzofuranylene, a benzothienylene, a benzosilolylene, an isobenzothiazolylene, a benzooxazolylene, an isobenzooxazolylene, a triazolylene, a tetrazolylene, an oxadiazolylene, a triazinylene, a dibenzofuranylene, a dibenzothiophenylene, a benzocarbazolylene, a dibenzocarbazolylene, and a dibenzoxilolylene, each substituted with at least one selected from deuterium, —F, —Cl, —Br, —I, a hydroxyl group, a cyano group, a nitro group, an amino group, an amidino group, a hydrazine group, a hydrazone group, a carboxyl acid group or a salt thereof, a sulfonic acid group or a salt thereof, a phosphoric acid group or a salt thereof, a $C_1$-$C_{20}$ alkyl, a $C_1$-$C_{20}$ alkoxy, a cyclopentyl, a cyclohexyl, a cycloheptyl, a cyclopentenyl, a cyclohexenyl, a phenyl, a pentalenyl, an indenyl, a naphthyl, an azulenyl, a heptalenyl, an indacenyl, an acenaphthyl, a fluorenyl, a spiro-fluorenyl, a benzofluorenyl, a dibenzofluorenyl, a phenalenyl, a phenanthrenyl, an anthracenyl, a fluorantenyl, a triphenylenyl, a pyrenyl, a chrysenyl, a naphthacenyl, a pycenyl, a perylenyl, a pentaphenyl, a hexacenyl, a pentacenyl, a rubicenyl, a coronenyl, an ovalenyl, a pyrrolyl, a thienyl, a furanyl, a silolyl, an imidazolyl, a pyrazolyl, a thiazolyl, an isothiazolyl, an oxazolyl, an isooxazolyl, a pyridinyl, a pyrazinyl, a pyrimidinyl, a pyridazinyl, an isoindolyl, an indolyl, an indazolyl, a purinyl, a quinolinyl, an isoquinolinyl, a benzoquinolinyl, a phthalazinyl, a naphthyridinyl, a quinoxalinyl, a quinazolinyl, a cinnolinyl, a carbazolyl, a phenanthridinyl, an acridinyl, a phenanthrolinyl, a phenazinyl, a benzoimidazolyl, a benzofuranyl, a benzothienyl, a benzosilolyl, an isobenzothiazolyl, a benzooxazolyl, an isobenzooxazolyl, a triazolyl, a tetrazole, an oxadiazolyl, a triazinyl, a dibenzofuranyl, a dibenzothienyl, a benzocarbazolyl, a dibenzocarbazolyl, and a dibenzosilolyl.

In other embodiments, $L_{21}$ and $L_{23}$ in Formula 2 may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene, a naphthylene, a fluorenylene, a spiro-fluorenylene, a benzofluorenylene, a dibenzofluorenylene, a phenanthrenylene, an anthracenylene, a pyrenylene, a chrysenylene, a pyridinylene, a pyrazinylene, a pyrimidinylene, a pyridazinylene, a quinolinylene, a isoquinolinylene, a quinoxalinylene, a quinazolinylene, a carbazolylene, and a triazinylene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl group, but they are not limited thereto.

In other embodiments, $L_{21}$ to $L_{23}$ in Formula 2 may be each independently represented by one of Formulae 6-1 to 6-7 below, but are not limited thereto:

6-1

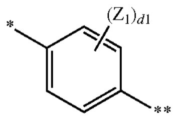

6-2

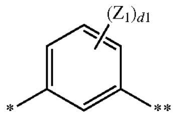

6-3

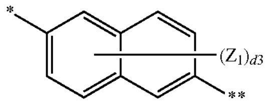

6-4

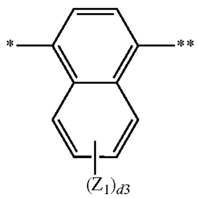

-continued 6-5

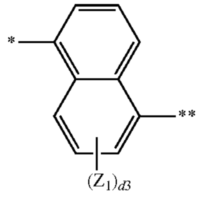

6-6

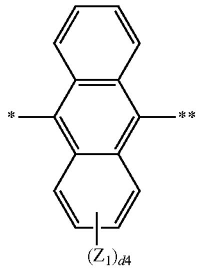

6-7

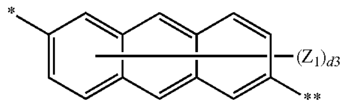

wherein in Formulae 6-1 to 6-7, $Z_1$ may be selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl;

d1 is an integer selected from 1 to 4;

d3 is an integer selected from 1 to 6;

d4 is an integer selected from 1 to 8; and

* and ** each indicate a binding site to a neighboring atom.

For example, n21 to n23 in Formula 2 may be each independently an integer of 0 or 1, but they are not limited thereto.

In other embodiments, in Formula 2, n21 may be 1, and n22 and n23 may each be 0, but they are not limited thereto.

For example, $R_{23}$ and $R_{24}$ in Formula 2 may bond to each other to form a substituted or unsubstituted saturated ring or unsaturated ring, but they are not limited thereto.

For example, $R_{21}$, and $R_{31}$ to $R_{35}$ in Formulae 2 and 3 may be each independently selected from:

a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a triazinyl group, a dibenzofuranyl group, and a dibenzothienyl group; and a phenyl, a naphthyl, a fluorenyl, a benzofluorenyl, an anthracenyl, a pyrenyl, a chrysenyl, a pyridinyl, a pyrazinyl, a pyrimidinyl, a pyridazinyl, a quinolinyl, an isoquinolinyl, a carbazolyl, a triazinyl, a dibenzofuranyl, and a dibenzothienyl, each substituted with at least one selected from a deuterium, —F, —Cl, —Br, —I, a cyano group, a nitro group, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, carbazolyl, a triazinyl, a dibenzofuranyl, and a dibenzothienyl, and —$N(Q_{31})(Q_{32})(Q_{33})$; and $Q_{31}$ to $Q_{33}$ may be each independently selected from a phenyl group and a naphthyl group, but they are not limited thereto.

In other embodiments, $R_{21}$, and $R_{31}$ to $R_{35}$ in Formulae 2 and 3 may be each independently selected from:

a phenyl, a naphthyl, a pyridinyl, a pyrazinyl, a pyrimidinyl, a pyridazinyl, and a triazinyl; and a phenyl, a naphthyl, a pyridinyl, a pyrazinyl, a pyrimidinyl, a pyridazinyl, and a triazinyl, each substituted with at least one of a deuterium, a halogen atom, a cyano group, a nitro group, a methyl, a methoxy group, a phenyl, a naphthyl, a pyridinyl, a pyrazinyl, a pyrimidinyl, a pyridazinyl, a triazinyl, and —$N(Ph)_3$, but they are not limited thereto.

For example, $R_{22}$ to $R_{24}$ in Formula 2 may be each independently selected from:

a $C_1$-$C_{20}$ alkyl and a $C_1$-$C_{20}$ alkoxy;

a phenyl, a naphthyl, a fluorenyl, a benzofluorenyl, an anthracenyl, a pyrenyl, a chrysenyl, a pyridinyl, a pyrazinyl, a pyrimidinyl, a pyridazinyl, a quinolinyl, an isoquinolinyl, a carbazolyl, a triazinyl, a dibenzofuranyl, and a dibenzothienyl; and a phenyl, a naphthyl, a fluorenyl, a benzofluorenyl, an anthracenyl, a pyrenyl, a chrysenyl, a pyridinyl, a pyrazinyl, a pyrimidinyl, a pyridazinyl, a quinolinyl, an isoquinolinyl, a carbazolyl, a triazinyl, a dibenzofuranyl, and a dibenzothienyl, each substituted with at least one of a deuterium, —F, —Cl, —Br, —I, a cyano group, a nitro group, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl, but they are not limited thereto.

In other examples, $R_{22}$ to $R_{24}$ in Formula 2 may be each independently selected from:

a methyl and a methoxy;

a phenyl, a naphthyl, a pyridinyl, a pyrazinyl, a pyrimidinyl, a pyridazinyl, and a triazinyl; and a phenyl, a naphthyl, a pyridinyl, a pyrazinyl, a pyrimidinyl, a pyridazinyl, and a triazinyl, each substituted with at least one of a deuterium, —F, —Cl, —Br, —I, a cyano group, a nitro group, a methyl, a methoxy, a phenyl, a naphthyl, a pyridinyl, a pyrazinyl, a pyrimidinyl, a pyridazinyl, and a triazinyl, but they are not limited thereto.

For example, $R_{25}$ to $R_{28}$ in Formula 2 may be each independently selected from:

a hydrogen, a deuterium, —F, —Cl, —Br, —I, a cyano group, a nitro group, a $C_1$-$C_{60}$ alkyl group, and a $C_1$-$C_{60}$ alkoxy group, but they are not limited thereto.

In other embodiment, $R_{25}$ to $R_{28}$ in Formula 2 may be each independently selected from a hydrogen, a deuterium, —F, —Cl, —Br, —I, a cyano group, a nitro group, a methyl, and a methoxy, but they are not limited thereto.

According to an embodiment, the hole transport material represented by Formula 2 may be represented by Formula 2A below, but is not limited thereto:

Formula 2A

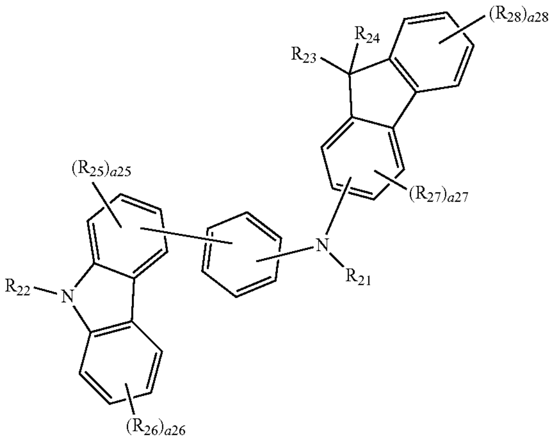

wherein in Formula 2A, $R_{21}$ to $R_{28}$ and a25 to a28 may be the same as described above.

In other embodiments, the hole transport material represented by Formula 2 or 3 may be selected from Compounds 301 to 326 below, but they are not limited thereto:

301

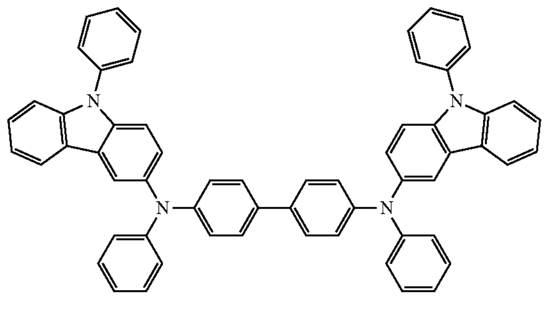

302

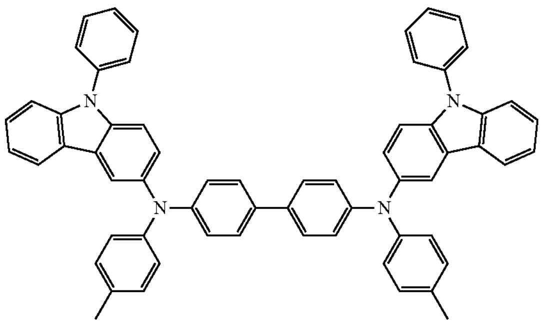

-continued
303
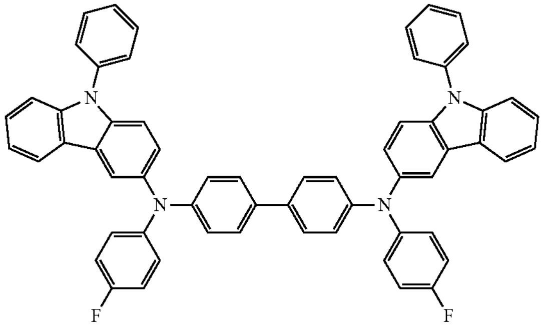
304
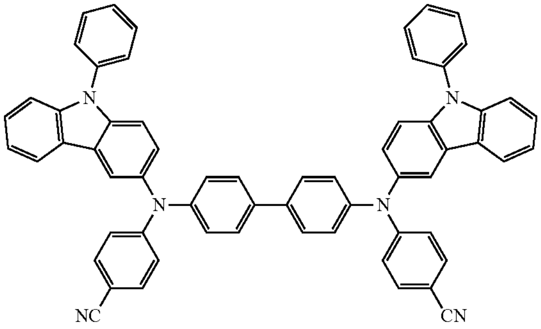
305
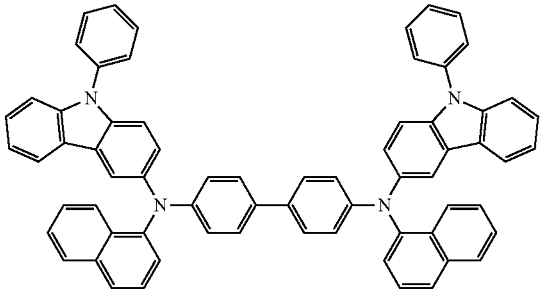
306
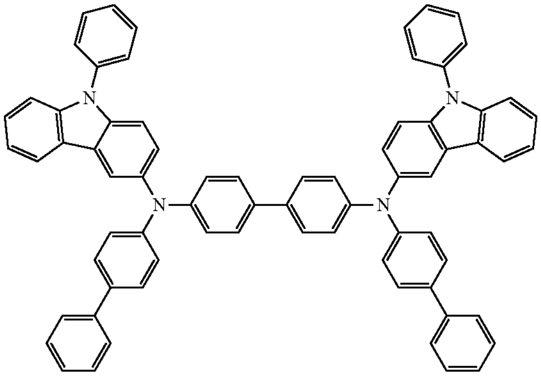
307
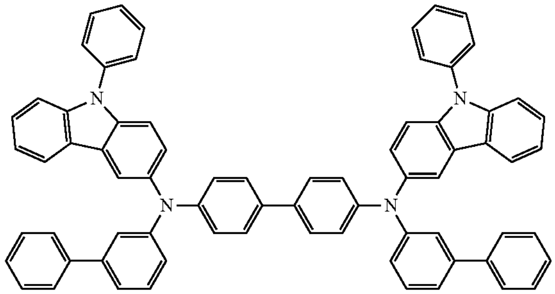
308
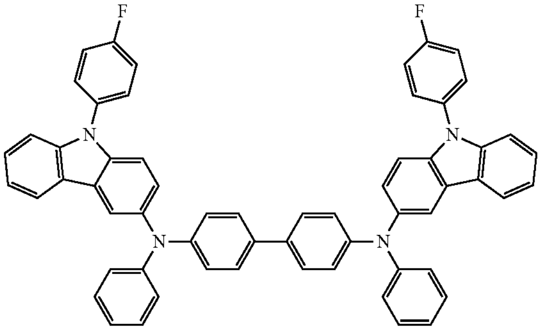

-continued
309
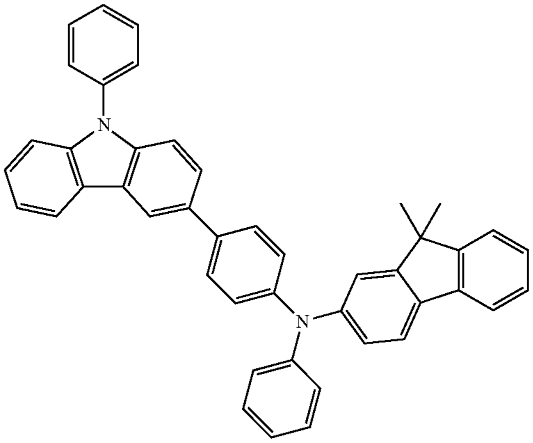
310
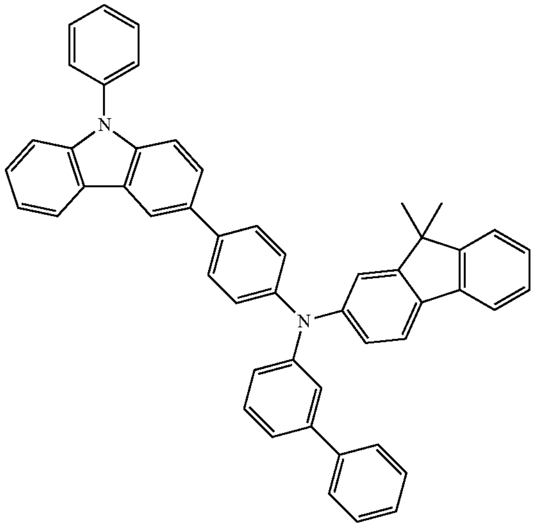
311
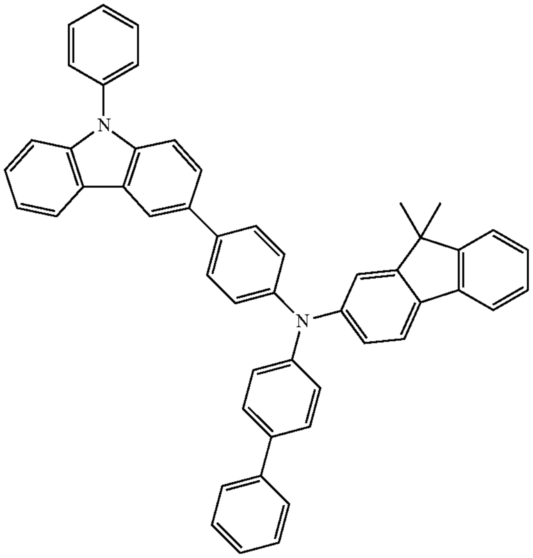
312
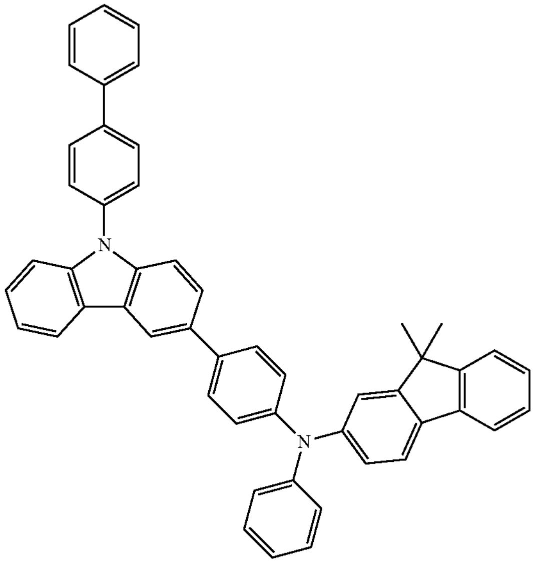

-continued
313
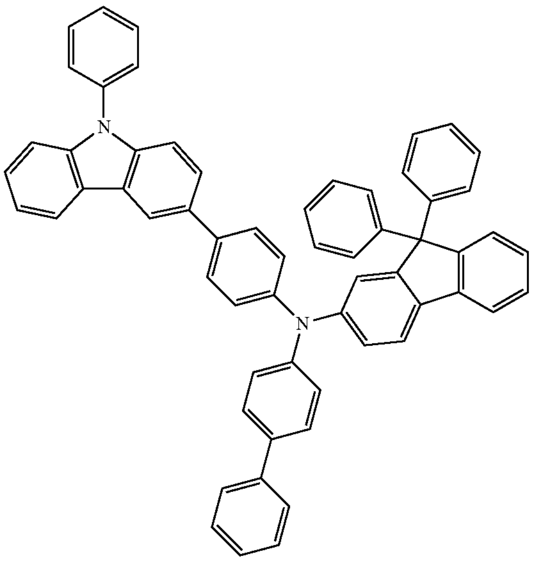
314
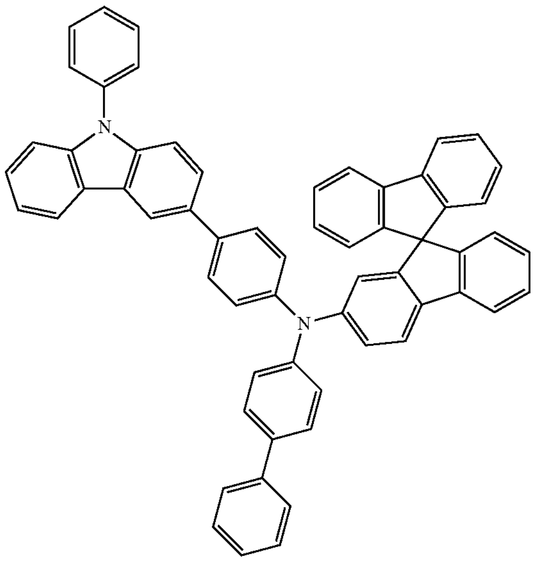
315
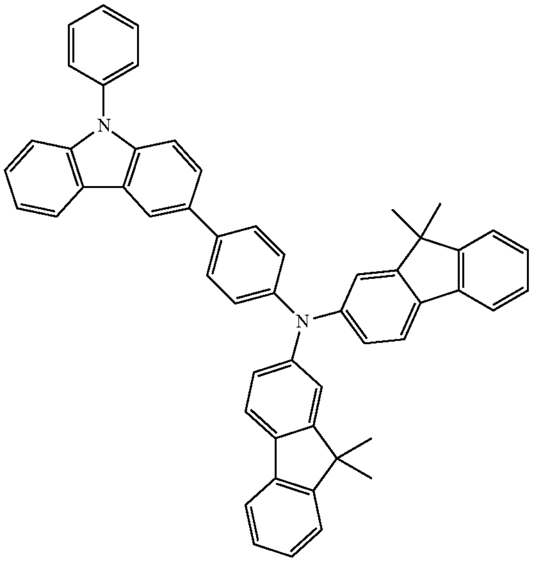
316
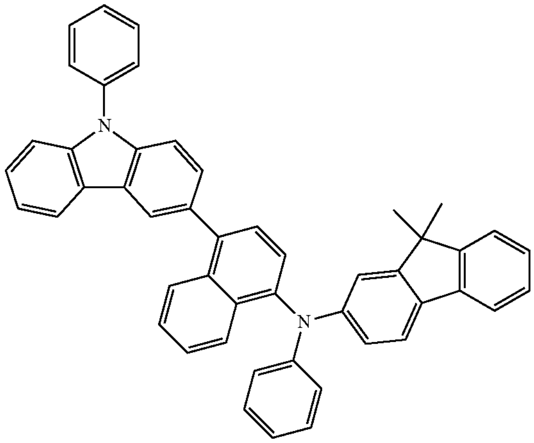

-continued
317
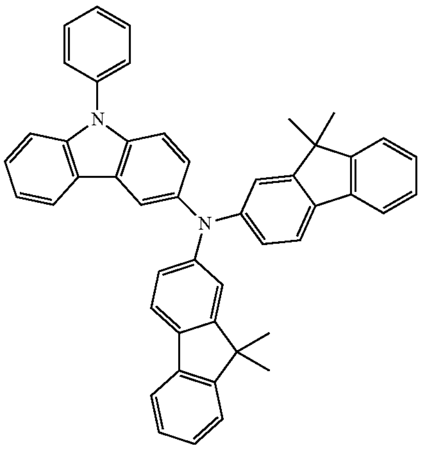
318
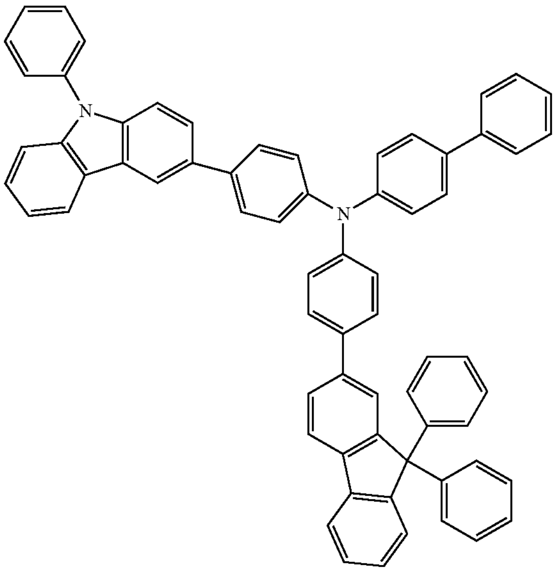
319
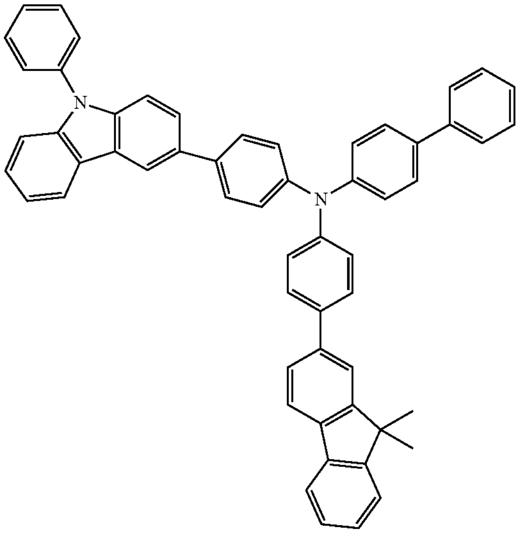
320
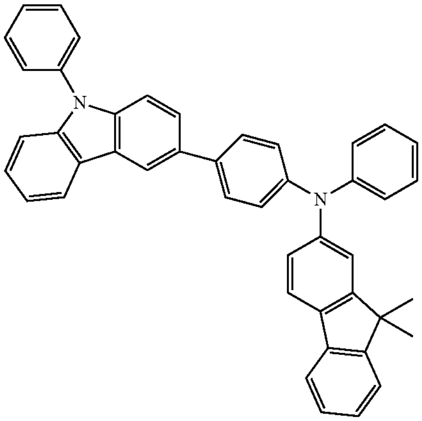
321
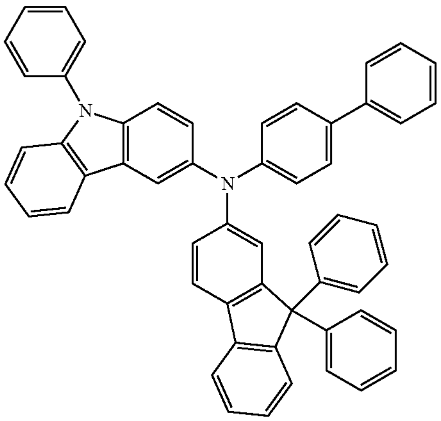
322
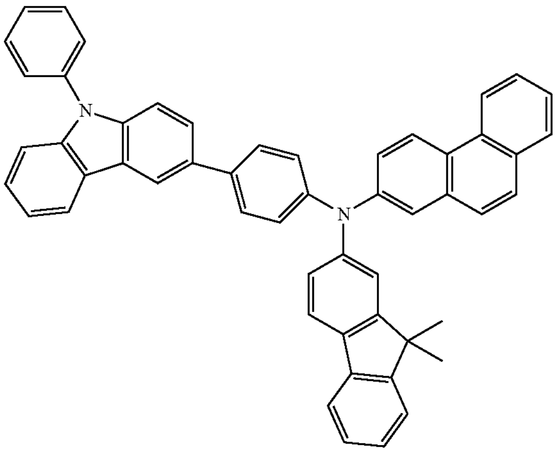

-continued

323

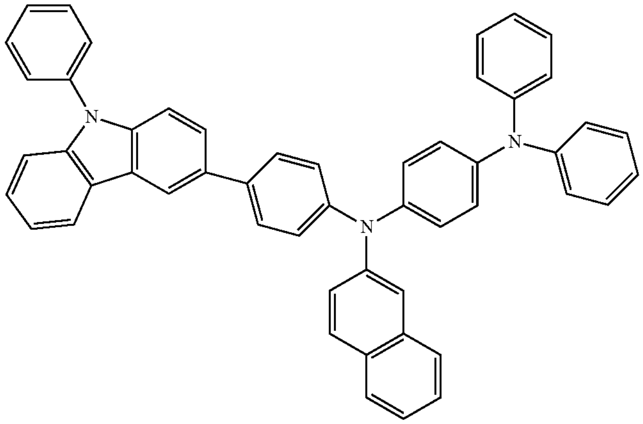

324

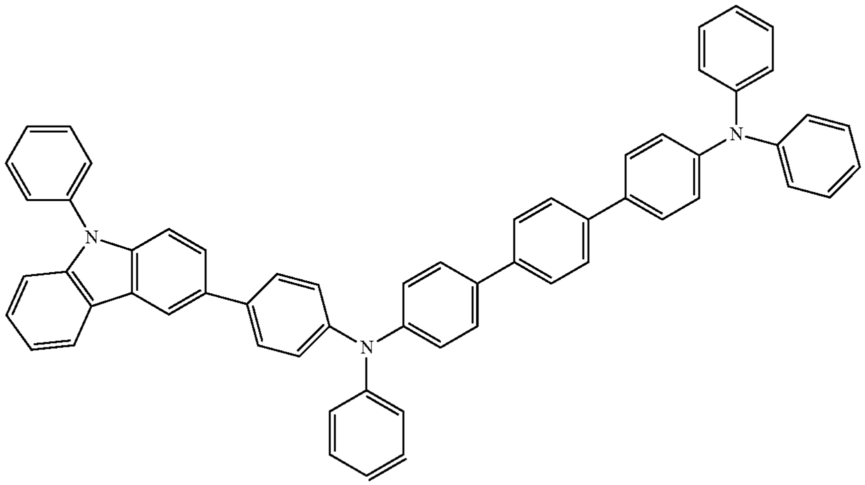

325

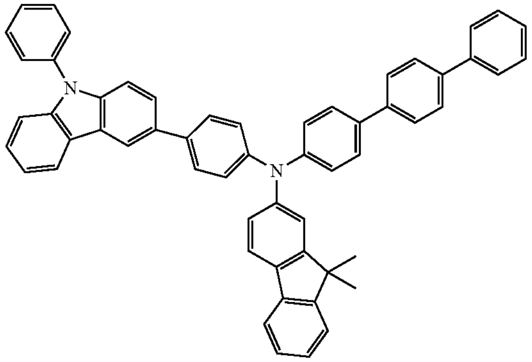

326

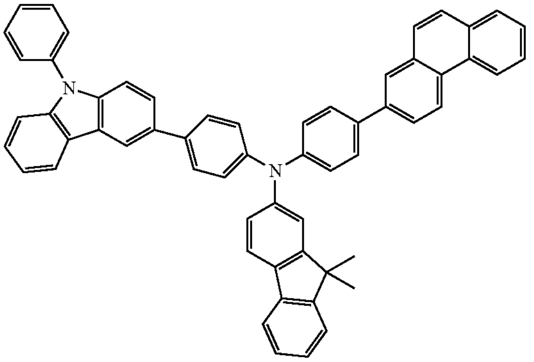

The hole transport material represented by Formula 2 or 3 has excellent hole transport capability, and thus, an organic light-emitting device including the hole transport material may have high efficiency and long lifespan.

A thickness of the hole transport region may be in a range of about 100 Å to about 10,000 Å, for example, about 100 Å to about 1000 Å. When the hole transport region includes both a hole injection layer and a hole transport layer, a thickness of the hole injection layer may be in a range of about 100 Å to about 10000 Å, for example, about 100 Å to about 1000 Å, and a thickness of the hole transport layer may be in a range of about 50 Å to about 2000 Å, for example, about 100 Å to about 1500 Å. In one embodiment, when the thicknesses of the hole transport region, the hole injection layer, and the hole transport layer are within these ranges, satisfactory hole transporting characteristics are obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one of a quinone derivative, a metal oxide, and a cyano group-containing compound, but is not limited thereto. For example, non-limiting examples of the p-dopant are a quinone derivative (such as tetracyanoquinonedimethane (TCNQ) or 2,3,5,6-tetrafluoro-tetracyano-1,4-benzoquinonedimethane (F4-TCNQ)); a metal oxide (such as a tungsten oxide or a molybdenum oxide); and Compound HT-D1 illustrated below, but are not limited thereto.

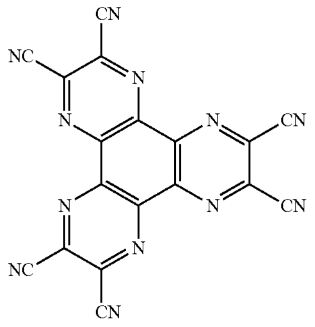

Compound HT-D1

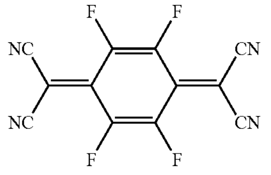

F4-TCNQ

The hole transport region may further include, in addition to the hole injection layer and the hole transport layer, at least one of a buffer layer and an electron blocking layer. The buffer layer may compensate for an optical resonance distance according to a wavelength of light emitted from the emission layer, and thus, light-emission efficiency of a formed organic light-emitting device may be improved. For use (usage) as a material included in the buffer layer, materials that are included in the hole transport region may be used (utilized). The electron blocking layer reduces or prevents injection of electrons from the electron transport region.

An emission layer is formed on the first electrode 110 or the hole transport region by using (utilizing) various suitable methods, such as vacuum deposition, spin coating, casting, an LB method, ink-jet printing, laser-printing, or laser-induced thermal imaging. When the emission layer is formed by vacuum deposition or spin coating, the deposition and coating conditions for the emission layer may be determined by referring to the deposition and coating conditions for the hole injection layer.

When the organic light-emitting device 10 is a full color organic light-emitting device, the emission layer may be patterned into a red emission layer, a green emission layer, and a blue emission layer, according to (the color of) a sub pixel. In some embodiments, the emission layer may have a stacked structure of a red emission layer, a green emission layer, and a blue emission layer; or may include a red-light emission material, a green-light emission material, and a blue-light emission material, which are mixed with each other in a single layer, to emit white light. According to another embodiment, the emission layer may be a white emission layer, and may further include a color converting layer or a color filter to turn white light into light of a desired color.

The emission layer may include a host and a dopant.

The host may include at least one selected from TPBi, TBADN, ADN (AND), CBP, CDBP, and TCP:

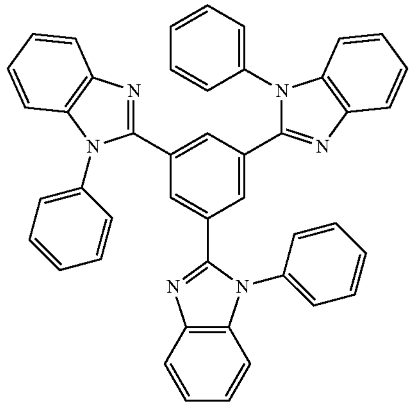

TPBi

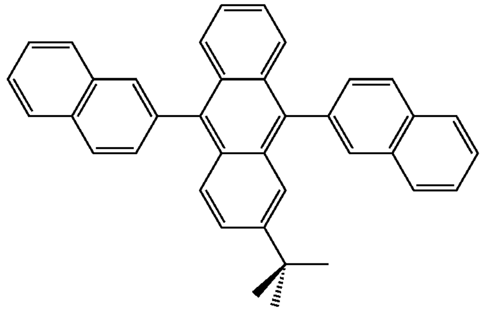

TBADN

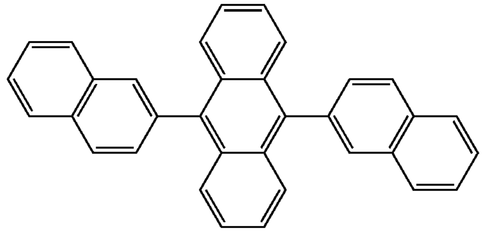

ADN

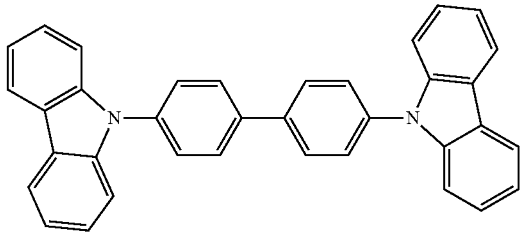

CBP

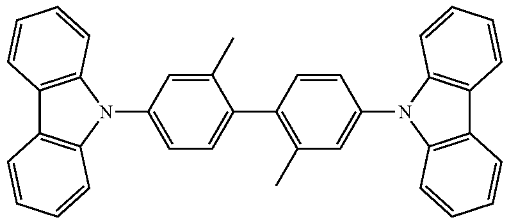

CDBP

-continued

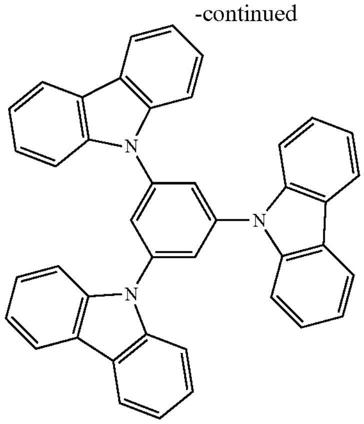

TCP

According to another embodiment, the host may include a compound represented by Formula 301 below.

$Ar_{301}$-$[L_{301})_{xb1}$-$R_{301}]_{xb2}$ Formula 301 wherein in Formula 301, $Ar_{301}$ may be selected from:

a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, a halogen atom, a hydroxyl, a cyano group, a nitro group, an amino, an amidino, a hydrazine, a hydrazone, a carboxylic acid group or a salt thereof, a sulfonic acid group or a salt thereof, a phosphoric acid group or a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_1$-$C_{10}$ heterocycloalkyl, a $C_3$-$C_{10}$ cycloalkenyl, a $C_1$-$C_{10}$ heterocycloalkenyl, a $C_6$-$C_{60}$ aryl, a $C_6$-$C_{60}$ aryloxy, a $C_6$-$C_{60}$ arylthio, a $C_1$-$C_{60}$ heteroaryl, a non-aromatic condensed polycyclic group, and —$Si(Q_{301})(Q_{302})(Q_{303})$ ($Q_{301}$ to $Q_{303}$ may be each independently selected from a hydrogen, a $C_1$-$C_{60}$ alkyl, a $C_2$-$C_{60}$ alkenyl, a $C_6$-$C_{60}$ aryl, and a $C_1$-$C_{60}$ heteroaryl group);

$L_{301}$ may be selected from a substituted or unsubstituted $C_3$-$C_{10}$ cycloalkylene, a substituted or unsubstituted $C_1$-$C_{10}$ heterocycloalkylene, a substituted or unsubstituted $C_3$-$C_{10}$ cycloalkenylene, a substituted or unsubstituted $C_1$-$C_{10}$ heterocycloalkenylene, a substituted or unsubstituted $C_6$-$C_{60}$ arylene, a substituted or unsubstituted $C_1$-$C_{60}$ heteroarylene, a substituted or unsubstituted divalent non-aromatic condensed polycyclic group, and a substituted or unsubstituted divalent non-aromatic condensed heteropolycyclic group, and at least one substituent of the substituted $C_3$-$C_{10}$ cycloalkylene, the substituted $C_1$-$C_{10}$ heterocycloalkylene, the substituted $C_3$-$C_{10}$ cycloalkenylene, the substituted $C_1$-$C_{10}$ heterocycloalkenylene, the substituted $C_6$-$C_{60}$ arylene, the substituted $C_1$-$C_{60}$ heteroarylene, the substituted divalent non-aromatic condensed polycyclic group, and the substituted divalent non-aromatic condensed heteropolycyclic group may be selected from:

a deuterium, a halogen atom, a hydroxyl group, a cyano group, a nitro group, an amino, an amidino, a hydrazine, a hydrazone, a carboxylic acid group or a salt thereof, a sulfonic acid group or a salt thereof, a phosphoric acid group or a salt thereof, a $C_1$-$C_{60}$ alkyl, a $C_2$-$C_{60}$ alkenyl, a $C_2$-$C_{60}$ alkynyl, and a $C_1$-$C_{60}$ alkoxy;

a $C_1$-$C_{60}$ alkyl, a $C_2$-$C_{60}$ alkenyl, a $C_2$-$C_{60}$ alkynyl, and a $C_1$-$C_{60}$ alkoxy, each substituted with at least one selected from a deuterium, a halogen atom, a hydroxyl group, a cyano group, a nitro group, an amino, an amidino, a hydrazine, a hydrazone, a carboxylic acid group or a salt thereof, a sulfonic acid group or a salt thereof, a phosphoric acid group or a salt thereof, a $C_3$-$C_{10}$ cycloalkyl, a $C_1$-$C_{10}$ heterocycloalkyl, a $C_3$-$C_{10}$ cycloalkenyl, a $C_1$-$C_{10}$ heterocycloalkenyl, a $C_6$-$C_{60}$ aryl, a $C_6$-$C_{60}$ aryloxy, a $C_6$-$C_{60}$ arylthio, a $C_1$-$C_{60}$ heteroaryl, a monovalent non-aromatic condensed polycyclic, a monovalent non-aromatic condensed heteropolycyclic group, —$N(Q_{201})(Q_{202})$, —$Si(Q_{203})(Q_{204})(Q_{205})$, and —$B(Q_{206})(Q_{207})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl, a $C_1$-$C_{10}$ heterocycloalkyl, a $C_3$-$C_{10}$ cycloalkenyl, a $C_1$-$C_{10}$ heterocycloalkenyl, a $C_6$-$C_{60}$ aryl, a $C_6$-$C_{60}$ aryloxy, a $C_6$-$C_{60}$ arythio, a $C_1$-$C_{60}$ heteroaryl, a monovalent non-aromatic condensed polycyclic group, and a monovalent non-aromatic condensed heteropolycyclic group, each substituted with at least one selected from a deuterium, a halogen atom, a hydroxyl group, a cyano, a nitro, an amino, an amidino, a hydrazine, a hydrazone, a carboxylic acid group or a salt thereof, a sulfonic acid group or a salt thereof, a phosphoric acid group or a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_1$-$C_{10}$ heterocycloalkyl, a $C_3$-$C_{10}$ cycloalkenyl, a $C_1$-$C_{10}$ heterocycloalkenyl, a $C_6$-$C_{60}$ aryl, a $C_6$-$C_{60}$ aryloxy, a $C_6$-$C_{60}$ arythio, a $C_1$-$C_{60}$ heteroaryl, a monovalent non-aromatic condensed polycyclic group, a monovalent non-aromatic condensed heteropolycyclic group, —$N(Q_{211})(Q_{212})$, —$Si(Q_{213})(Q_{214})(Q_{215})$, and —$B(Q_{216})(Q_{217})$; and —$N(Q_{221})(Q_{222})$, —$Si(Q_{223})(Q_{224})(Q_{225})$, and —$B(Q_{226})(Q_{227})$, For example, $Ar_{301}$ may be selected from:

a $C_1$-$C_{20}$ alkyl and a $C_1$-$C_{20}$ alkoxy;

a $C_1$-$C_{20}$ alkyl and a $C_1$-$C_{20}$ alkoxy, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl, each substituted with at least one selected from a deuterium, a halogen atom, a hydroxyl group, a cyano, a nitro, an amino, an amidino, a hydrazine, a hydrazone, a carboxylic acid group or a salt thereof, a sulfonic acid group or a salt thereof, a phosphoric acid group or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl; and xb1 may be selected from 0, 1, 2, and 3; and xb2 may be selected from 1, 2, 3, and 4.

In Formula 301, $L_{301}$ may be selected from:

a phenylene, a naphthylene, fluorenylene, a spiro-fluorenylene, a benzofluorenylene, a dibenzofluorenylene, a phenanthrenylene, an anthracenylene, a pyrenylene, and a chrysenylene; and a phenylene, a naphthylene, a fluorenylene, a spiro-fluorenylene, a benzofluorenylene, a dibenzofluorenylene, a phenanthrenylene, an anthracenylene, a pyrenylene, and a chrysenylene, each substituted with at least one selected from deuterium, a halogen atom, a hydroxyl group, a cyano, a nitro, an amino, an amidino, a hydrazine, a hydrazone, a carboxylic acid group or a salt thereof, a sulfonic acid group or a salt thereof, a phosphoric acid group or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, and a chrysenyl; and $R_{301}$ may be selected from:

a $C_1$-$C_{20}$ alkyl and a $C_1$-$C_{20}$ alkoxy;

a $C_1$-$C_{20}$ alkyl and a $C_1$-$C_{20}$ alkoxy, each substituted with at least one selected from deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl, a naphthyl, a fluorenyl, a spiro-fluorenyl, a benzofluorenyl, a dibenzofluorenyl, a phenanthrenyl, an anthracenyl, a pyrenyl, and a chrysenyl;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and a phenyl, a naphthyl, a fluorenyl, a spiro-fluorenyl, a benzofluorenyl, a dibenzofluorenyl, a phenanthrenyl, an anthracenyl, a pyrenyl, and a chrysenyl, each substituted with at least one selected from deuterium, a halogen atom, a hydroxyl group, a cyano, a nitro, an amino, an amidino, a hydrazine, a hydrazone, a carboxylic acid group or a salt thereof, a sulfonic acid group or a salt thereof, a phosphoric acid group or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, and a chrysenyl group, but they are not limited thereto.

For example, the host may include a compound represented by Formula 301A below:

Formula 301A

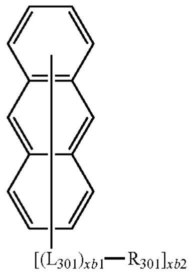

Substituents of Formula 301A may be understood by corresponding descriptions provided herein.

The compound represented by Formula 301 may include at least one of Compounds H1 to H42, but is not limited thereto:

H1

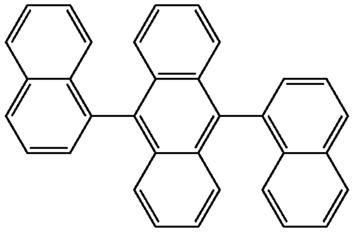

H2

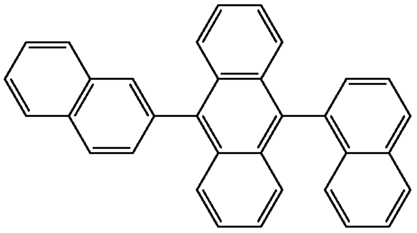

H3

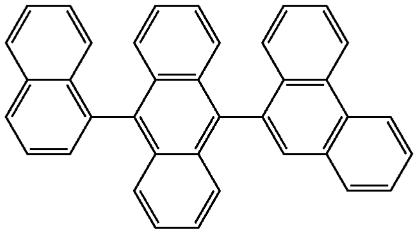

H4

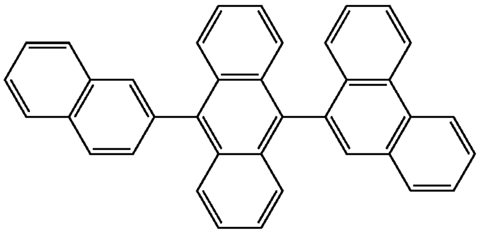

-continued
H5
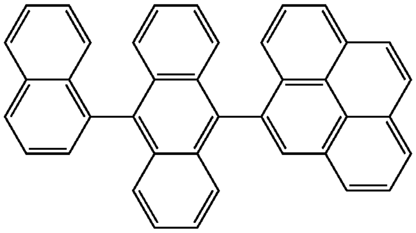
H6
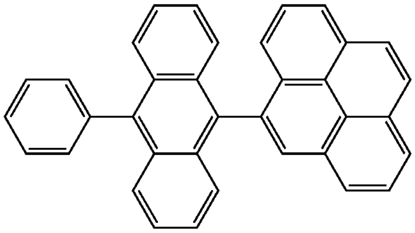
H7
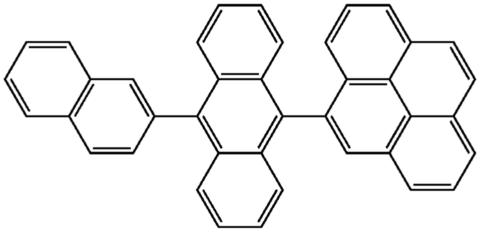
H8
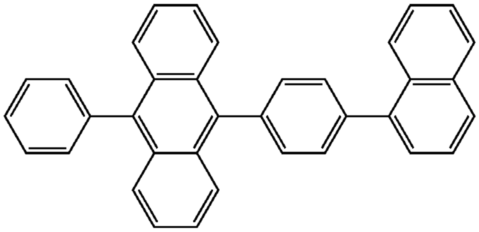
H9
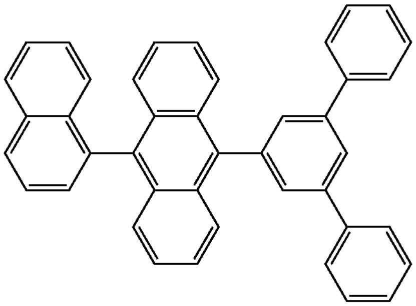
H10
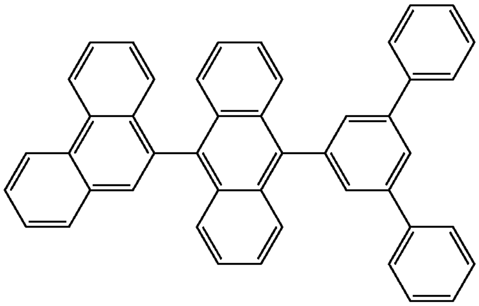
H11
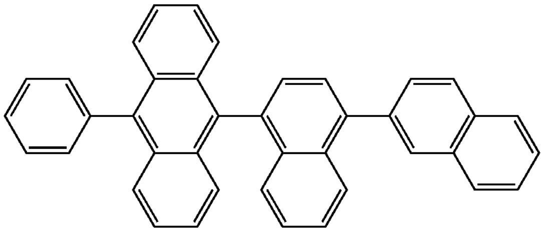
H12
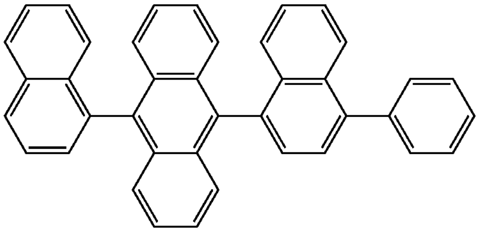
H13
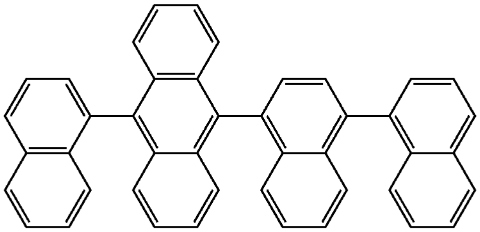
H14
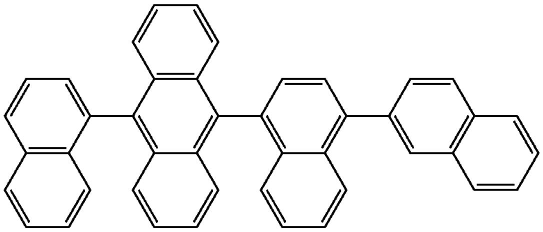
H15
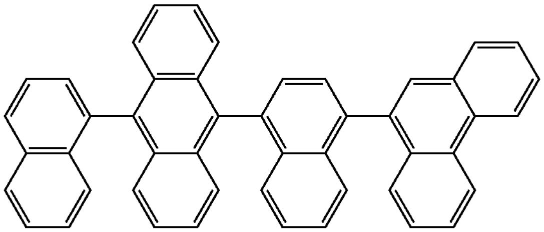

-continued
H16
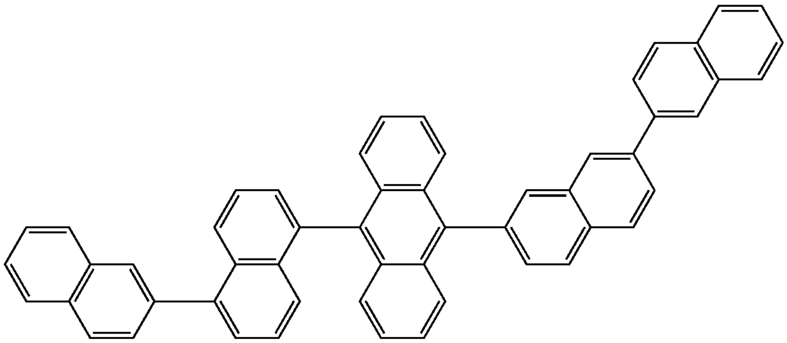
H17
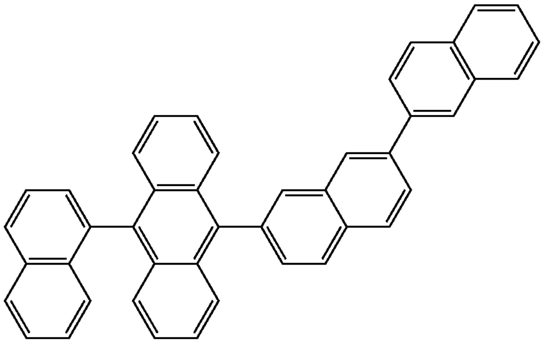
H18
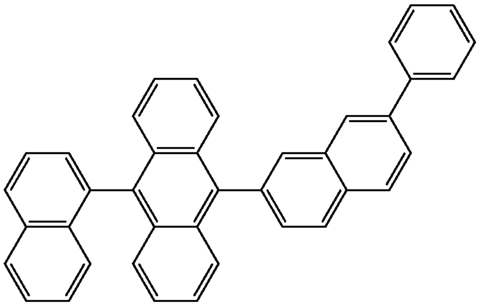
H19
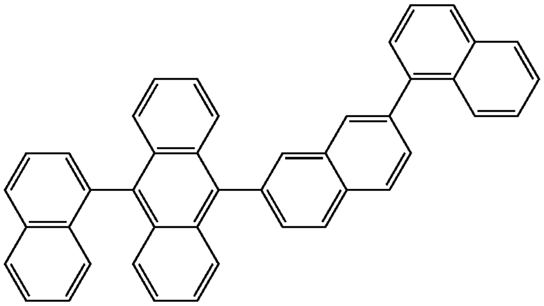
H20
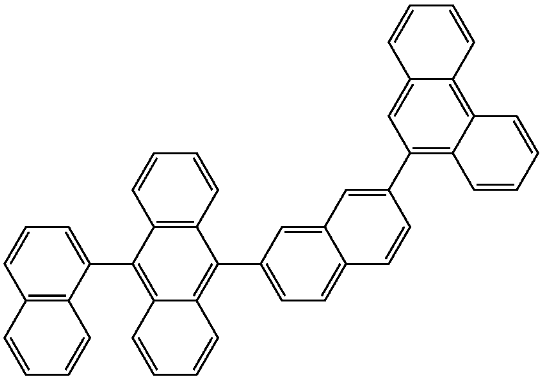
H21
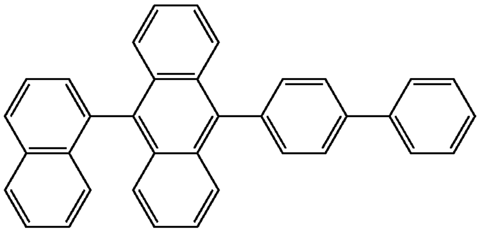
H22
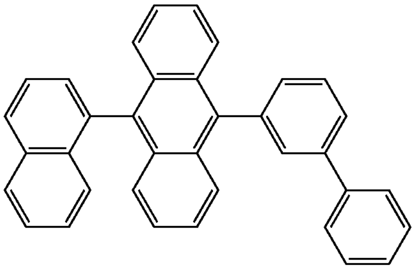
H23
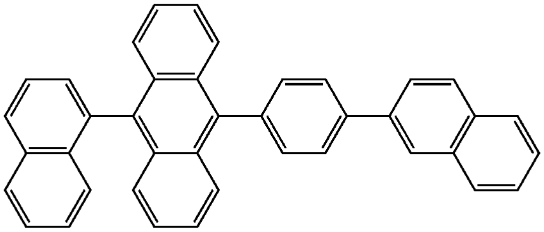
H24
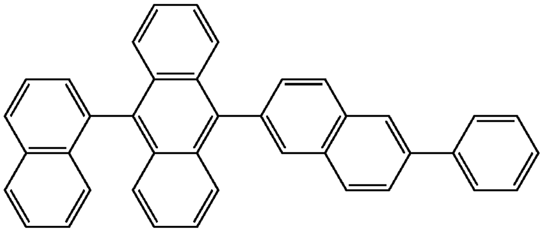

-continued
H25
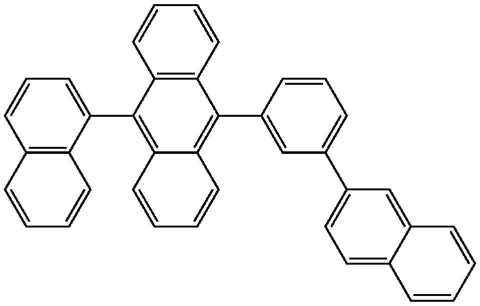
H26
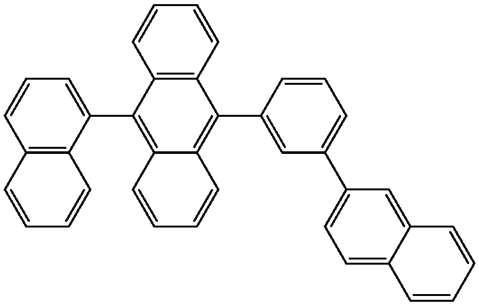
H27
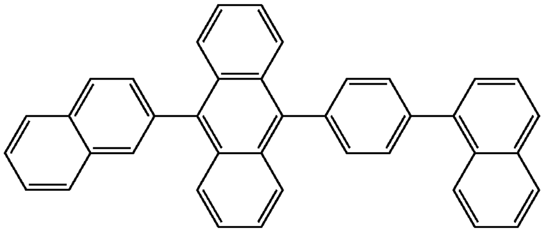
H28
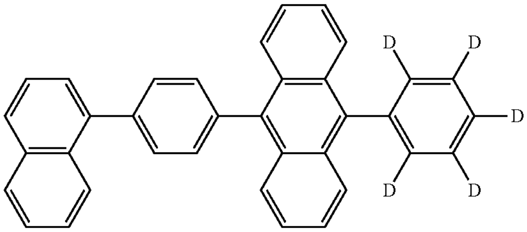
H29
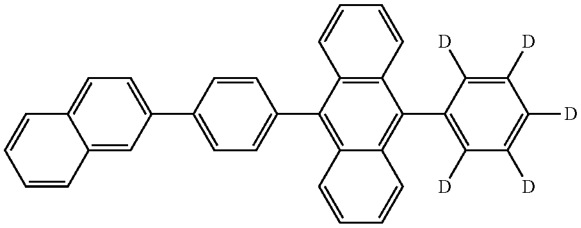
H30
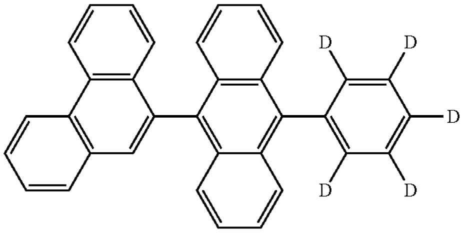
H31
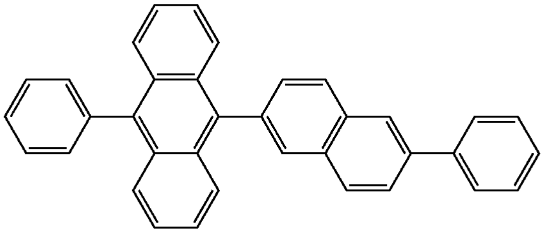
H32
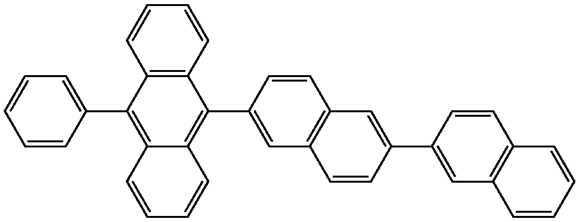
H33
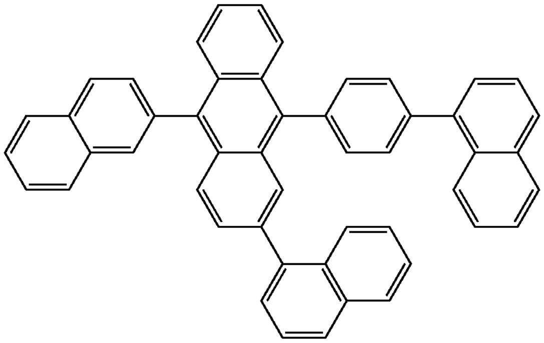
H34
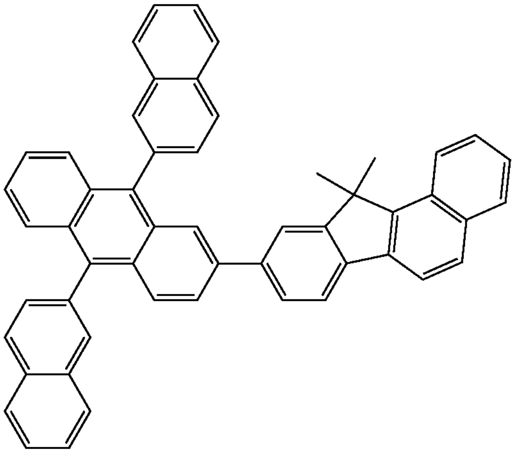

-continued
H35
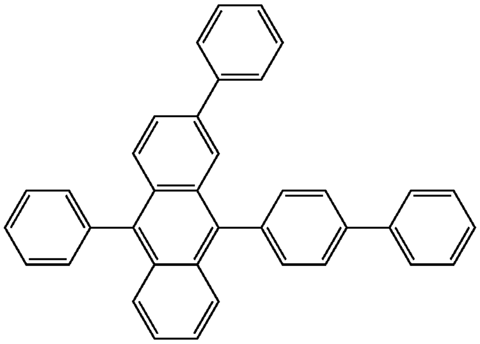
H36
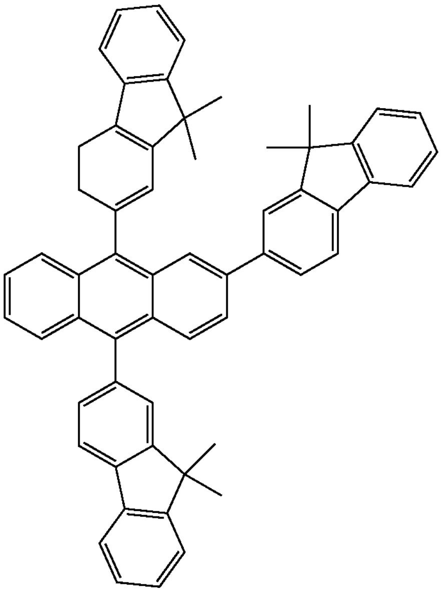
H37
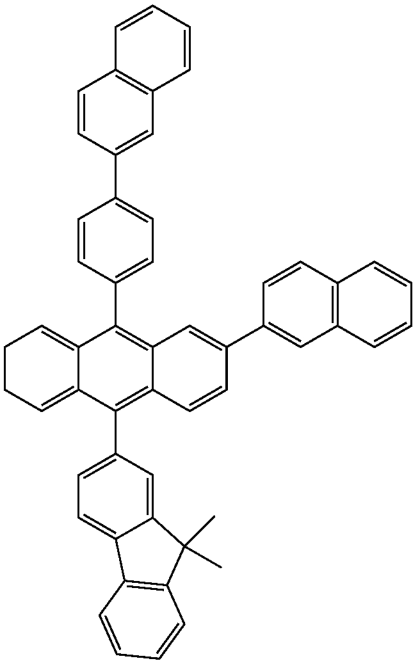
H38
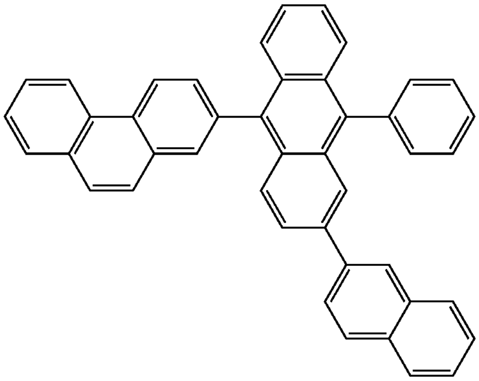

-continued
H39
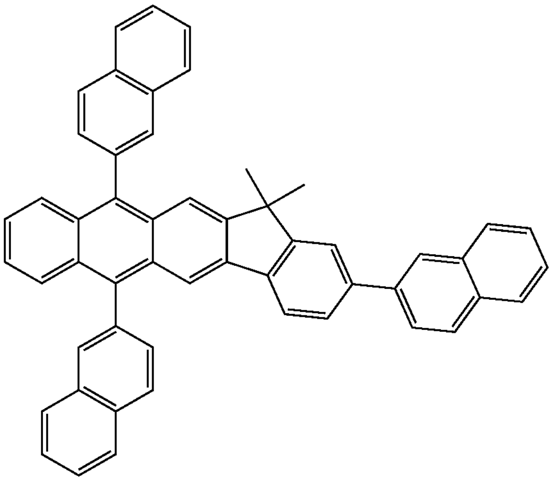
H40
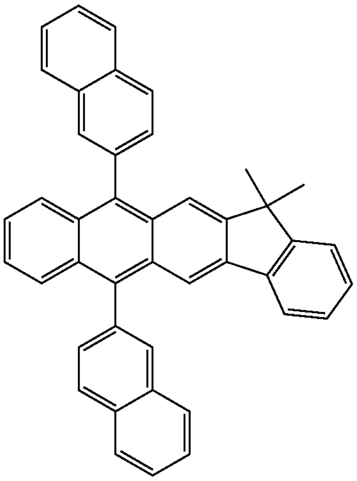
H41
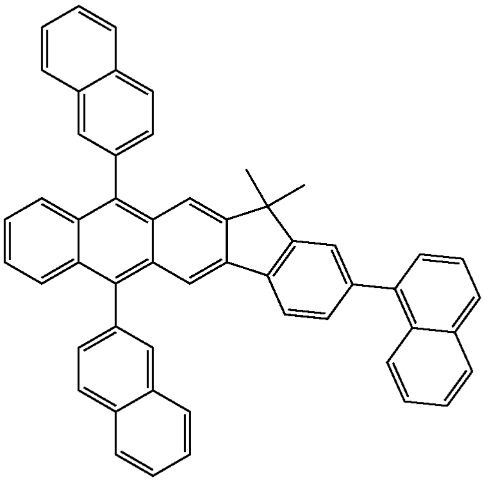
H42
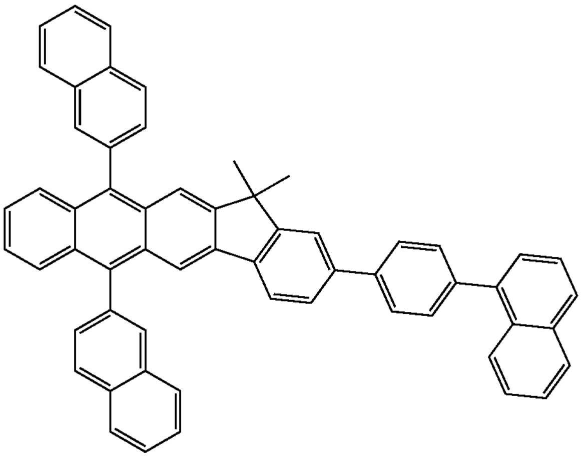
According to another embodiment, the host may include at least one of Compounds H43 to H49 below, but is not limited thereto:
H43
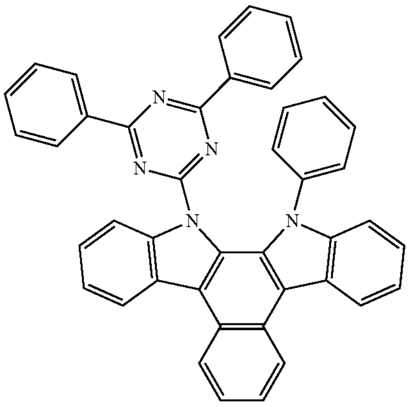
-continued
H44
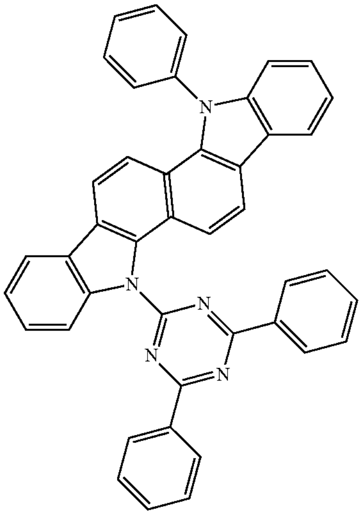

-continued

H45

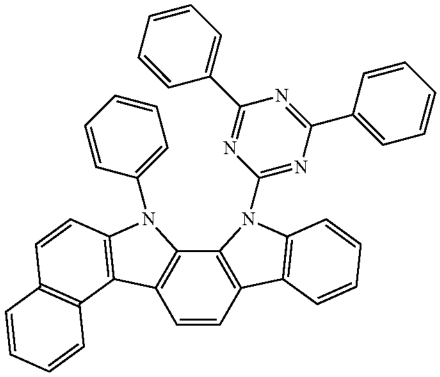

H46

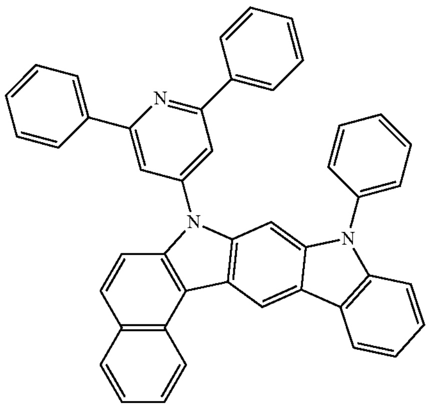

H47

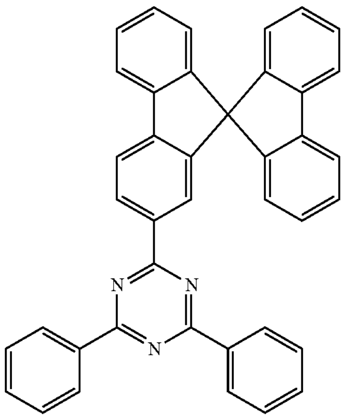

H48

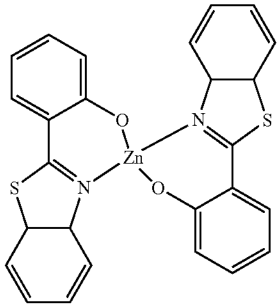

-continued

H49

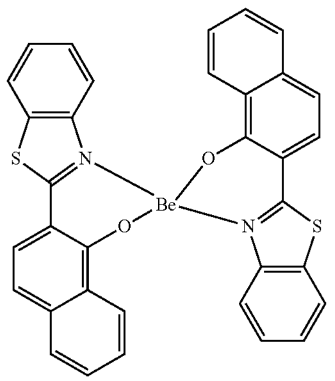

The emission layer of the organic light-emitting device may further include at least one selected from a fluorescent dopant and a phosphorescent dopant.

The phosphorescent dopant may include an organometallic complex represented by Formula 401 below:

<Formula 401>

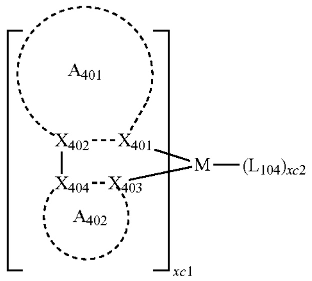

wherein in Formula 401,

M may be selected from iridium (Ir), platinum (Pt), osmium (Os), titanium (Ti), zirconium (Zr), hafnium (Hf), euroform (Eu), terbium (Tb), and thulium (Tm);

$X_{401}$ to $X_{404}$ may be each independently a nitrogen atom or a carbon atom;

$A_{401}$ and $A_{402}$ rings may be each independently selected from a substituted or unsubstituted benzene group, a substituted or unsubstituted naphthalene group, a substituted or unsubstituted fluorenene group, a substituted or unsubstituted spiro-fluorenene group, a substituted or unsubstituted indene group, a substituted or unsubstituted pyrrol group, a substituted or unsubstituted thiophene group, a substituted or unsubstituted furan group, a substituted or unsubstituted imidazole group, a substituted or unsubstituted pyrazole group, a substituted or unsubstituted thiazole group, a substituted or unsubstituted isothiazole group, a substituted or unsubstituted oxazole group, a substituted or unsubstituted isoxazole group, a substituted or unsubstituted pyridine group, a substituted or unsubstituted pyrazine group, a substituted or unsubstituted pyrimidine group, a substituted or unsubstituted pyridazine group, a substituted or unsubstituted quinoline group, a substituted or unsubstituted isoquinoline group, a substituted or unsubstituted benzoquinoline group, a substituted or unsubstituted quinoxaline group, a substituted or unsubstituted quinazoline group, a substituted or unsubstituted carbazol group, a substituted or unsubstituted benzoimidazole group, a substituted or unsubstituted benzofuran group, a substituted or unsubstituted benzothiophene group, a substituted or unsubstituted isobenzothiophene group, a substituted or unsubstituted benzooxazole group, a substituted or unsubstituted isobenzooxazole group, a substituted or unsubstituted triazole group, a substituted or unsubstituted oxadiazole group, a substituted or unsubstituted triazine group, a substituted or unsubstituted dibenzofuran group, and a substituted or unsubstituted dibenzothiophene group; and at least one substituent of the substituted benzene group, substituted naphthalene group, substituted fluorenene group, substituted spiro-fluorenene group, substituted indene group, substituted pyrrol group, substituted thiophene group, substituted furan group, substituted imidazole group, substituted pyrazole group, substituted thiazole group, substituted isothiazole group, substituted oxazole group, substituted isoxazole group, substituted pyridine group, substituted pyrazine group, substituted pyrimidine group, substituted pyridazine group, substituted quinoline group, substituted isoquinoline group, substituted benzoquinoline group, substituted quinoxaline group, substituted quinazoline group, substituted carbazol group, substituted benzoimidazole group, substituted benzofuran group, substituted benzothiophene group, substituted isobenzothiophene group, substituted benzooxazole group, substituted isobenzooxazole group, substituted triazole group, substituted oxadiazole group, substituted triazine group, substituted dibenzofuran group, and substituted dibenzothiophene group may be selected from:

a deuterium, a halogen atom, a hydroxyl group, a cyano group, a nitro group, an amino, an amidino, a hydrazine, a hydrazone, a carboxylic acid group or a salt thereof, a sulfonic acid group or a salt thereof, a phosphoric acid group or a salt thereof, a $C_1$-$C_{60}$ alkyl, a $C_2$-$C_{60}$ alkenyl, a $C_2$-$C_{60}$ alkynyl, and a $C_1$-$C_{60}$ alkoxy;

a $C_1$-$C_{60}$ alkyl, a $C_2$-$C_{60}$ alkenyl, a $C_2$-$C_{60}$ alkynyl, and a $C_1$-$C_{60}$ alkoxy, each substituted with at least one selected from a deuterium, a halogen atom, a hydroxyl group, a cyano group, a nitro group, an amino, an amidino, a hydrazine, a hydrazone, a carboxylic acid group or a salt thereof, a sulfonic acid group or a salt thereof, a phosphoric acid group or a salt thereof, a $C_3$-$C_{10}$ cycloalkyl, a $C_1$-$C_{10}$ heterocycloalkyl, a $C_3$-$C_{10}$ cycloalkenyl, a $C_1$-$C_{10}$ heterocycloalkenyl, a $C_6$-$C_{60}$ aryl, a $C_6$-$C_{60}$ aryloxy, a $C_6$-$C_{60}$ arylthio, a $C_1$-$C_{60}$ heteroaryl, a monovalent non-aromatic condensed polycyclic, a monovalent non-aromatic condensed heteropolycyclic group, —$N(Q_{401})(Q_{402})$, —$Si(Q_{403})(Q_{404})(Q_{405})$, and —$B(Q_{406})(Q_{407})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, and a non-aromatic condensed polycyclic group;

a $C_3$-$C_{10}$ cycloalkyl, a $C_1$-$C_{10}$ heterocycloalkyl, a $C_3$-$C_{10}$ cycloalkenyl, a $C_1$-$C_{10}$ heterocycloalkenyl, a $C_6$-$C_{60}$ aryl, a $C_6$-$C_{60}$ aryloxy, a $C_6$-$C_{60}$ arythio, a $C_1$-$C_{60}$ heteroaryl, a monovalent non-aromatic condensed polycyclic group, and a monovalent non-aromatic condensed heteropolycyclic group, each substituted with at least one selected from a deuterium, a halogen atom, a hydroxyl group, a cyano, a nitro, an amino, an amidino, a hydrazine, a hydrazone, a carboxylic acid group or a salt thereof, a sulfonic acid group or a salt thereof, a phosphoric acid group or a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_1$-$C_{10}$ heterocycloalkyl, a $C_3$-$C_{10}$ cycloalkenyl, a $C_1$-$C_{10}$ heterocycloalkenyl, a $C_6$-$C_{60}$ aryl, a $C_6$-$C_{60}$ aryloxy, a $C_6$-$C_{60}$ arythio, a $C_1$-$C_{60}$ heteroaryl, a monovalent non-aromatic condensed polycyclic group, a monovalent non-aromatic condensed heteropolycyclic group, —$N(Q_{411})(Q_{412})$, —$Si(Q_{413})(Q_{414})(Q_{415})$, and —$B(Q_{416})(Q_{417})$; and —$N(Q_{411})(Q_{422})$, —$Si(Q_{423})(Q_{424})(Q_{425})$, and —$B(Q_{426})(Q_{427})$, wherein $L_{401}$ is an organic ligand;

xc1 is 1, 2, or 3; and xc2 is 0, 1, 2, or 3.

$L_{401}$ may be a monovalent, divalent, or trivalent organic ligand. For example, $L_{401}$ may be selected from a halogen ligand (for example, Cl or F), a diketone ligand (for example, acetylacetonate, 1,3-diphenyl-1,3-propandionate, 2,2,6,6-tetramethyl-3,5-heptandionate, or hexafluoroacetonate), a carboxylic acid ligand (for example, picolinate, dimethyl-3-pyrazolecarboxylate, or benzoate), a carbon monooxide ligand, an isonitrile ligand, a cyano ligand, and a phosphorous ligand (for example, phosphine, or phosphate), but is not limited thereto.

When $A_{401}$ in Formula 401 has two or more substituents, the substituents of $A_{401}$ may bind to each other to form a saturated or unsaturated ring.

When $A_{402}$ in Formula 401 has two or more substituents, the substituents of $A_{402}$ may bind to each other to form a saturated or unsaturated ring.

When xc1 in Formula 401 is two or more, a plurality of ligands

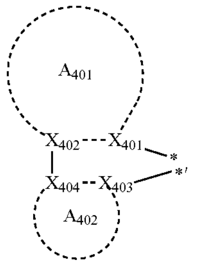

in Formula 401 may be identical or different. When xc1 in Formula 401 is two or more, $A_{401}$ and $A_{402}$ may be respectively directly connected to $A_{401}$ and $A_{402}$ of other neighboring ligands with or without a linker (for example, a $C_1$-$C_1$ alkylene, or —N(R')— (wherein R' may be a $C_1$-$C_{10}$ alkyl group or a $C_6$-$C_{20}$ aryl group) or —C(=O)—) therebetween.

The phosphorescent dopant may include at least one of Compounds PD1 to PD75 below, but is not limited thereto:

PD1

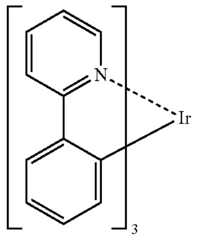

-continued
PD2
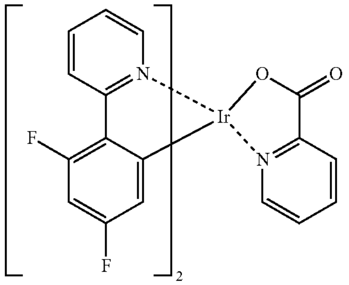
PD3
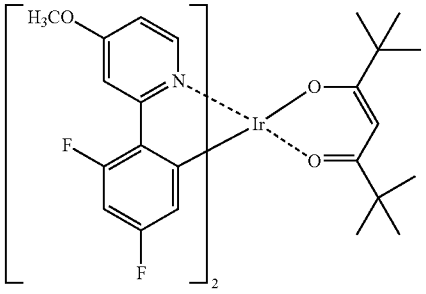
PD4
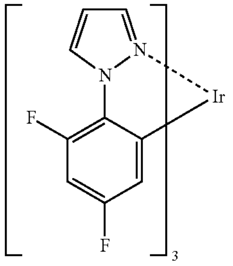
PD5
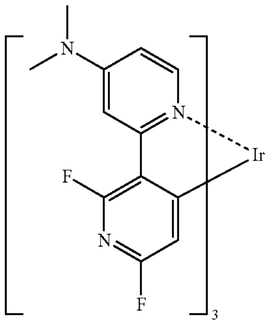
PD6
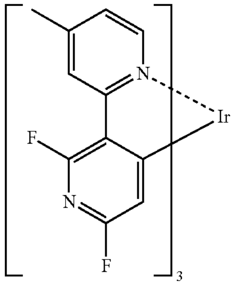
-continued
PD7
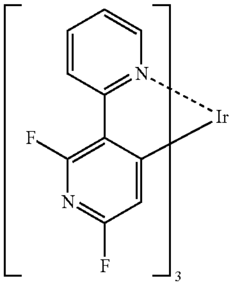
PD8
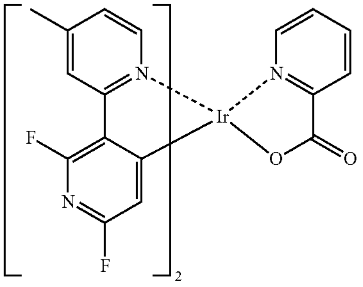
PD9
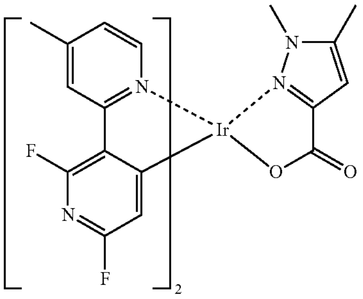
PD10
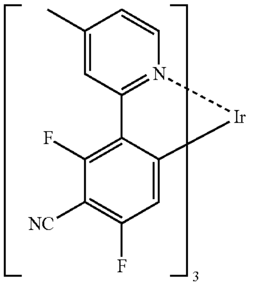
PD11
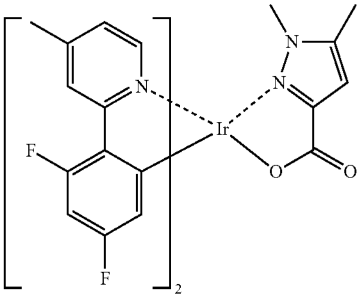

-continued
PD12
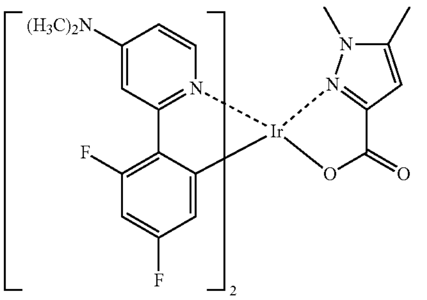
PD13
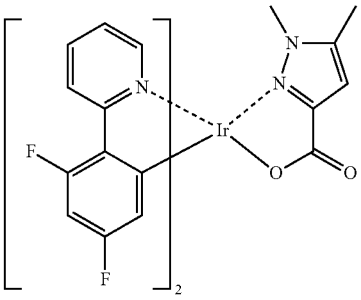
PD14
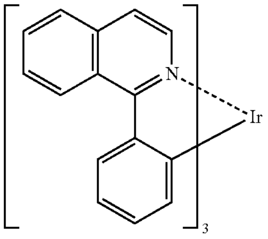
PD15
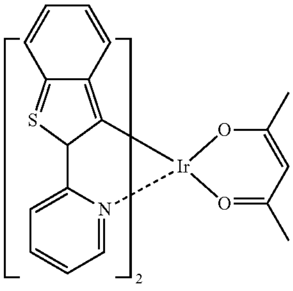
PD16
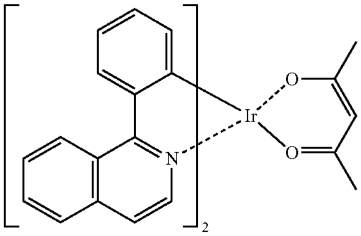
-continued
PD17
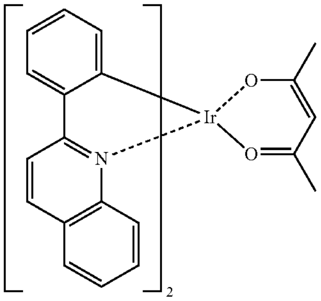
PD18
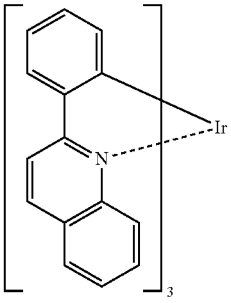
PD19
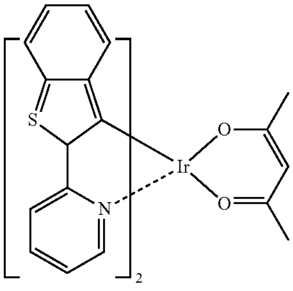
PD20
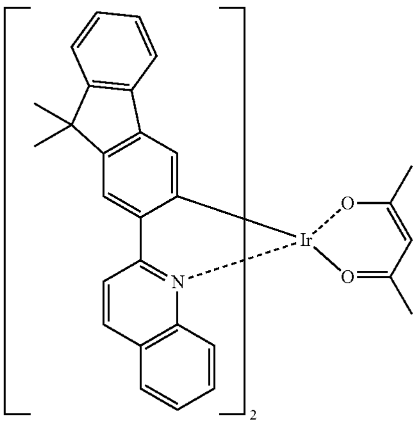

-continued
PD21
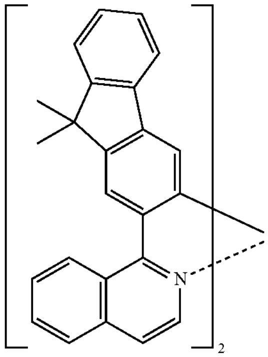
PD22
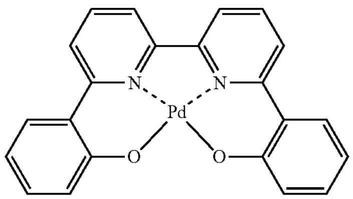
PD23
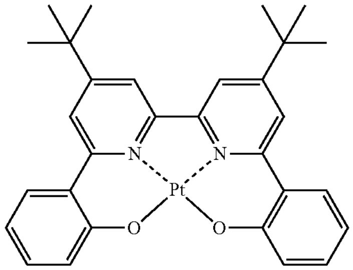
PD24
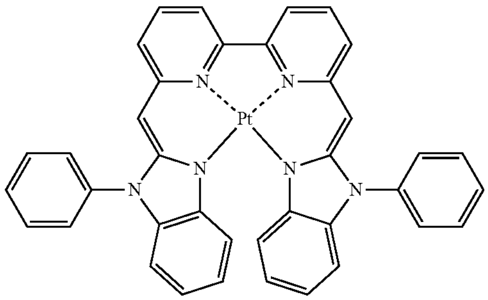
PD25
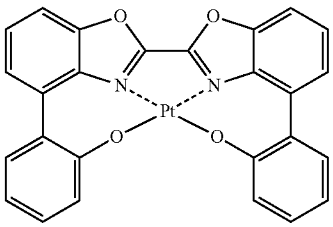
PD26
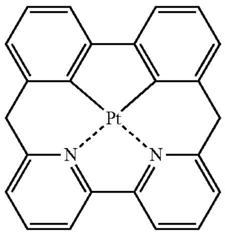
-continued
PD27
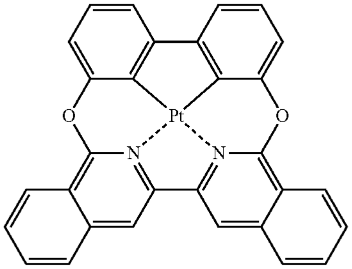
PD28
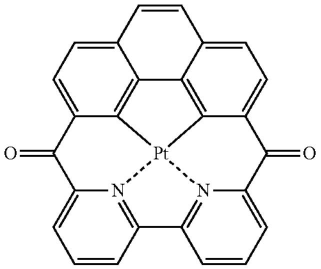
PD29
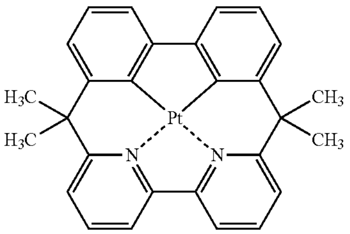
PD30
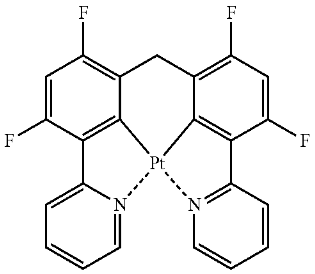
PD31
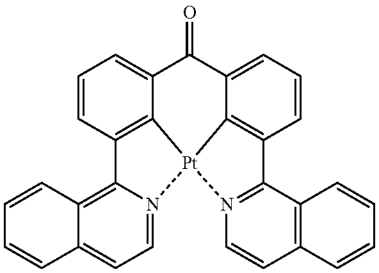
PD32
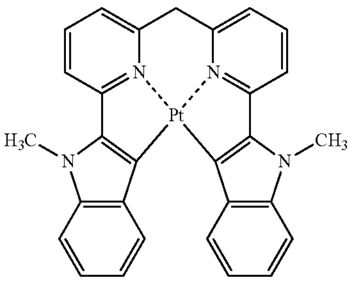

-continued
PD33
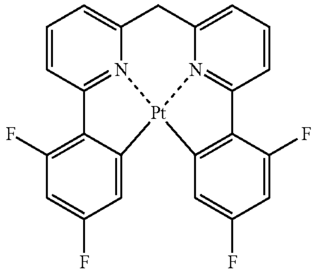
PD34
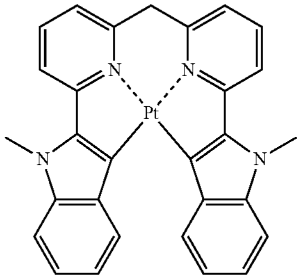
PD35
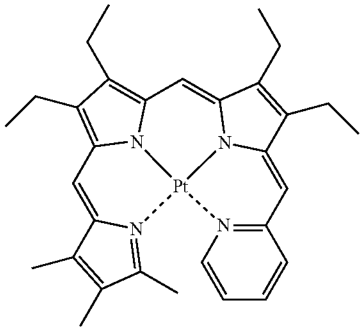
PD36
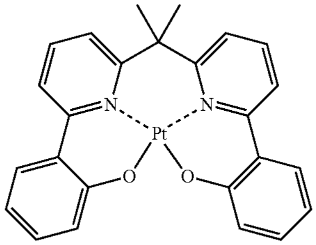
PD37
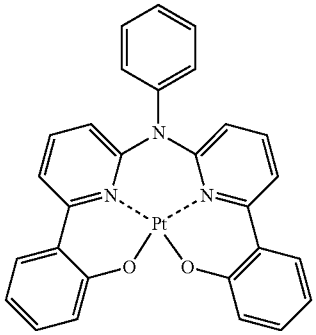
-continued
PD38
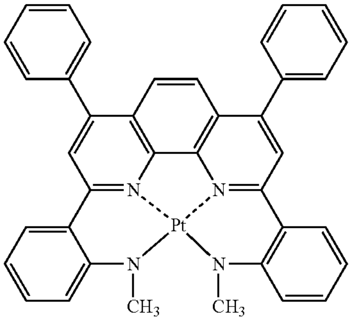
PD39
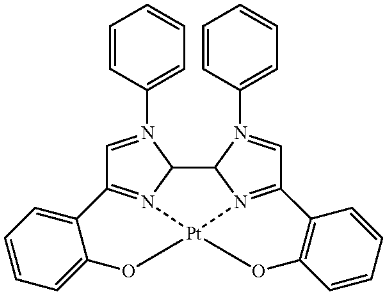
PD40
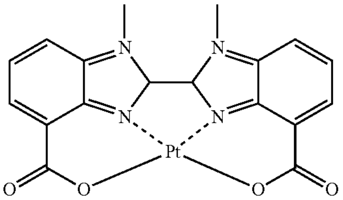
PD41
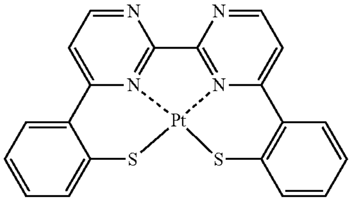
PD42
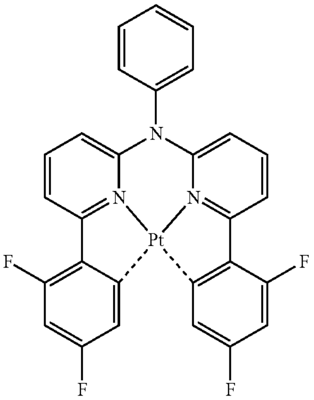

-continued
PD43
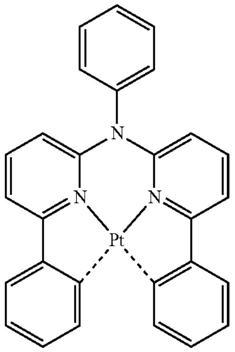
PD44
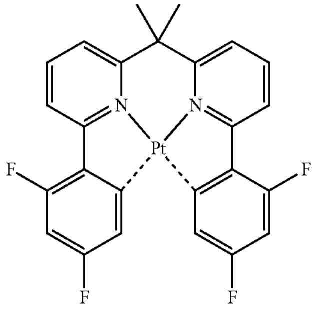
PD45
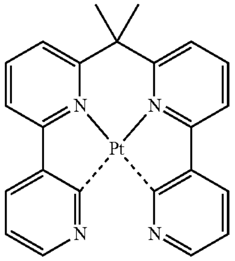
PD46
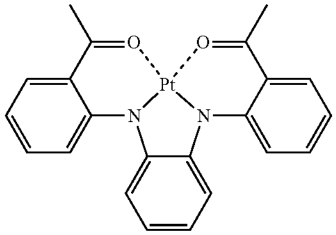
PD47
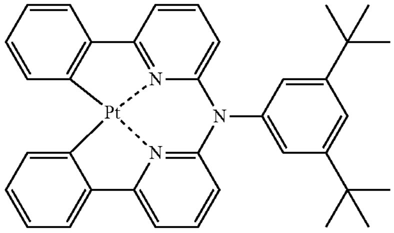
-continued
PD48
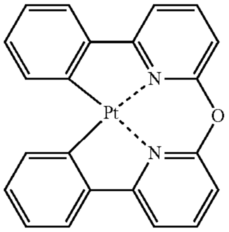
PD49
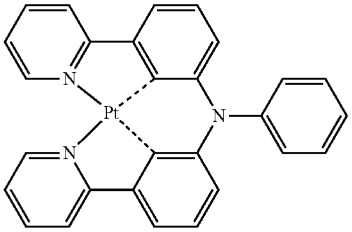
PD50
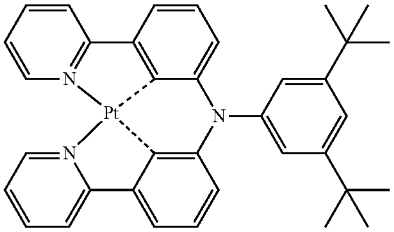
PD51
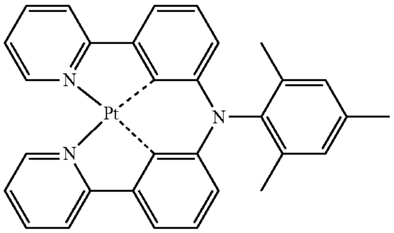
PD52
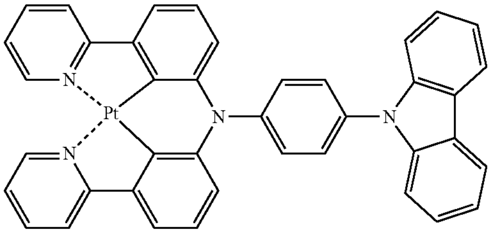
PD53
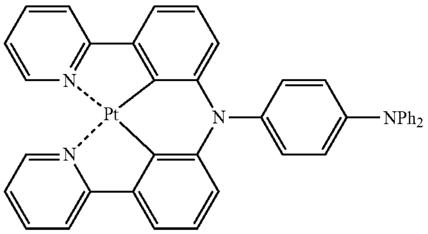

-continued
PD54
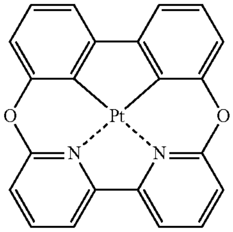
PD55
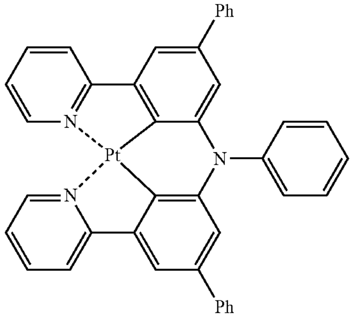
PD56
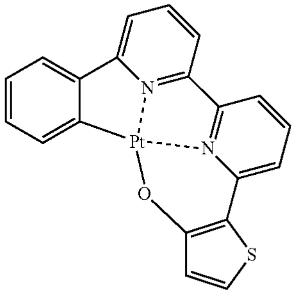
PD57
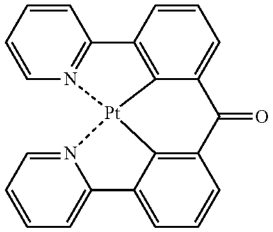
PD58
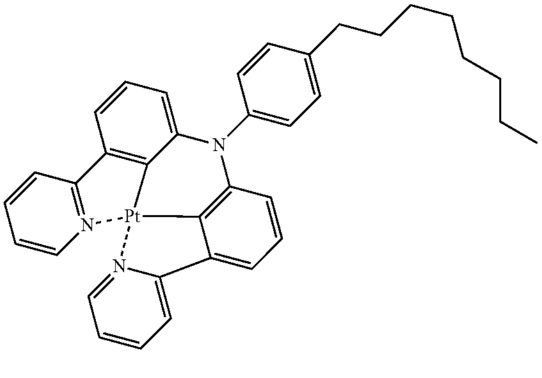
-continued
PD59
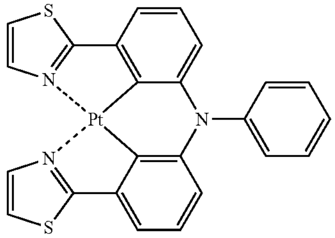
PD60
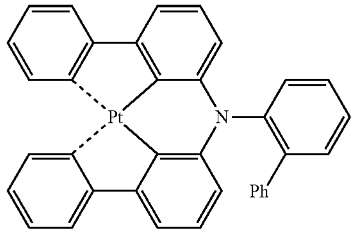
PD61
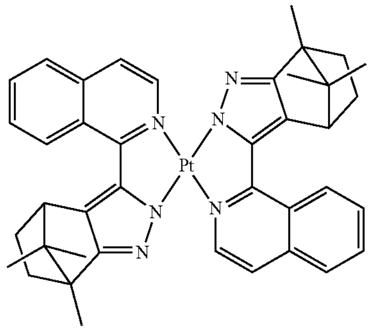
PD62
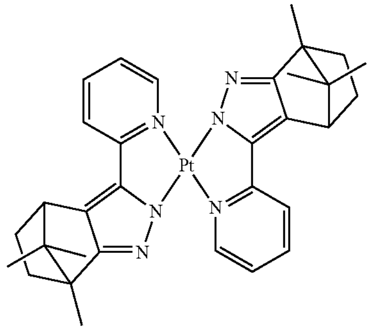
PD63
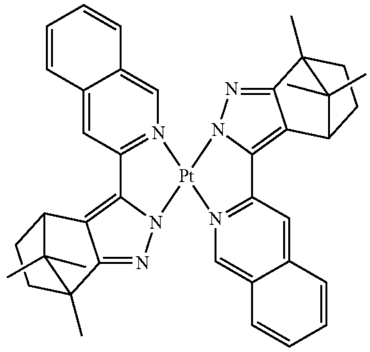

PD64
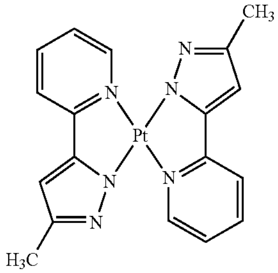
PD65
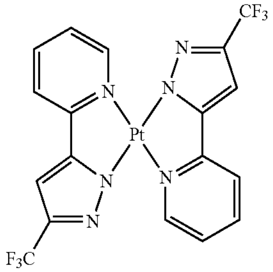
PD66
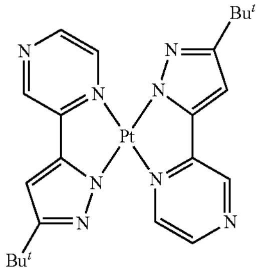
PD67
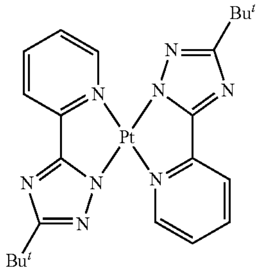
PD68
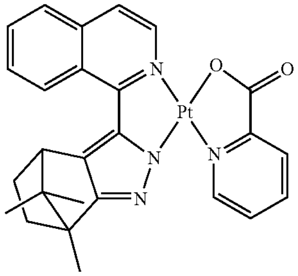
PD69
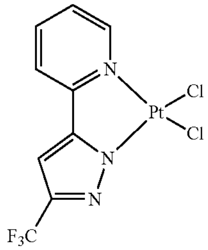
PD70
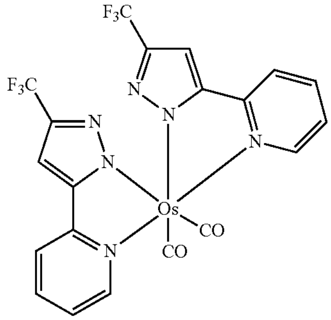
PD71
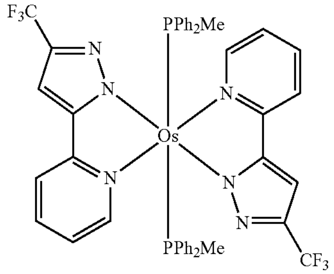
PD72
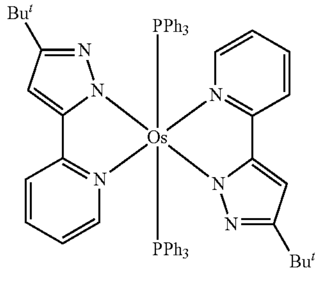
PD73
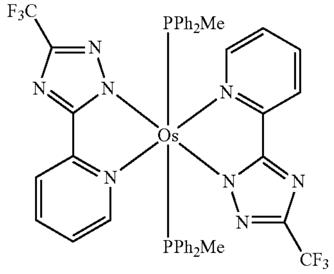

-continued
PD74
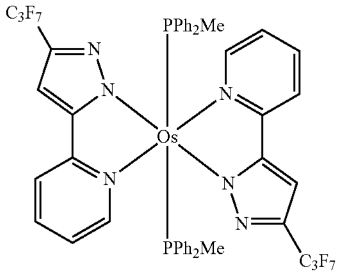
-continued
PD75
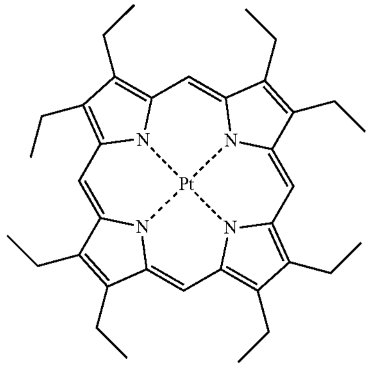
The fluorescent dopant may include at least one selected from DPAVBi, BDAVBi, TBPe, DCM, DCJTB, Coumarin 6, and C545T.
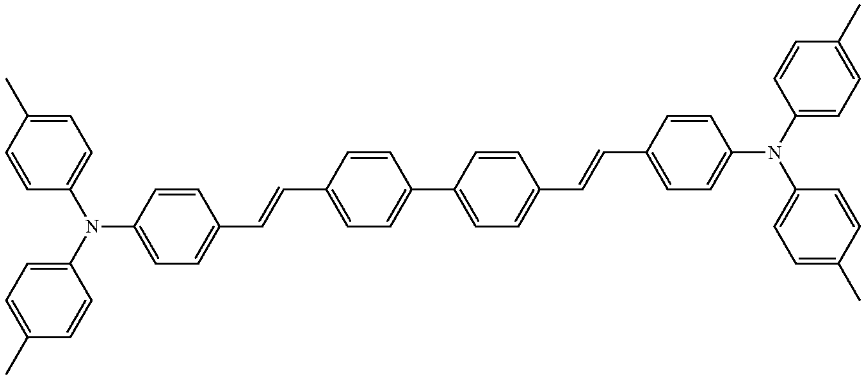
DPAVBi
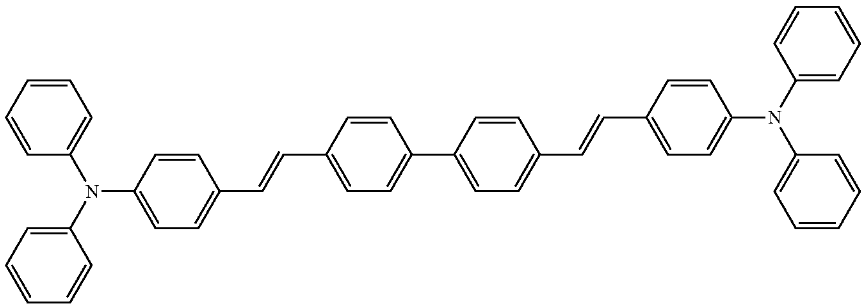
BDAVBi
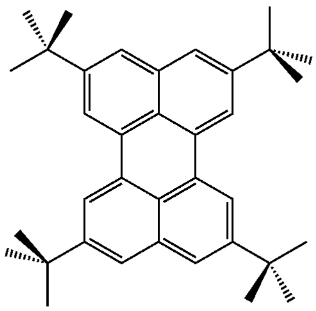
TBPe
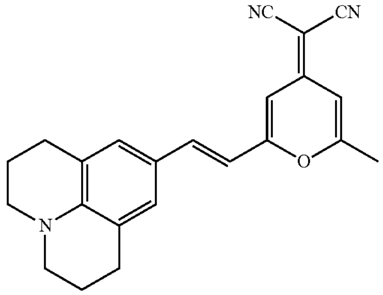
DCM
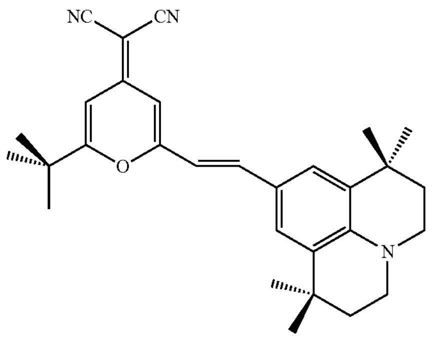
DCJTB -continued

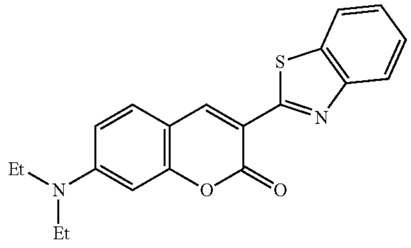

Coumarin 6

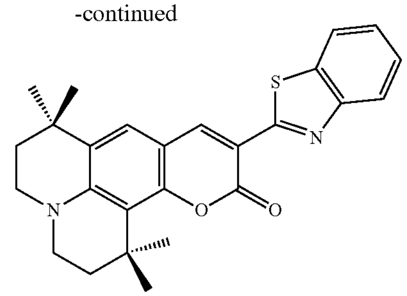

C545T

According to another embodiment, the fluorescent dopant may include a compound represented by Formula 501 below.

Formula 501

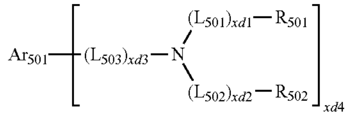

wherein in Formula 501, $Ar_{501}$ may be selected from:

a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one of a deuterium, a halogen atom, a hydroxyl group, a cyano, a nitro, an amino, an amidino, a hydrazine, a hydrazone, a carboxylic acid group or a salt thereof, a sulfonic acid group or a salt thereof, a phosphoric acid group or a salt thereof, a $C_1$-$C_{60}$ alkyl, a $C_2$-$C_{60}$ alkenyl, a $C_2$-$C_{60}$ alkynyl, a $C_1$-$C_{60}$ alkoxy, a $C_3$-$C_{10}$ cycloalkyl, a $C_1$-$C_{10}$ heterocycloalkyl, a $C_3$-$C_{10}$ cycloalkenyl, a $C_1$-$C_{10}$ heterocycloalkenyl, a $C_6$-$C_{60}$ aryl, a $C_6$-$C_{60}$ aryloxy, a $C_6$-$C_{60}$ arylthio, a $C_1$-$C_{60}$ heteroaryl, a monovalent non-aromatic condensed polycyclic group, a monovalent non-aromatic condensed heteropolycyclic group, and —Si($Q_{501}$)($Q_{502}$)($Q_{503}$) ($Q_{501}$ to $Q_{503}$ may be each independently selected from a hydrogen, a $C_1$-$C_{60}$ alkyl, a $C_2$-$C_{60}$ alkenyl, a $C_6$-$C_{60}$ aryl, and a $C_1$-$C_{60}$ heteroaryl group);

$L_{501}$ to $L_{503}$ may be understood by referring to the description provided herein in connection with $L_{301}$;

$R_{501}$ and $R_{502}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl, a naphthyl, a fluorenyl, a spiro-fluorenyl, a benzofluorenyl, a dibenzofluorenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl, each substituted with at least one selected from a deuterium, a halogen atom, a hydroxyl group, a cyano, a nitro, an amino, an amidino, a hydrazine, a hydrazone, a carboxylic acid group or a salt thereof, a sulfonic acid group or a salt thereof, a phosphoric acid group or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, a triazinyl, a dibenzofuranyl, and a dibenzothiophenyl; and xd1 to xd3 may be each independently selected from 0, 1, 2, and 3; and xd4 may be selected from 1, 2, 3, and 4.

The fluorescent host may include at least one of Compounds FD1 to FD9.

FD1

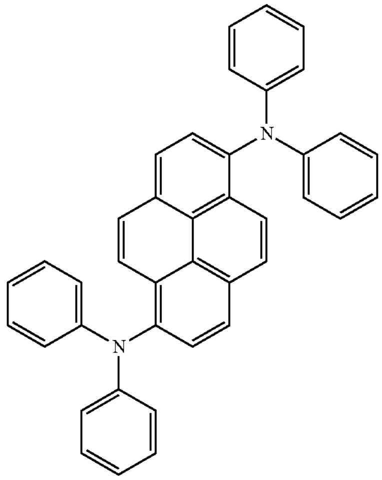

FD2

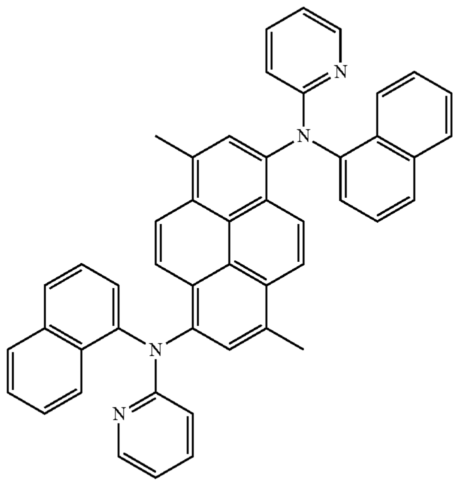

-continued
FD3
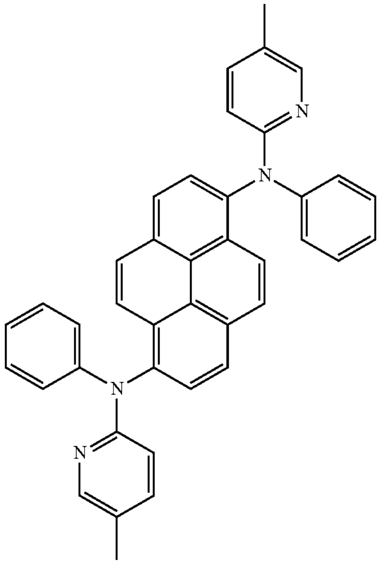
FD4
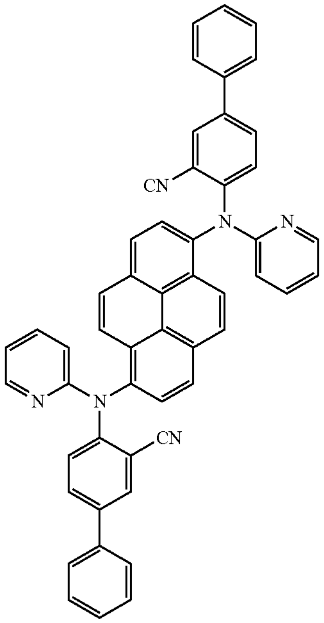
-continued
FD5
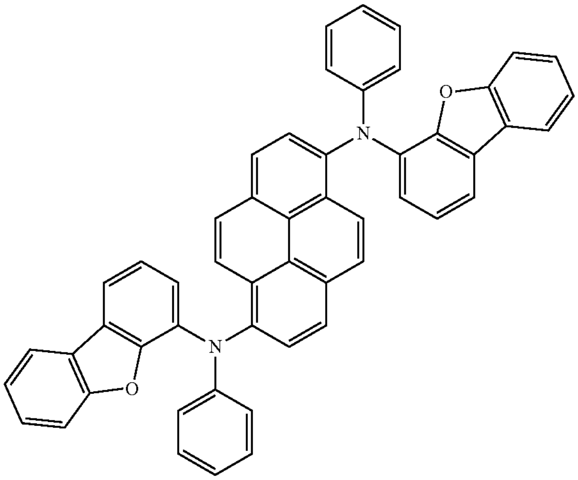
FD6
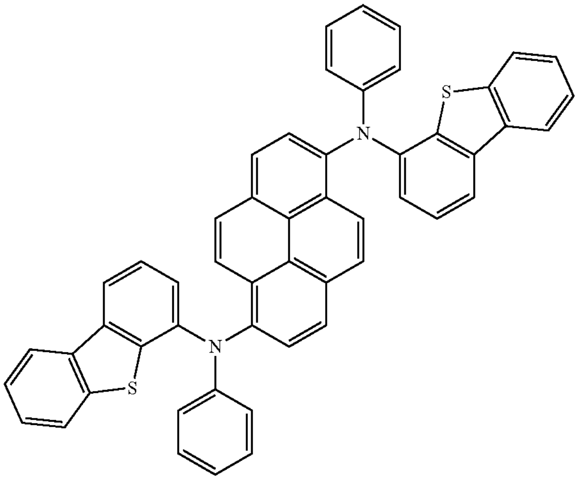
FD7
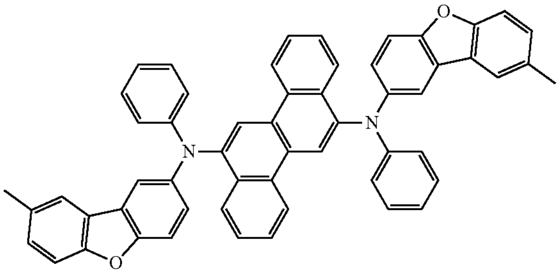
FD8
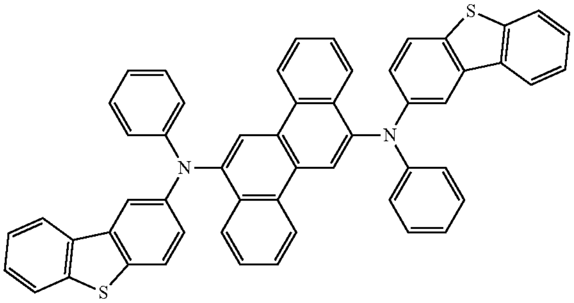

-continued

FD9

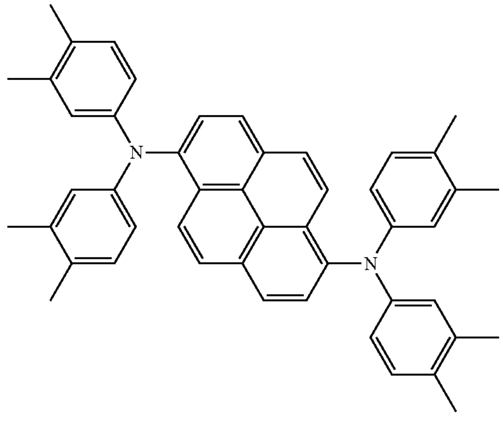

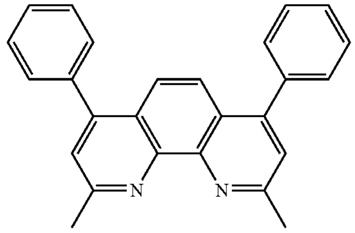

BCP

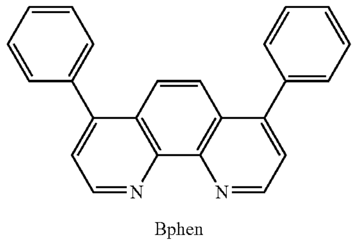

Bphen

An amount of the dopant in the emission layer may be, in general, in a range of about 0.01 to about 15 parts by weight based on 100 parts by weight of the host, but is not limited thereto.

A thickness of the emission layer may be in a range of about 100 Å to about 1,000 Å, for example, about 200 Å to about 600 Å. In one embodiment, when the thickness of the emission layer is within this range, excellent light-emission characteristics are obtained without a substantial increase in driving voltage.

Then, an electron transport region may be disposed on the emission layer.

The electron transport region may include at least one selected from a hole blocking layer, an electron transport layer (electron transport layer), and an electron injection layer, but is not limited thereto.

For example, the electron transport region may have a structure of electron transport layer/electron injection layer, or a structure of hole blocking layer/electron transport layer/electron injection layer, wherein layers of each structure are sequentially stacked from the emission layer in the stated order, but is not limited thereto.

The electron transport region may include a hole blocking layer. The hole blocking layer may be formed, when the emission layer includes a phosphorescent dopant, to reduce or prevent diffusion of excitons or holes into an electron transport layer.

When the electron transport region includes a hole blocking layer, the hole blocking layer may be formed on the emission layer by using (utilizing) various suitable methods, such as vacuum deposition, spin coating casting, a Langmuir-Blodgett (LB) method, ink-jet printing, laser-printing, or laser-induced thermal imaging. When the hole blocking layer is formed by vacuum deposition or spin coating, the deposition and coating conditions for the hole blocking layer may be determined by referring to the deposition and coating conditions for the hole injection layer.

The hole blocking layer may include, for example, at least one of BCP and Bphen, but is not limited thereto.

A thickness of the hole blocking layer may be in a range of about 20 Å to about 1,000 Å, for example, about 30 Å to about 300 Å. In one embodiment, when the thickness of the hole blocking layer is within these ranges, the hole blocking layer has excellent hole blocking characteristics without a substantial increase in driving voltage.

The electron transport region may include an electron transport layer. The electron transport layer may be formed on the emission layer or the hole blocking layer by using (utilizing) various suitable methods, such as vacuum deposition, spin coating casting, an LB method, ink-jet printing, laser-printing, or laser-induced thermal imaging. When an electron transport layer is formed by vacuum deposition or spin coating, the deposition and coating conditions for the electron transport layer may be determined by referring to the deposition and coating conditions for the hole injection layer.

The electron transport layer may include at least one of an electron transport material represented by Formula 1 below:

Formula 1

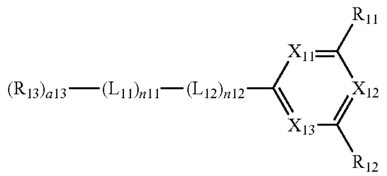

wherein in Formula 1, $X_{11}$, $X_{12}$, and $X_{13}$ may be each independently CH or N; at least one of $X_{11}$, $X_{12}$, and $X_{13}$ may be N;

$L_{11}$ and $L_{12}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

n11 and n12 (and n21 to n23) may be each independently an integer selected from 0 to 3;

the sum of n11 and n12 is 1 or more;

$R_{11}$ to $R_{13}$ may be each independently a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

a13 is an integer selected from 1 to 3;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arythio group, the substituted $C_1$-$C_{60}$ heteroaryl group, the substituted monovalent non-aromatic condensed polycyclic group, the substituted monovalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group and the substituted $C_1$-$C_{60}$ alkoxy group is selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$ and —$B(Q_{26})(Q_{27})$; and —$N(Q_{31})(Q_{32})(Q_{33})$, —$Si(Q_{34})(Q_{35})(Q_{36})$, and —$B(Q_{37})(Q_{38})$; and $Q_{11}$ to $Q_{17}$, $Q_{21}$ to $Q_{27}$, and $Q_{31}$ to $Q_{38}$ may be each independently selected from a hydrogen, a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, in Formula 1, $X_{11}$ and $X_{13}$ may be each N, and $X_{12}$ may be CH, but they are not limited thereto.

In other examples, in Formula 1, $X_{12}$ and $X_{13}$ may be each N, and $X_{11}$ may be CH, but they are not limited thereto.

In other examples, in Formula 1, $X_{12}$ may be N, and $X_{11}$ and $X_{13}$ each may be CH, but they are not limited thereto.

For example, $L_{11}$ and $L_{12}$ in Formula 1 may be each independently selected from:

a phenylene, a pentalenylene, an indenylene, a naphthylene, an azulenylene, a heptalenylene, an indacenylene, an acenaphthylene, a fluorenylene, a spiro-fluorenylene, a benzofluorenylene, a dibenzofluorenylene, a phenalenylene, a phenanthrenylene, an anthracenylene, a fluoranthenylene, a triphenylenylene, a pyrenylene, a chrysenylene, a naphthacenylene, a picenylene, a perylenylene, a pentaphenylene, a hexacenylene, a pentacenylene, a rubicenylene, a coronenylene, an ovalenylene, a pyrrolylene, a thienylene, a furanylene, a silolylene, an imidazolylene, a pyrazolylene, a thiazolylene, an isothiazolylene, an oxazolylene, an isooxazolylene, a pyridinylene, a pyrazinylene, a pyrimidinylene, a pyridazinylene, an isoindolylene, an indolylene, an indazolylene, a purinylene, a quinolinylene, an isoquinolinylene, a benzoquinolinylene, a phthalazinylene, a naphthyridinylene, a quinoxalinylene, a quinazolinylene, a cinnolinylene, a carbazolylene, a phenanthridinylene, an acridinylene, a phenanthrolinylene, a phenazinylene, a benzoimidazolylene, a benzofuranylene, a benzothienylene, a benzosilolylene, a benzooxazolylene, an isobenzooxazolylene, a triazolylene, a tetrazolylene, an oxadiazolylene, a triazinylene, a dibenzofuranylene, a dibenzothiophenylene, a benzocarbazolylene, a dibenzocarbazolylene, and a dibenzosilolylene; and a phenylene, a pentalenylene group, an indenylene, a naphthylene, an azulenylene, a heptalenylene, an indacenylene, an acenaphthylene, a fluorenylene, a spiro-fluorenylene, a benzofluorenylene, a dibenzofluorenylene, a phenalenylene, a phenanthrenylene, an anthracenylene, a fluoranthenylene, a triphenylenylene, a pyrenylene, a chrysenylene, a naphthacenylene, a picenylene, a perylenylene, a pentaphenylene, a hexacenylene, a pentacenylene, a rubicenylene, a coronenylene, an ovalenylene, a pyrrolylene, a thienylene, a furanylene, a silolylene, an imidazolylene, a pyrazolylene, a thiazolylene, an isothiazolylene, an oxazolylene, an isooxazolylene, a pyridinylene, a pyrazinylene, a pyrimidinylene, a pyridazinylene, an isoindolylene, an indolylene, an indazolylene, a purinylene, a quinolinylene, an isoquinolinylene, a benzoquinolinylene, a phthalazinylene, a naphthyridinylene, a quinoxalinylene, a quinazolinylene, a cinnolinylene, a carbazolylene, a phenanthridinylene, an acridinylene, a phenanthrolinylene, a phenazinylene, a benzoimidazolylene, a benzofuranylene, a benzothienylene, a benzosilolylene, an isobenzothiazolylene, a benzooxazolylene, an isobenzooxazolylene, a triazolylene, a tetrazolylene, an oxadiazolylene, a triazinylene, a dibenzofuranylene, a dibenzothiophenylene, a benzocarbazolylene, a dibenzocarbazolylene, and a dibenzoxilolylene, each substituted with at least one selected from deuterium, —F, —Cl, —Br, —I, a hydroxyl group, a cyano group, a nitro group, an amino group, an amidino group, a hydrazine group, a hydrazone group, a carboxyl acid group or a salt thereof, a sulfonic acid group or a salt thereof, a phosphoric acid group or a salt thereof, a $C_1$-$C_{20}$ alkyl, a $C_1$-$C_{20}$ alkoxy, a cyclopentyl, a cyclohexyl, a cycloheptyl, a cyclopentenyl, a cyclohexenyl, a phenyl, a pentalenyl, an indenyl, a naphthyl, an azulenyl, a heptalenyl, an indacenyl, an acenaphthyl, a fluorenyl, a spiro-fluorenyl, a benzofluorenyl, a dibenzofluorenyl, a phenalenyl, a phenanthrenyl, an anthracenyl, a fluorantenyl, a triphenylenyl, a pyrenyl, a chrysenyl, a naphthacenyl, a pycenyl, a perylenyl, a pentaphenyl, a hexacenyl, a pentacenyl, a rubicenyl, a coronenyl, an ovalenyl, a pyrrolyl, a thienyl, a furanyl, a silolyl, an imidazolyl, a pyrazolyl, a thiazolyl, an isothiazolyl, an oxazolyl, an isooxazolyl, a pyridinyl, a pyrazinyl, a pyrimidinyl, a pyridazinyl, an isoindolyl, an indolyl, an indazolyl, a purinyl, a quinolinyl, an isoquinolinyl, a benzoquinolinyl, a phthalazinyl, a naphthyridinyl, a quinoxalinyl, a quinazolinyl, a cinnolinyl, a carbazolyl, a phenanthridinyl, an acridinyl, a phenanthrolinyl, a phenazinyl, a benzoimidazolyl, a benzofuranyl, a benzothienyl, a benzosilolyl, an isobenzothiazolyl, a benzooxazolyl, an isobenzooxazolyl, a triazolyl, a tetrazole, an oxadiazolyl, a triazinyl, a dibenzofuranyl, a dibenzothienyl, a benzocarbazolyl, a dibenzocarbazolyl, and a dibenzosilolyl.

In other embodiments, $L_{11}$ in Formula 1 may be selected from:

a phenylene, a naphthylene, a fluorenylene, a spiro-fluorenylene, a benzofluorenylene, a dibenzofluorenylene, a phenalenylene, a phenanthrenylene, an anthracenylene, a fluoranthenylene, a triphenylenylene, a pyrenylene, and a chrysenylene; and a phenylene, a naphthylene, a fluorenylene, a spiro-fluorenylene, a benzofluorenylene, a dibenzofluorenylene, a phenalenylene, a phenanthrenylene, an anthracenylene, a fluoranthenylene, a triphenylenylene, a pyrenylene, and a chrysenylene, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl group, but is not limited thereto.

According to other embodiments, $L_{11}$ in Formula 1 may be selected from Formulae 4-1 to 4-3 below, but are not limited thereto:

4-1

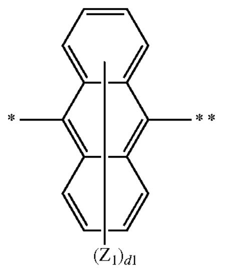

4-2

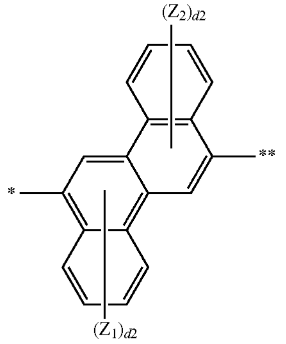

4-3

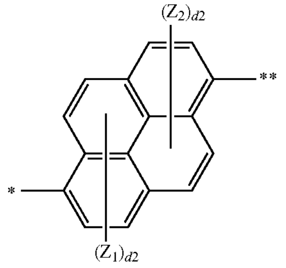

wherein in Formulae 4-1 to 4-3, $Z_1$ and $Z_2$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl group;

d1 may be an integer selected from 1 to 8;

d2 may be an integer selected from 1 to 4; and

* and ** each indicate a binding site to a neighboring atom.

In other embodiments, $L_{12}$ may be selected from:

a phenylene, a naphthylene, an anthracenylene, and a triphenylenylene; and a phenylene, a naphthylene, an anthracenylene, and a triphenylenylene, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl group, but is not limited thereto.

According to other embodiments, $L_{12}$ in Formula 1 may be Formula 5-1 below, but is not limited thereto:

wherein in Formula 5-1, 5-1

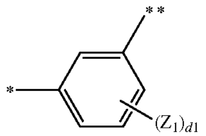

$Z_1$ may be selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl;

d1 may be an integer selected from 1 to 4; and

* and ** each indicate a binding site to a neighboring atom.

For example, n11 and n12 in Formula 1 may be each independently an integer of 0 or 1; and the sum of n11 and n12 may be 1 or more, but they are not limited thereto.

In other embodiments, n11 and n12 each in Formula 1 may be an integer of 1, but they are not limited thereto.

For example, $R_{11}$ to $R_{13}$ in Formula 1 may be each independently selected from:

a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a triazinyl group, a dibenzofuranyl group, and a dibenzothienyl group; and a phenyl, a naphthyl, a fluorenyl, a benzofluorenyl, an anthracenyl, a pyrenyl, a chrysenyl, a pyridinyl, a pyrazinyl, a pyrimidinyl, a pyridazinyl, a quinolinyl, an isoquinolinyl, a carbazolyl, a triazinyl, a dibenzofuranyl, and a dibenzothienyl, each substituted with at least one selected from a deuterium, —F, —Cl, —Br, —I, a cyano group, a nitro group, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, carbazolyl, a triazinyl, a dibenzofuranyl, and a dibenzothienyl, and —$N(Q_{31})(Q_{32})(Q_{33})$; and $Q_{31}$ to $Q_{33}$ may be each independently selected from a phenyl group and a naphthyl group, but they are not limited thereto.

In other embodiments, $R_{11}$ to $R_{13}$ in Formula 1 may be each independently represented by one of Formulae 7-1 to 7-15 below, but are not limited thereto:

7-1

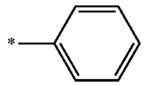

7-2

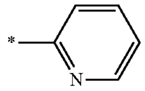

7-3

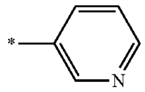

7-4

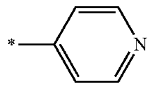

7-5

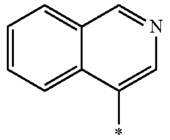

7-6

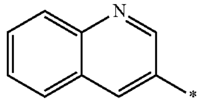

7-7

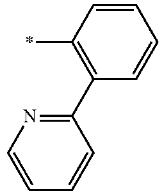

7-8

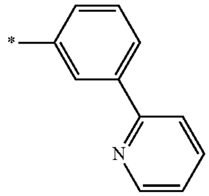

7-9

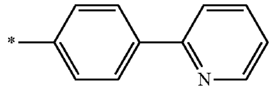

7-10

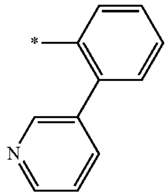

7-11

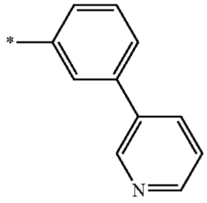

7-12

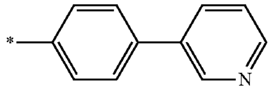

7-13

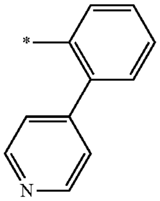

7-14

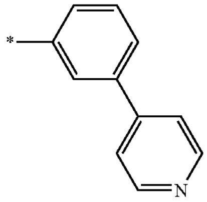

7-15

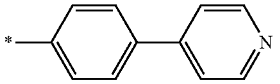

For example, a13 in Formula 1 may be 1, but is not limited thereto.

According to an embodiment, the electron transport material represented by Formula 1 may be represented by Formula 1A below, but is not limited thereto:

Formula 1A

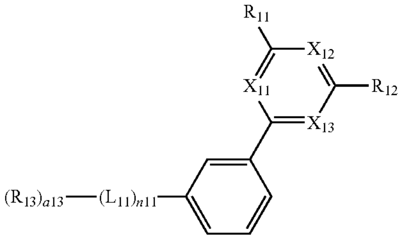

wherein in Formula 1A, $X_{11}$ to $X_{13}$, $L_{11}$, n11, $R_{11}$ to $R_{13}$, and a13 may be the same as described above.

In other embodiments, the electron transport material represented by Formula 1 may be selected from Compounds 1 to 267 below, but it is not limited thereto:

1

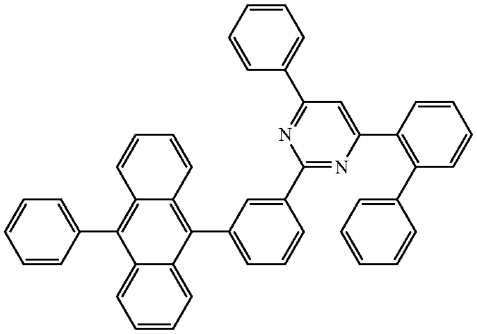

2

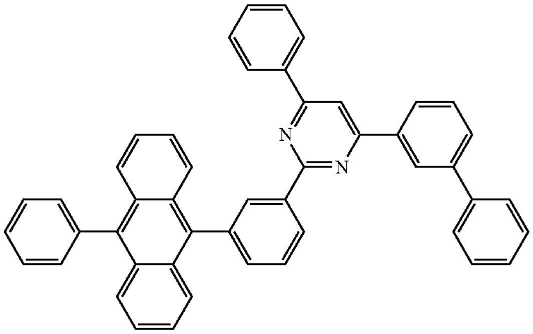

3

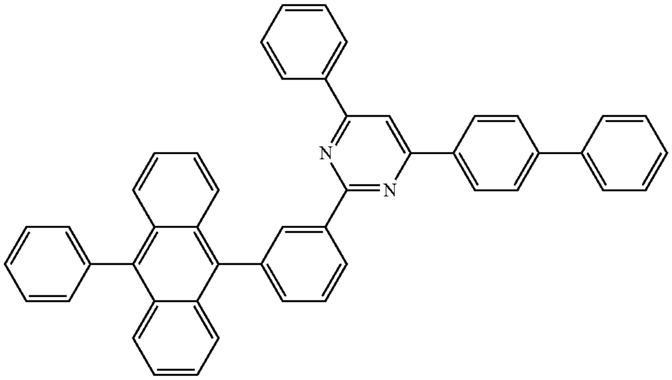

-continued
4
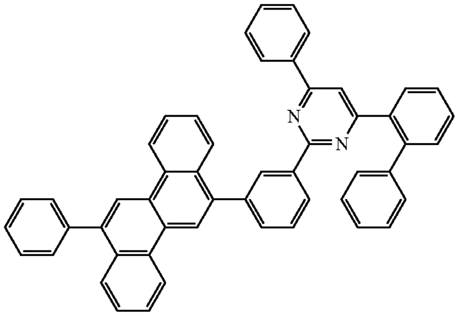
5
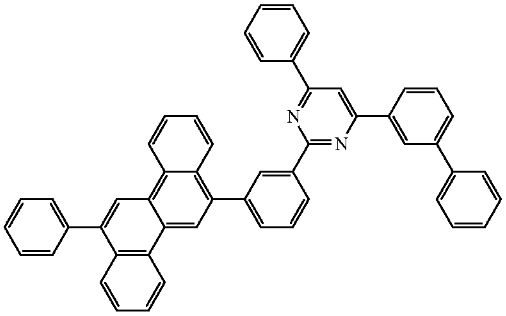
6
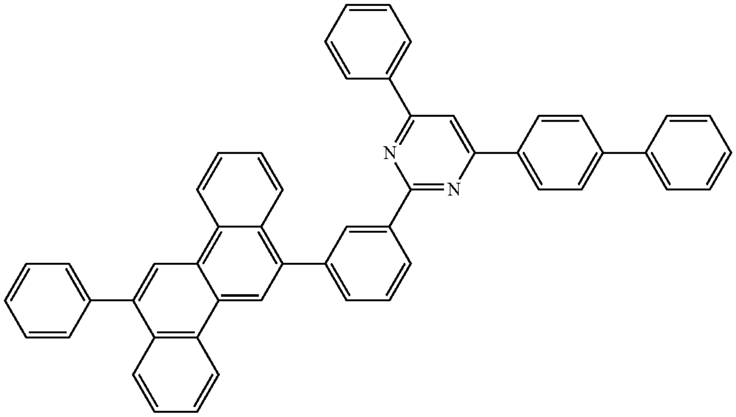
7
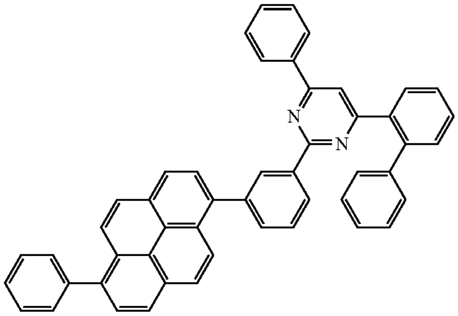
8
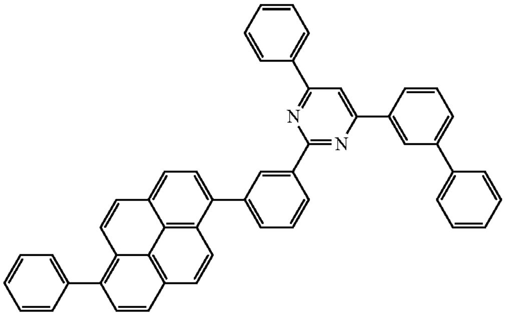
9
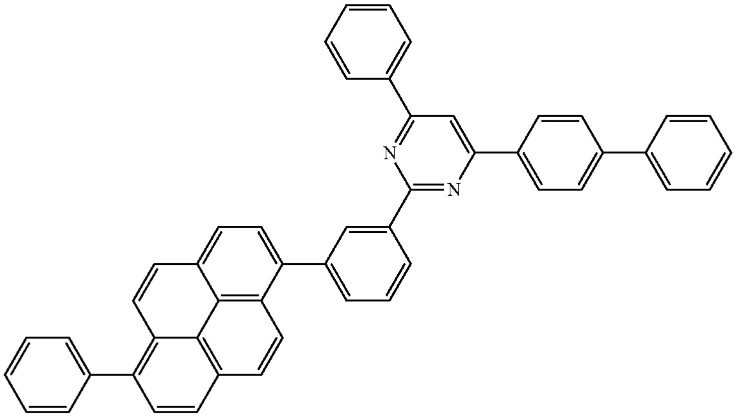

-continued
10
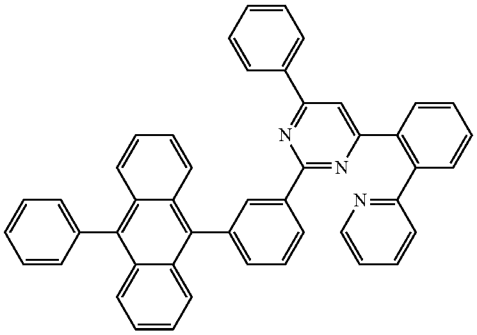
11
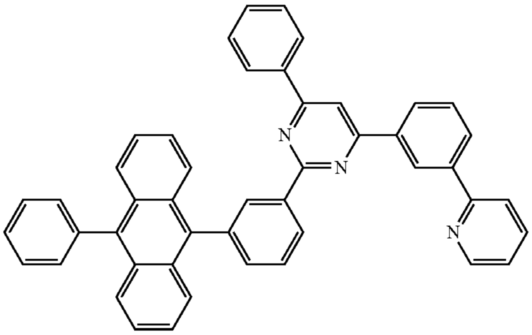
12
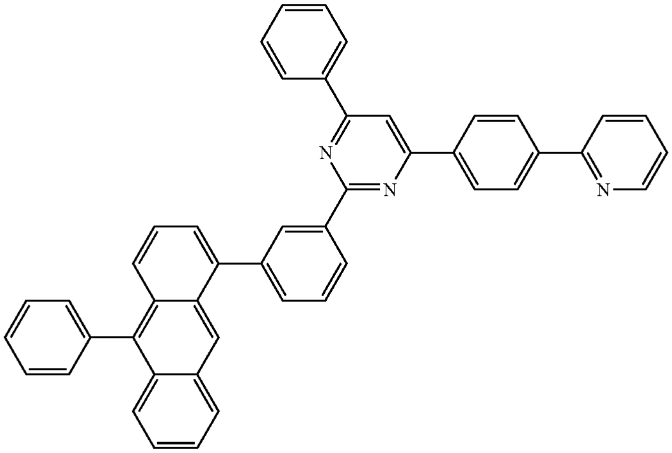
13
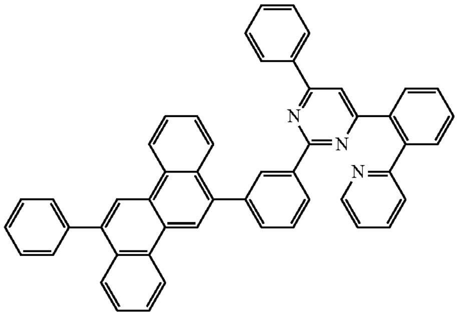
14
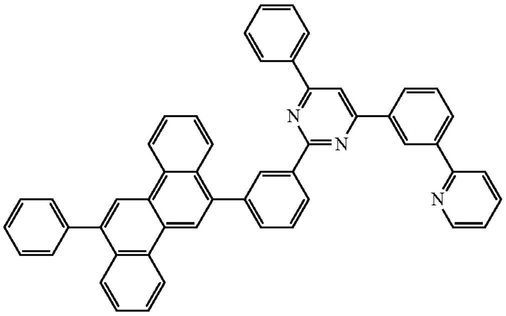
15
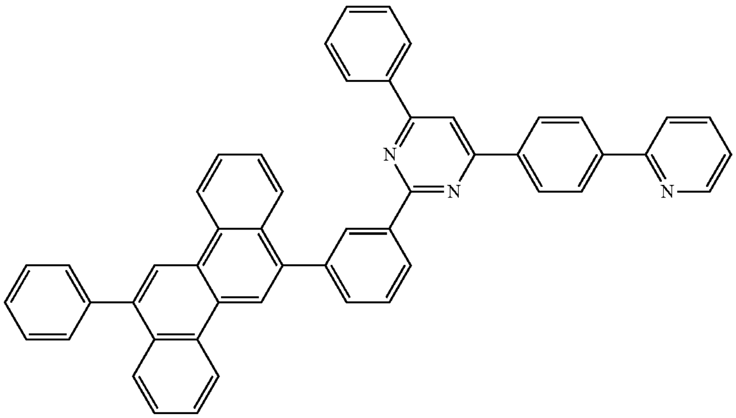

-continued
16
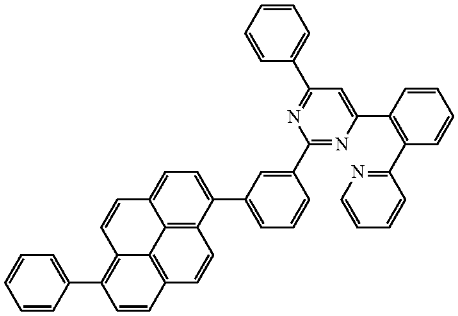
17
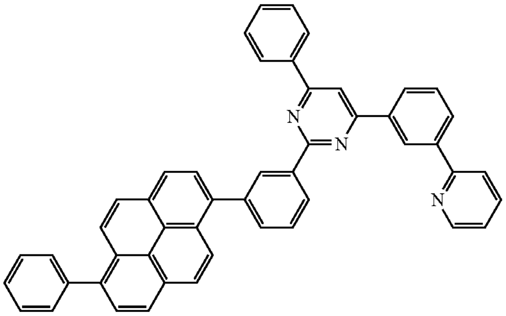
18
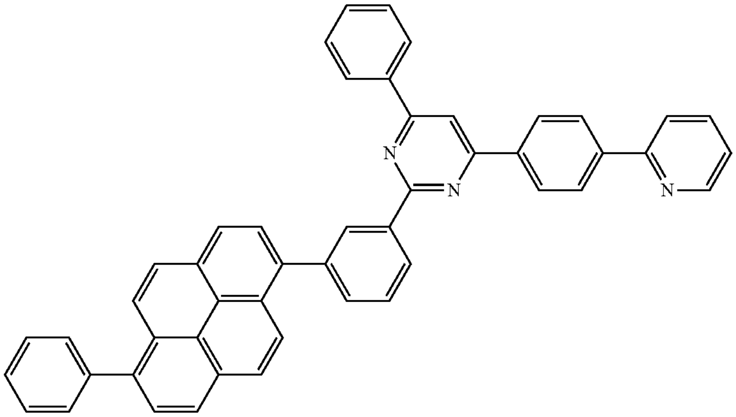
19
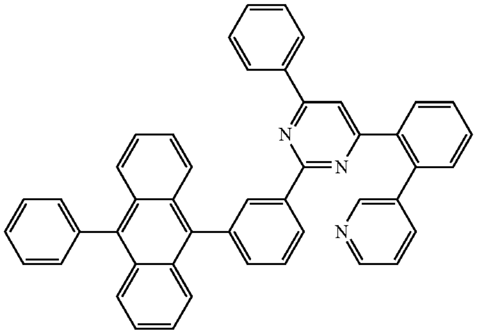
20
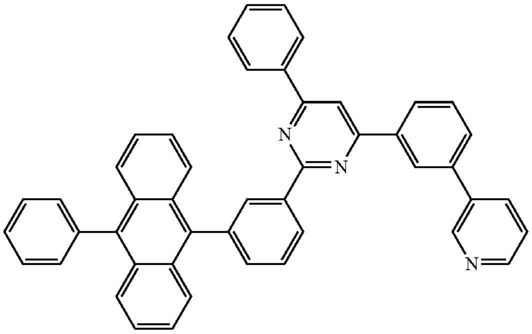
21
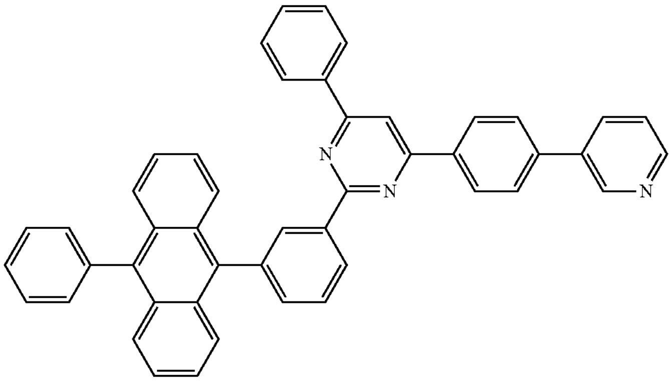

-continued
22
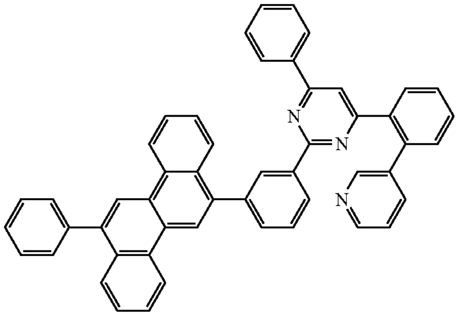
23
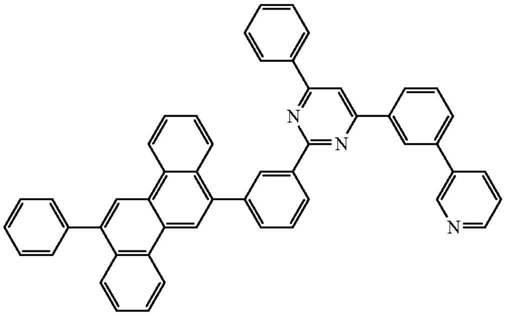
24
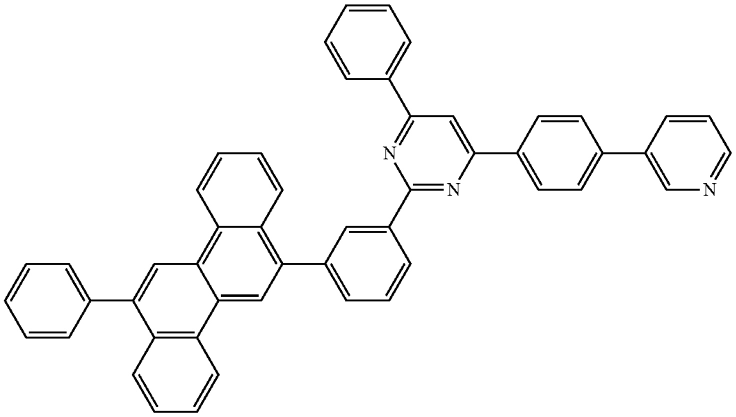
25
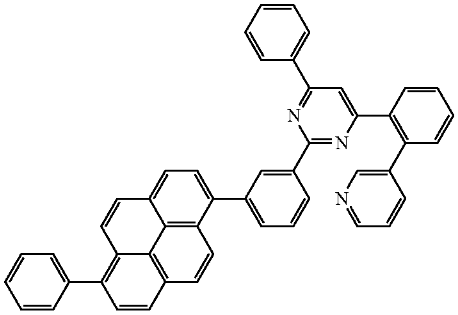
26
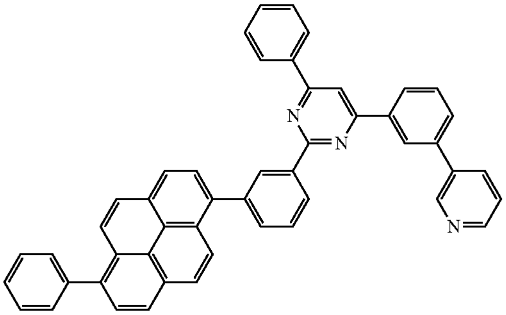
27
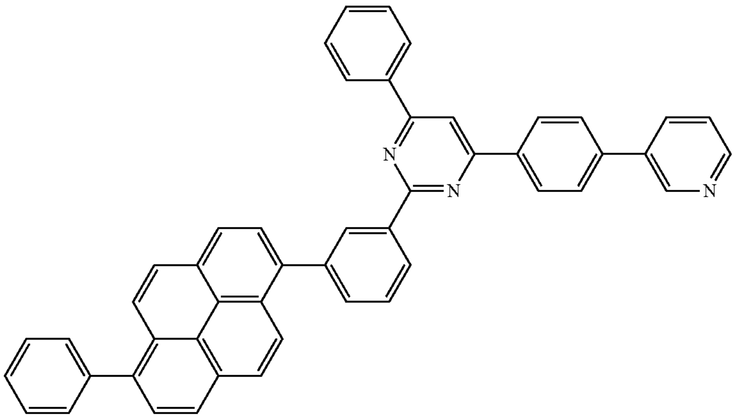

-continued
28
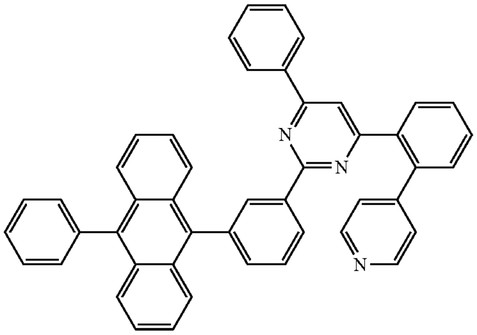
29
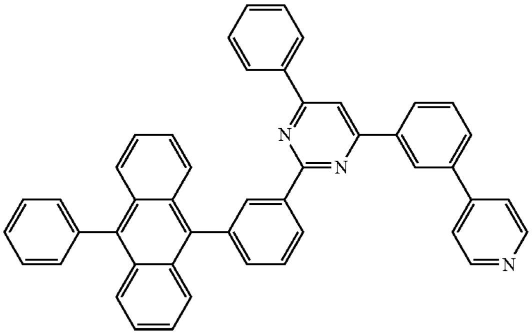
30
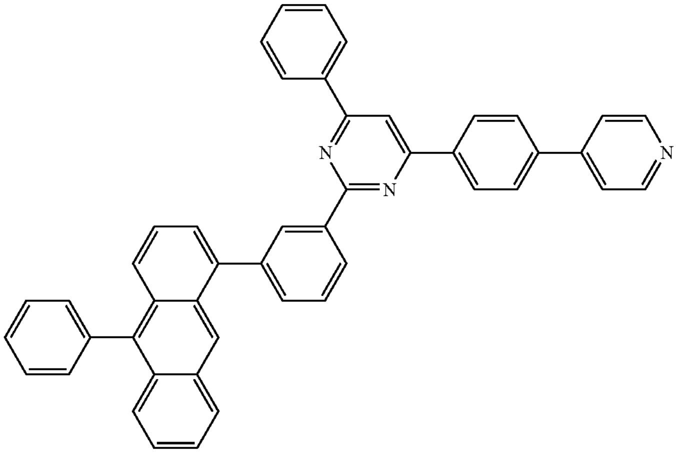
31
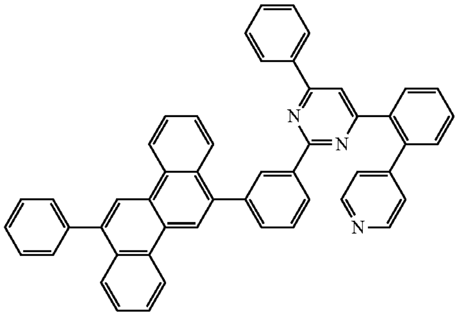
32
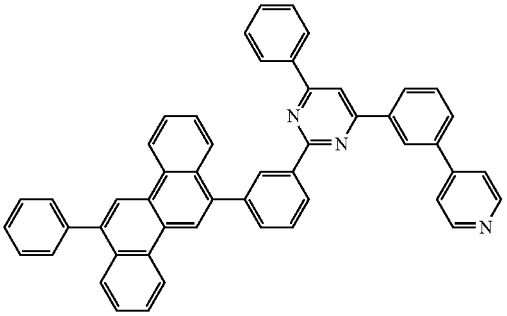
33
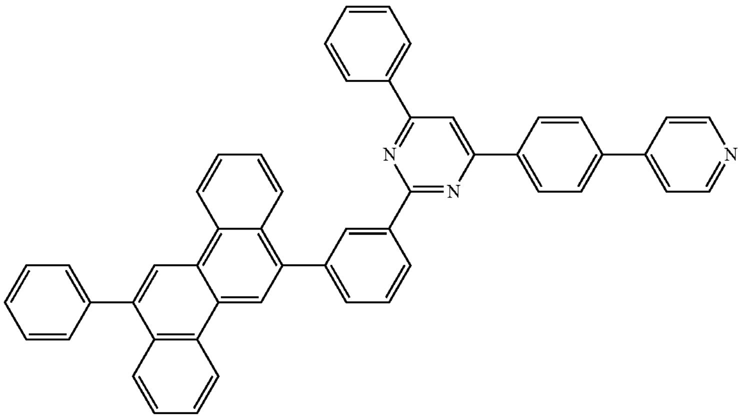

-continued
34
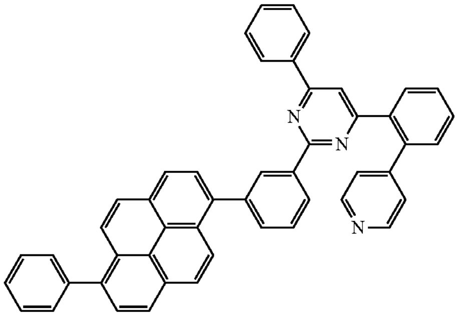
35
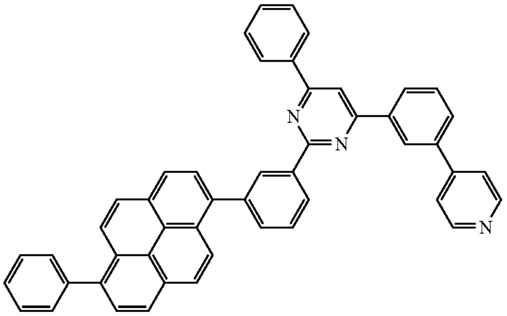
36
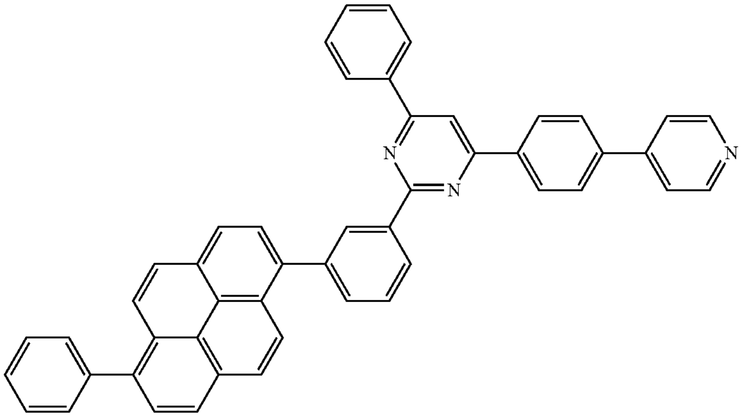
37
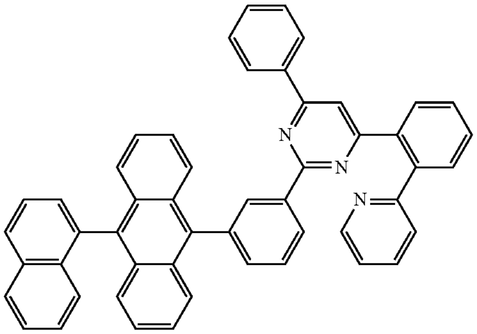
38
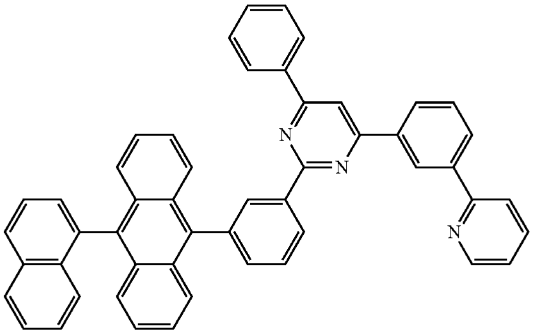
39
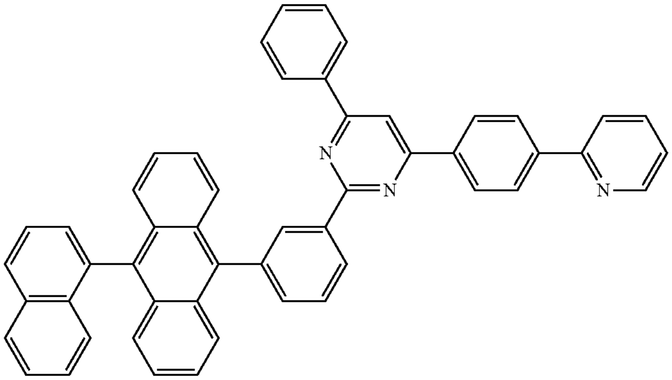

-continued
40
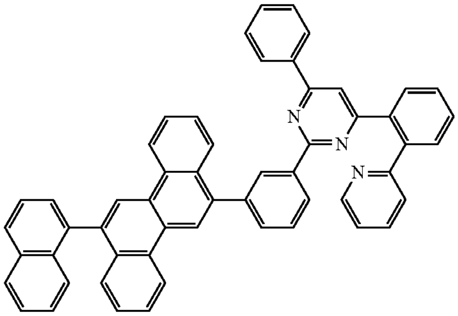
41
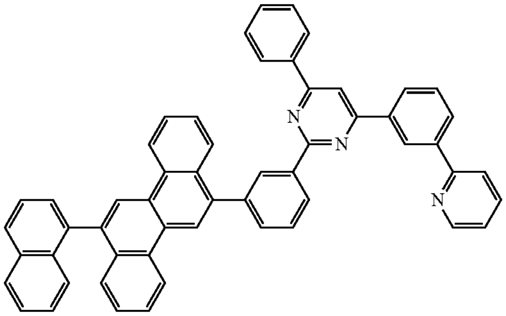
42
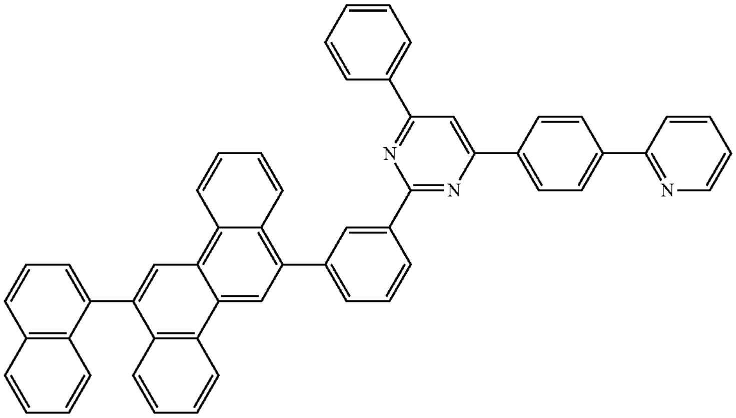
43
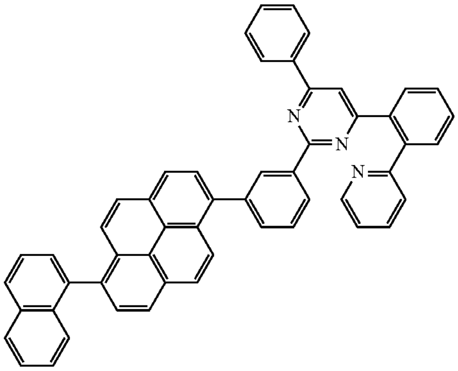
44
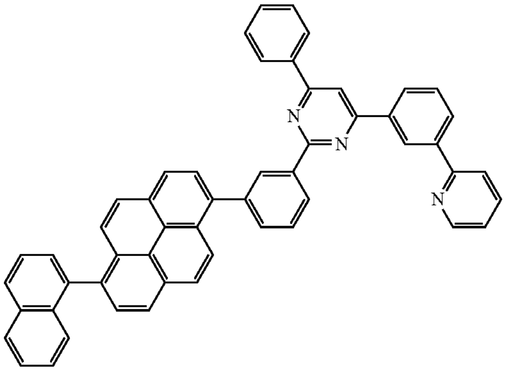
45
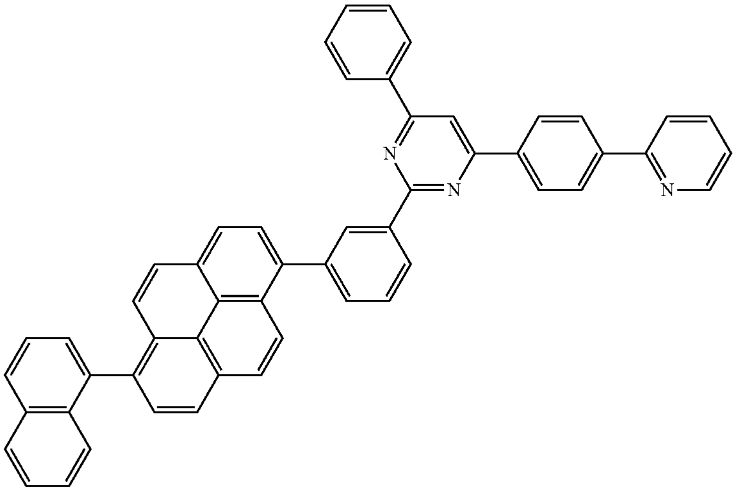

-continued
46
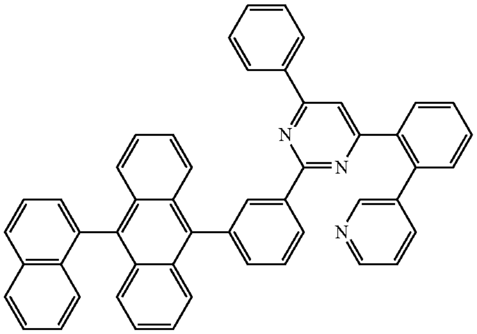
47
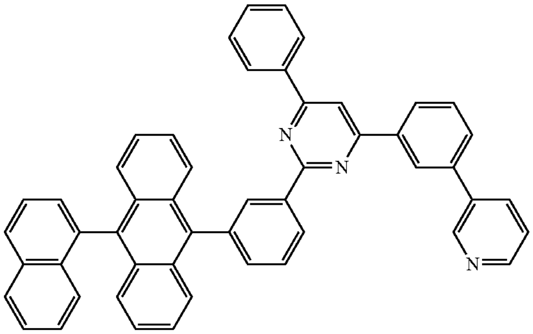
48
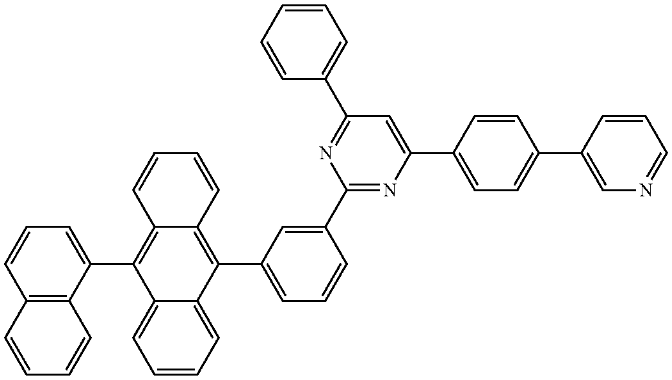
49
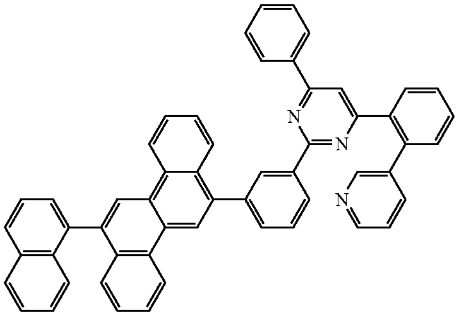
50
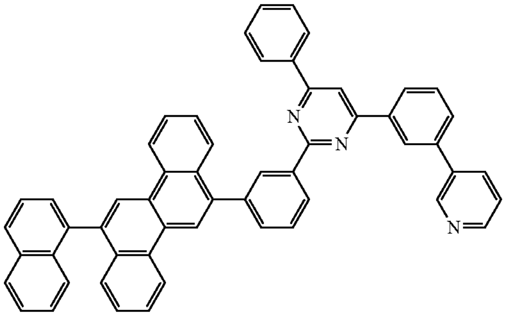
51
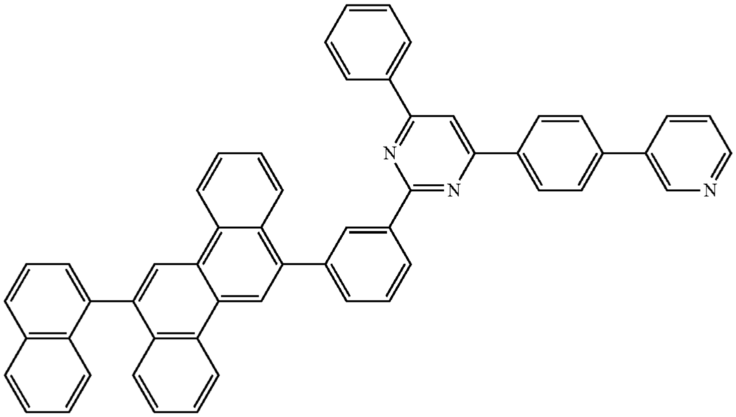

-continued
52
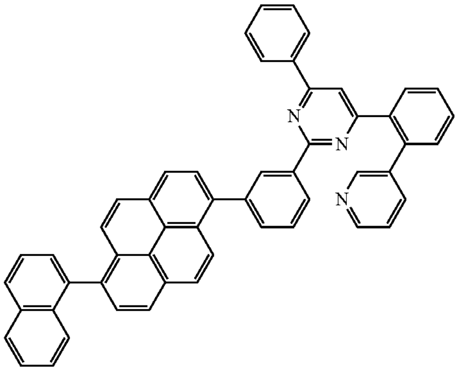
53
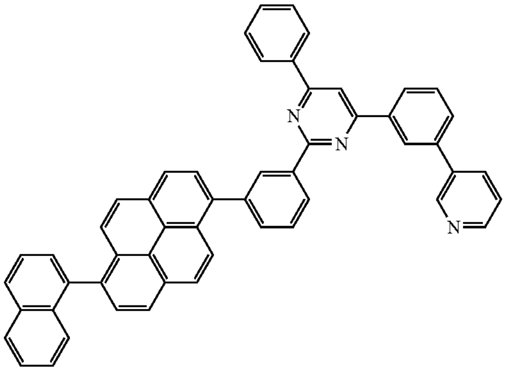
54
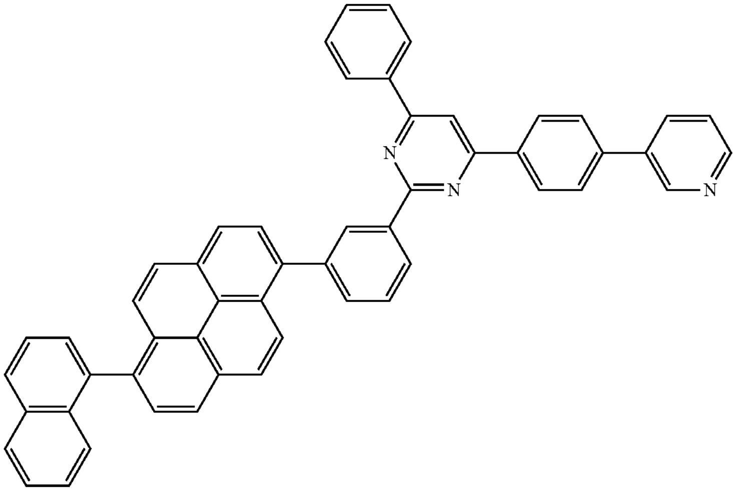
55
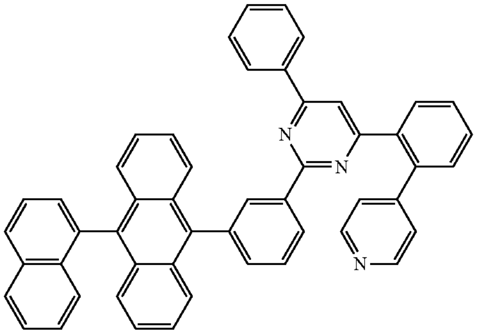
56
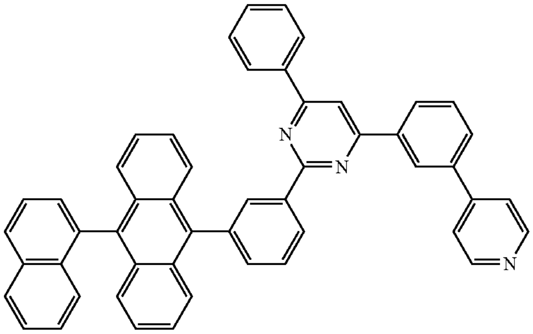
57
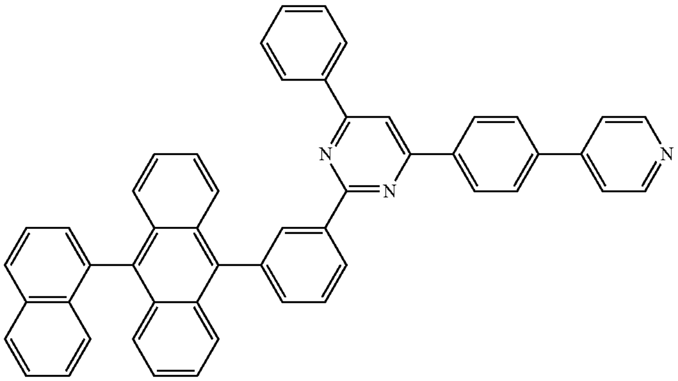

-continued
58
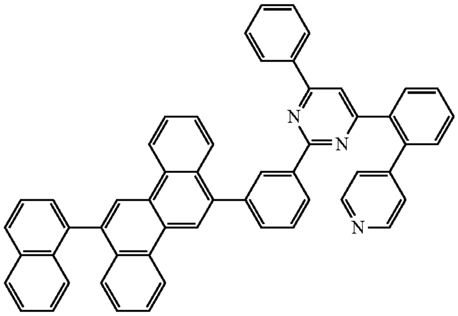
59
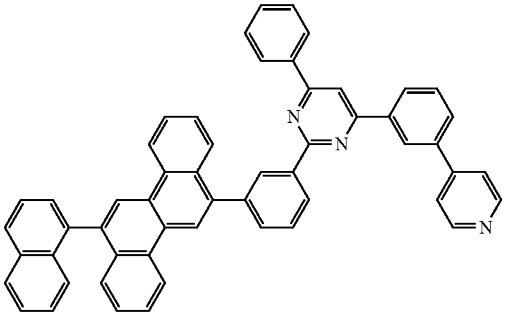
60
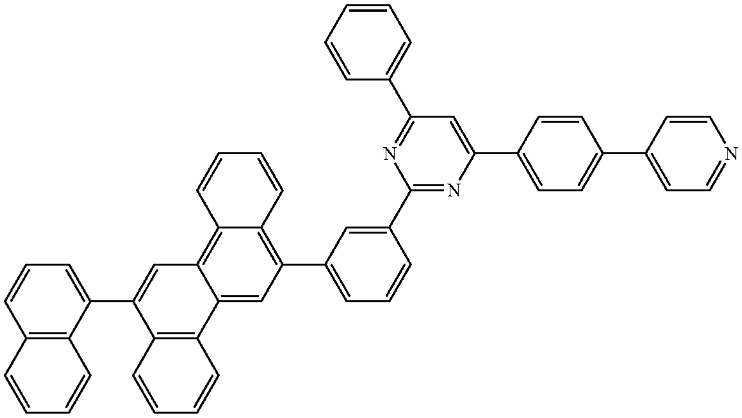
61
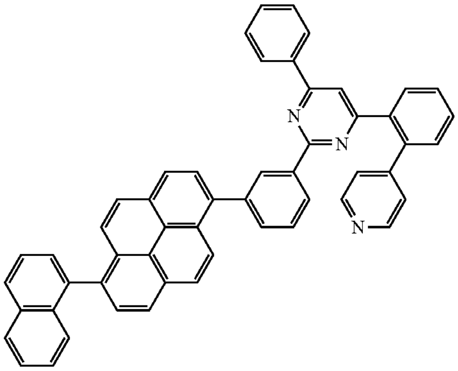
62
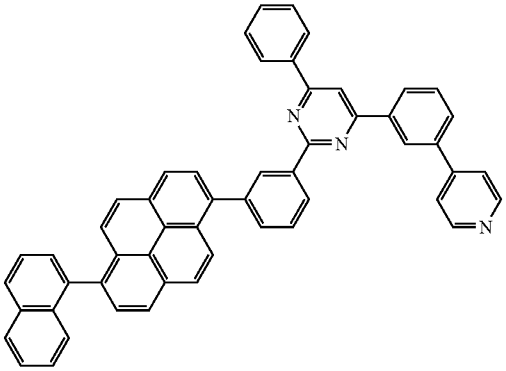
63
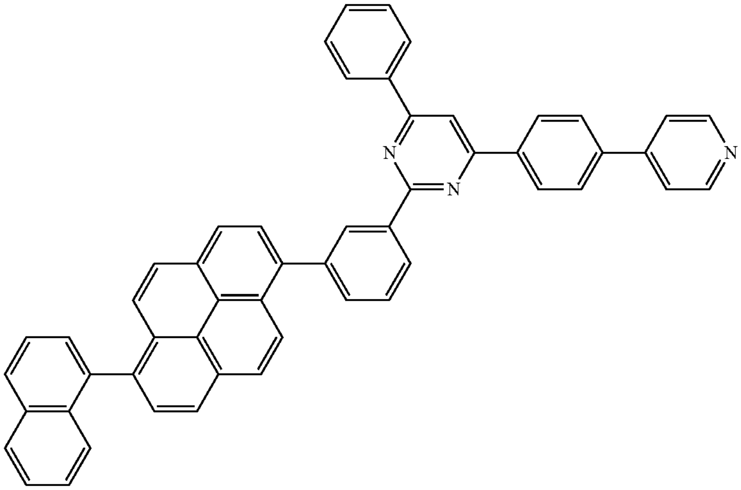

-continued
64
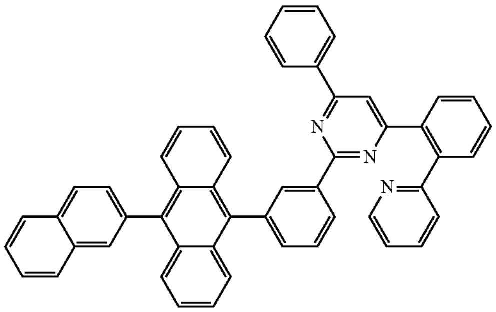
65
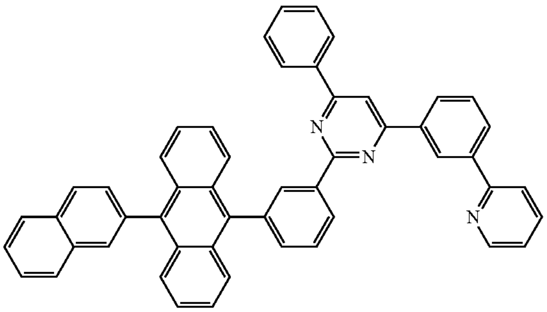
66
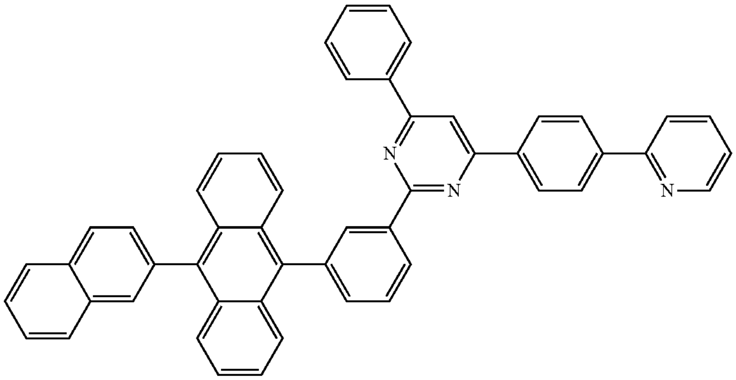
67
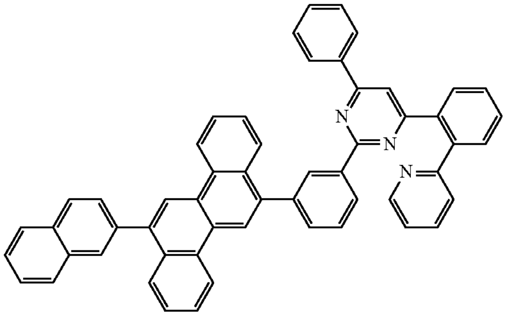
68
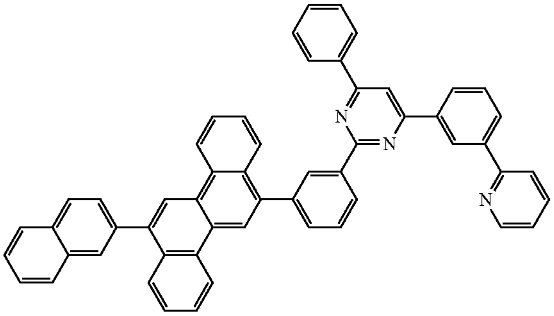
69
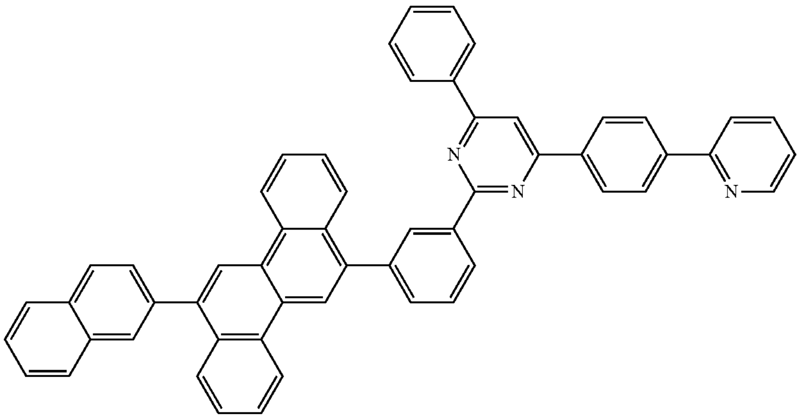

-continued
70
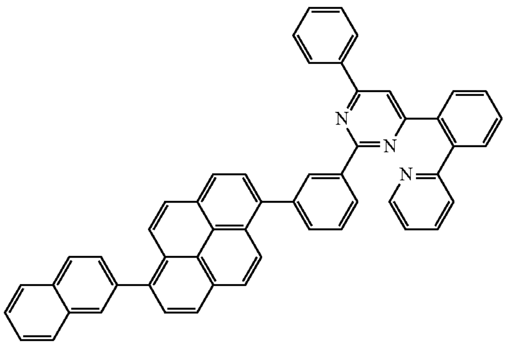
71
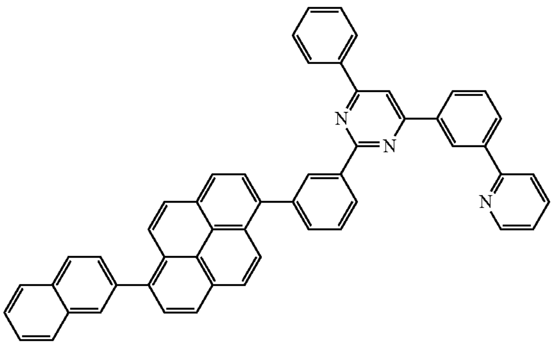
72
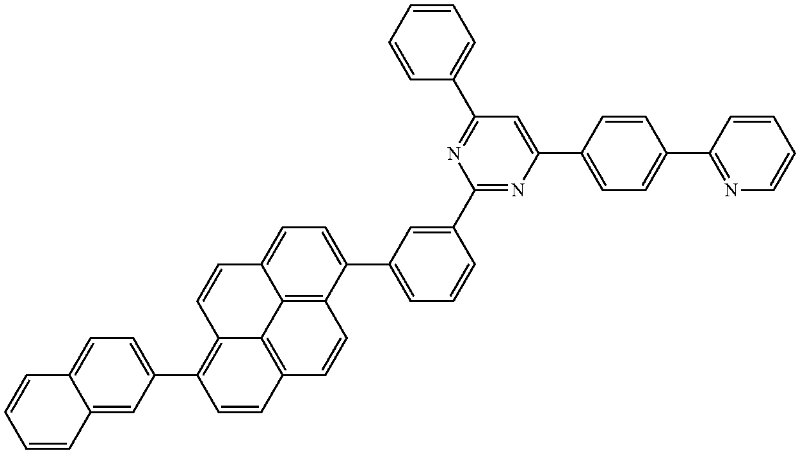
73
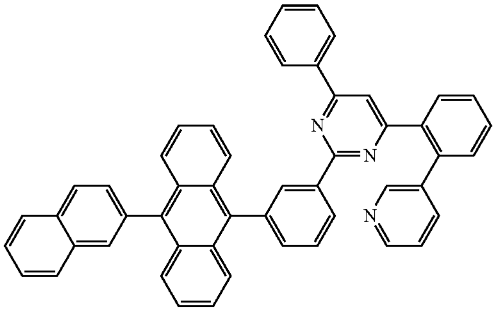
74
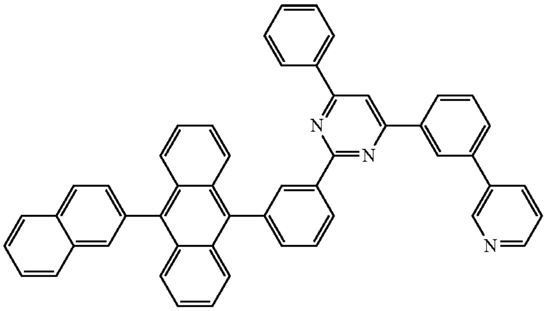
75
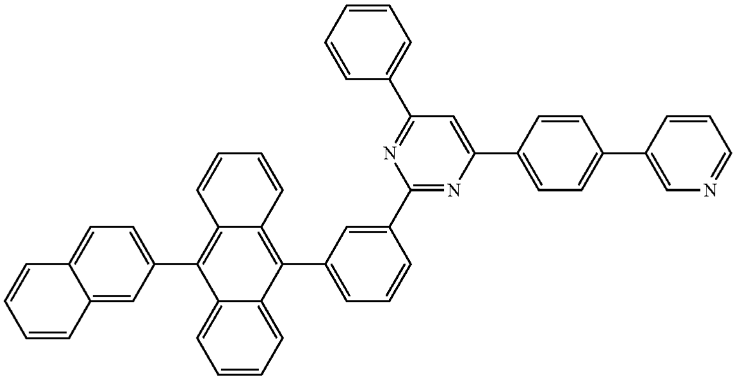

-continued
76
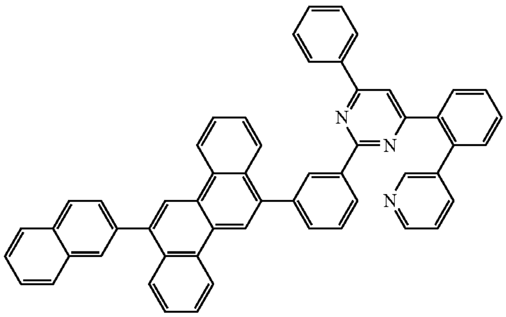
77
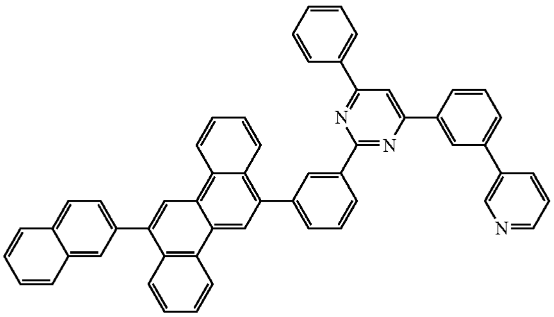
78
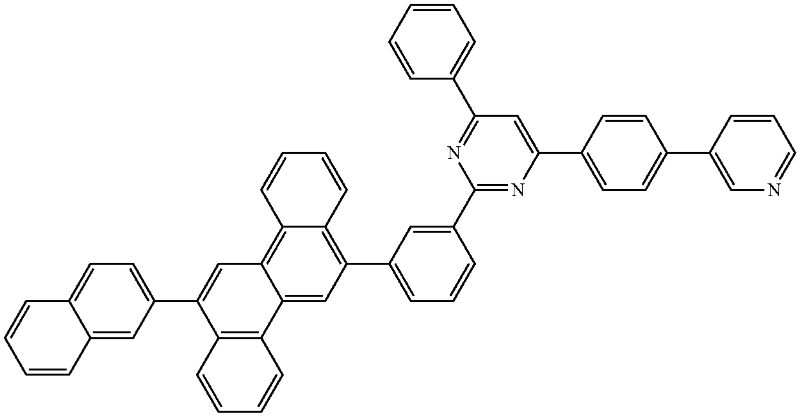
79
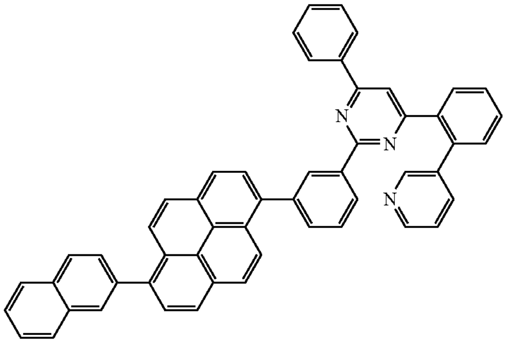
80
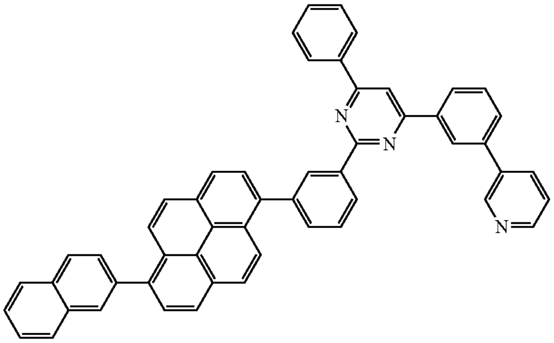
81
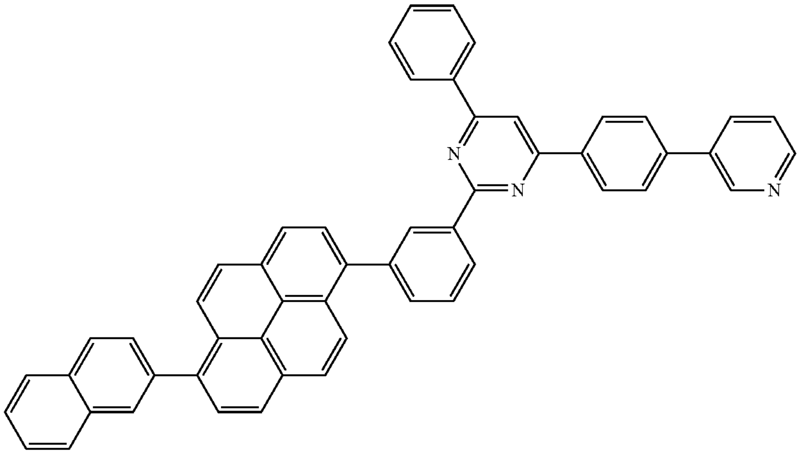

-continued
82
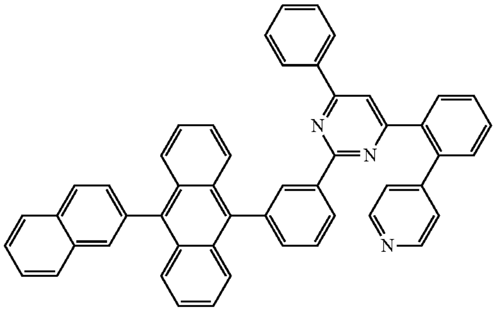
83
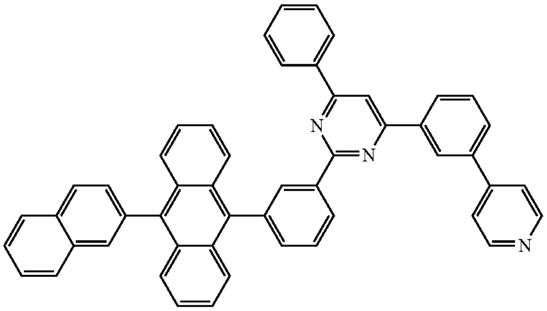
84
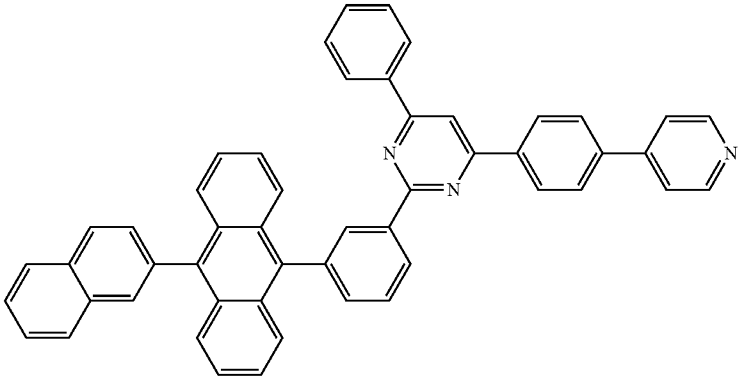
85
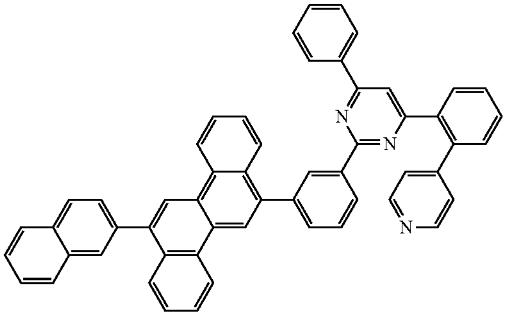
86
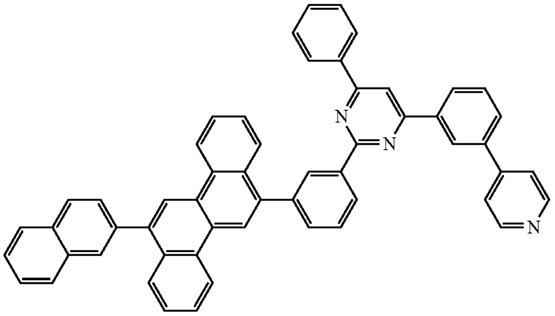
87
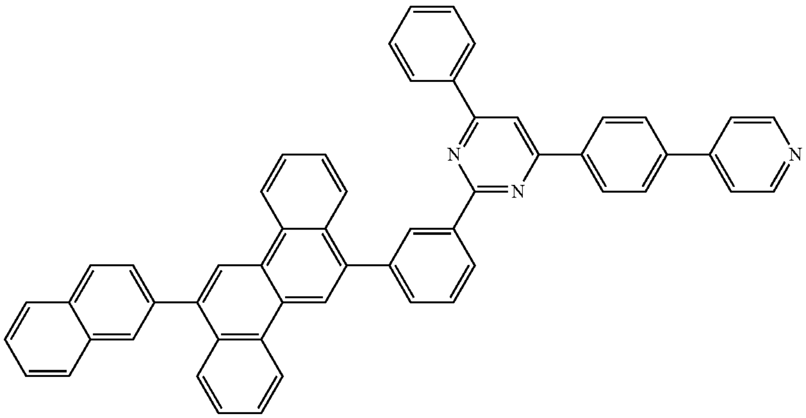

-continued
88
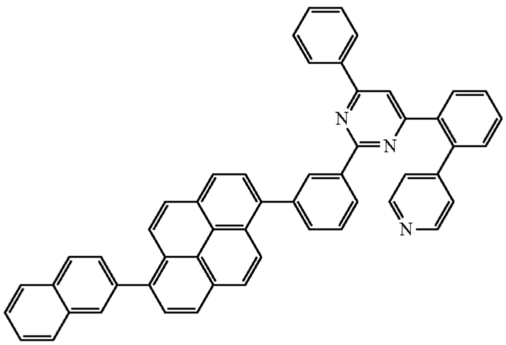
89
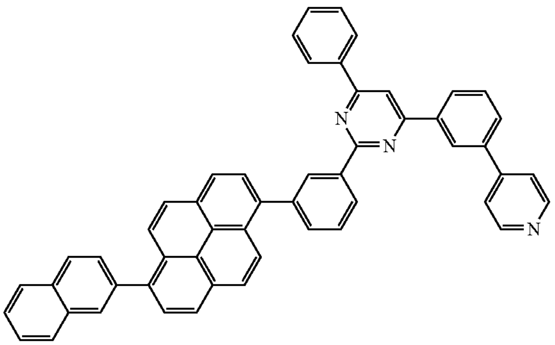
90
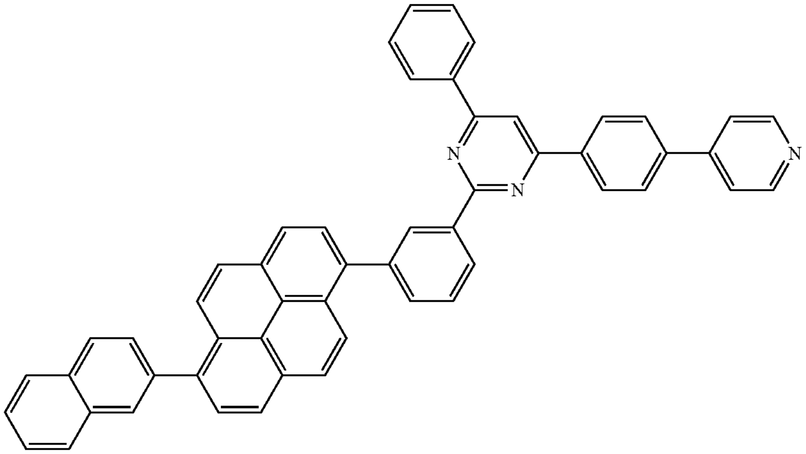
91
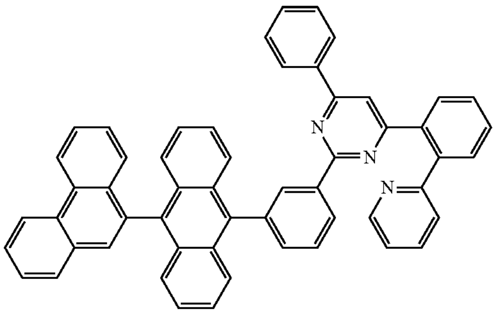
92
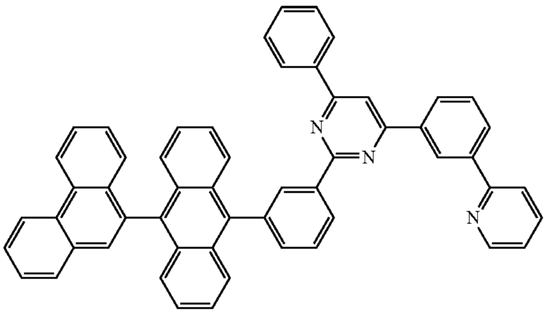
93
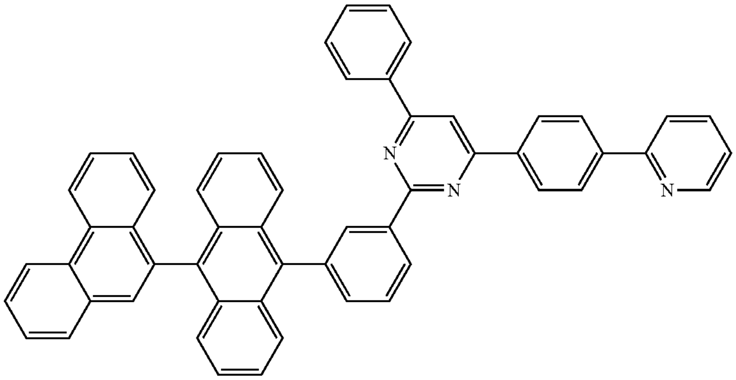

-continued
94
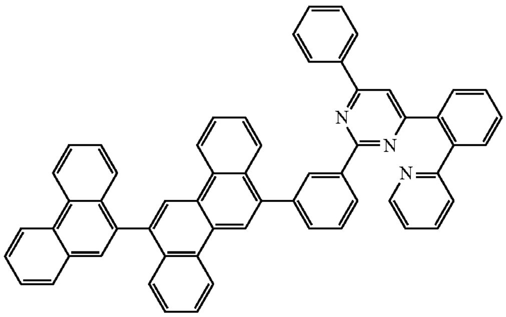
95
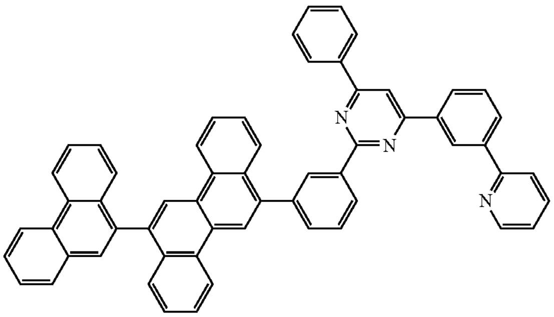
96
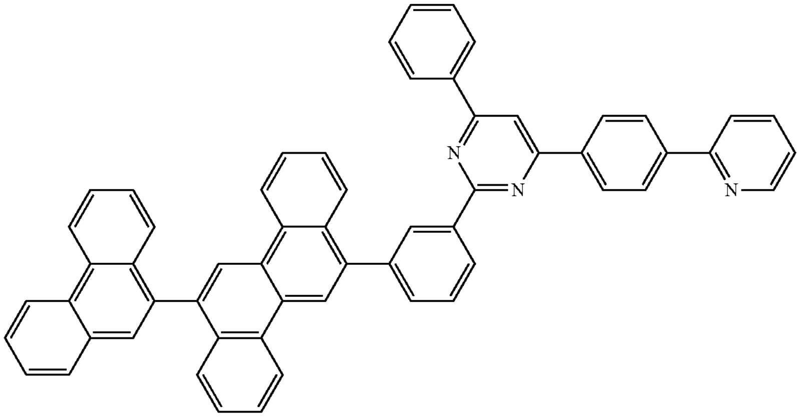
97
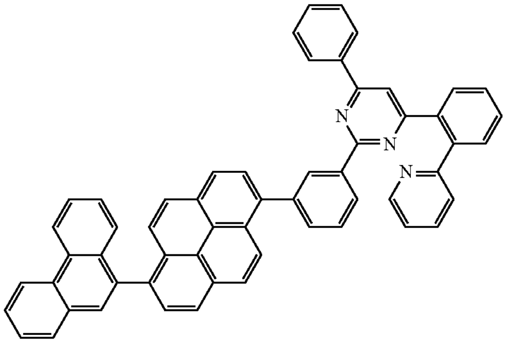
98
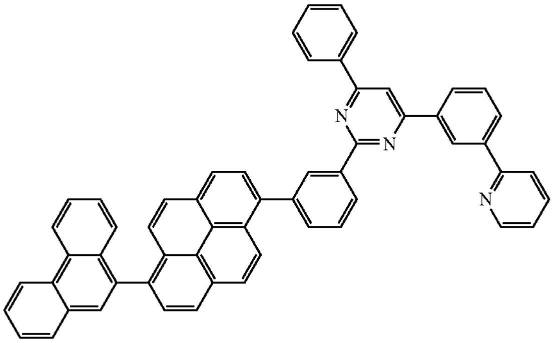
99
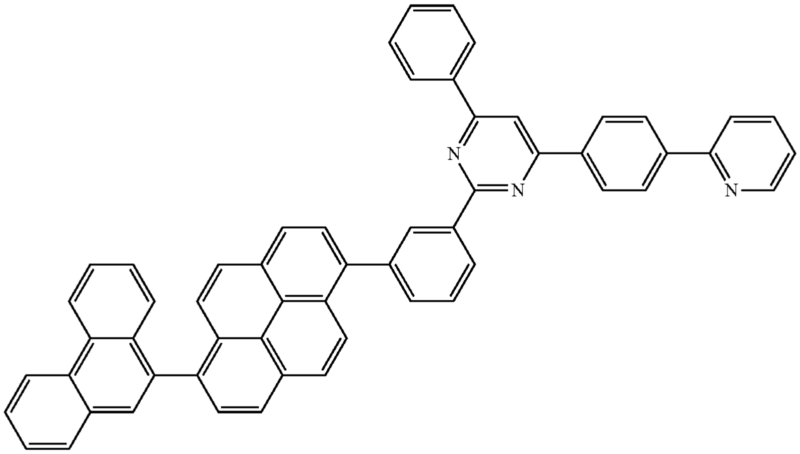

-continued
100
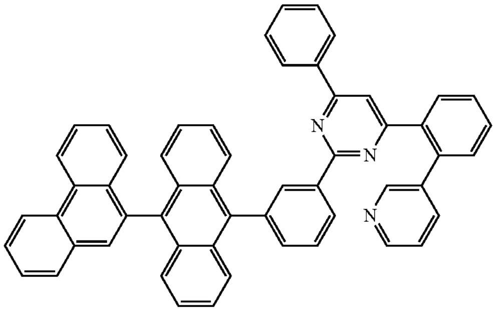
101
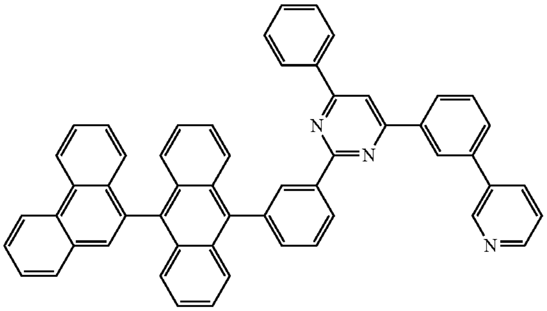
102
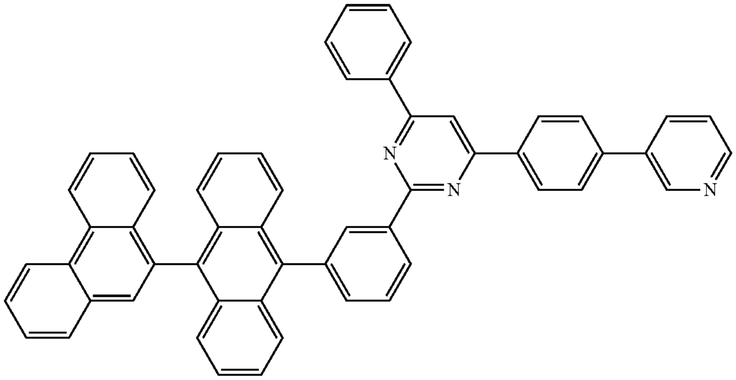
103
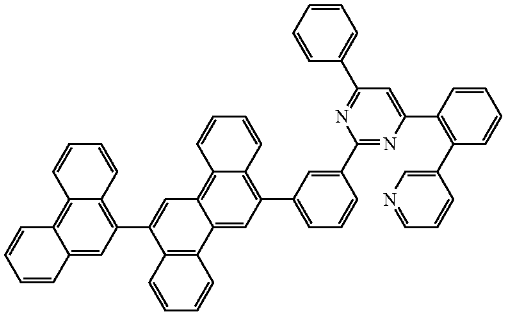
104
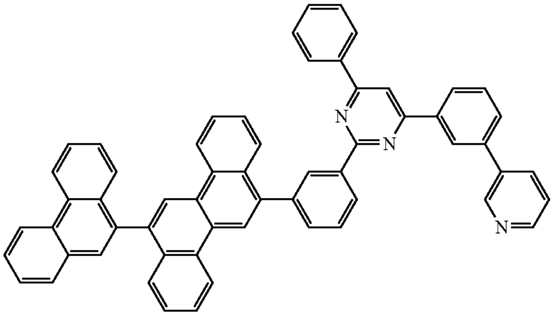
105
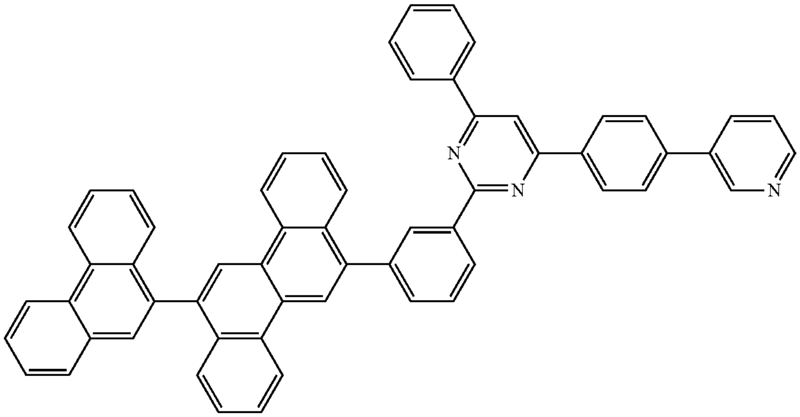

-continued
106
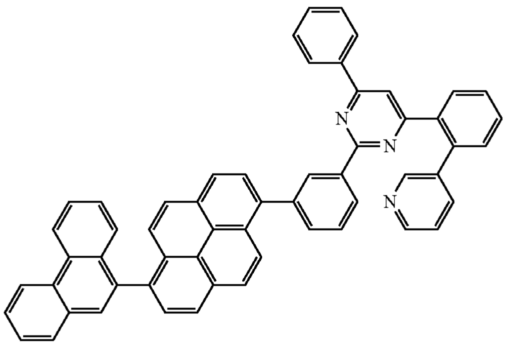
107
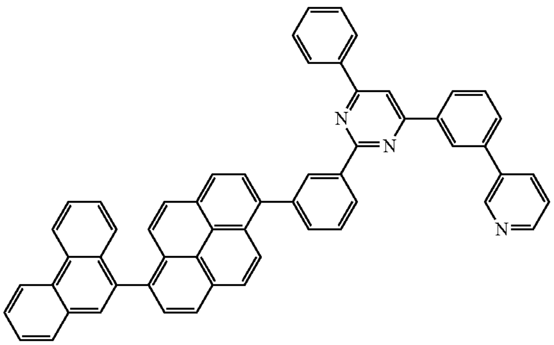
108
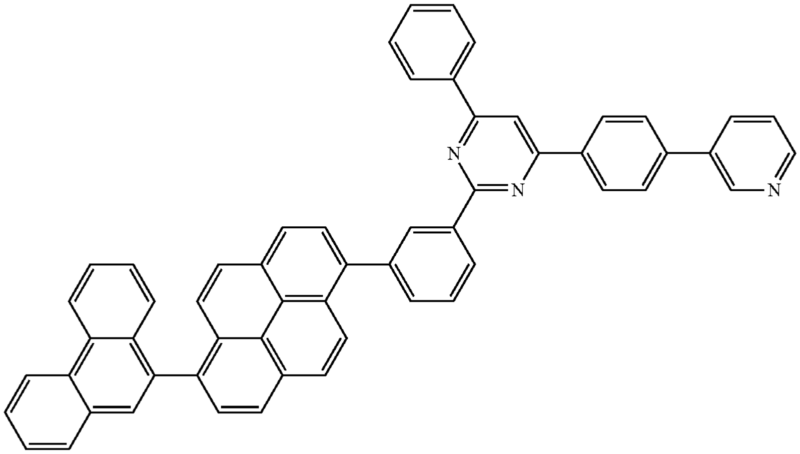
109
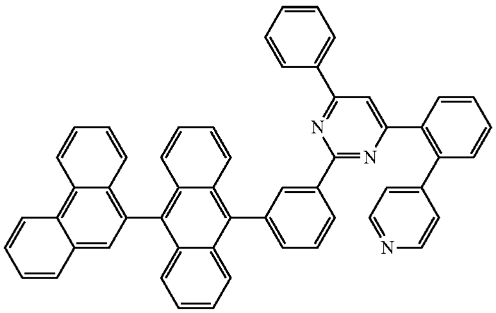
110
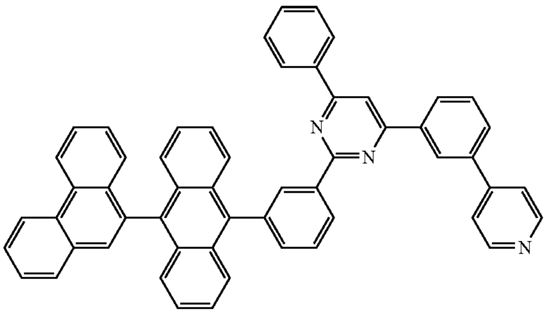
111
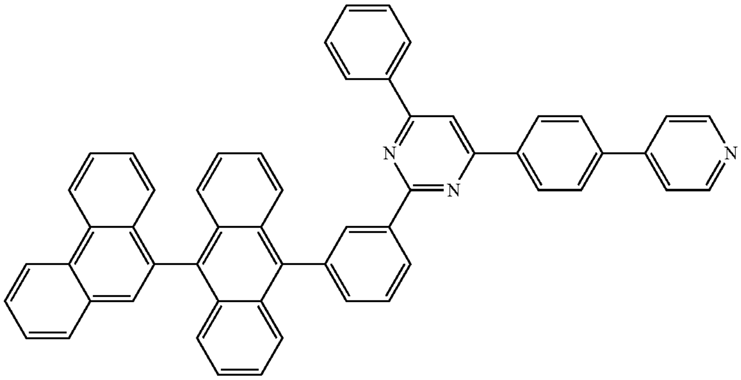

-continued
112
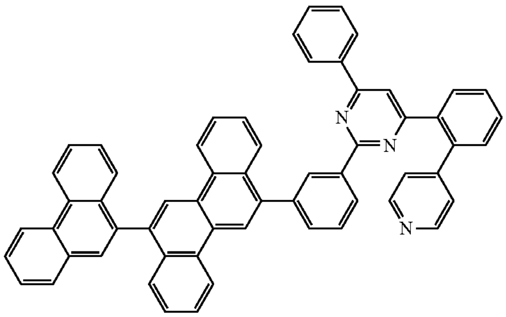
113
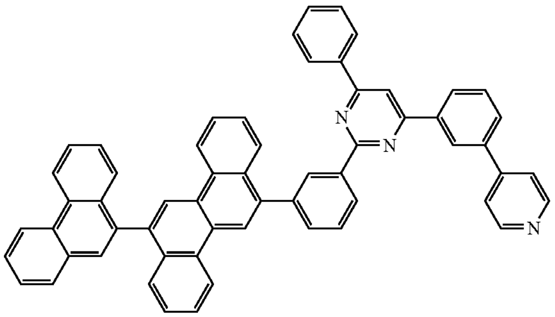
114
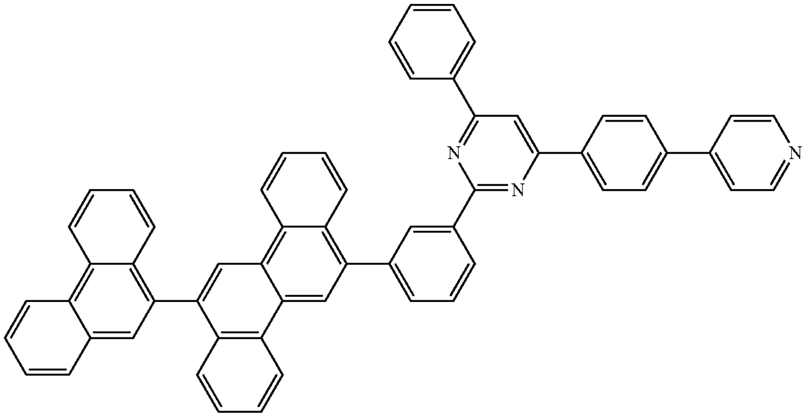
115
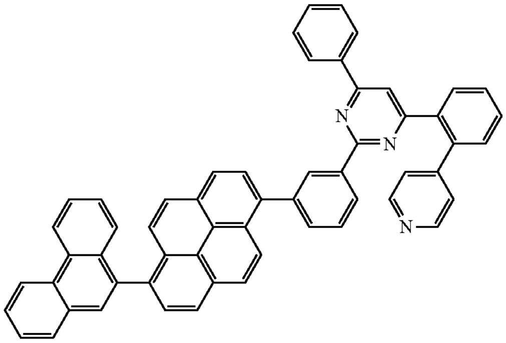
116
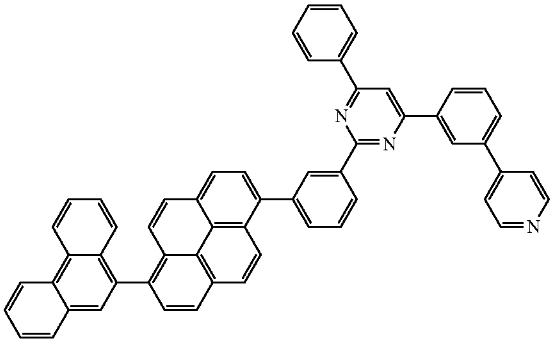
117
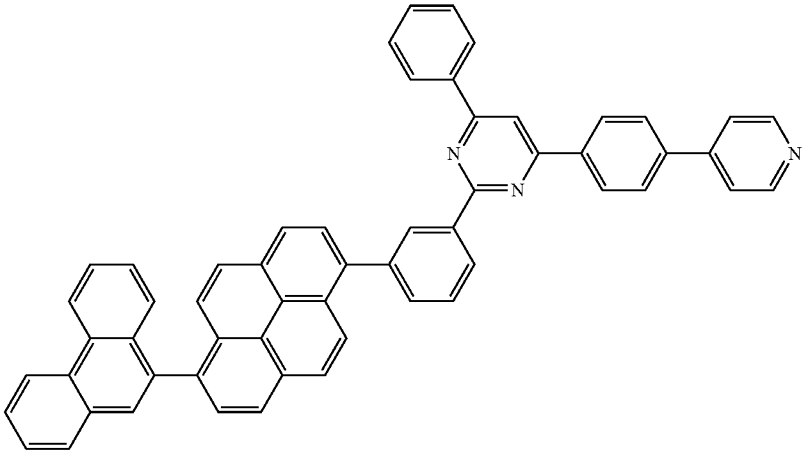

-continued
118
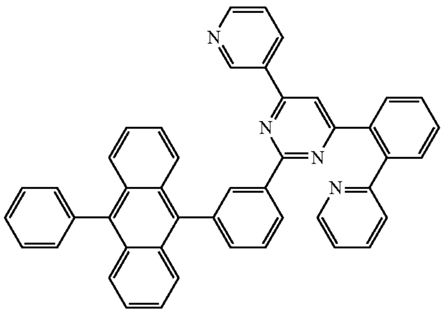
119
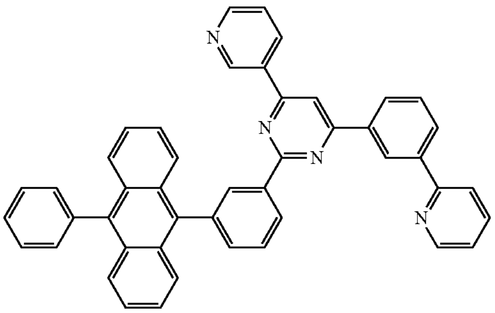
120
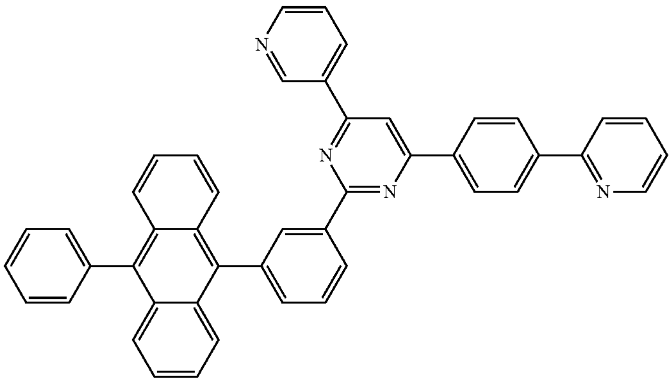
121
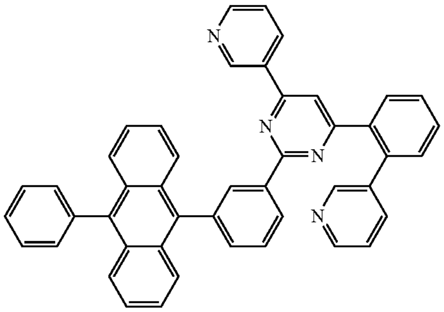
122
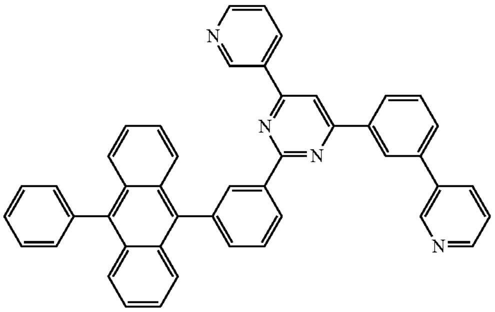
123
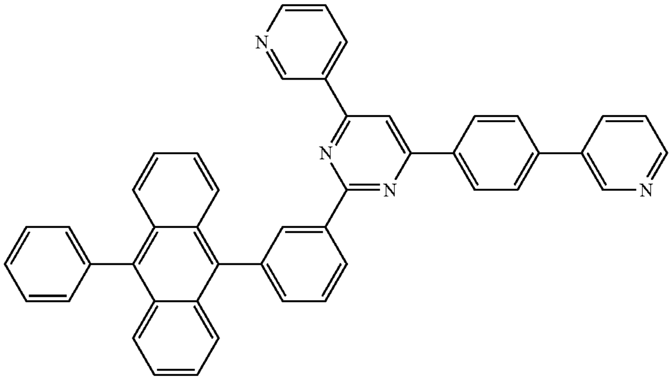

-continued
124
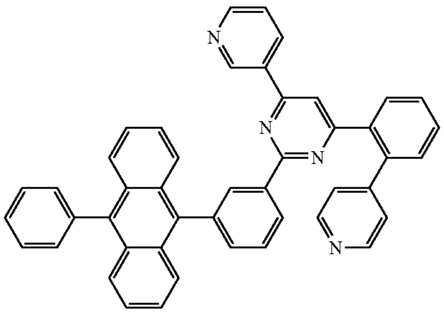
125
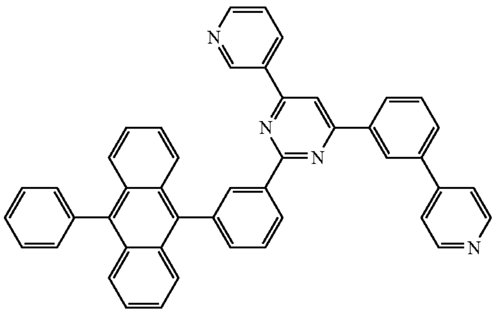
126
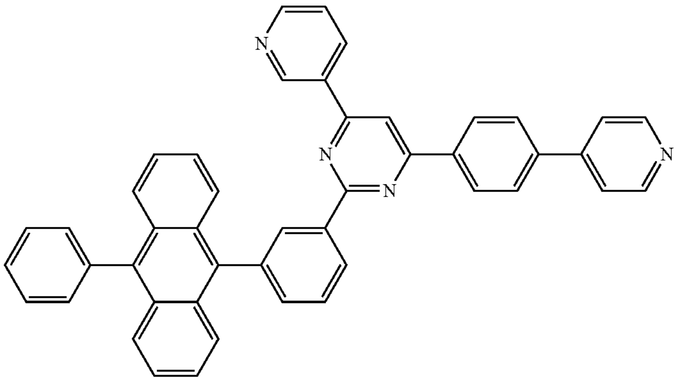
127
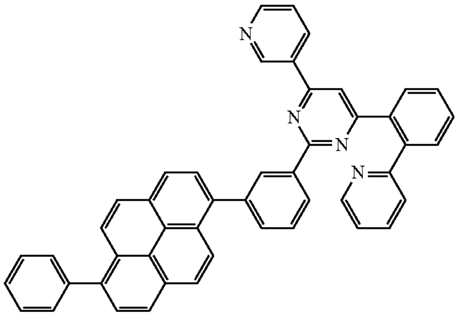
128
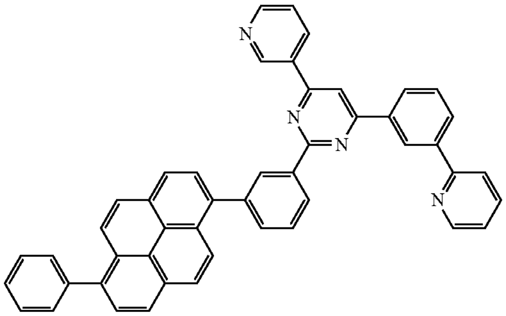
129
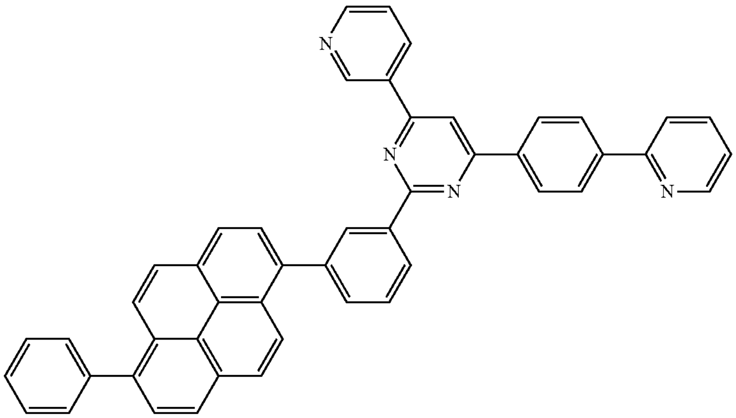

-continued
130
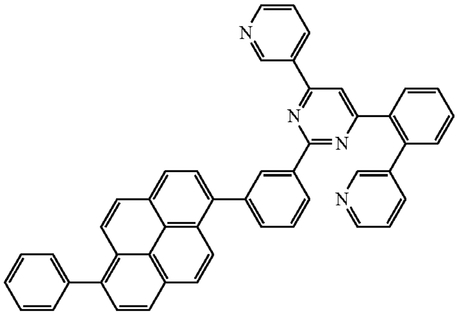
131
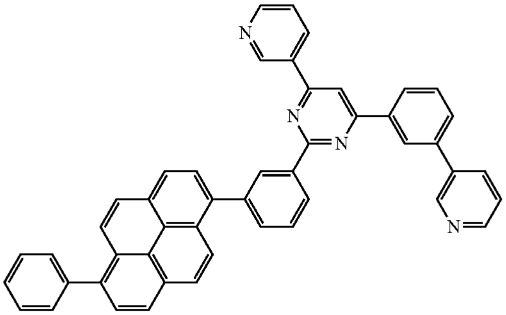
132
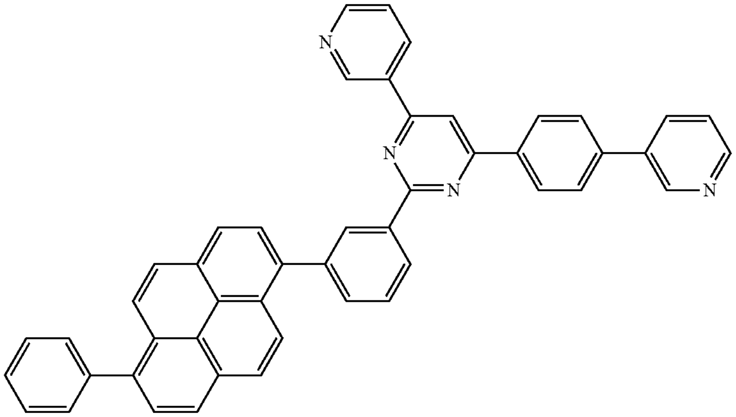
133
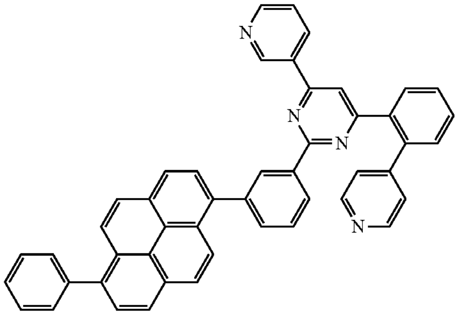
134
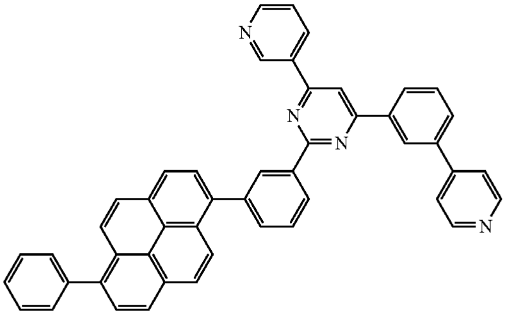
135
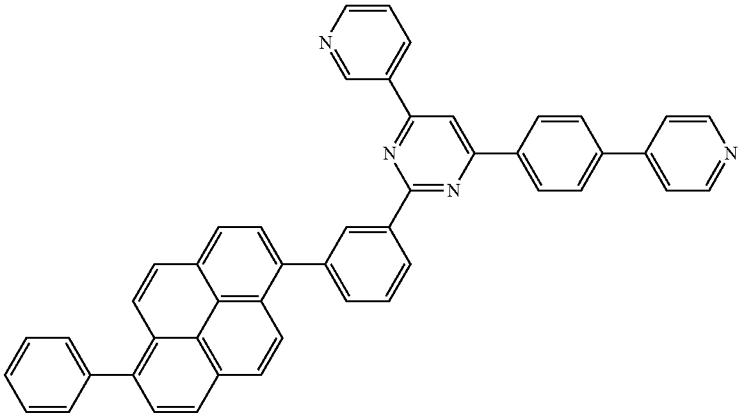

-continued
136
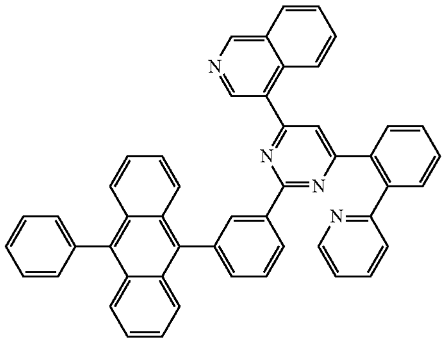
137
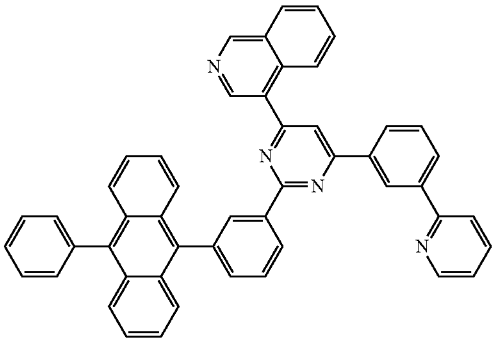
138
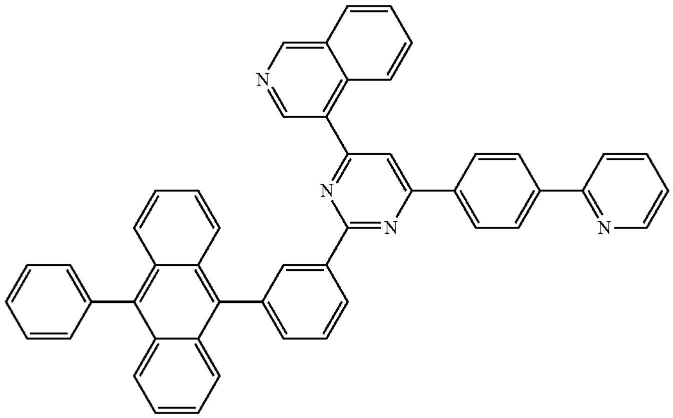
139
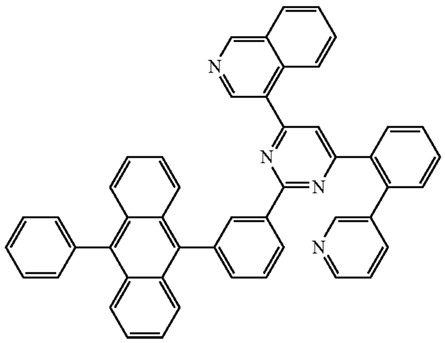
140
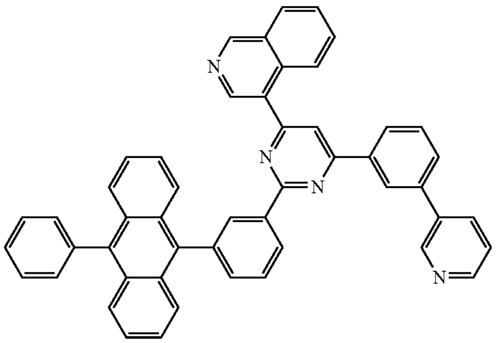
141
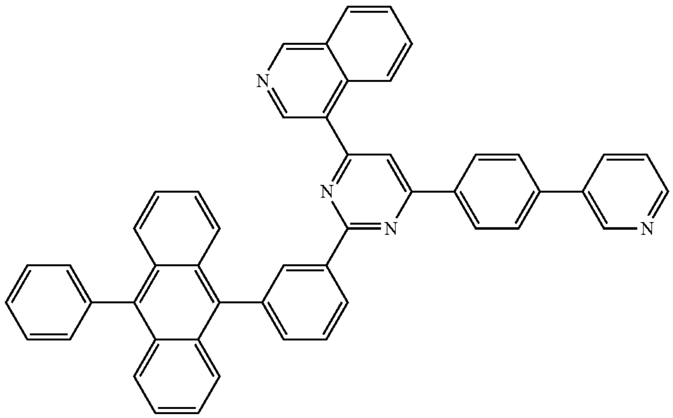

-continued
142
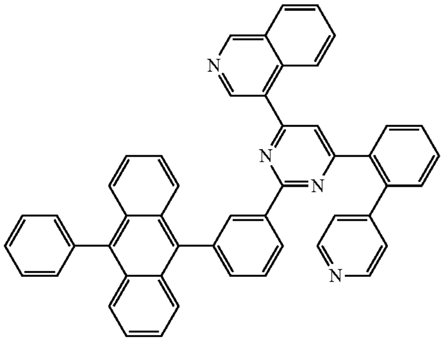
143
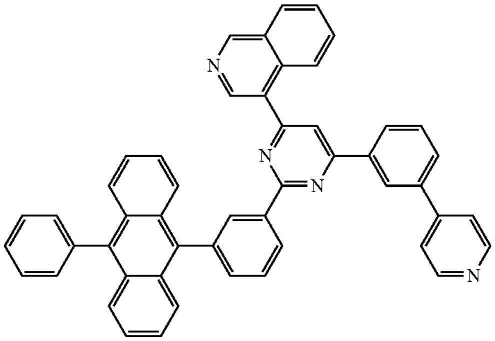
144
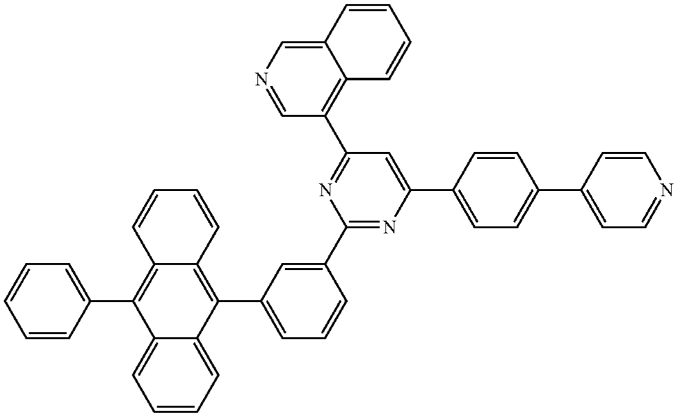
145
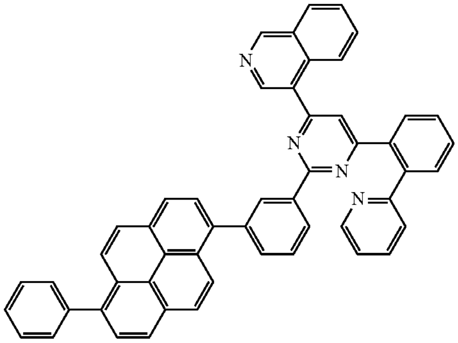
146
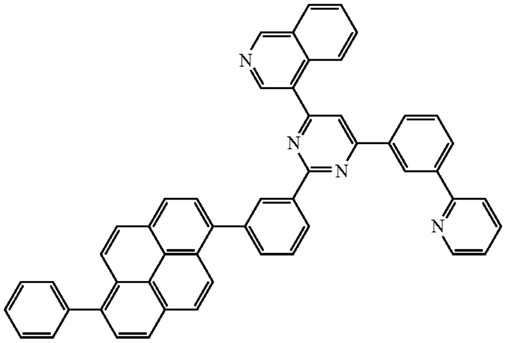
147
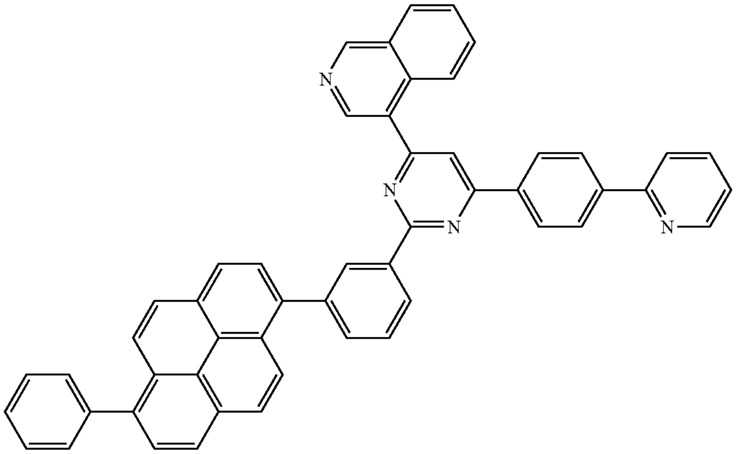

-continued
148
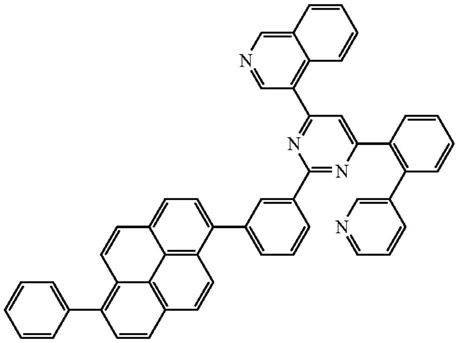
149
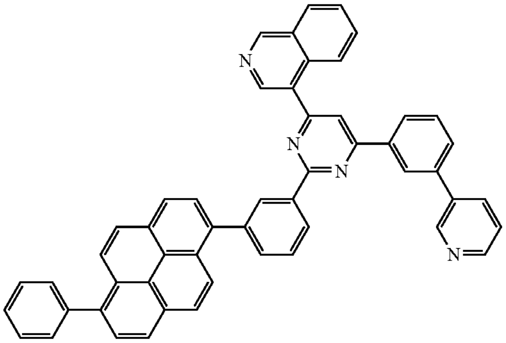
150
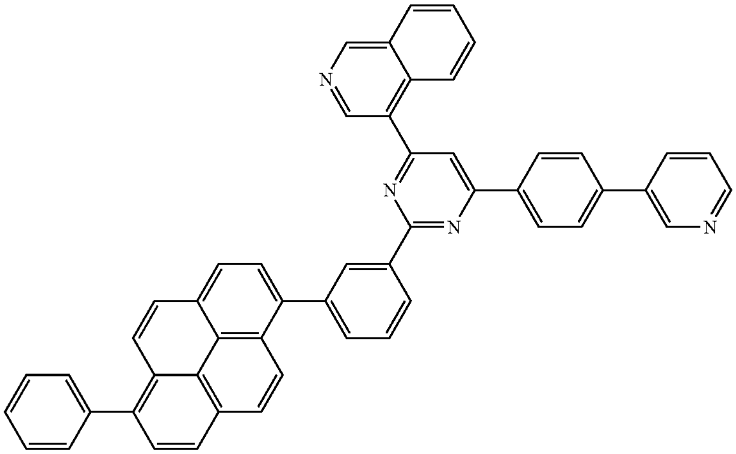
151
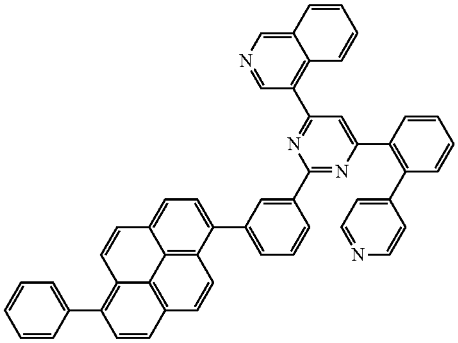
152
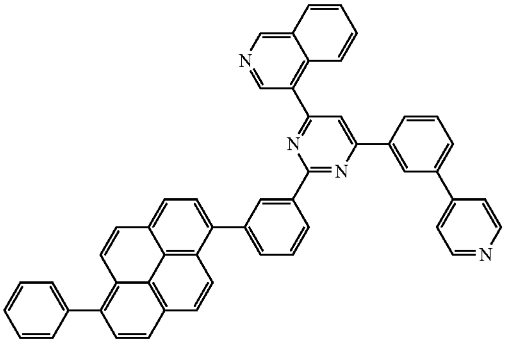
153
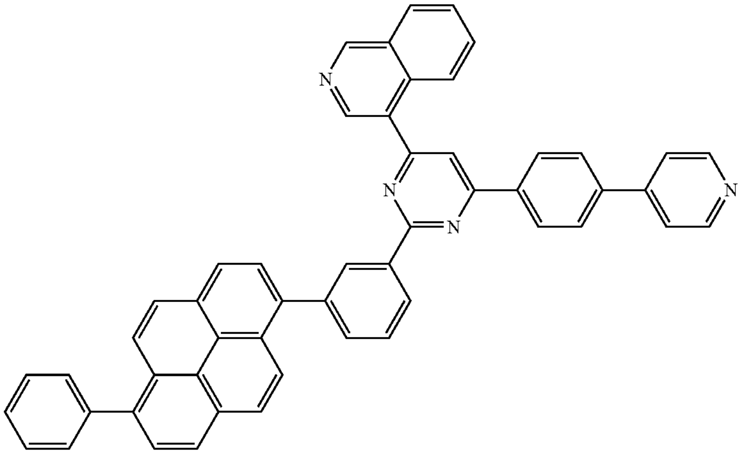

-continued
154
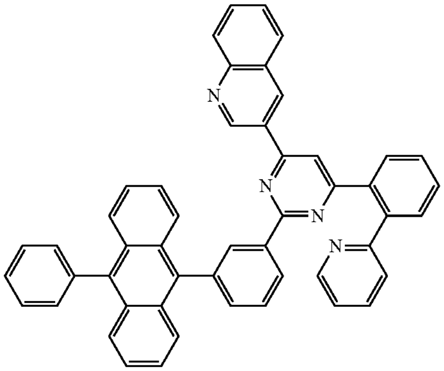
155
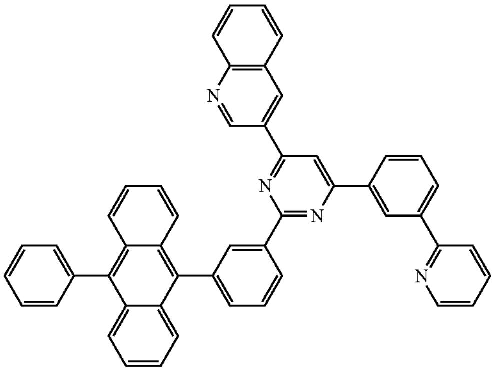
156
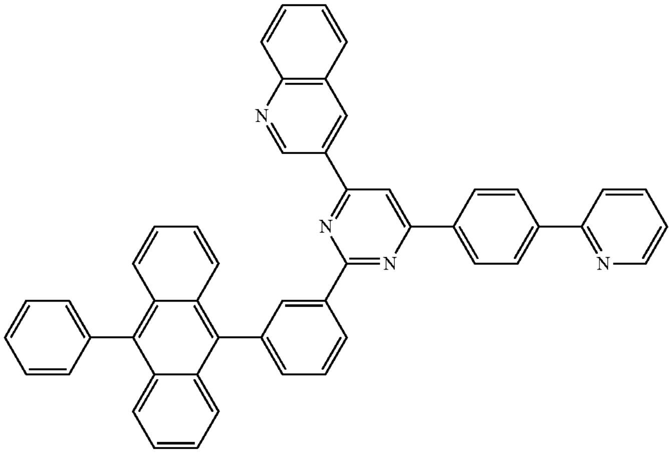
157
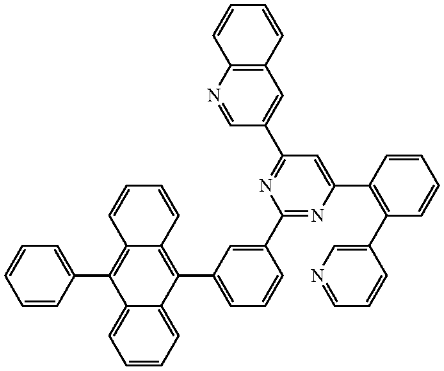
158
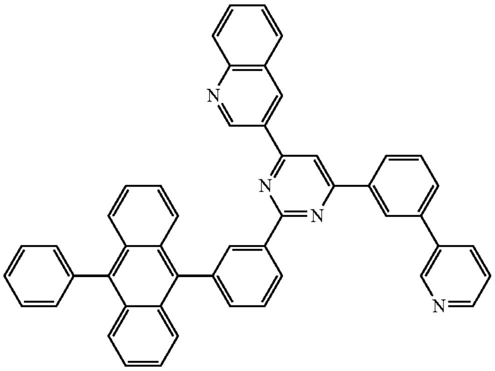
159
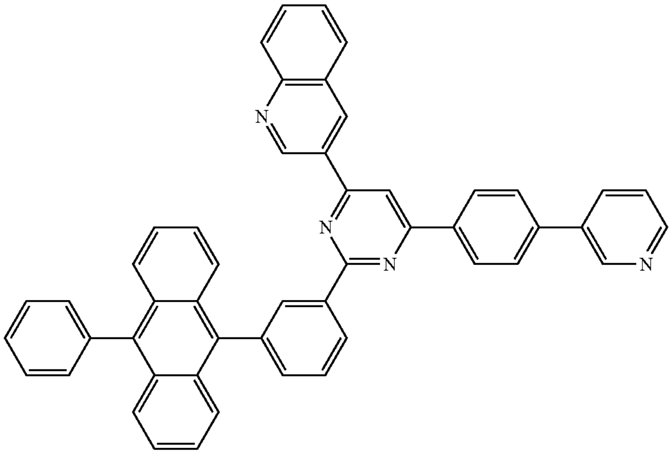

-continued
160
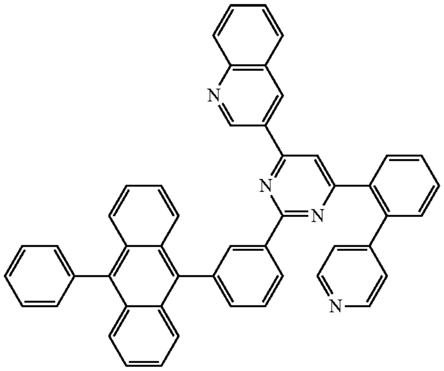
161
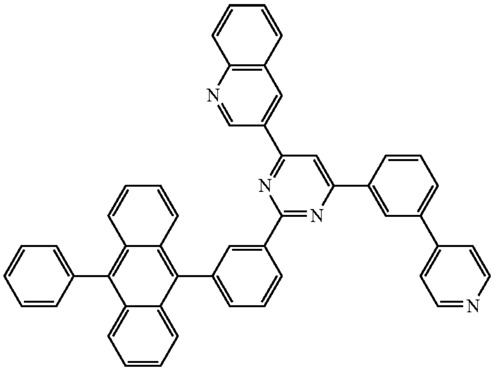
162
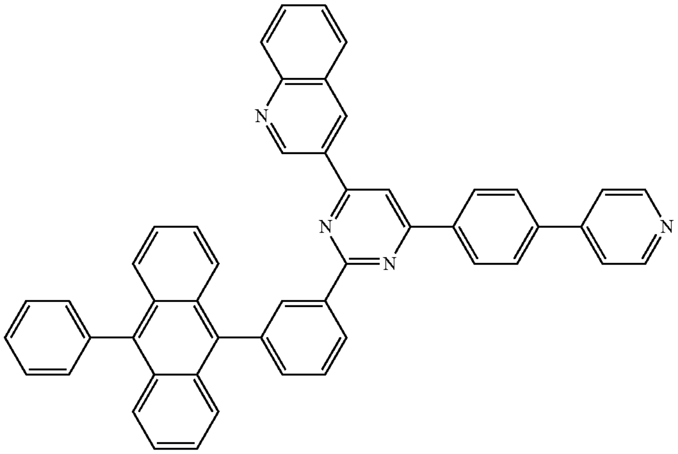
163
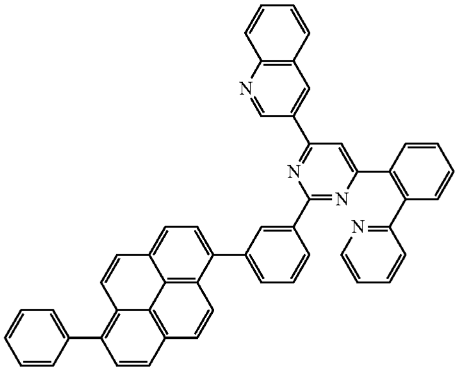
164
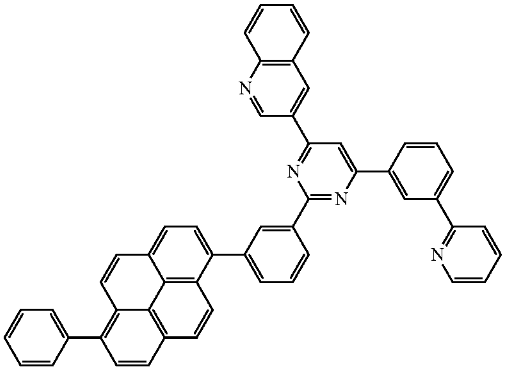

-continued
165
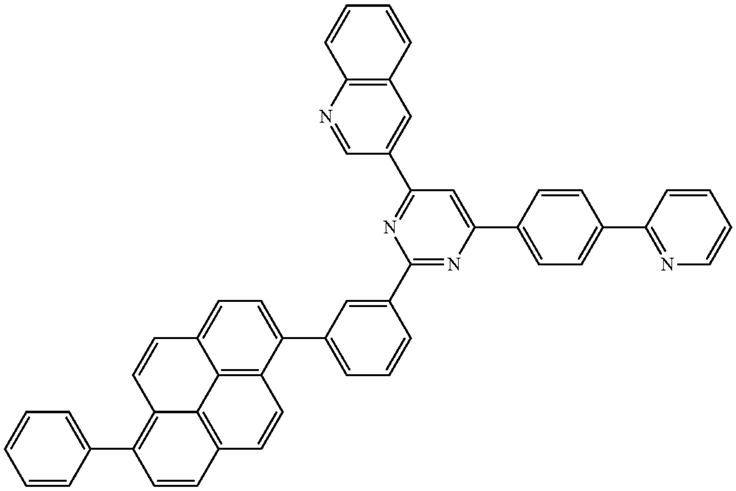
166
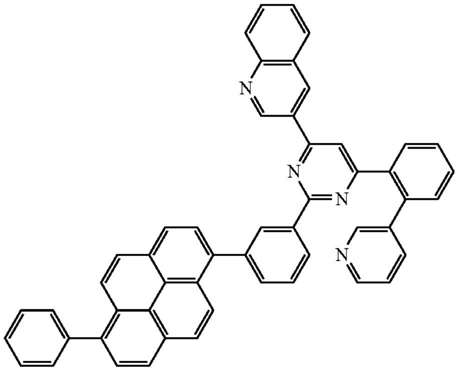
167
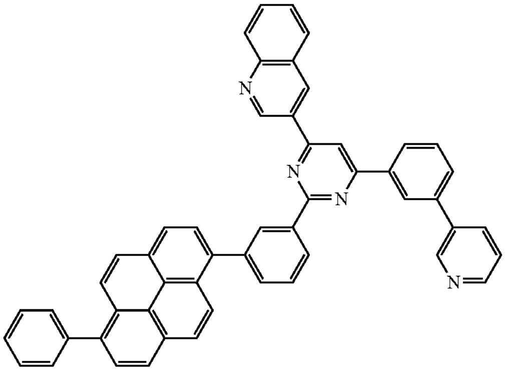
168
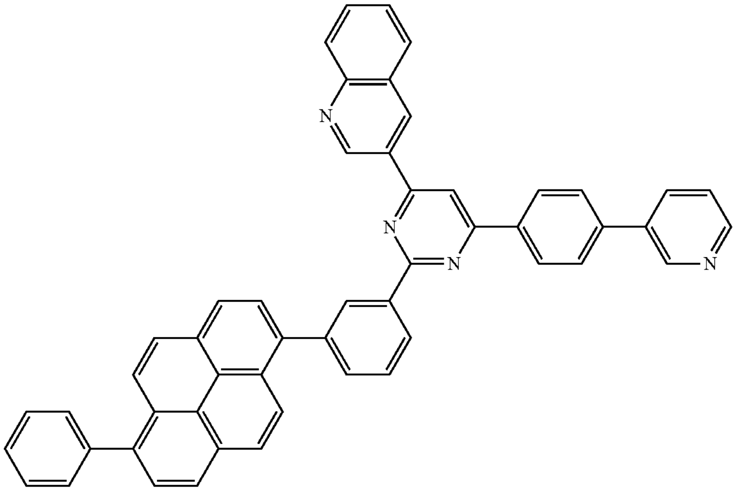

-continued
169
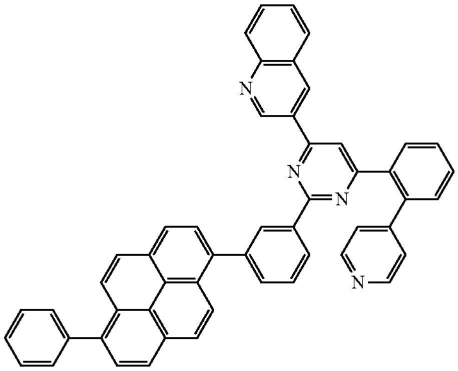
170
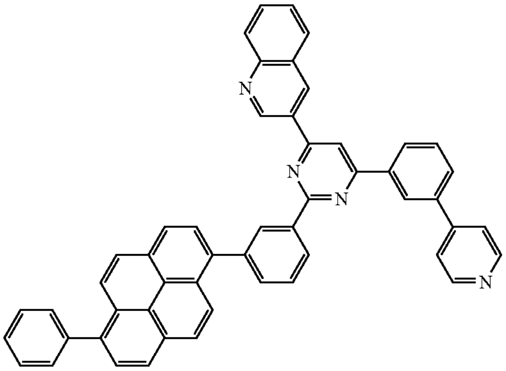
171
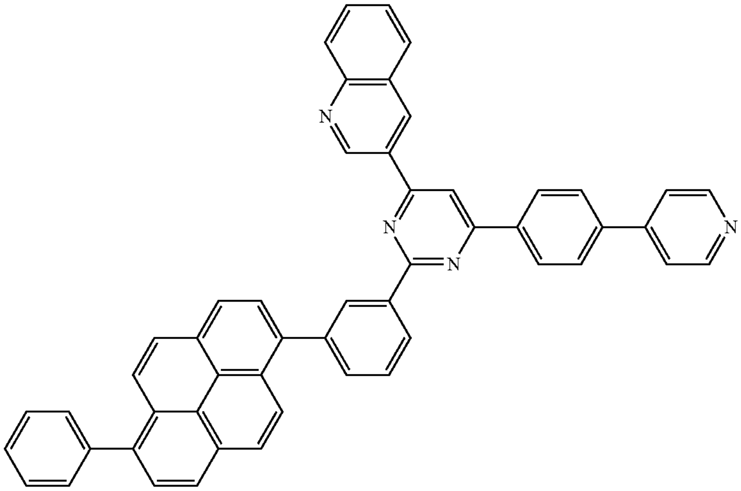
172
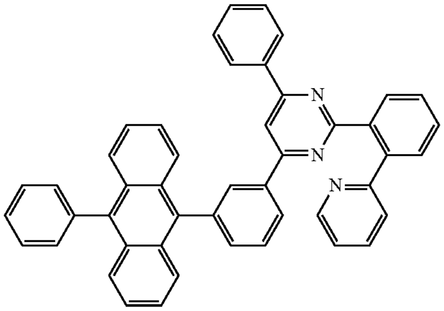
173
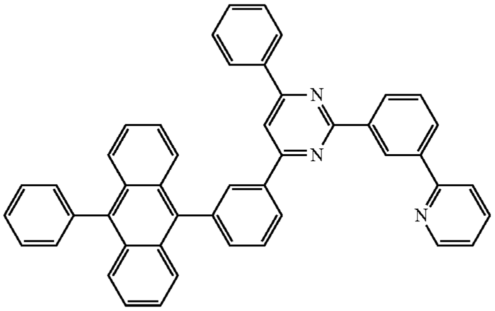
174
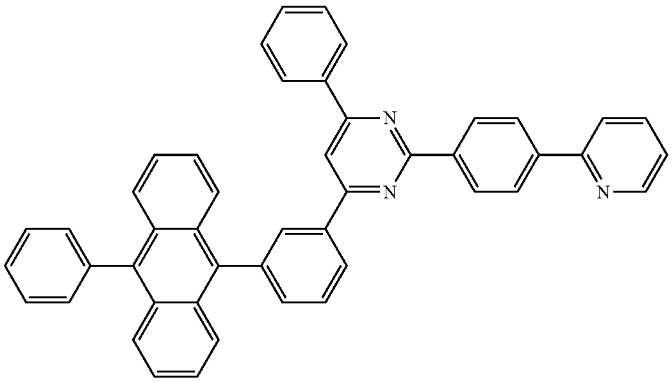

-continued
175
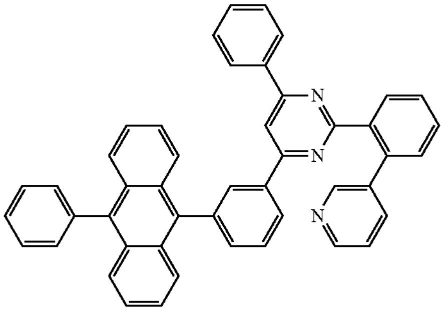
176
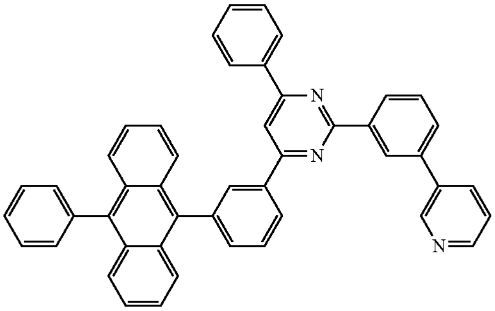
177
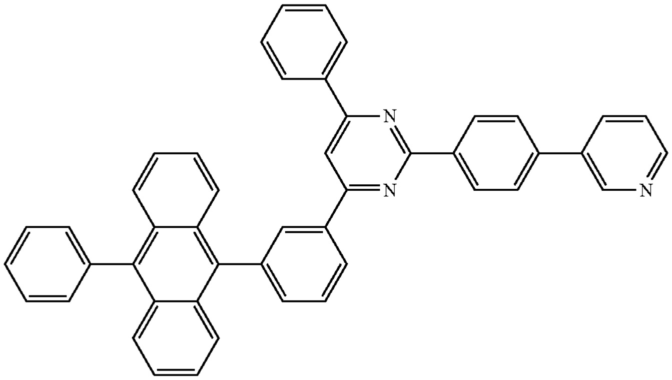
178
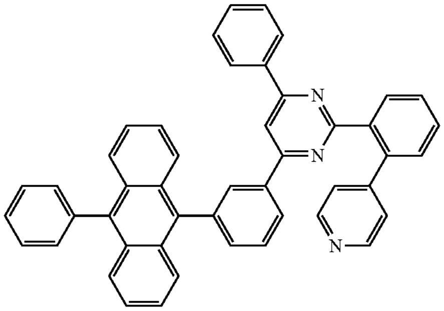
179
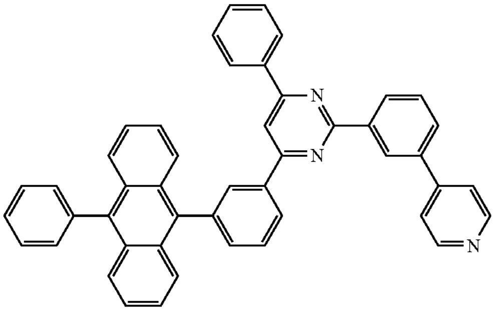
180
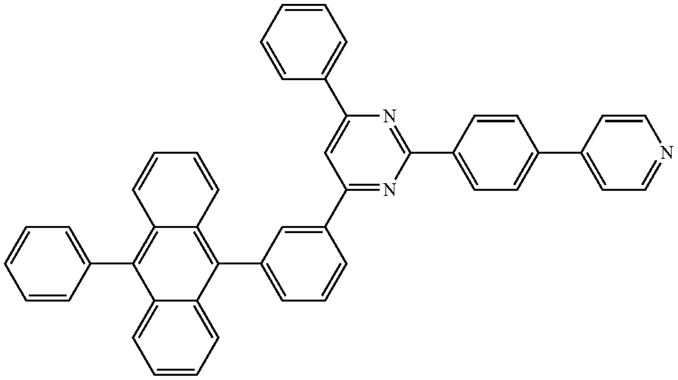

-continued
181
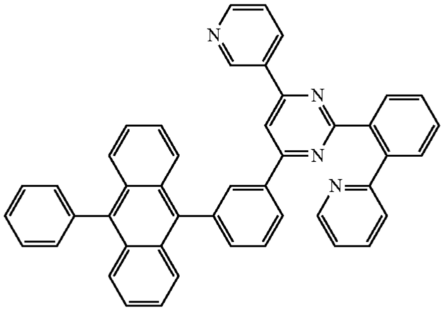
182
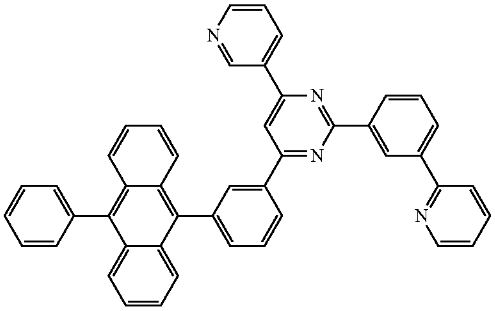
183
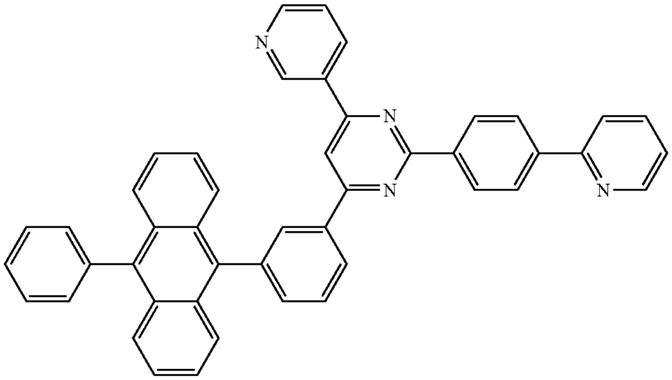
184
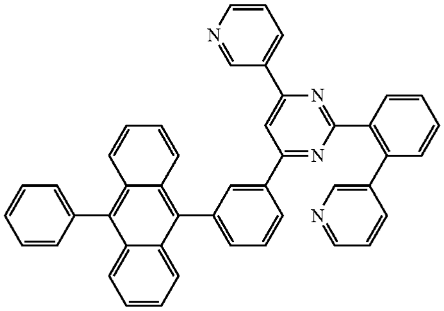
185
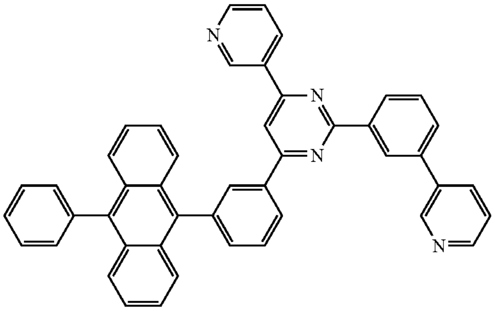
186
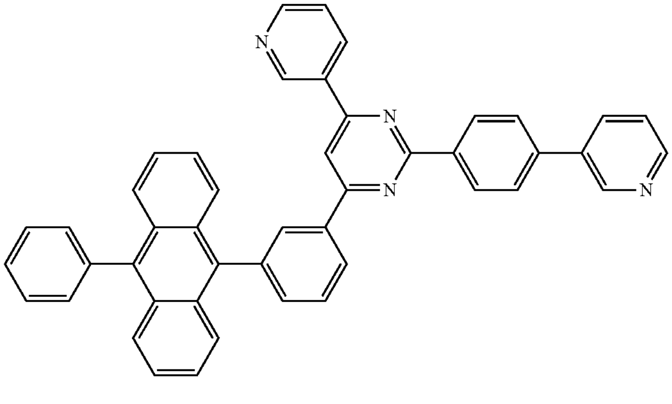

-continued
187
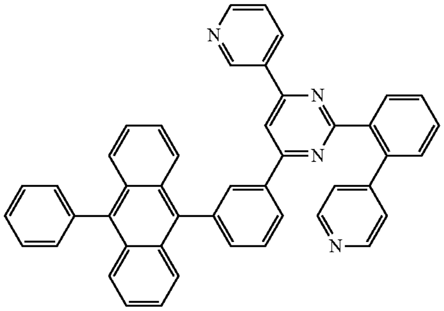
188
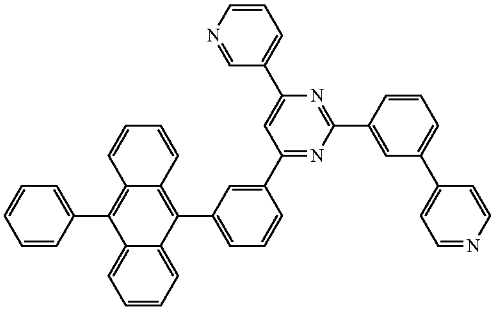
189
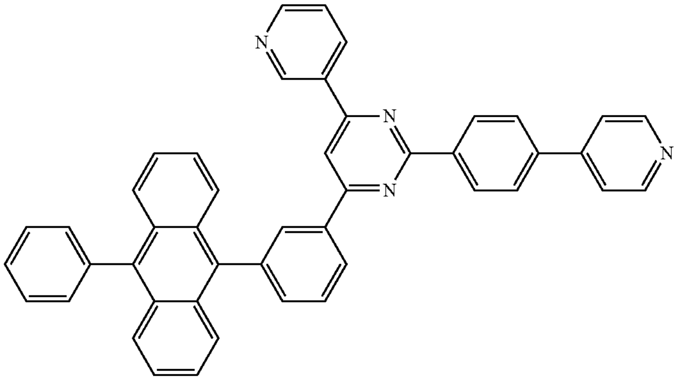
190
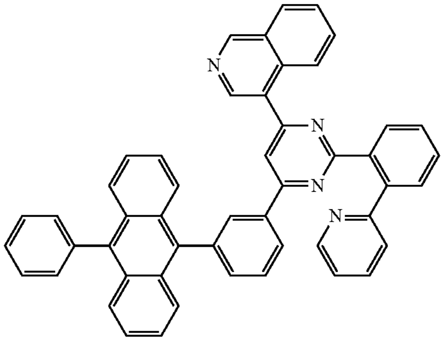
191
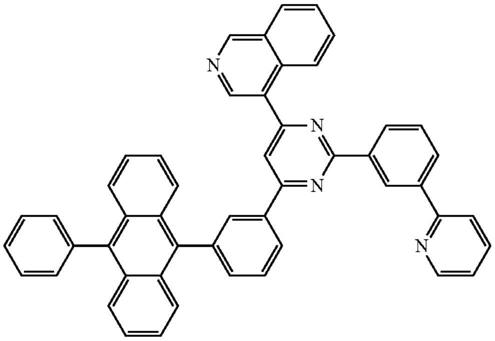
192
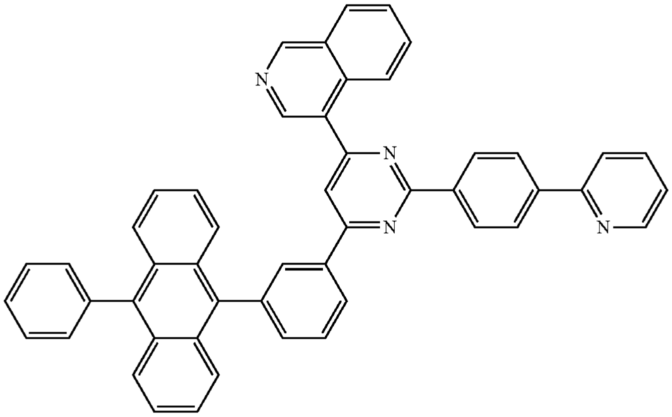

-continued
193
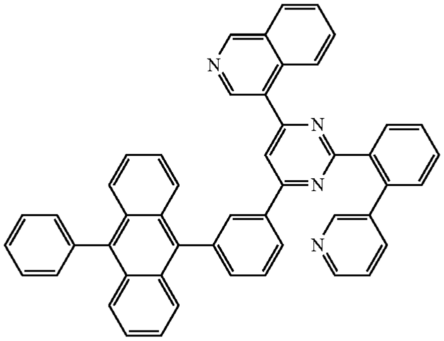
194
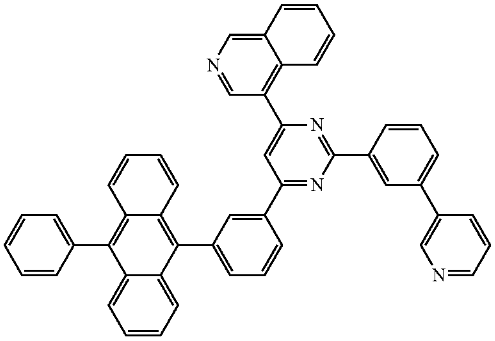
195
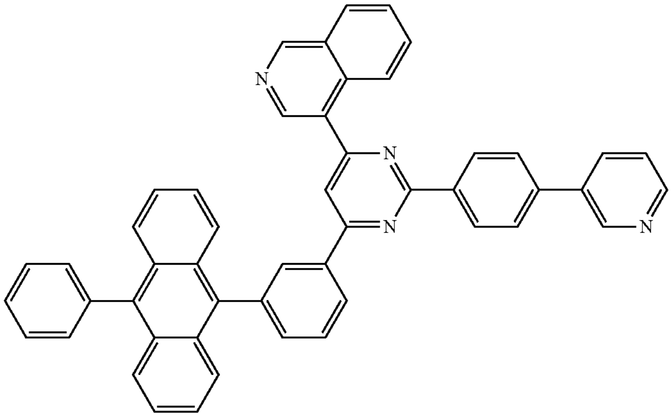
196
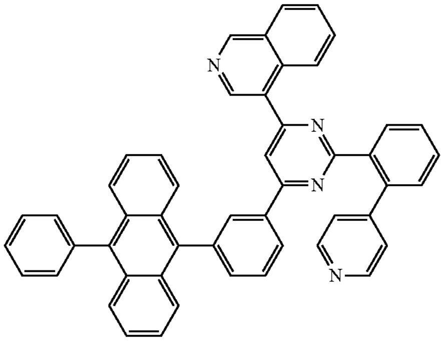
197
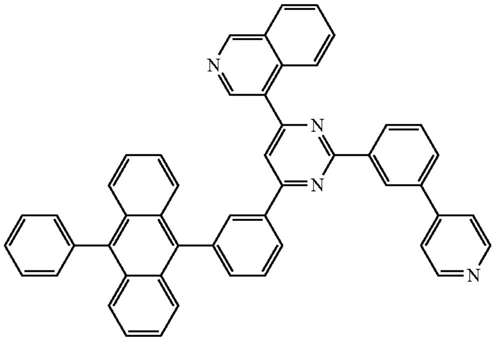
198
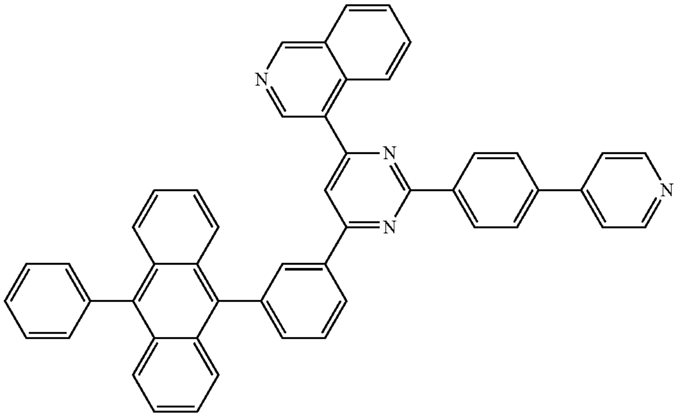

-continued
199
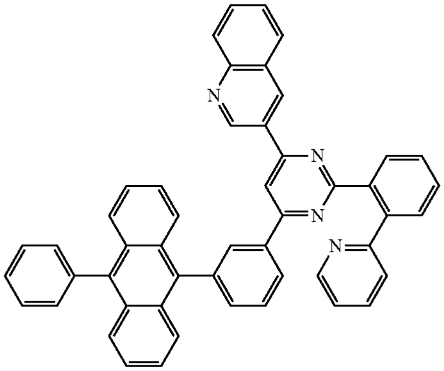
200
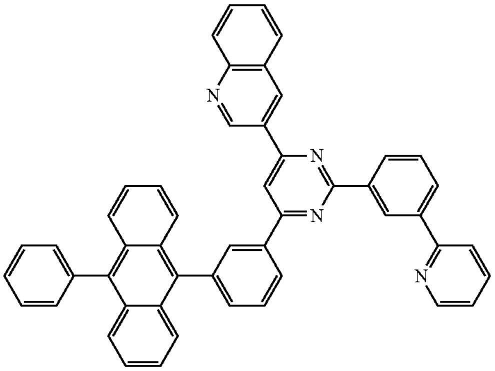
201
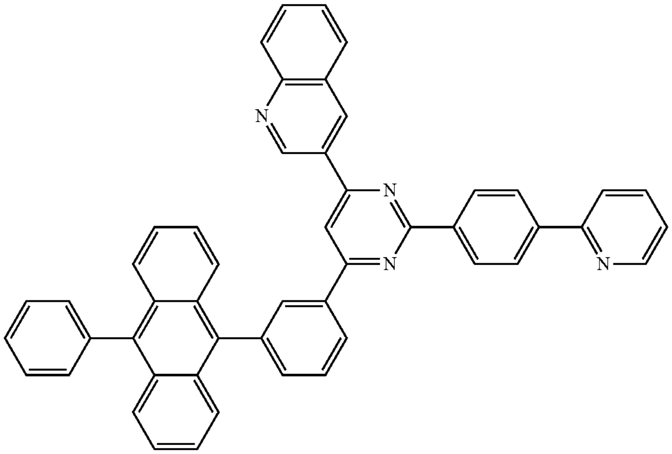
202
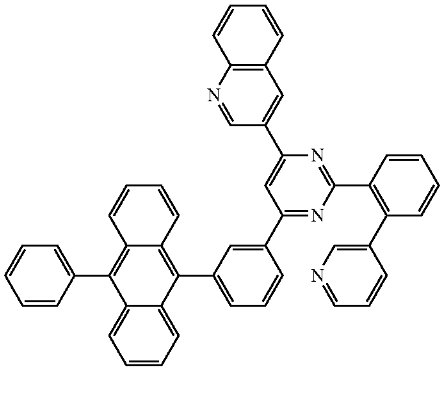
203
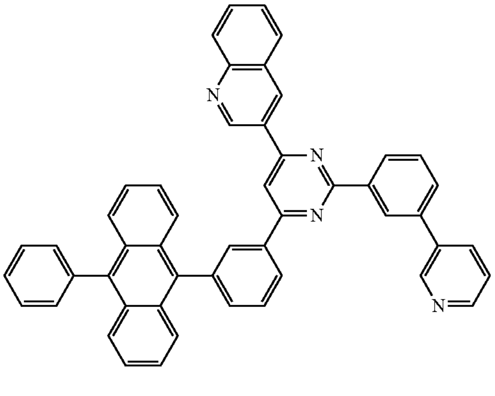

-continued
204
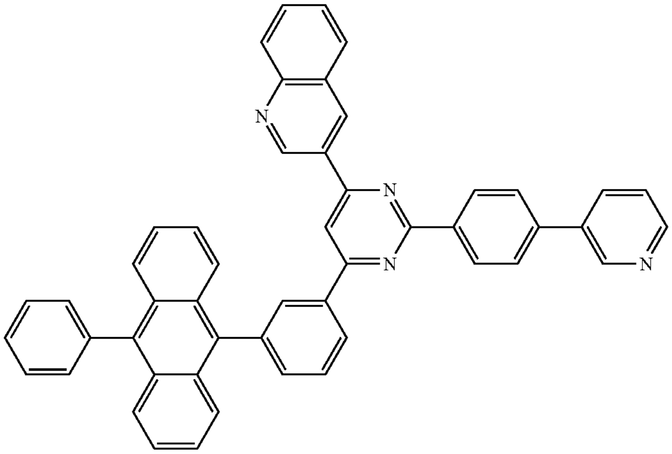
205
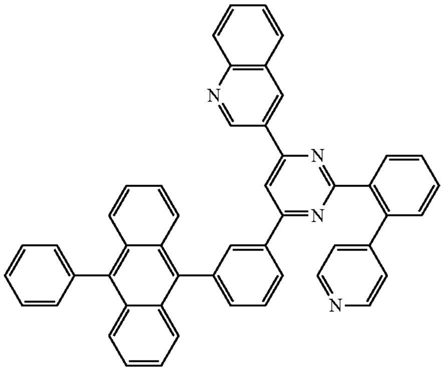
206
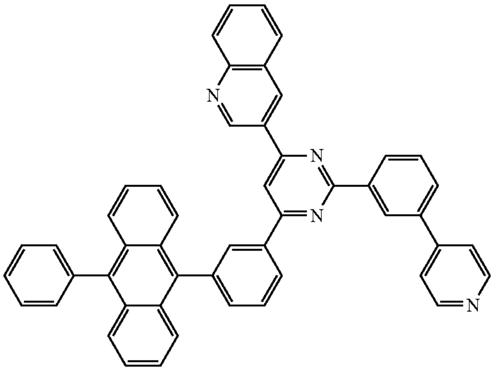
207
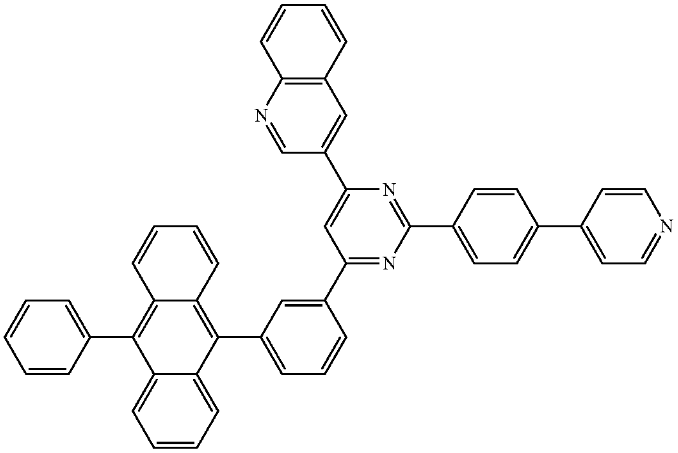
208
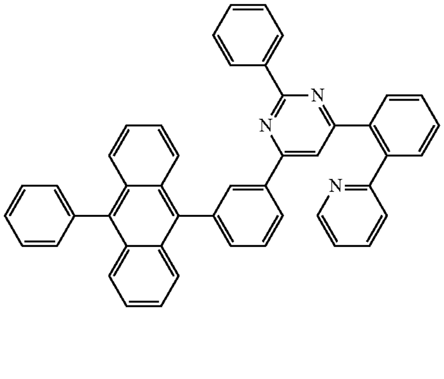
209
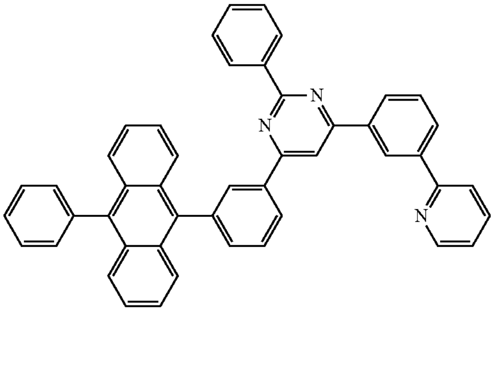

-continued
210
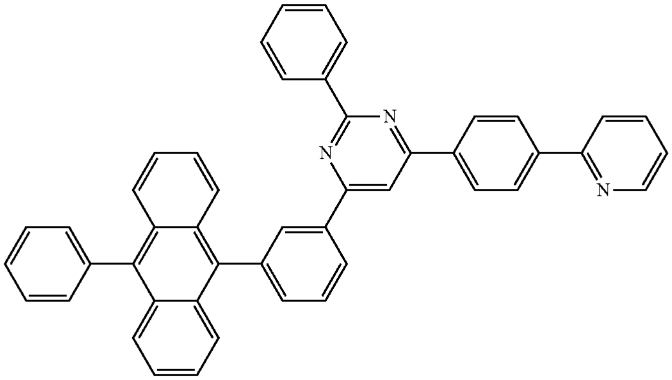
211
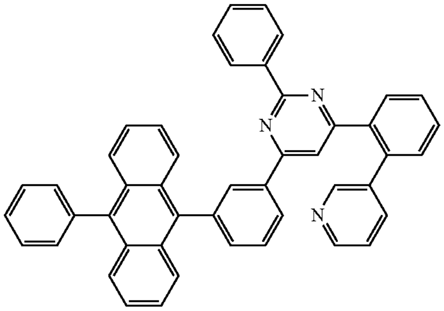
212
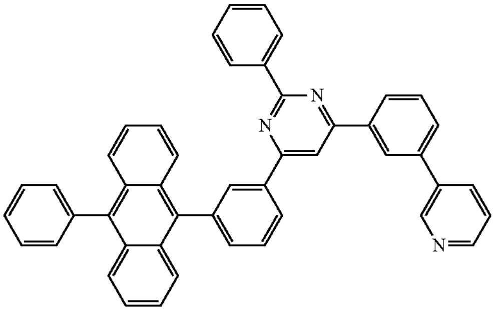
213
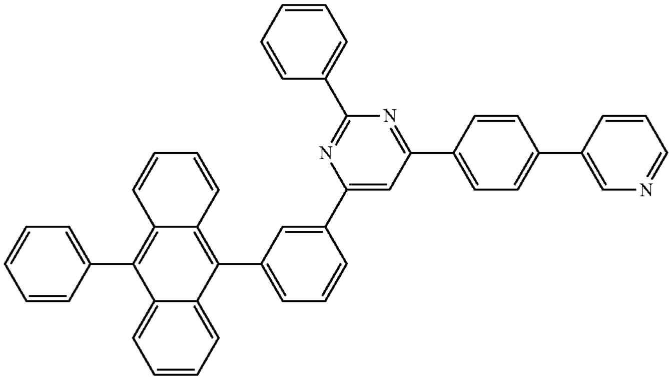
214
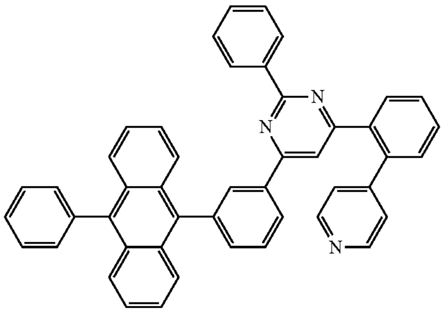
215
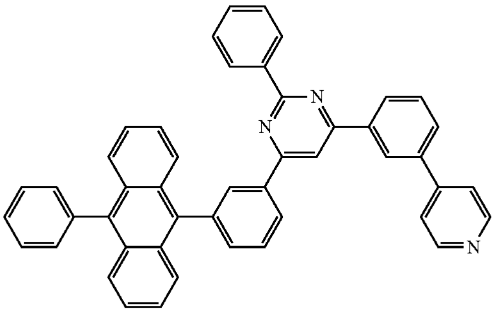

-continued
216
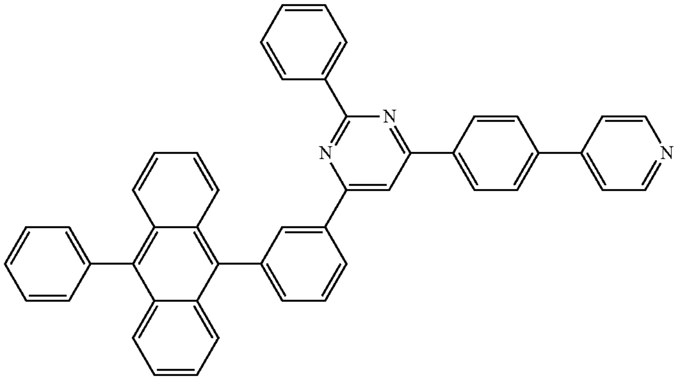
217
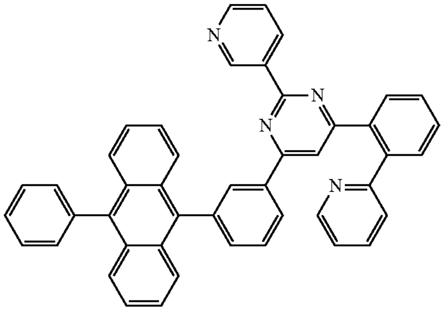
218
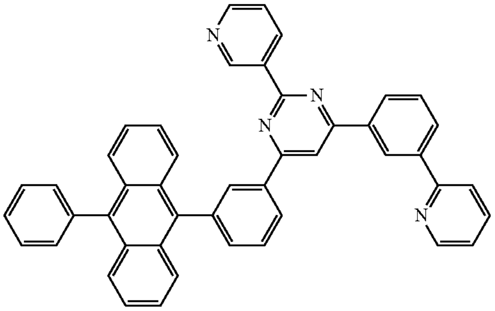
219
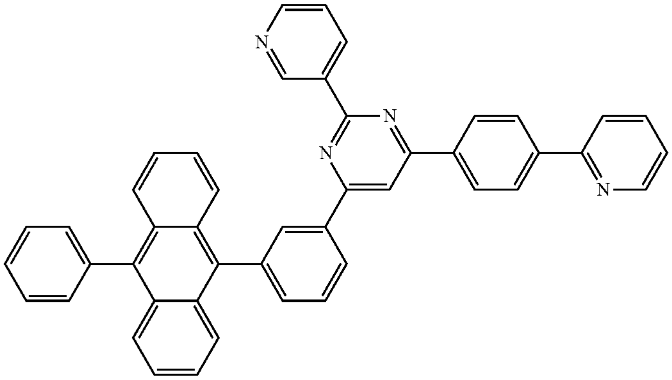
220
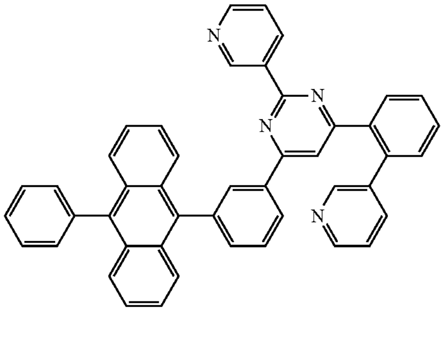
221
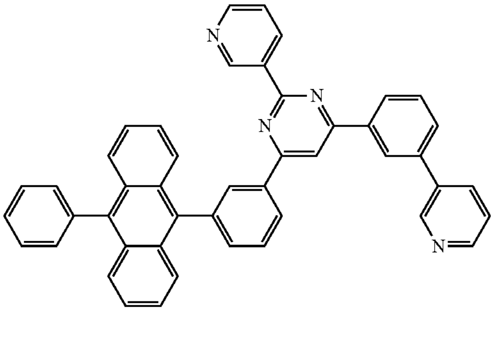

-continued
222
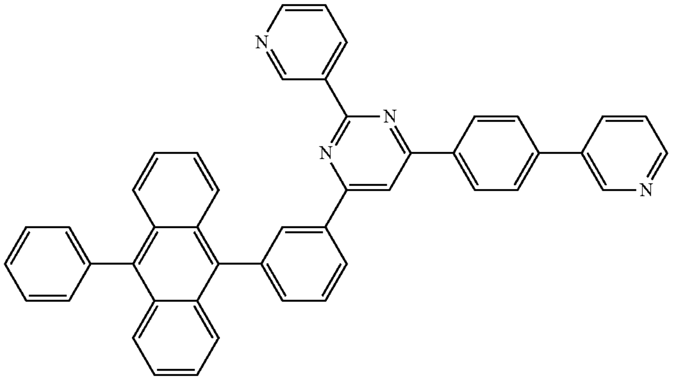
223
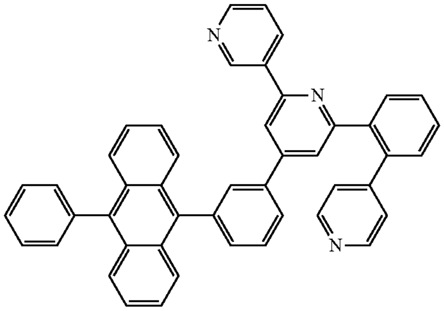
224
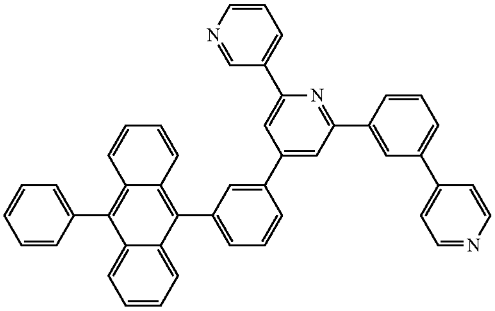
225
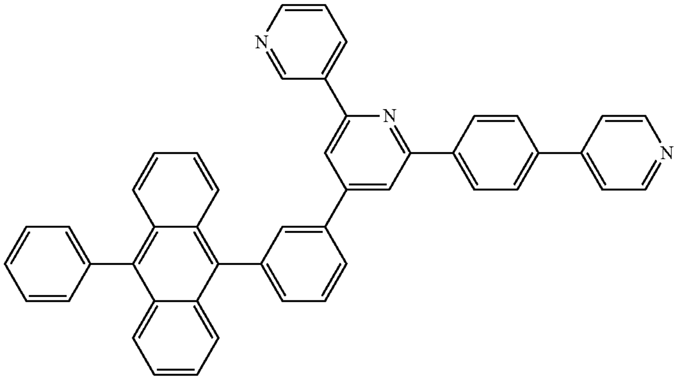
226
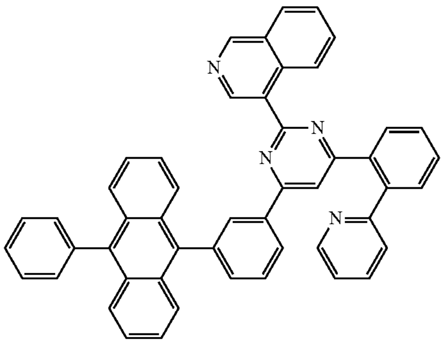
227
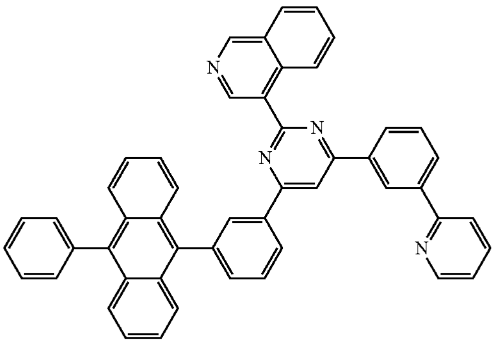

-continued
228
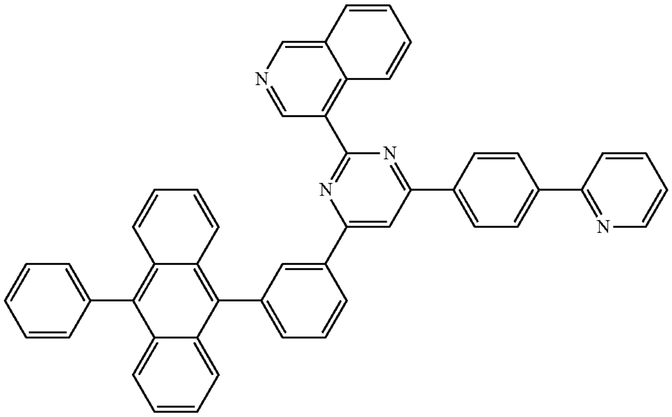
229
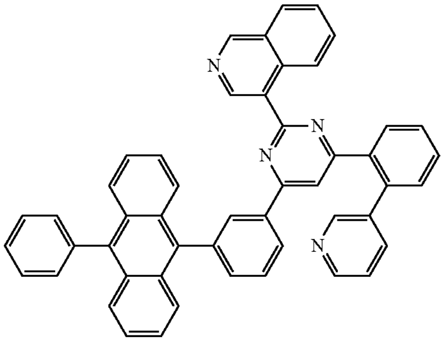
230
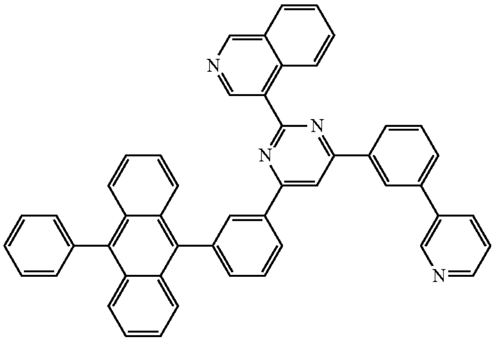
231
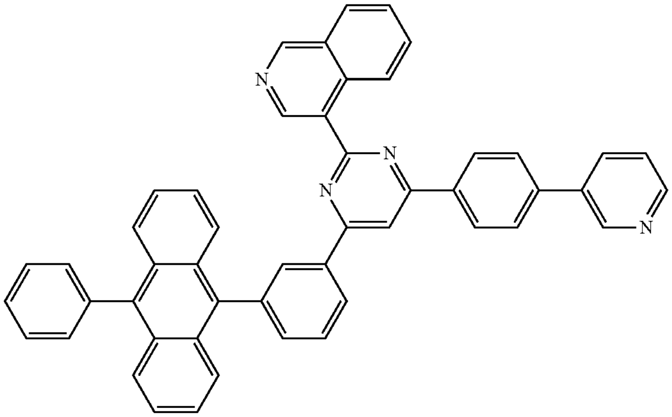
232
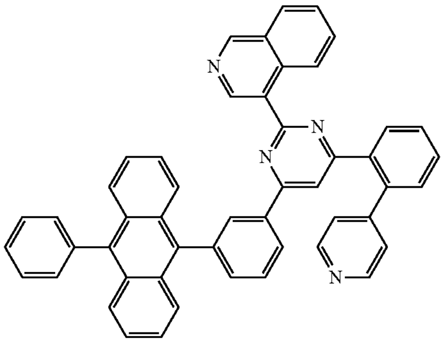
233
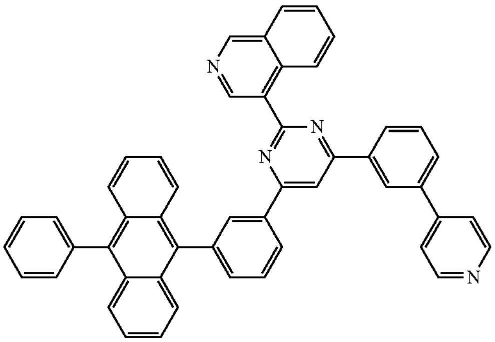

-continued
234
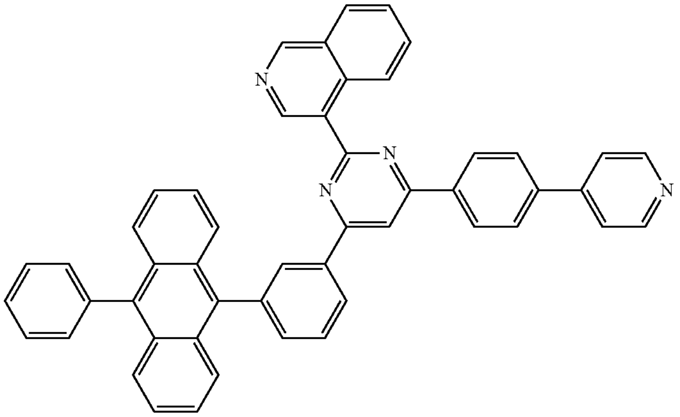
235
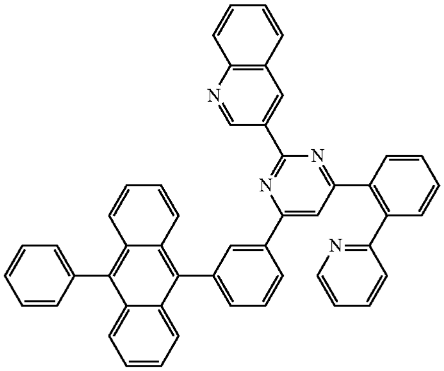
236
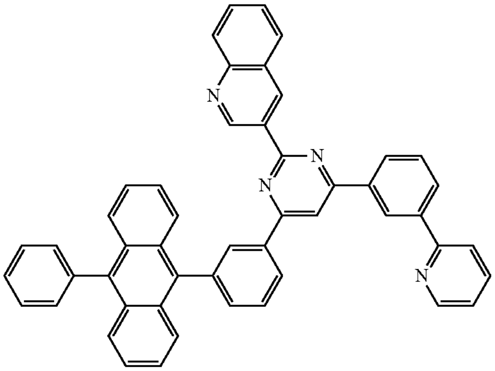
237
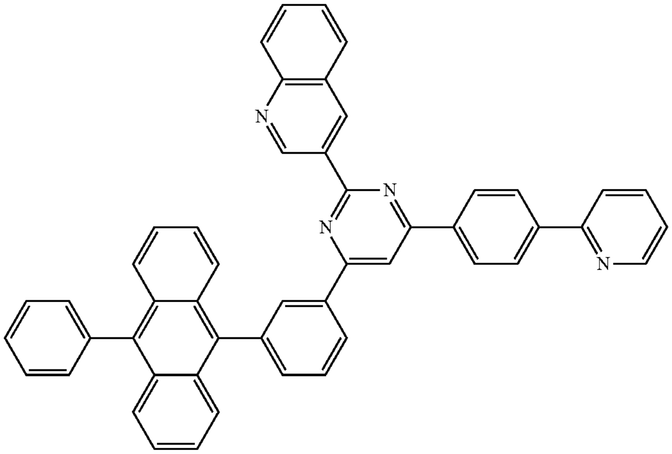
238
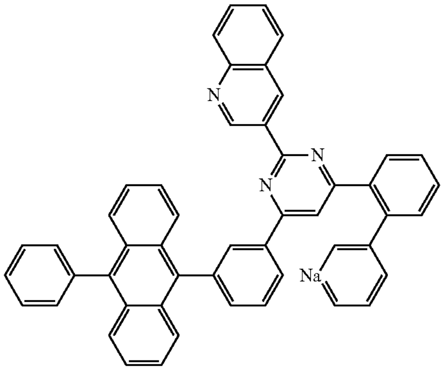
239
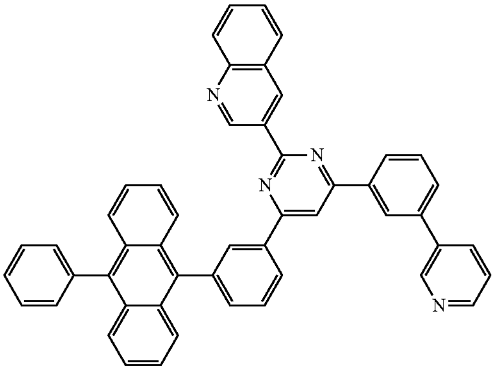

-continued
240
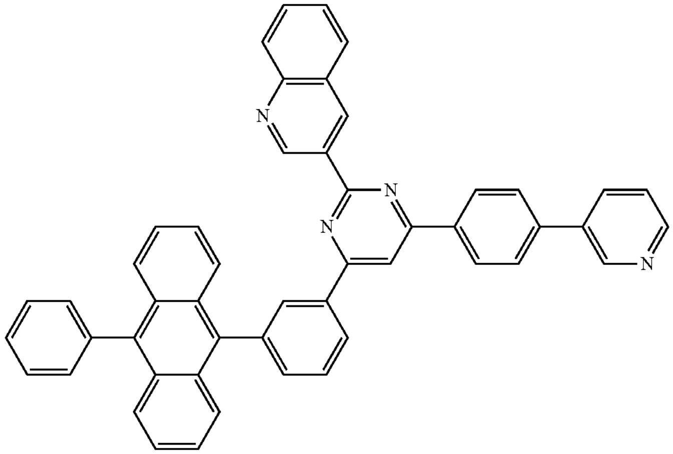
241
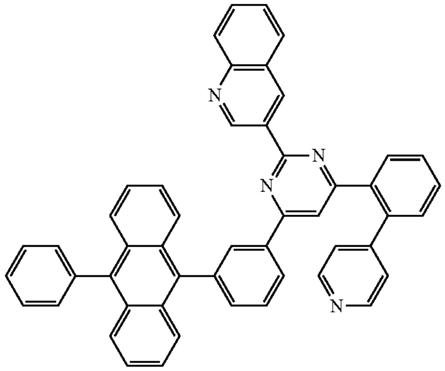
242
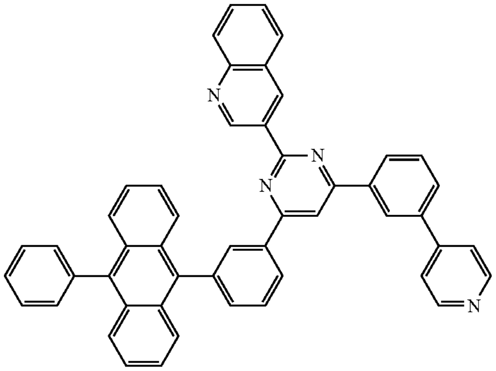
243
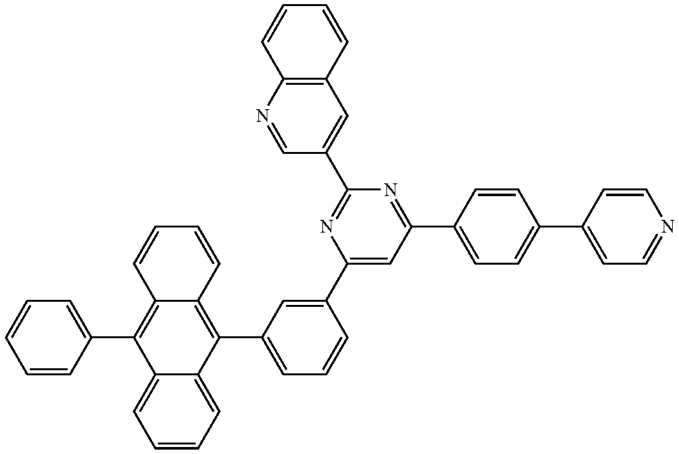
244
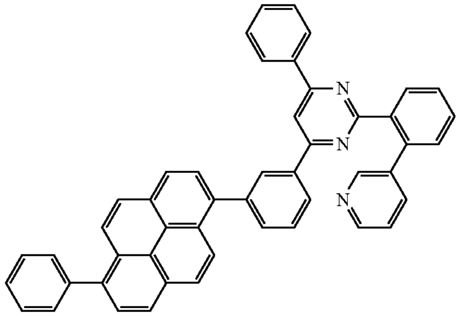
245
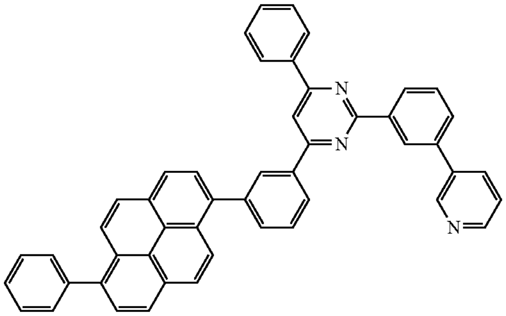

-continued
246
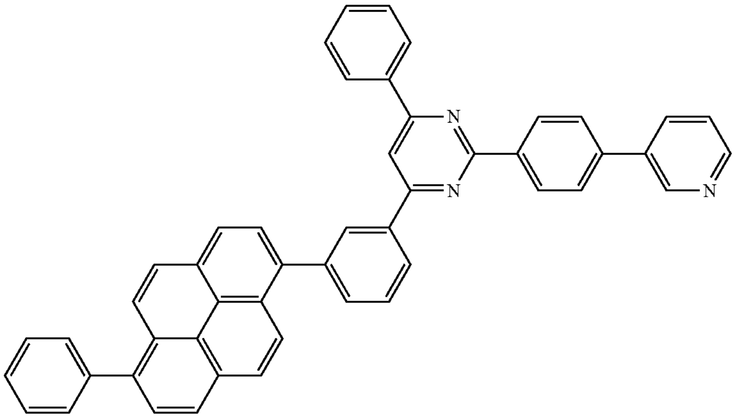
247
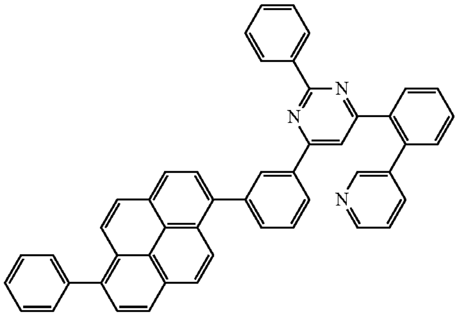
248
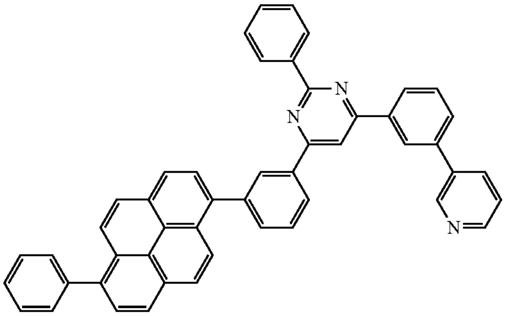
249
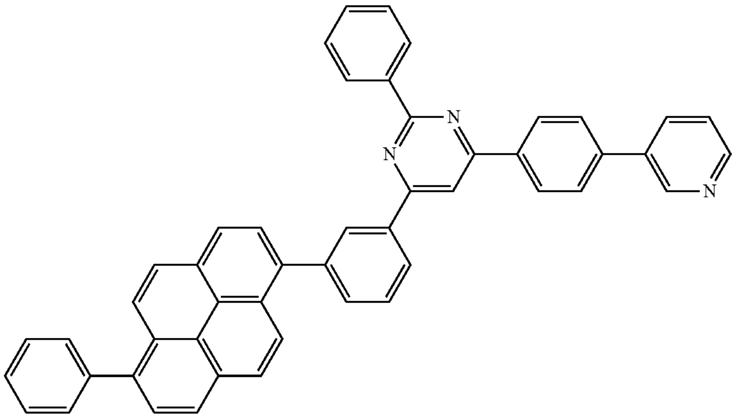
250
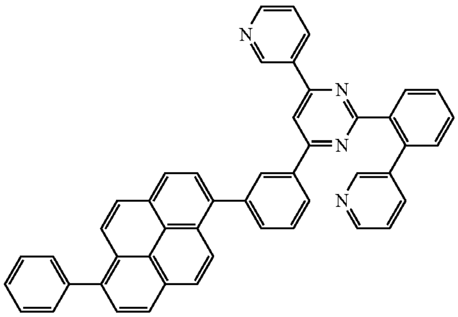
251
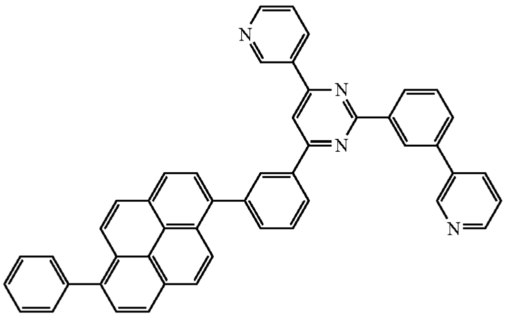

-continued
252
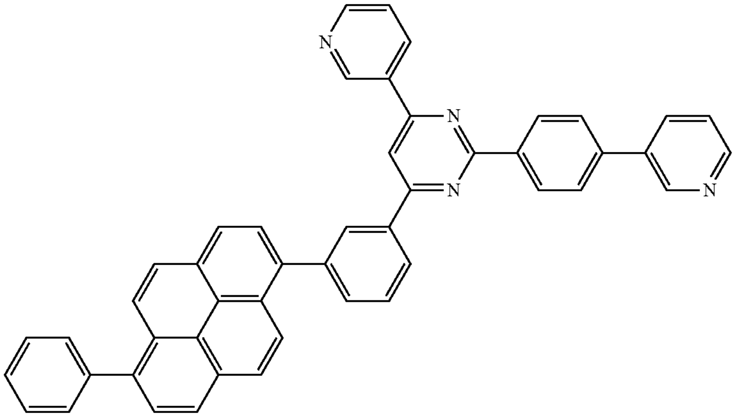
253
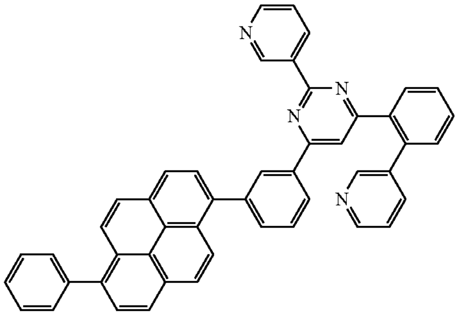
254
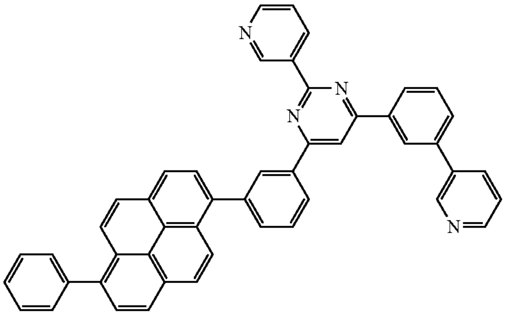
255
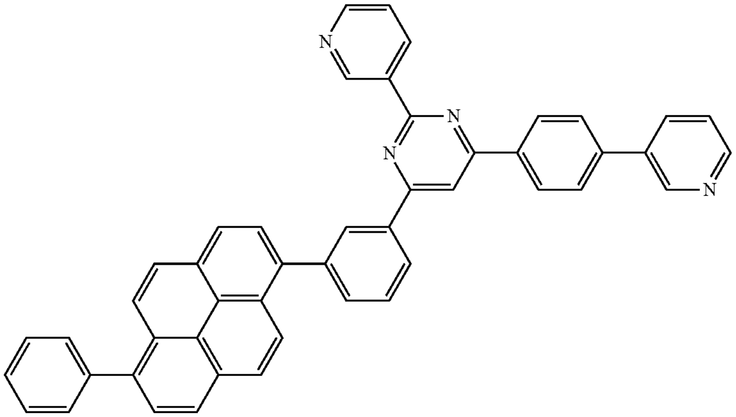
256
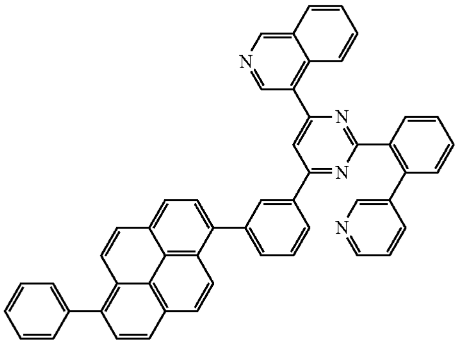
257
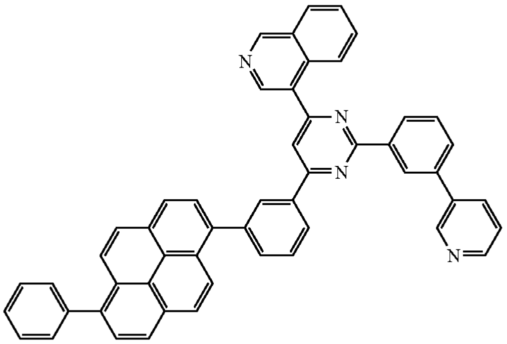

-continued
258
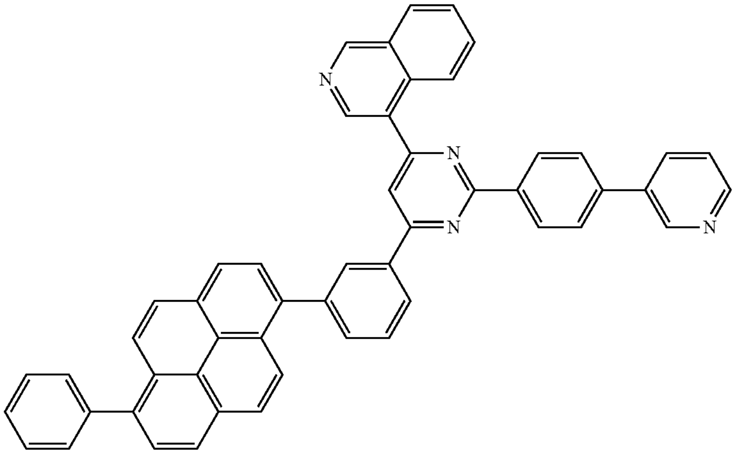
259
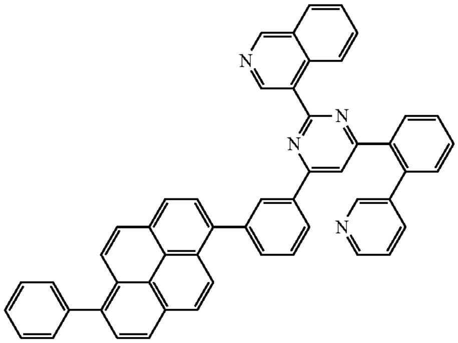
260
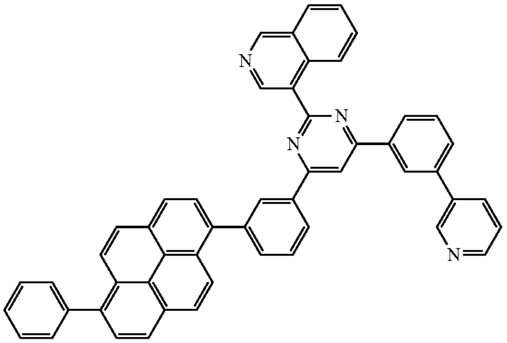
261
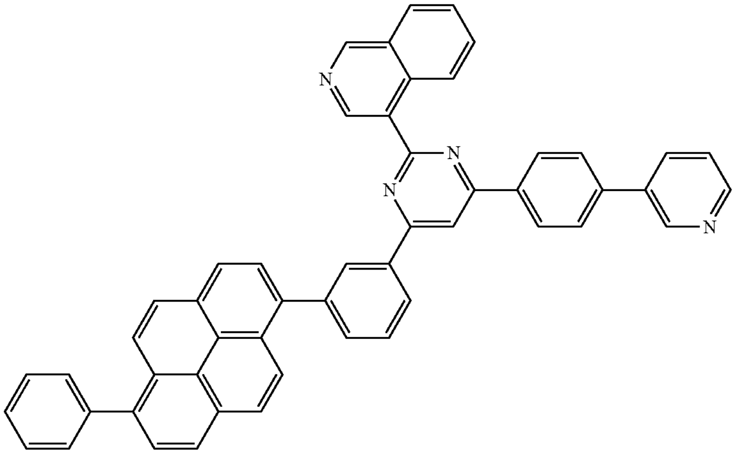
262
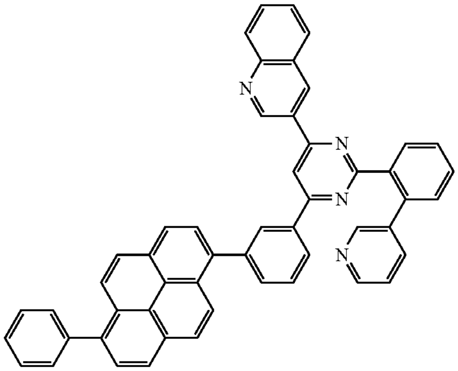
263
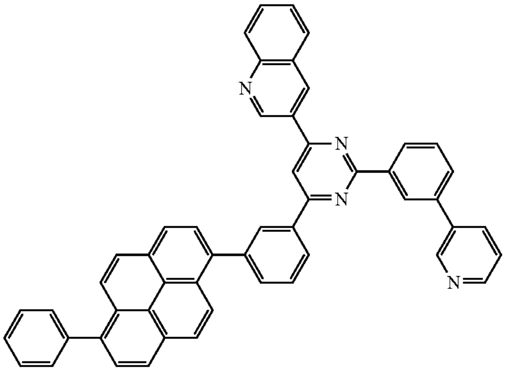

-continued

264

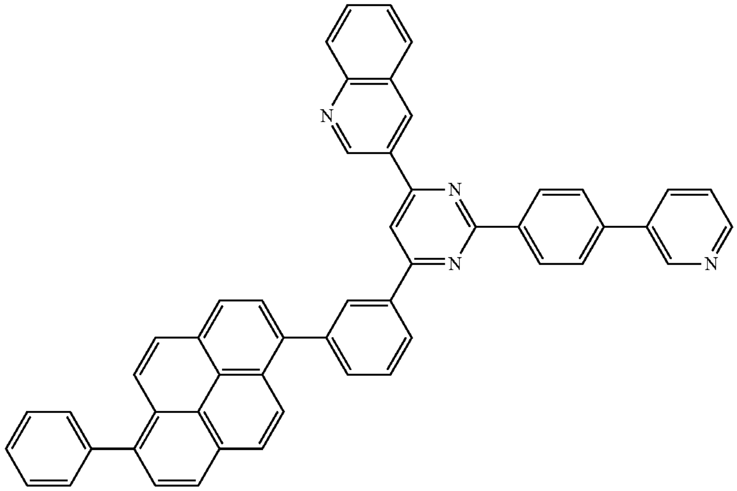

265

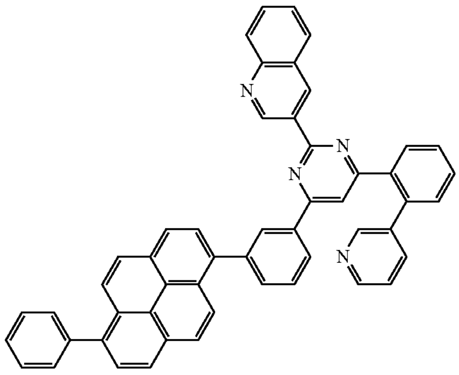

266

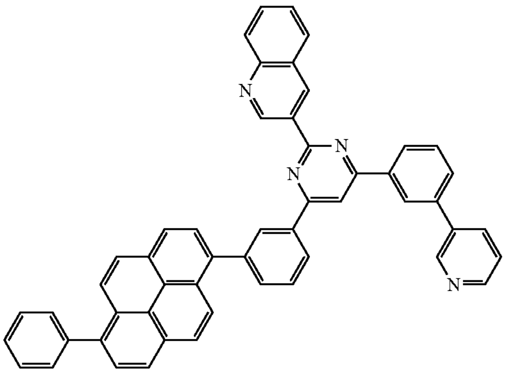

267

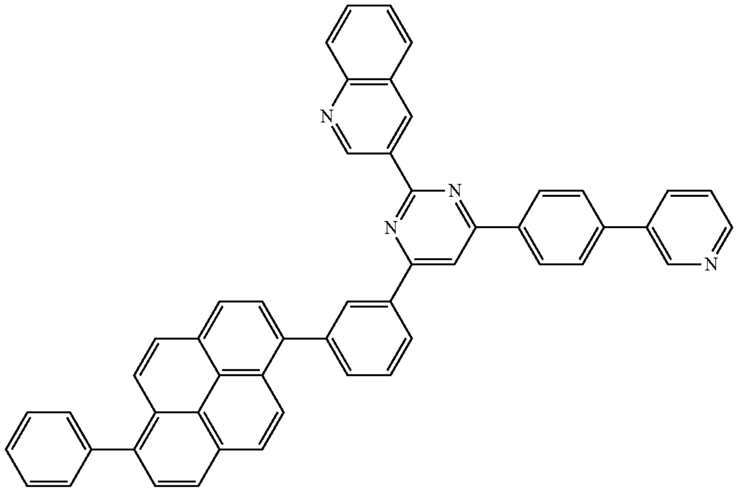

The electron transport material represented by Formula 1 has excellent electron transport capability. Accordingly, an organic light-emitting device including the electron transport material may have high efficiency.

The electron transport material represented by Formula 1 has excellent durability. Accordingly, an organic light-emitting device including the electron transport material may have high thermal stability.

The electron transport material represented by Formula 1 undergoes relatively small change in an electron transport capability according to temperature. Accordingly, an organic light-emitting device having relatively small change in device characteristics according to temperature is provided.

A thickness of the electron transport layer may be in a range of about 100 Å to about 1,000 Å, for example, about 150 Å to about 500 Å. In one embodiment, when the thickness of the electron transport layer is within the range described above, the electron transport layer has satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

ET-D1

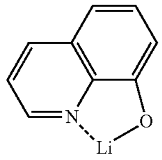

ET-D2

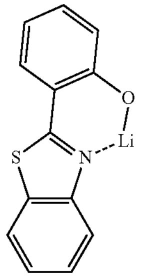

The electron transport region may include an electron injection layer that allows electrons to be easily provided from the second electrode 190.

The electron injection layer may be formed on the electron transport layer by using (utilizing) various suitable methods, such as vacuum deposition, spin coating casting, an LB method, ink-jet printing, laser-printing, or laser-induced thermal imaging. When an electron injection layer is formed by vacuum deposition or spin coating, the deposition and coating conditions for the electron injection layer may be determined by referring to the deposition and coating conditions for the hole injection layer.

The electron injection layer may include at least one selected from, LiF, NaCl, CsF, $Li_2O$, BaO, and LiQ.

A thickness of the electron injection layer may be in a range of about 1 Å to about 100 Å, for example, about 3 Å to about 90 Å. In one embodiment, when the thickness of the electron injection layer is within the range described above, the electron injection layer has satisfactory electron injection characteristics without a substantial increase in driving voltage.

The second electrode is disposed on the organic layer 130 having such a structure. The second electrode 190 may be a cathode which is an electron injection electrode, and in this regard, a material for the second electrode 190 may be metal, an alloy, an electrically conductive compound, and a mixture thereof, which have a relatively low work function. Examples of the second electrode 190 are lithium (Li), magnesium (Mg), aluminum (Al), aluminum-lithium (Al—Li), calcium (Ca), magnesium-indium (Mg—In), and magnesium-silver (Mg—Ag). According to another embodiment, the material for forming the second electrode 190 may be ITO or IZO. The second electrode 190 may be a reflective electrode, a semi-transmissive electrode, or a transmissive electrode.

Typically (in a comparable device), an organic light-emitting device including a material having excellent electron transport characteristics has high efficiency. However, its lifespan is short.

An organic light-emitting device including the electron transport material represented by Formula 1 and the hole transport material represented by Formula 2 or 3 has high efficiency, due to high electron transport capability of the electron transport material represented by Formula 1.

An organic light-emitting device including the electron transport material represented by Formula 1 and the hole transport material represented by Formula 2 or 3 has improved lifespan characteristics, due to the simultaneous inclusion of the electron transport material represented by Formula 1 and the hole transport material represented by Formula 2 or 3.

Hereinbefore, the organic light-emitting device has been described with reference to the drawing, but is not limited thereto.

A $C_1$-$C_{60}$ alkyl group used herein refers to a linear or branched aliphatic hydrocarbon monovalent group having 1 to 60 carbon atoms, and examples thereof are a methyl group, an ethyl group, a propyl group, an isobutyl group, a sec-butyl group, a ter-butyl group, a pentyl group, an isoamyl group, and a hexyl group. A $C_1$-$C_{60}$ alkylene group used herein refers to a divalent group having the same structure as the $C_1$-$C_{60}$ alkyl group.

A $C_1$-$C_{60}$ alkoxy group used herein refers to a monovalent group represented by —$OA_{101}$ (wherein $A_{101}$ is the $C_1$-$C_{60}$ alkyl group), and examples thereof are a methoxy group, an ethoxy group, and an isopropyloxy group.

A $C_2$-$C_{60}$ alkenyl group used herein refers to a hydrocarbon group formed by substituting at least one carbon double bond in the middle or terminal of the $C_2$-$C_{60}$ alkyl group, and examples thereof are an ethenyl group, a prophenyl group, and a butenyl group. A $C_2$-$C_{60}$ alkenylene group used herein refers to a divalent group having the same structure as the $C_2$-$C_{60}$ alkenyl group.

A $C_2$-$C_{60}$ alkynyl group used herein refers to a hydrocarbon group formed by substituting at least one carbon triple bond in the middle or terminal of the $C_2$-$C_{60}$ alkyl group, and examples thereof are an ethynyl group, and a propynyl group. A $C_2$-$C_{60}$ alkynylene group used herein refers to a divalent group having the same structure as the $C_2$-$C_2$ alkynyl group.

A $C_3$-$C_{10}$ cycloalkyl group used herein refers to a monovalent hydrocarbon monocyclic group having 3 to 10 carbon atoms, and examples thereof are a cyclopropyl group, a cyclobutyl group, a cyclopentyl group, a cyclohexyl group, and a cycloheptyl group. A $C_3$-$C_{10}$ cycloalkylene group used herein refers to a divalent group having the same structure as the $C_3$-$C_{10}$ cycloalkyl group.

A $C_1$-$C_{10}$ heterocycloalkyl group used herein refers to a monovalent monocyclic group having at least one hetero atom selected from N, O, P, and S as a ring-forming atom and 1 to 10 carbon atoms, and examples thereof are a tetrahydrofuranyl group, and a tetrahydrothiophenyl group. A $C_1$-$C_{10}$ heterocycloalkylene group used herein refers to a divalent group having the same structure as the $C_1$-$C_{10}$ heterocycloalkyl group.

A $C_3$-$C_{10}$ cycloalkenyl group used herein refers to a monovalent monocyclic group that has 3 to 10 carbon atoms and at least one double bond in the ring thereof and does not have aromacity, and examples thereof are a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

A $C_1$-$C_{10}$ heterocycloalkenyl group used herein refers to a monovalent monocyclic group that has at least one hetero atom selected from N, O, P, and S as a ring-forming atom, 1 to 10 carbon atoms, and at least one double bond in its ring. Examples of the $C_1$-$C_{10}$ heterocycloalkenyl group are a 2,3-hydrofuranyl group and a 2,3-hydrothiophenyl group. A $C_1$-$C_{10}$ heterocycloalkenylene group used herein refers to a divalent group having the same structure as the $C_1$-$C_{10}$ heterocycloalkenyl group.

A $C_6$-$C_{60}$ aryl group used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_1$-$C_{60}$ heteroaryl group used herein refers to a monovalent group having a carboncyclic aromatic system that has at least one hetero atom selected from N, O, P, and S as a ring-forming atom, and 1 to 60 carbon atoms. A $C_1$-$C_{60}$ heteroarylene group used herein refers to a divalent group having a carbocyclic aromatic system that has at least one hetero atom selected from N, O, P, and S as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

A $C_6$-$C_{60}$ aryloxy group used herein may be represented by —$OA_{102}$ (wherein $A_{102}$ is the $C_6$-$C_{60}$ aryl group), and a $C_6$-$C_{60}$ arylthio group may be represented by —$SA_{103}$ (wherein $A_{103}$ is the $C_6$-$C_{60}$ aryl group).

A monovalent non-aromatic condensed polycyclic group used herein refers to a monovalent group that has two or more rings condensed to each other, only carbon atoms (for example, the number of carbon atoms may be in a range of 8 to 60) as a ring forming atom, and non-aromacity in the entire molecular structure. An example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic condensed heteropolycyclic group used herein refers to a monovalent group that has two or more rings condensed to each other, has a heteroatom selected from N, O P, and S other than carbon atoms (for example, the number of carbon atoms may be in a range of 1 to 60) as a ring forming atom, and has non-aromacity in the entire molecular structure. An example of the monovalent non-aromatic condensed heteropolycyclic group is a carbazolyl group. A divalent non-aromatic condensed heteropolycyclic group used herein refers to a divalent group having the same structure as the monovalent non-aromatic condensed heteropolycyclic group.

At least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arythio group, the substituted $C_1$-$C_{60}$ heteroaryl group, the substituted monovalent non-aromatic condensed polycyclic group, the substituted monovalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, and the substituted $C_1$-$C_{60}$ alkoxy group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a furinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzolmidazolyl group, a benzofuranyl group, a benzothiophenyl group, an isobenzothiazolyl group, a benzooxazolyl group, isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, —$N(Q_{11})(Q_{12})$, —$Si(Q_{13})(Q_{14})(Q_{15})$, and —$B(Q_{16})(Q_{17})$;

a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cynolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group;

a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cynolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, —N($Q_{21}$)($Q_{22}$), —Si($Q_{23}$)($Q_{24}$) ($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$) ($Q_{37}$), wherein $Q_1$ to $Q_7$, $Q_{11}$ to $Q_{17}$, $Q_{21}$ to $Q_{27}$, and $Q_{31}$ to $Q_{37}$ may be each independently selected from a hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cycloheptenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cynolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group.

The term "Ph" used herein refers to a phenyl group, the term "Me" used herein refers to a methyl group, the term "Et" used herein refers to an ethyl group, and the term "ter-Bu" or "But" used herein refers to a tert-butyl.

Hereinafter, an organic light-emitting device according to an embodiment will be described in more detail with reference to Synthesis Examples and Examples. The wording "B was used (utilized) instead of A" used (utilized) in describing Synthesis Examples means that (refers to) a molar equivalent of A was identical to a molar equivalent of B.

EXAMPLE

Synthesis Example 1: Synthesis of Compound 20

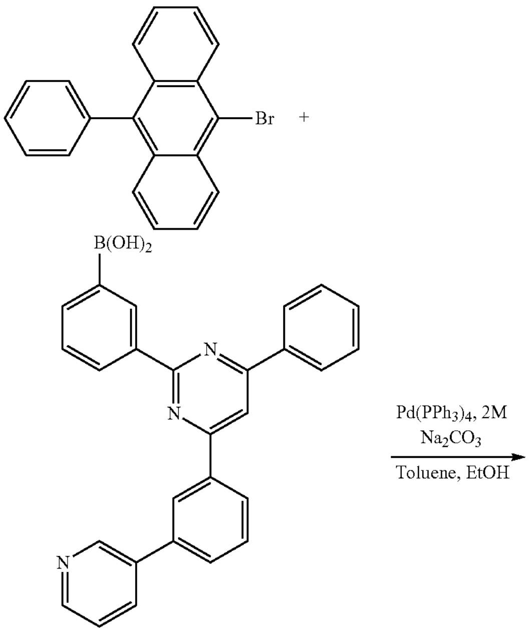

-continued

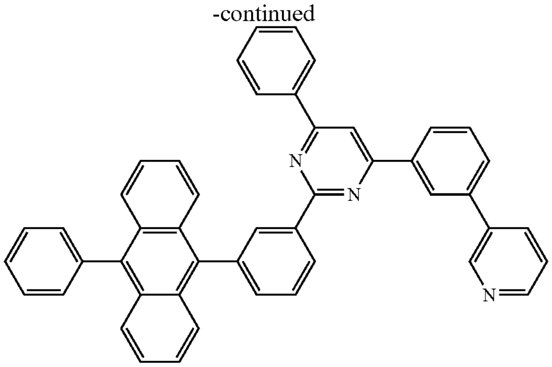

3.5 g (1 eq, 10.5 mmol) of 9-bromo-10-phenylanthracene, 4.75 g (1.05 eq, 11.07 mmol) of (3-(4-phenyl-6-(3-(pyridin-3-yl)phenyl)pyrimidin-2-yl)phenyl)boronic acid, and 485 mg (0.04 eq, 0.42 mmol) of tetrakis(triphenylphosphine) palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 4.34 g of Compound 20 (yield=65%).

1H-NMR: 9.26 (1H), 8.73 (1H), 8.43 (1H), 8.23 (2H), 7.91 (4H), 7.79 (5H), 7.57 (3H), 7.51 (8H), 7.41 (2H), 7.39 (4H), APCI-MS (m/z): 637.25 [M+]

Synthesis Example 2: Synthesis of Compound 23

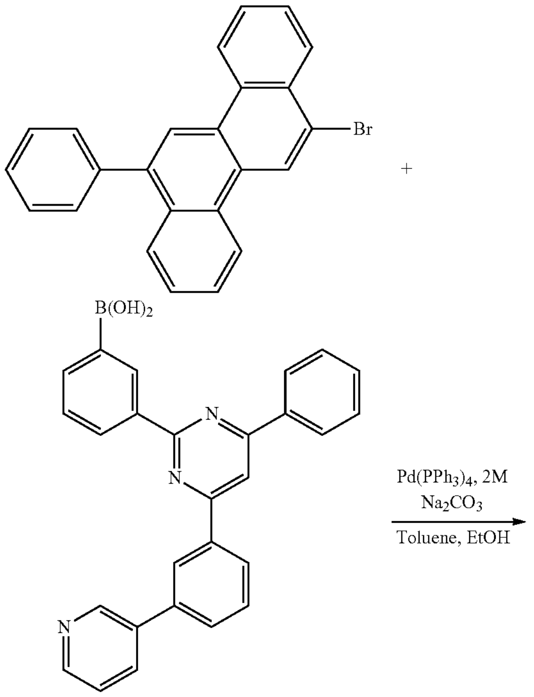

-continued

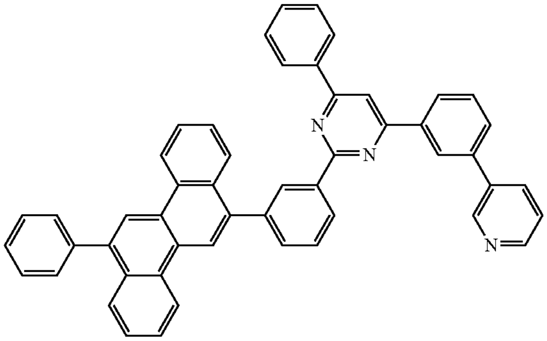

4.0 g (1 eq, 10.5 mmol) of 6-bromo-12-phenylchrysene, 4.75 g (1.05 eq, 11.07 mmol) of 3-(4-phenyl-6-(3-(pyridin-3-yl)phenyl)pyrimidin-2-yl)phenyl)boronic acid, and 485 mg (0.04 eq, 0.42 mmol) of tetrakis(triphenylphosphine) palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 5.00 g of Compound 23 (yield=70%).

1H-NMR: 9.26 (1H), 9.15 (1H), 8.93 (2H), 8.70 (1H), 8.42 (1H), 8.24 (2H), 8.12 (2H), 7.88~7.70 (12H), APCI-MS (m/z): 687.27 [M+]

Synthesis Example 3: Synthesis of Compound 26

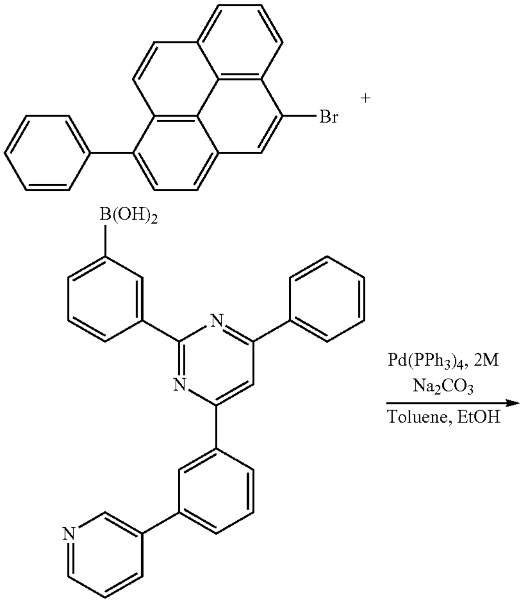

-continued

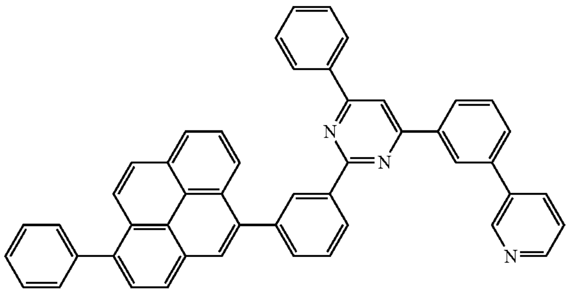

3.7 g (1 eq, 10.5 mmol) of 5-bromo-1-phenylpyrene, 4.75 g (1.05 eq, 11.07 mmol) of 3-(4-phenyl-6-(3-(pyridin-3-yl)phenyl)pyrimidin-2-yl)phenyl)boronic acid, and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 4.37 g of Compound 26 (yield=63%).

1H-NMR: 9.26 (1H), 8.70 (1H), 8.42 (1H), 8.24 (2H), 8.12 (1H), 8.04 (1H), 7.88~7.51 (13H), 7.57~7.41 (11H), APCI-MS (m/z): 661.25 [M+]

Synthesis Example 4: Synthesis of Compound 47

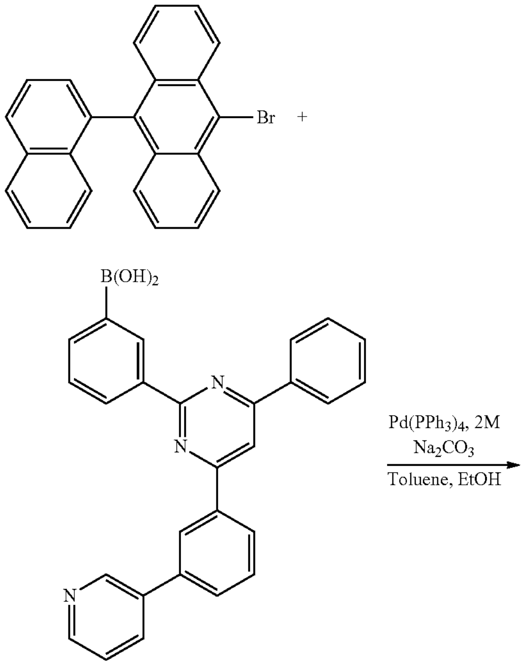

-continued

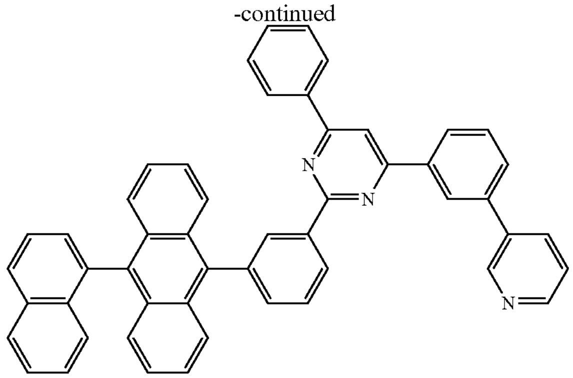

4.0 g (1 eq, 10.5 mmol) of 9-bromo-10-(naphthalen-1-yl)anthracene, 4.75 g (1.05 eq, 11.07 mmol) of 3-(4-phenyl-6-(3-(pyridin-3-yl)phenyl)pyrimidin-2-yl)phenyl)boronic acid, and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 5.26 g of Compound 47 (yield=73%).

1H-NMR: 9.26 (1H), 8.70 (1H), 8.51 (1H), 8.42 (2H), 8.23 (2H), 8.04 (2H), 8.24 (4H) 7.91 (4H) 7.79~7.70 (5H), 7.61~7.41 (15H), APCI-MS (m/z): 687.27 [M+]

Synthesis Example 5: Synthesis of Compound 50

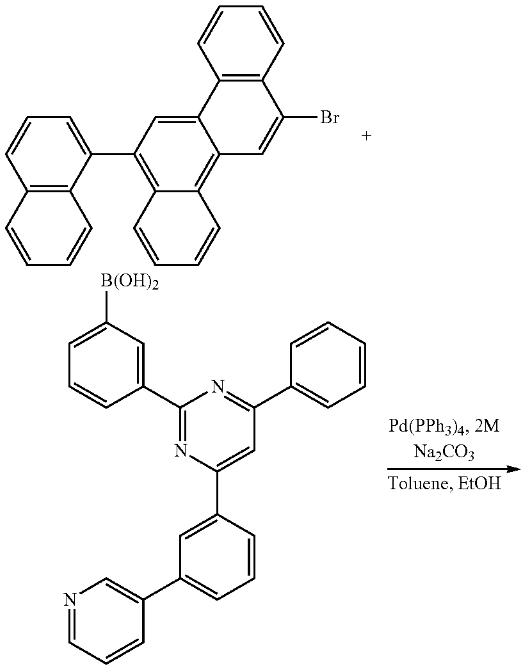

-continued

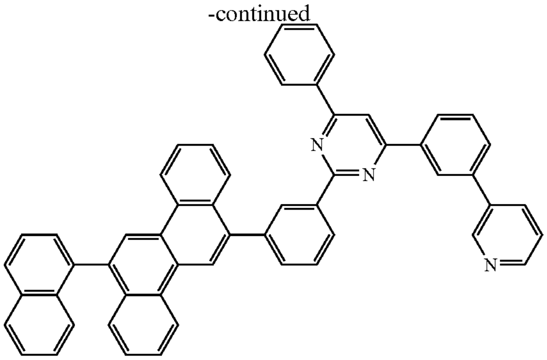

4.5 g (1 eq, 10.5 mmol) of 6-bromo-12-(naphthalen-1-yl) chrysene, 4.75 g (1.05 eq, 11.07 mmol) of 3-(4-phenyl-6-(3-(pyridin-3-yl)phenyl)pyrimidin-2-yl)phenyl)boronic acid, and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 5.03 g of Compound 50 (yield=65%).

1H-NMR: 9.26 (1H), 9.15 (1H), 8.92 (2H), 8.70 (1H), 8.27 (1H), 8.42 (2H), 8.24 (2H) 8.12 (4H) 7.93~7.79 (10H), 7.61~7.41 (11H), APCI-MS (m/z): 737.28 [M+]

Synthesis Example 6: Synthesis of Compound 74

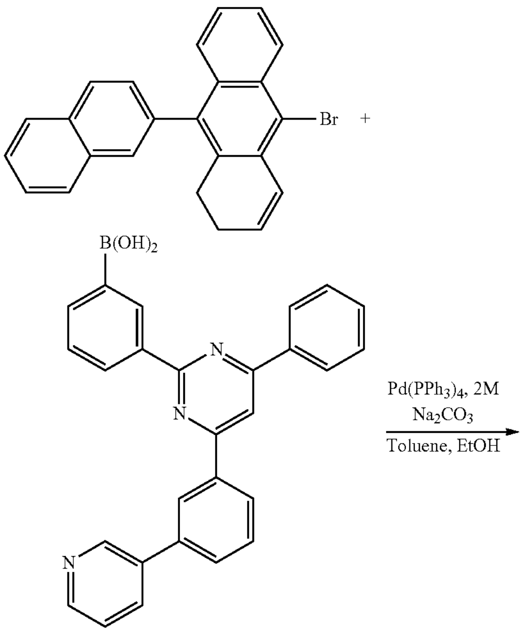

-continued

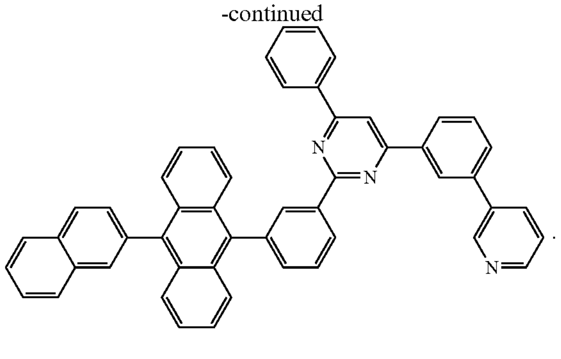

4.0 g (1 eq, 10.5 mmol) of 9-bromo-10-(naphthalen-2-yl) anthracene, 4.75 g (1.05 eq, 11.07 mmol) of 3-(4-phenyl-6-(3-(pyridin-3-yl)phenyl)pyrimidin-2-yl)phenyl)boronic acid, and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 5.12 g of Compound 74 (yield=71%).

1H-NMR: 9.26 (1H), 8.70 (1H), 8.51 (1H), 8.24 (2H), 8.04~7.79 (7H), 7.79~7.70 (6H), 7.61~7.41 (15H), APCI-MS (m/z): 687.27 [M+]

Synthesis Example 7: Synthesis of Compound 77

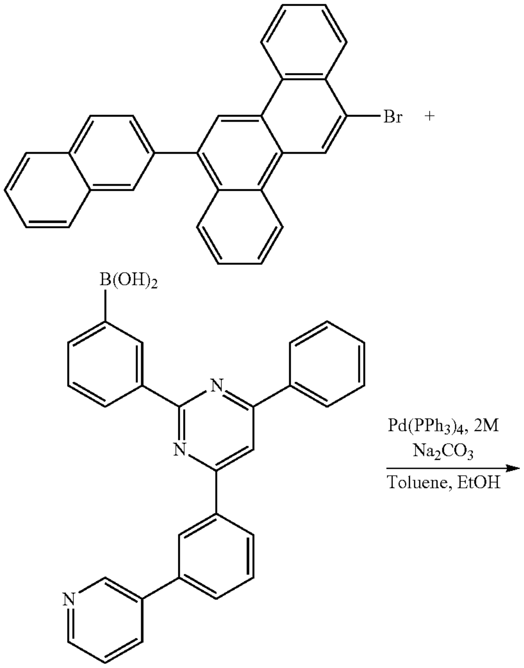

-continued

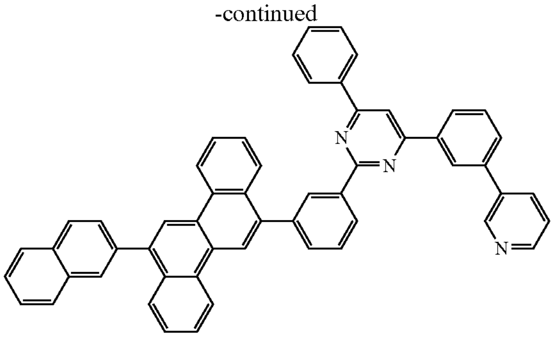

4.53 g (1 eq, 10.5 mmol) of 6-bromo-12-(naphthalen-2-yl)chrysene, 4.75 g (1.05 eq, 11.07 mmol) of 3-(4-phenyl-6-(3-(pyridin-3-yl)phenyl)pyrimidin-2-yl)phenyl)boronic acid, and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 5.42 g of Compound 77 (yield=70%).

1H-NMR: 9.26 (1H), 8.70 (1H), 8.42 (1H), 8.24 (2H), 8.12 (1H), 8.04 (1H), 7.88~7.51 (13H), 7.57~7.41 (11H), APCI-MS (m/z): 661.25 [M+]

Synthesis Example 8: Synthesis of Compound 101

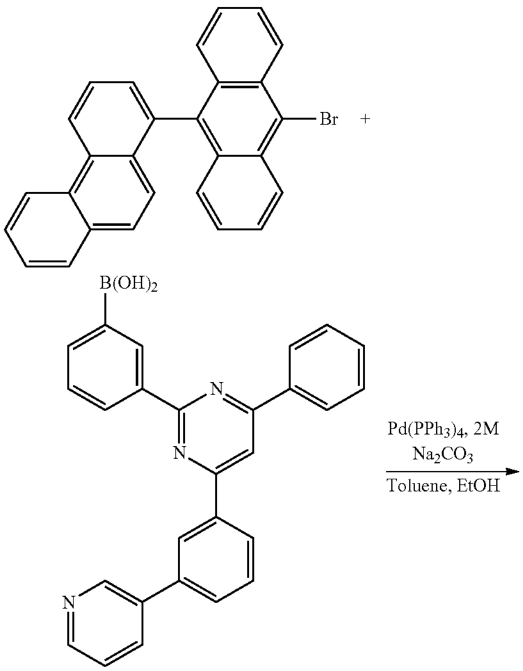

-continued

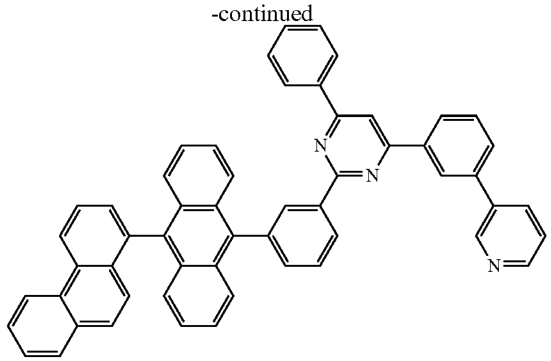

4.56 g (1 eq, 10.5 mmol) of 9-bromo-10-(phenanthren-9-yl)anthracene, 4.75 g (1.05 eq, 11.07 mmol) of 3-(4-phenyl-6-(3-(pyridin-3-yl)phenyl)pyrimidin-2-yl)phenyl)boronic acid, and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 5.42 g of Compound 101 (yield=70%).

1H-NMR: 9.26 (1H), 8.93 (2H), 8.70 (1H), 8.42 (1H), 8.23 (2H), 8.12 (2H), 7.88~7.70 (14H), 7.59~7.41 (12H), APCI-MS (m/z): 737.28 [M+]

Synthesis Example 9: Synthesis of Compound 122

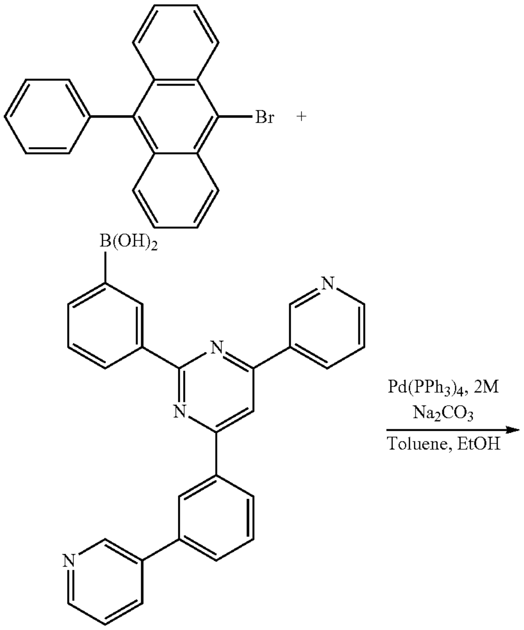

-continued

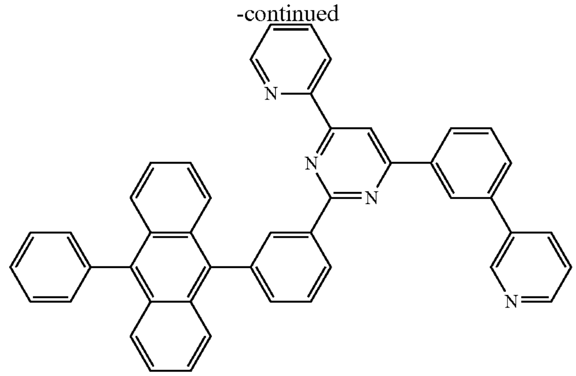

3.48 g (1 eq, 10.5 mmol) of 9-bromo-10-phenylanthracene, 4.76 g (1.05 eq, 11.07 mmol) of (3-(4-(pyridin-3-yl)-6-(3-(pyridin-3-yl)phenyl)pyrimidin-2-yl)phenyl)boronic acid, and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 5.42 g of Compound 122 (yield=70%).

1H-NMR: 9.26 (1H), 8.70 (1H), 8.42 (1H), 8.24 (2H), 8.12 (1H), 8.04 (1H), 7.88~7.51 (13H), 7.57~7.41 (11H), APCI-MS (m/z): 661.25 [M+]

Synthesis Example 10: Synthesis of Compound 140

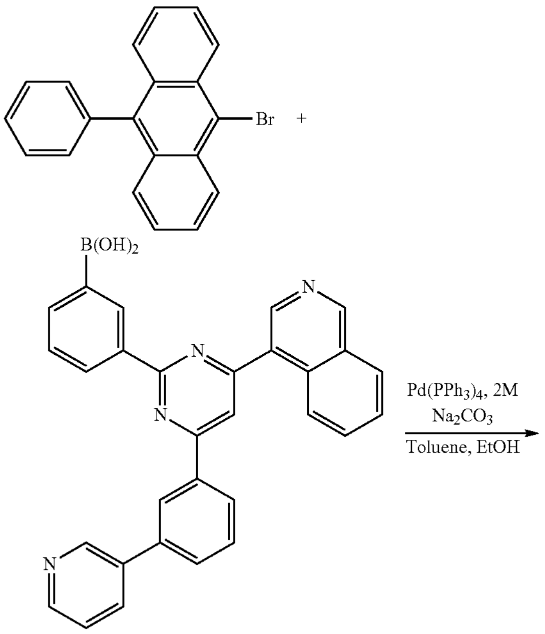

-continued

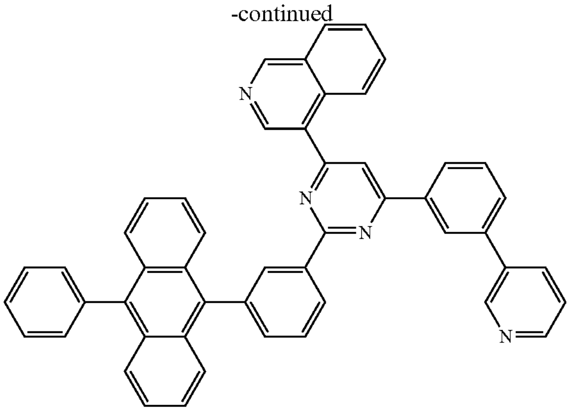

3.48 g (1 eq, 10.5 mmol) of 9-bromo-10-phenylanthracene, 5.31 g (1.05 eq, 11.07 mmol) of (3-(4-(isoquinolin-4-yl)-6-(3-(pyridin-3-yl)phenyl)pyrimidin-2-yl)phenyl)boronic acid, and 485 mg (0.04 eq, 0.42 mmol) of tetrakis (triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 4.48 g of Compound 140 (yield=62%).

1H-NMR: 9.26 (1H), 8.93 (1H), 8.70 (1H), 8.42 (2H), 8.23 (2H), 7.92 (5H), 7.75 (4H), 7.57~7.39 (16H), APCI-MS (m/z): 688.26 [M+]

Synthesis Example 11: Synthesis of Compound 149

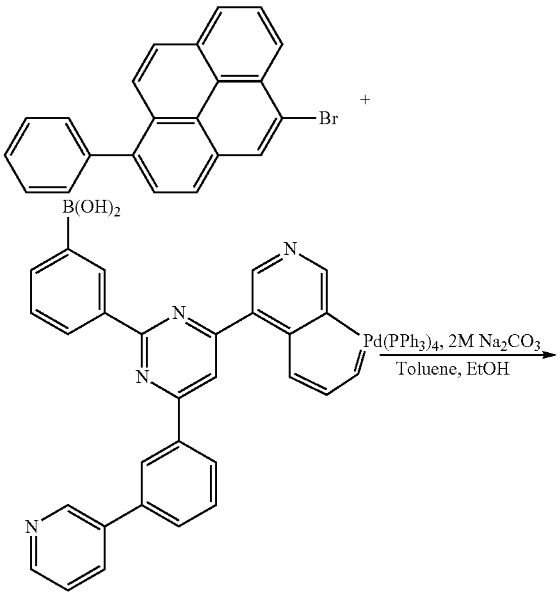

-continued

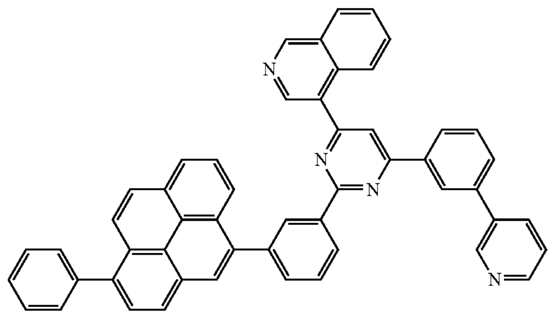

3.73 g (1 eq, 10.5 mmol) of 5-bromo-1-phenylpyrene, 5.31 g (1.05 eq, 11.07 mmol) of (3-(4-(isoquinolin-1-yl)-6-(3-(pyridin-3-yl)phenyl)pyrimidin-2-yl)phenyl)boronic acid, and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 4.37 g of Compound 149 (yield=63%).

1H-NMR: 9.26 (1H), 8.70 (1H), 8.42 (1H), 8.24 (2H), 8.12 (1H), 8.04 (1H), 7.88~7.51 (13H), 7.57~7.41 (11H), APCI-MS (m/z): 661.25 [M+]

Synthesis Example 12: Synthesis of Compound 158

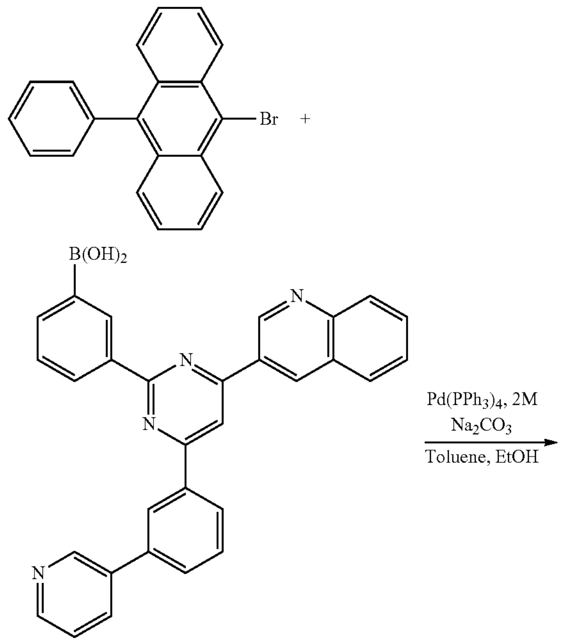

-continued

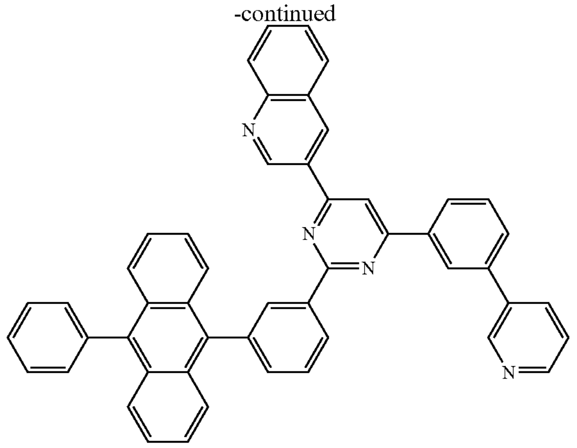

3.48 g (1 eq, 10.5 mmol) of 9-bromo-10-phenylanthracene, 5.31 g (1.05 eq, 11.07 mmol) of (3-(4-(3-(pyridin-3-yl)phenyl)-6-(quinolin-3-yl)pyrimidin-2-yl)phenyl)boronic acid), and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 4.56 g of Compound 158 (yield=65%).

1H-NMR: 9.26 (1H), 8.93 (1H), 8.57 (1H), 8.42 (1H), 8.23 (3H), 8.06 (1H) 7.98 (5H), 7.78 (4H), 7.60~7.39 (15H), APCI-MS (m/z): 668.26 [M+]

Synthesis Example 13: Synthesis of Compound 176

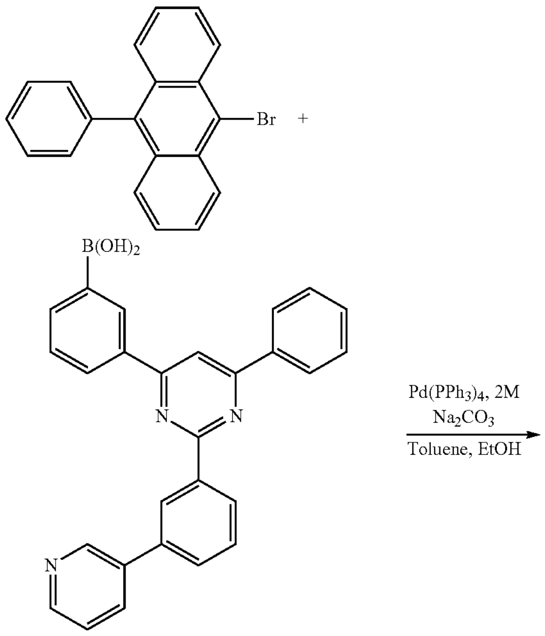

-continued

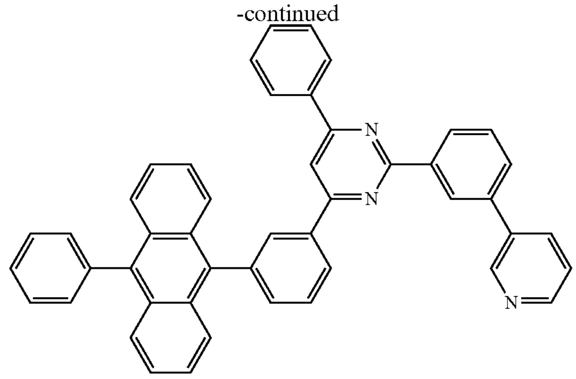

3.48 g (1 eq, 10.5 mmol) of 9-bromo-10-phenylanthracene, 5.02 g (1.05 eq, 11.07 mmol) of (3-(6-phenyl-2-(3-(pyridin-3-yl)phenyl)pyrimidin-4-yl)phenyl)boronic acid), and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 4.35 g of Compound 176 (yield=65%).

1H-NMR: 9.26 (1H), 8.70 (1H), 8.42 (1H), 8.24 (2H), 8.12 (1H), 8.04 (1H), 7.88~7.51 (13H), 7.57~7.41 (11H), APCI-MS (m/z): 661.25 [M+]

Synthesis Example 14: Synthesis of Compound 185

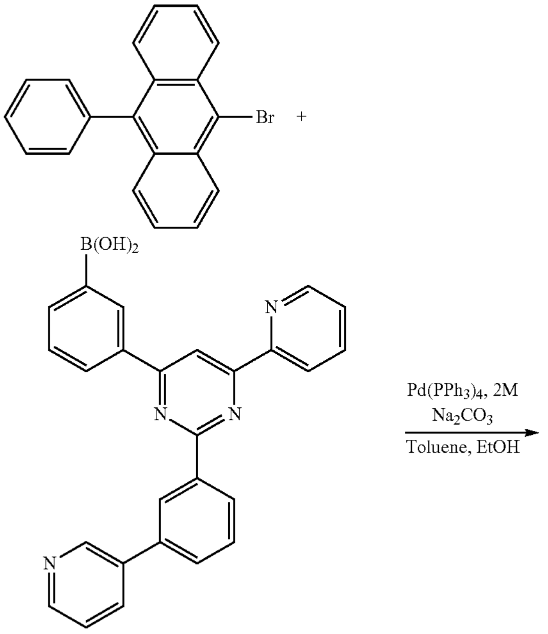

-continued

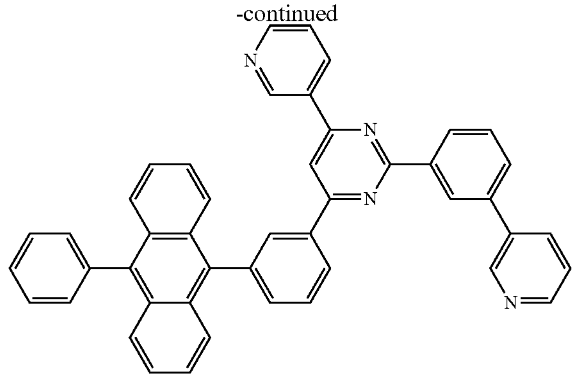

3.48 g (1 eq, 10.5 mmol) of 9-bromo-10-phenylanthracene, 4.76 g (1.05 eq, 11.07 mmol) of (3-(6-(pyridin-2-yl)-2-(3-(pyridin-3-yl)phenyl)pyrimidin-4-yl)phenyl)boronic acid, and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 4.15 g of Compound 185 (yield=62%).

1H-NMR: 9.26 (2H), 8.70 (2H), 8.42 (2H), 8.23 (2H), 7.78 (4H), 7.75 (3H), 7.51~7.41 (15H), APCI-MS (m/z): 638.76 [M+]

Synthesis Example 15: Synthesis of Compound 194

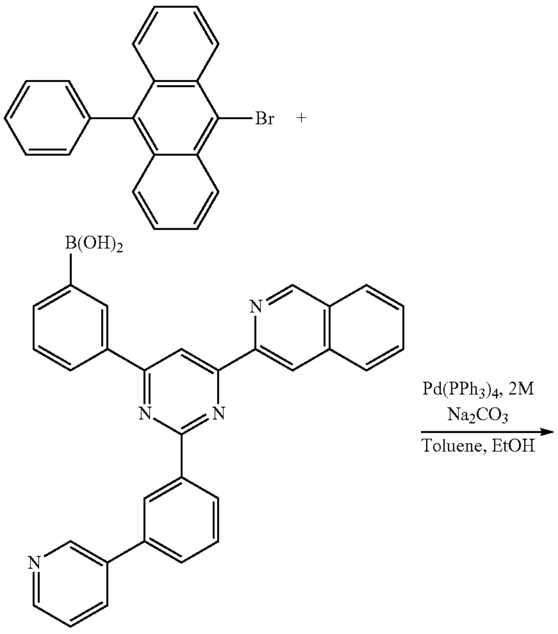

-continued

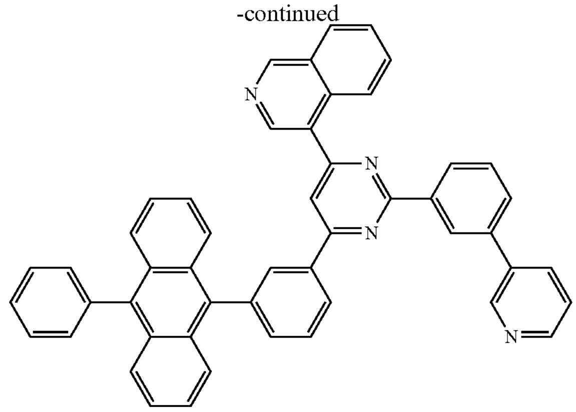

3.48 g (1 eq, 10.5 mmol) of 9-bromo-10-phenylanthracene, 5.31 g (1.05 eq, 11.07 mmol) of (3-(6-(isoquinolin-3-yl)-2-(3-(pyridin-3-yl)phenyl)pyrimidin-4-yl)phenyl)boronic acid, and 485 mg (0.04 eq, 0.42 mmol) of tetrakis (triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 4.70 g of Compound 194 (yield=65%).

1H-NMR: 9.26 (2H), 8.87 (1H), 8.70 (1H), 8.42 (2H), 8.23 (2H), 7.92 (5H), 7.75 (4H), 7.51~7.41 (16H), APCI-MS (m/z): 688.26 [M+]

Synthesis Example 16: Synthesis of Compound 221

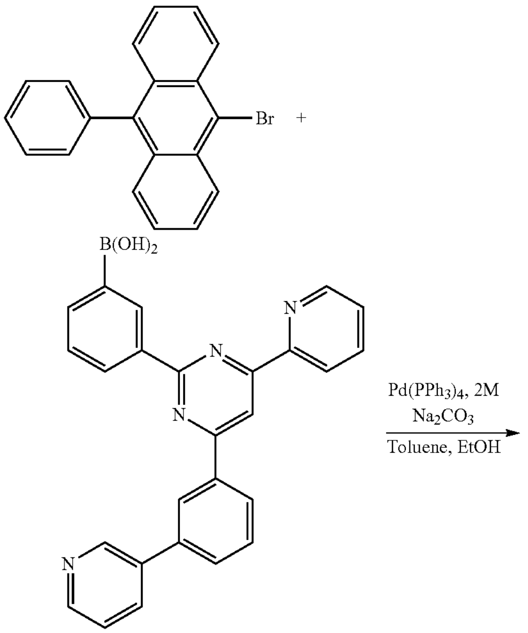

-continued

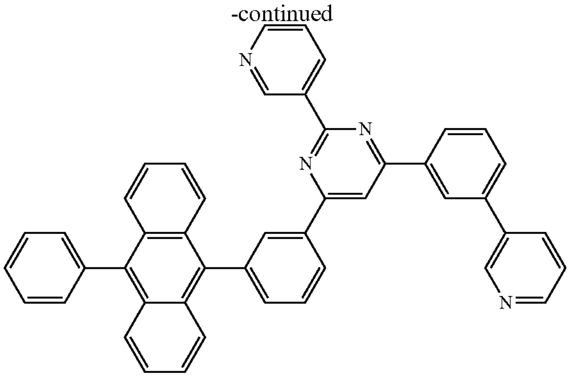

3.48 g (1 eq, 10.5 mmol) of 9-bromo-10-phenylanthracene, 4.76 g (1.05 eq, 11.07 mmol) of (3-(4-(pyridin-2-yl)-6-(3-(pyridin-3-yl)phenyl)pyrimidin-2-yl)phenyl)boronic acid, and 485 mg (0.04 eq, 0.42 mmol) of tetrakis(triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 4.15 g of Compound 221 (yield=62%).

1H-NMR: 9.26 (2H), 8.70 (2H), 8.59 (1H), 8.23 (2H), 7.92 (4H), 7.75 (4H), 7.51~7.41 (15H), APCI-MS (m/z): 638.25 [M+]

Synthesis Example 17: Synthesis of Compound 228

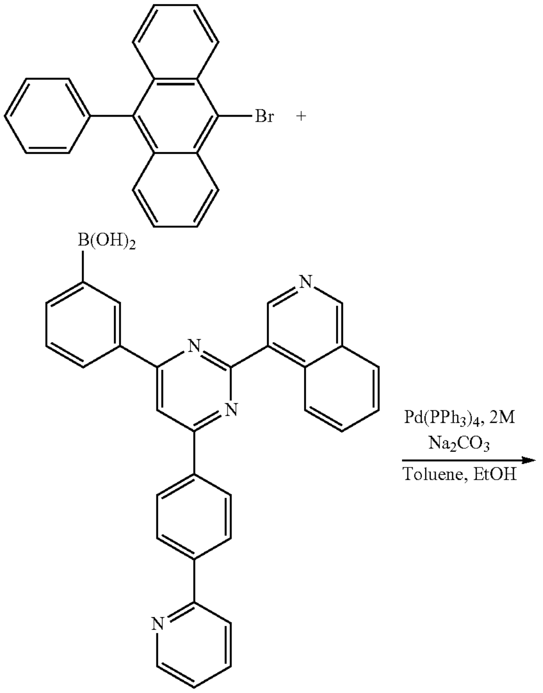

-continued

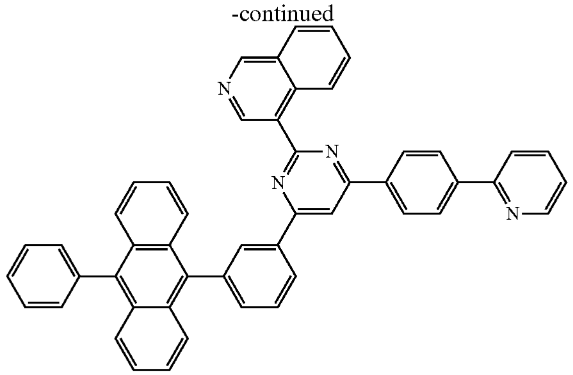

3.48 g (1 eq, 10.5 mmol) of 9-bromo-10-phenylanthracene, 5.31 g (1.05 eq, 11.07 mmol) of (3-(2-(isoquinolin-4-yl)-6-(4-(pyridin-2-yl)phenyl)pyrimidin-4-yl)phenyl)boronic acid, and 485 mg (0.04 eq, 0.42 mmol) of tetrakis (triphenylphosphine)palladium(0) were added to a reaction vessel, vacuum-dried, and followed by filling with nitrogen gas. 80 ml of toluene, 40 ml of ethanol, and 16 ml (3 eq, 31.6 mmol) of 2.0 M sodium carbonate aqueous solution were added to the reaction vessel. The mixture was stirred while refluxing at a temperature of 120° C. for 3 hours. After the reaction stopped, the reaction product was washed with distilled water, and then extracted with ethyl acetate. Once an organic layer was collected, the organic layer was dried with magnesium sulfate. After a pre-product was obtained by distillation under reduced pressure, the resultant product was purified by column chromatograph, thereby obtaining 4.84 g of Compound 228 (yield=67%).

1H-NMR: 8.87 (3H), 8.59 (1H), 8.50 (2H), 8.33 (2H), 7.92 (5H), 7.75 (3H), 7.51~7.41 (14H), 7.26 (1H), 7.01 (1H) APCI-MS (m/z): 688.26 [M+]

Example 1

An ITO glass substrate (a product of Corning Co., Ltd) was cut to a size of 50 mm×50 mm×0.7 mm, sonicated by using (utilizing) isopropyl alcohol for 5 minutes and pure water for 5 minutes, cleaned by the exposure to ultraviolet rays for 30 minutes, and then ozone, and the ITO glass substrate was mounted on a vacuum deposition apparatus.

m-MTDATA was deposited on the glass substrate acting as an anode to form a hole injection layer having a thickness of 600 Å, Compound 309 was deposited on the hole injection layer to form a hole transport layer having a thickness of 300 Å, and then, ADN and FD9 were co-deposited at a weight ratio of 95:5 on the hole transport layer to form an emission layer having a thickness of 200 Å.

Compound 20 was deposited on the emission layer to form an electron transport layer having a thickness of 300 Å. LiF was vacuum deposited on the electron transport layer to form an electron injection layer having a thickness of 10 Å, and then, Al was vacuum deposited on to form a cathode having a thickness of 1000 Å to complete the manufacturing of an organic light-emitting device.

Example 2

An organic light-emitting device was manufactured in the same manner as in Example 1, except that in forming an electron transport layer, Compound 23 was used (utilized) instead of Compound 20.

Example 3

An organic light-emitting device was manufactured in the same manner as in Example 1, except that in forming an electron transport layer, Compound 26 was used (utilized) instead of Compound 20.

Example 4

An organic light-emitting device was manufactured in the same manner as in Example 1, except that in forming an electron transport layer, Compound 47 was used (utilized) instead of Compound 20.

Example 5

An organic light-emitting device was manufactured in the same manner as in Example 1, except that in forming an electron transport layer, Compound 50 was used (utilized) instead of Compound 20.

Example 6

An organic light-emitting device was manufactured in the same manner as in Example 1, except that in forming an electron transport layer, Compound 74 was used (utilized) instead of Compound 20.

Example 7

An organic light-emitting device was manufactured in the same manner as in Example 1, except that in forming an electron transport layer, Compound 77 was used (utilized) instead of Compound 20.

Example 8

An organic light-emitting device was manufactured in the same manner as in Example 1, except that in forming an electron transport layer, Compound 101 was used (utilized) instead of Compound 20.

Example 9

An organic light-emitting device was manufactured in the same manner as in Example 1, except that in forming an electron transport layer, Compound 122 was used (utilized) instead of Compound 20.

Example 10

An organic light-emitting device was manufactured in the same manner as in Example 1, except that in forming an electron transport layer, Compound 140 was used (utilized) instead of Compound 20.

Example 11

An organic light-emitting device was manufactured in the same manner as in Example 1, except that in forming an electron transport layer, Compound 149 was used (utilized) instead of Compound 20.

Example 12

An organic light-emitting device was manufactured in the same manner as in Example 1, except that in forming an electron transport layer, Compound 158 was used (utilized) instead of Compound 20.

Example 13

An organic light-emitting device was manufactured in the same manner as in Example 1, except that in forming an electron transport layer, Compound 176 was used (utilized) instead of Compound 20.

Example 14

An organic light-emitting device was manufactured in the same manner as in Example 1, except that in forming an electron transport layer, Compound 185 was used (utilized) instead of Compound 20.

Example 15

An organic light-emitting device was manufactured in the same manner as in Example 1, except that in forming an electron transport layer, Compound 194 was used (utilized) instead of Compound 20.

Example 16

An organic light-emitting device was manufactured in the same manner as in Example 1, except that in forming an electron transport layer, Compound 221 was used (utilized) instead of Compound 20.

Example 17

An organic light-emitting device was manufactured in the same manner as in Example 1, except that in forming an electron transport layer, Compound 228 was used (utilized) instead of Compound 20.

Comparative Example 1

An organic light-emitting device was manufactured in the same manner as in Example 1, except that in forming an electron transport layer, Compound A illustrated below was used (utilized) instead of Compound 20.

Compound A

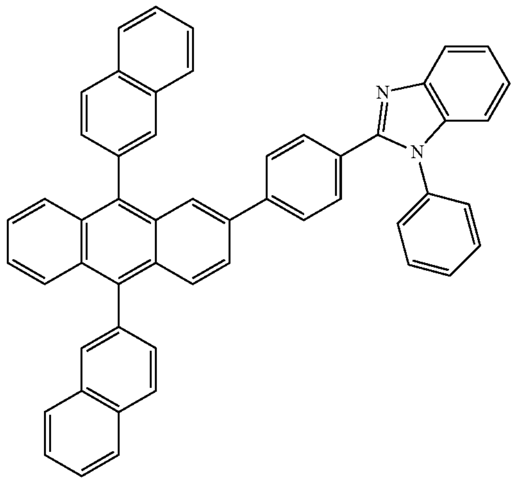

Comparative Example 2

An organic light-emitting device was manufactured in the same manner as in Example 1, except that in forming a hole transport layer, Compound B was used (utilized) instead of Compound 309.

Compound B

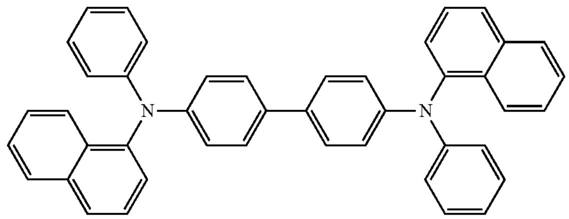

Comparative Example 3

An organic light-emitting device was manufactured in the same manner as in Example 1, except that in forming an electron transport layer, Compound A was used (utilized) instead of Compound 2, and in forming a hole transport layer, Compound B was used (utilized) instead of Compound 309.

Evaluation Example 1

The driving voltage, brightness, and efficiency of the organic light-emitting devices manufactured according to Examples 1 to 17, and Comparative Examples 1 to 3 were measured by using (utilizing) Kethley SMU 236 and a brightness photometer PR650.

TABLE 1

| | Hole transport layer | Electron transport layer | Driving voltage (V) | Brightness (cd/m$^2$) | Efficiency (cd/A) |
|---|---|---|---|---|---|
| Example 1 | Compound 309 | Compound 20 | 3.7 | 350 | 3.50 |
| Example 2 | Compound 309 | Compound 23 | 3.8 | 412 | 4.12 |
| Example 3 | Compound 309 | Compound 26 | 3.7 | 385 | 3.85 |
| Example 4 | Compound 309 | Compound 47 | 4.0 | 373 | 3.73 |
| Example 5 | Compound 309 | Compound 50 | 3.9 | 325 | 3.25 |
| Example 6 | Compound 309 | Compound 74 | 3.8 | 407 | 4.07 |
| Example 7 | Compound 309 | Compound 77 | 3.7 | 362 | 3.62 |
| Example 8 | Compound 309 | Compound 101 | 4.1 | 340 | 3.40 |
| Example 9 | Compound 309 | Compound 122 | 4.0 | 312 | 3.12 |
| Example 10 | Compound 309 | Compound 140 | 3.8 | 290 | 2.90 |
| Example 11 | Compound 309 | Compound 149 | 3.7 | 360 | 3.60 |
| Example 12 | Compound 309 | Compound 158 | 3.9 | 378 | 3.78 |
| Example 13 | Compound 309 | Compound 176 | 4.2 | 408 | 4.08 |
| Example 14 | Compound 309 | Compound 185 | 3.7 | 355 | 3.55 |
| Example 15 | Compound 309 | Compound 194 | 4.1 | 342 | 3.42 |
| Example 16 | Compound 309 | Compound 221 | 4.3 | 331 | 3.31 |
| Example 17 | Compound 309 | Compound 228 | 4.1 | 389 | 3.89 |
| Comparative Example 1 | Compound 309 | Compound A | 4.5 | 255 | 2.55 |
| Comparative Example 2 | Compound B | Compound 20 | 4.4 | 247 | 2.47 |
| Comparative Example 3 | Compound B | Compound A | 4.6 | 220 | 2.20 |

From Table 1, it was confirmed that the driving voltage, brightness, and efficiency of the organic light-emitting devices manufactured according to Examples 1 to 17 are higher than the driving voltage, brightness, and efficiency of the organic light-emitting devices manufactured according to Comparative Examples 1 to 3.

An organic light-emitting device according to an embodiment may have a low driving voltage, high brightness, and high efficiency.

While one or more embodiments of the present invention have been described with reference to the drawing, it will be understood by those of ordinary skill in the art that various changes in form and details may be made therein without departing from the spirit and scope of the present invention as defined by the following claims, and equivalent thereof.

What is claimed is:

1. An organic light-emitting device comprising:

a first electrode;

a second electrode facing the first electrode;

an emission layer between the first electrode and the second electrode;

an electron transport region between the emission layer and the second electrode; and a hole transport region between the first electrode and the emission layer, wherein the electron transport region comprises at least one of an electron transport material represented by Formula 1 below; and the hole transport region comprises at least one of a hole transport material represented by Formula 2 or 3 below:

Formula 1

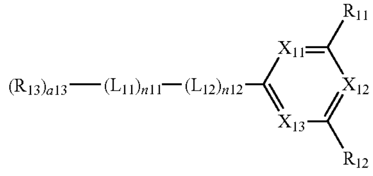

-continued

Formula 2

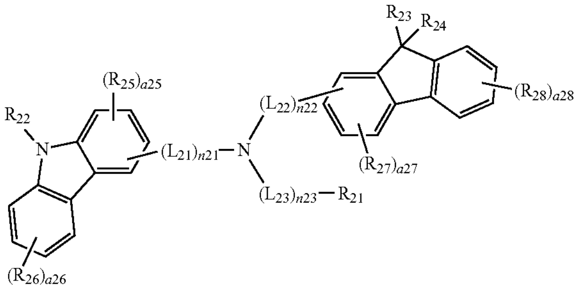

Formula 3

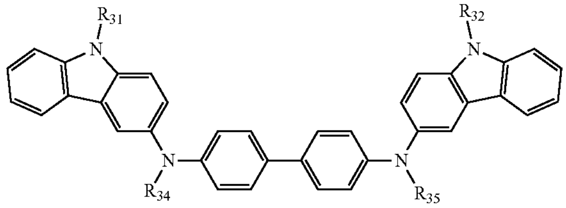

wherein in Formulae 1 to 3, $X_{11}$, $X_{12}$, and $X_{13}$ are each independently CH or N;

two of $X_{11}$, $X_{12}$, and $X_{13}$ are each independently N and a remaining one of $X_{11}$, $X_{12}$, and $X_{13}$ is CH;

$L_{11}$ is selected from:

a naphthylene group, a fluorenylene group, a spiro-fluorenylene group, a benzofluorenylene group, a dibenzofluorenylene group, a phenalenylene group, a phenanthrenylene group, a fluoranthenylene group, a triphenylenylene group, a pyrenylene group, and a chrysenylene group; and a phenylene group, a naphthylene group, a fluorenylene group, a spiro-fluorenylene group, a benzofluorenylene group, a dibenzofluorenylene group, a phenalenylene group, a phenanthrenylene group, a fluoranthenylene group, a triphenylenylene group, a pyrenylene group, and a chrysenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C1-C20 alkyl group, a C1-C20 alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$L_{12}$ is selected from:

a phenylene group, a naphthylene group, a fluorenylene group, a spiro-fluorenylene group, a benzofluorenylene group, a dibenzofluorenylene group, a phenalenylene group, a phenanthrenylene group, a fluoranthenylene group, a triphenylenylene group, a pyrenylene group, and a chrysenylene group; and a phenylene group, a naphthylene group, a fluorenylene group, a spiro-fluorenylene group, a benzofluorenylene group, a dibenzofluorenylene group, a phenalenylene group, a phenanthrenylene group, a fluoranthenylene group, a triphenylenylene group, a pyrenylene group, and a chrysenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C1-C20 alkyl group, a C1-C20 alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$L_{21}$ to $L_{23}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

n11 and n12 are each independently an integer selected from 1 to 3, and n21 to n23 are each independently an integer selected from 0 to 3;

the sum of n11 and n12 is 1 or more;

$R_{11}$, $R_{12}$, $R_{21}$ to $R_{24}$, $R_{31}$, $R_{32}$, $R_{34}$, and $R_{35}$ are each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_{13}$ is selected from:

a phenyl group, a naphthyl group, a fluorenyl group, a benzofluorenyl group, a phenanthrenyl group, an a pyrenyl group, a chrysenyl group, a pyridinyl group, a pyrazinyl group, a pyrimidinyl group, a pyridazinyl group, a quinolinyl group, an isoquinolinyl group, a carbazolyl group, a triazinyl group, a dibenzofuranyl group, and a dibenzothienyl group; and a phenyl group, a naphthyl group, a fluorenyl group, a benzofluorenyl group, a phenanthrenyl group, an a pyrenyl group, a chrysenyl group, a pyridinyl group, a pyrazinyl group, a pyrimidinyl group, a pyridazinyl group, a quinolinyl group, an isoquinolinyl group, a carbazolyl group, a triazinyl group, a dibenzofuranyl group, and a dibenzothienyl group, each substituted with at least one selected from a deuterium, —F, —Cl, —Br, —I, a cyano group, a nitro group, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, carbazolyl group, a triazinyl group, a dibenzofuranyl group, and a dibenzothienyl group, and —$N(Q_{31})(Q_{32})$;

a13 is an integer selected from 1 to 3;

$R_{25}$ to $R_{28}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$;

a25 and a27 are each independently an integer selected from 1 to 3;

a26 and a28 are each independently an integer selected from 1 to 4;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arythio group, the substituted $C_1$-$C_{60}$ heteroaryl group, the substituted monovalent non-aromatic condensed polycyclic group, the substituted monovalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group and the substituted $C_1$-$C_{60}$ alkoxy group is selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{31}$)($Q_{32}$), —Si($Q_{33}$)($Q_{34}$)($Q_{35}$) and —B($Q_{36}$)($Q_{37}$), and $Q_1$ to $Q_7$, $Q_{11}$ to $Q_{17}$, $Q_{21}$ to $Q_{27}$ and $Q_{31}$ to $Q_{37}$ are each independently selected from a hydrogen, a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting device of claim 1, wherein each of $X_{11}$ and $X_{13}$ is N, and $X_{12}$ is CH.

3. The organic light-emitting device of claim 1, wherein each of $X_{12}$ and $X_{13}$ is N, and $X_{11}$ is CH.

4. The organic light-emitting device of claim 1, wherein each of $X_{11}$ and $X_{12}$ is N, and $X_{13}$ is CH.

5. The organic light-emitting device of claim 1, wherein $L_{21}$ to $L_{23}$ are each independently selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thienylene group, a furanylene group, a silolylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothienylene group, a benzosilolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, and a dibenzosilolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thienylene group, a furanylene group, a silolylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothienylene group, a benzosilolylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, and a dibenzoxilolylene group, each substituted with at least one selected from deuterium, —F, —Cl, —Br, —I, a hydroxyl group, a cyano group, a nitro group, an amino group, an amidino group, a hydrazine group, a hydrazone group, a carboxyl acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluorantenyl group, a triphenylenyl group, a pyrenyl group, a chrysenyl group, a naphthacenyl group, a pycenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, a silolyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, a benzosilolyl group, an isobenzothiazolyl group, a benzooxazolyl group, an isobenzooxazolyl group, a triazolyl group, a tetrazole group, an oxadiazolyl group, a triazinyl group, a dibenzofuranyl group, a dibenzothienyl group, a benzocarbazolyl group, a dibenzocarbazolyl group, and a dibenzosilolyl group.

6. The organic light-emitting device of claim 1, wherein $L_{12}$ is selected from:
a phenylene group, a naphthylene group, and a triphenylenylene group; and
a phenylene group, a naphthylene group, and a triphenylenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

7. The organic light-emitting device of claim 1, wherein each of n11 and n12 is 1.

8. The organic light-emitting device of claim 1, wherein $L_{21}$ to $L_{23}$ are each independently selected from:
a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and
a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

9. The organic light-emitting device of claim 1, wherein n21 is 1, and each of n22 and n23 is 0.

10. The organic light-emitting device of claim 1, wherein $R_{11}$, $R_{12}$, $R_{21}$, and $R_{31}$ to $R_{35}$ are each independently selected from:

a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a triazinyl group, a dibenzofuranyl group, and a dibenzothienyl group; and a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a triazinyl group, a dibenzofuranyl group, and a dibenzothienyl group, each substituted with at least one selected from a deuterium, —F, —Cl, —Br, —I, a cyano group, a nitro group, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, carbazolyl group, a triazinyl group, a dibenzofuranyl group, and a dibenzothienyl group, and —N($Q_{31}$)($Q_{32}$); and $Q_{31}$ and $Q_{32}$ are each independently selected from a phenyl group and a naphthyl group.

11. The organic light-emitting device of claim 1, wherein $R_{11}$ to $R_{13}$ are each independently selected from Formulae 7-1 to 7-15 below:

7-1

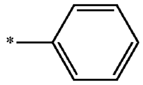

7-2

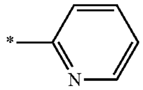

7-3

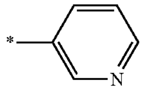

7-4

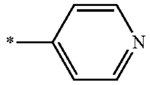

7-5

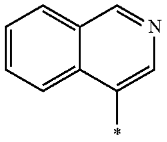

7-6

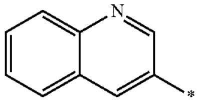

-continued 7-7

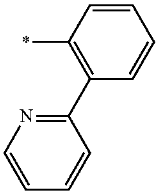

7-8

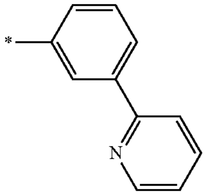

7-9

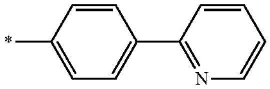

7-10

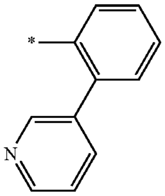

7-11

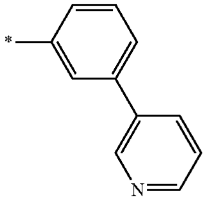

7-12

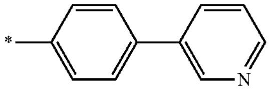

7-13

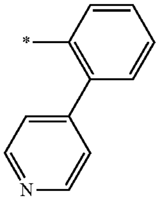

7-14

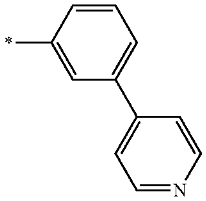

7-15

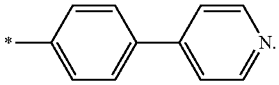

12. The organic light-emitting device of claim 1, wherein $R_{22}$ to $R_{24}$ are each independently selected from:

a $C_1$-$C_{20}$ alkyl group and a $C_1$-$C_{20}$ alkoxy group;

a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a triazinyl group, a dibenzofuranyl group, and a dibenzothienyl group; and a phenyl group, a naphthyl group, a fluorenyl group, a benzofluorenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a carbazolyl group, a triazinyl group, a dibenzofuranyl group, and a dibenzothienyl group, each substituted with at least one of a deuterium, —F, —Cl, —Br, —I, a cyano group, a nitro group, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

13. The organic light-emitting device of claim 1, wherein a13 is 1.

14. The organic light-emitting device of claim 1, wherein $R_{25}$ to $R_{28}$ are each independently selected from:

a hydrogen, a deuterium, —F, —Cl, —Br, —I, a cyano group, a nitro group, a $C_1$-$C_{60}$ alkyl group, and a $C_1$-$C_{60}$ alkoxy group.

15. The organic light-emitting device of claim 1, wherein the electron transport material is represented by Formula 1A below:

Formula 1A

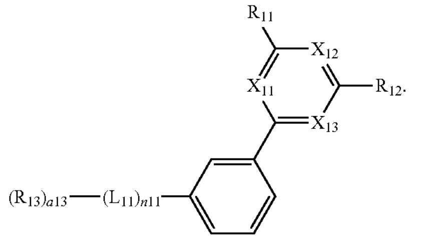

16. The organic light-emitting device of claim 1, wherein the hole transport material is represented by Formula 2A below:

Formula 2A

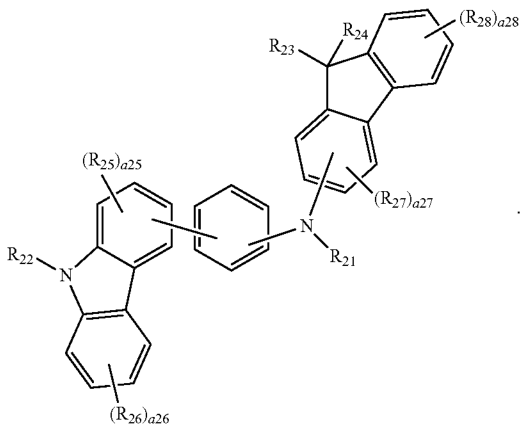

17. An organic light-emitting device comprising:

a first electrode;

a second electrode facing the first electrode;

an emission layer between the first electrode and the second electrode;

an electron transport region between the emission layer and the second electrode; and a hole transport region between the first electrode and the emission layer, wherein the electron transport region comprises at least one of an electron transport material; and the hole transport region comprises at least one of a hole transport material, wherein the electron transport material is selected from Compounds 4 to 9, 13 to 18, 22 to 27, 31 to 36, 40 to 45, 49 to 54, 58 to 63, 67 to 72, 76 to 81, 85 to 90, 94 to 99, 103 to 108, 112 to 117, 127 to 135, 145 to 153, 163 to 171 and 244 to 267 below, and the hole transport material is selected from Compounds 301 to 326 below:

4

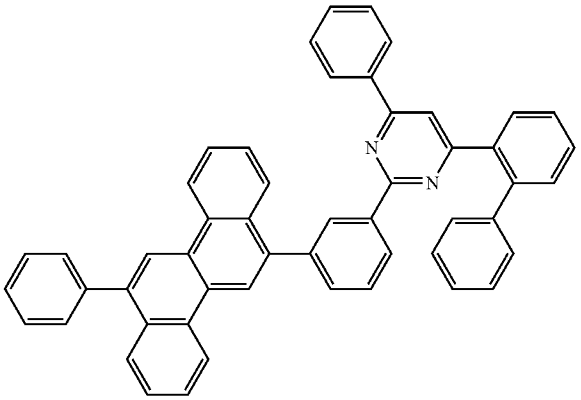

5

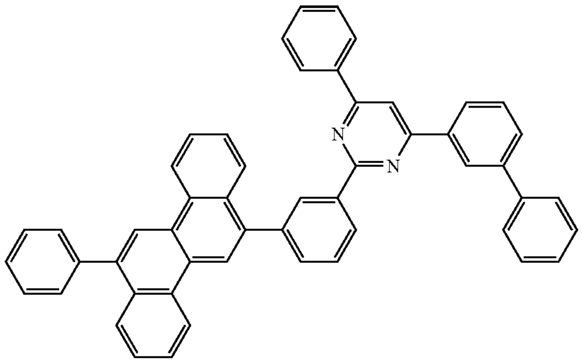

-continued
6
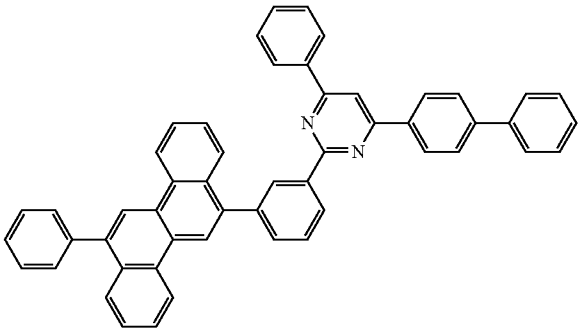
7
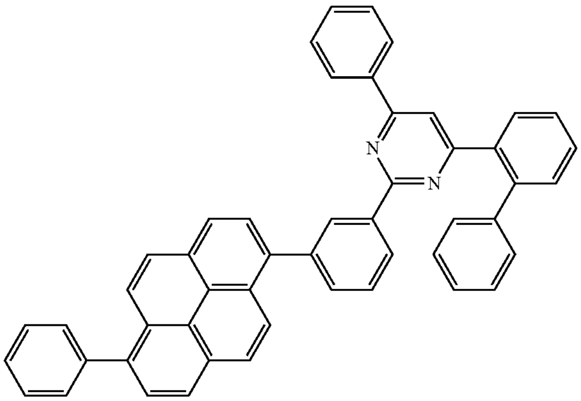
8
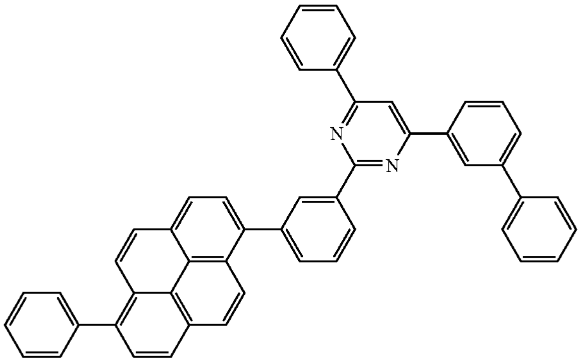
9
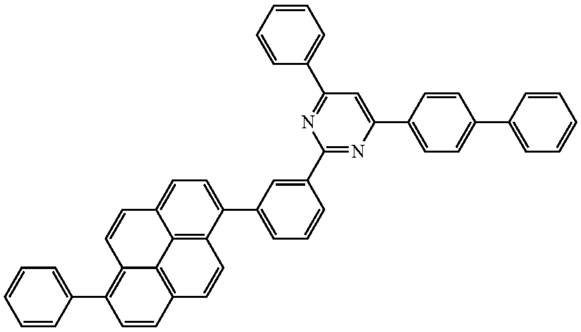
13
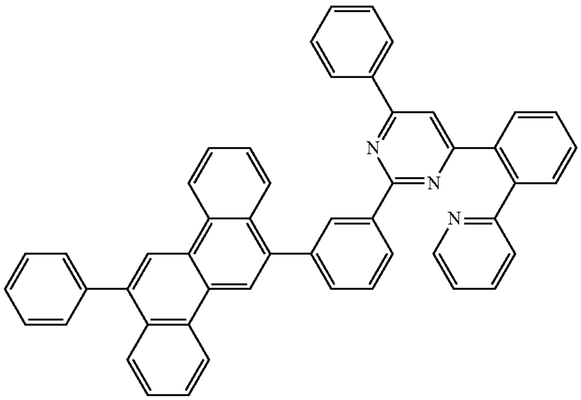
14
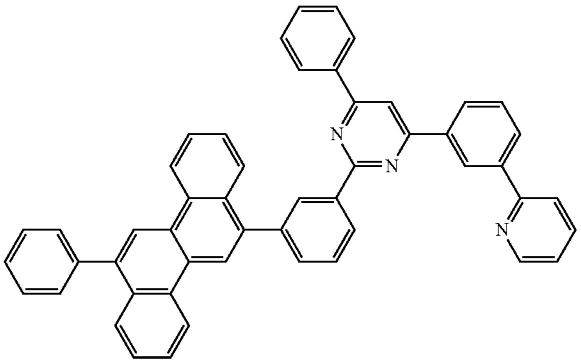
15
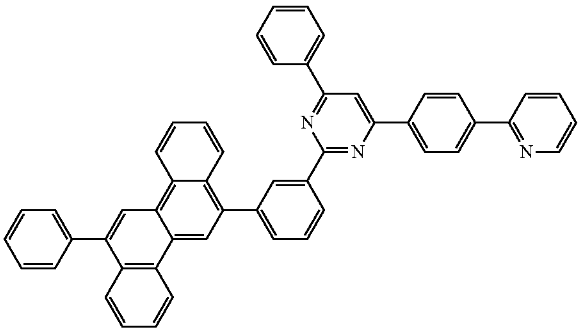
16
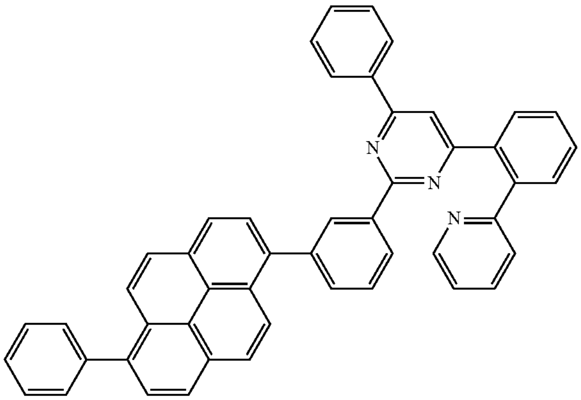

-continued
17
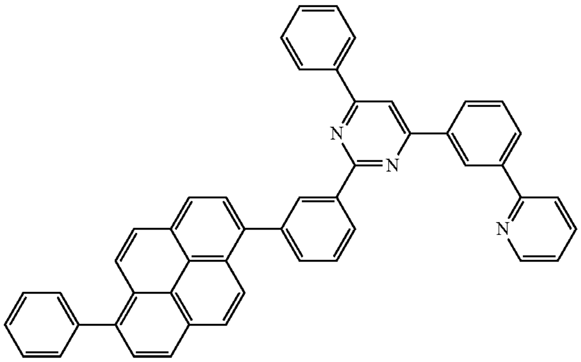
18
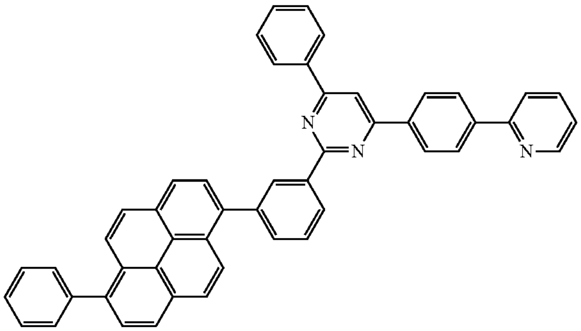
22
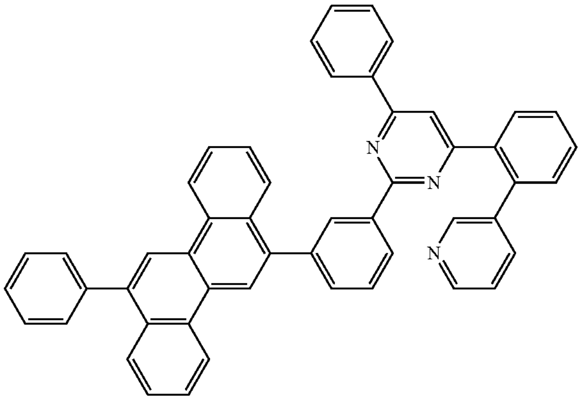
23
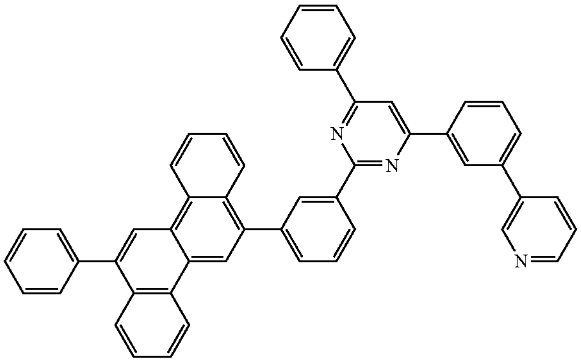
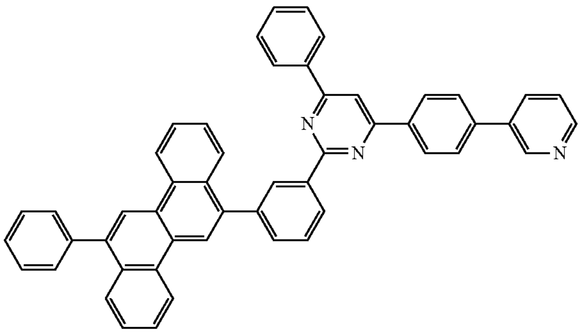
25
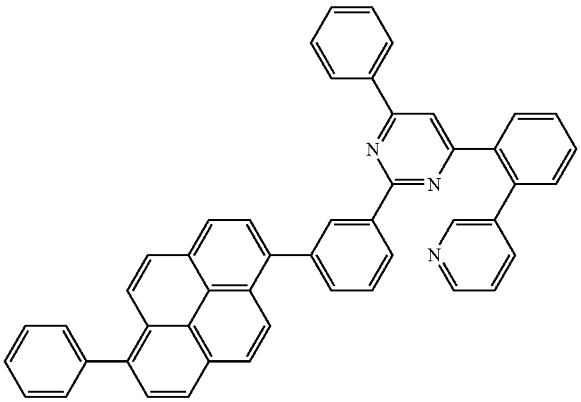
26
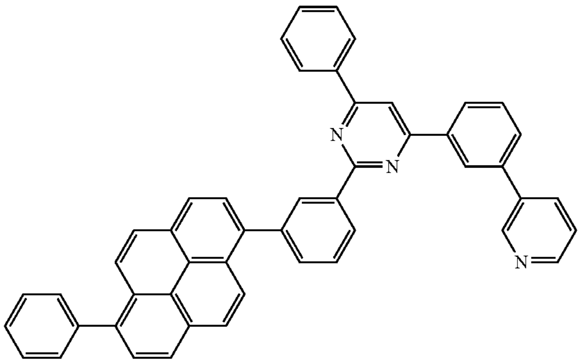
27
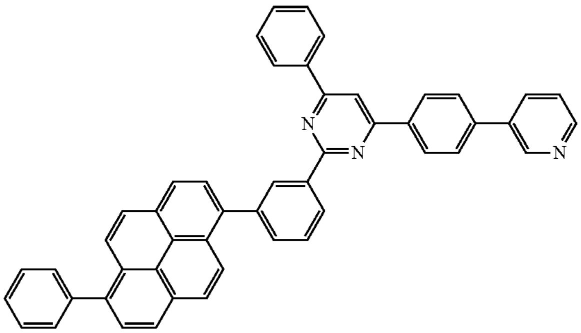

-continued
31
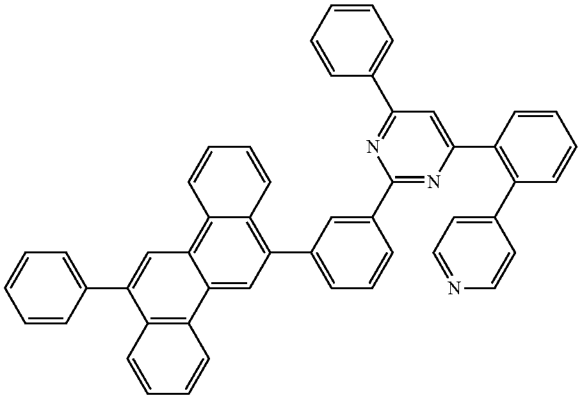
32
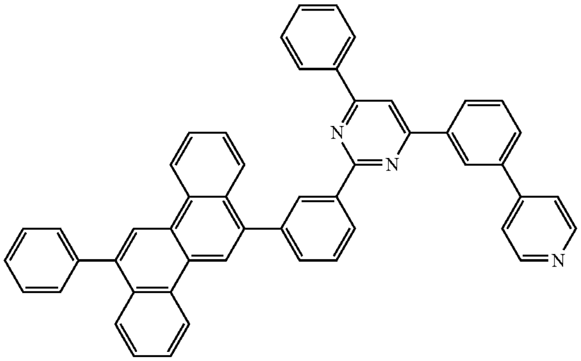
33
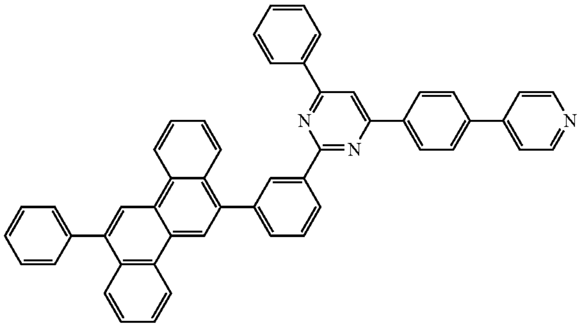
34
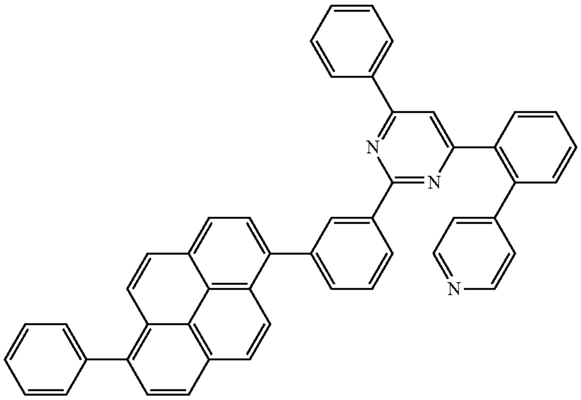
35
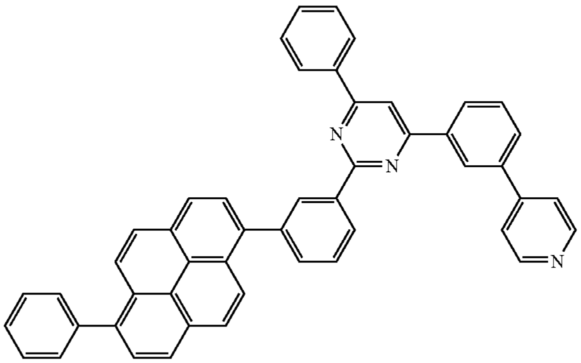
36
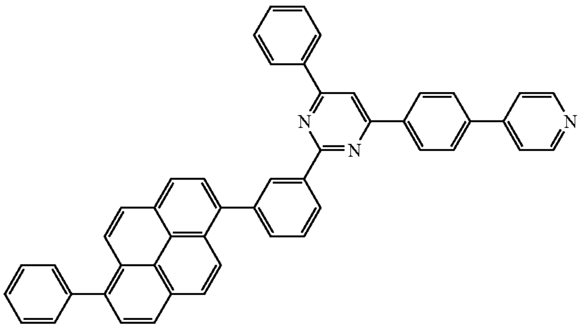
40
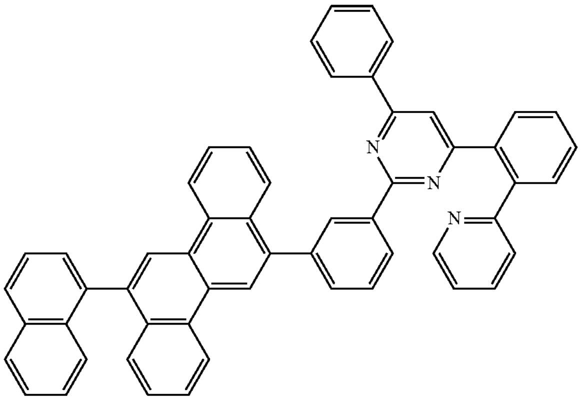
41
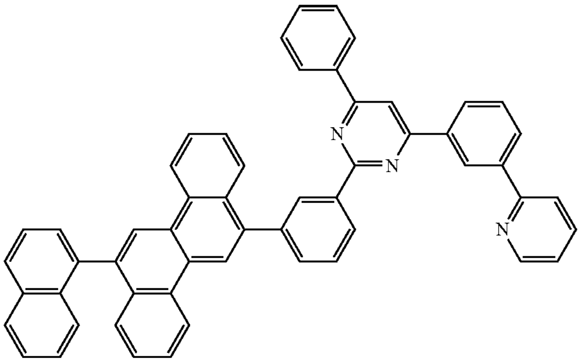

-continued
42
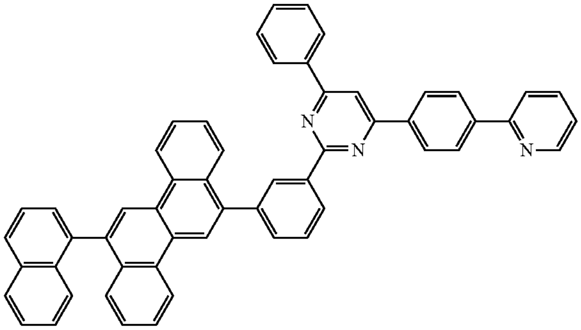
43
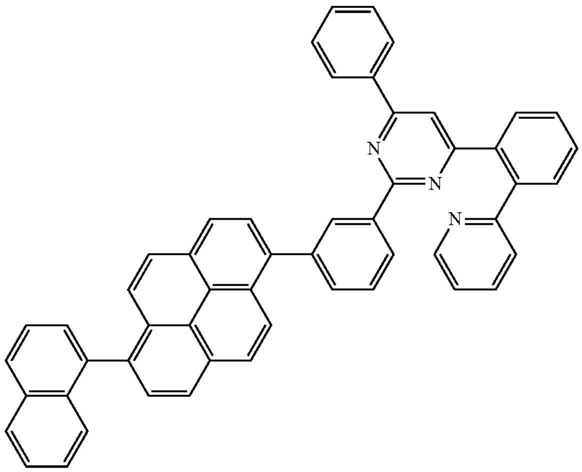
44
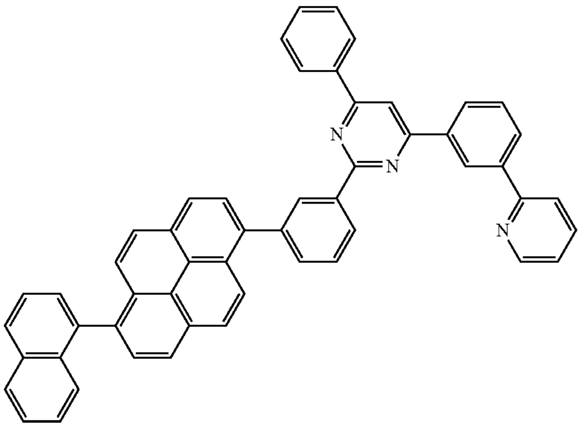
45
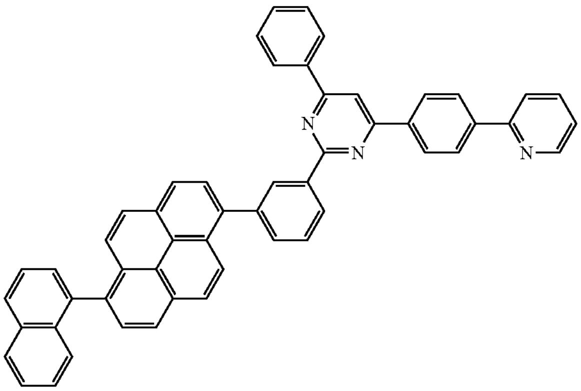
49
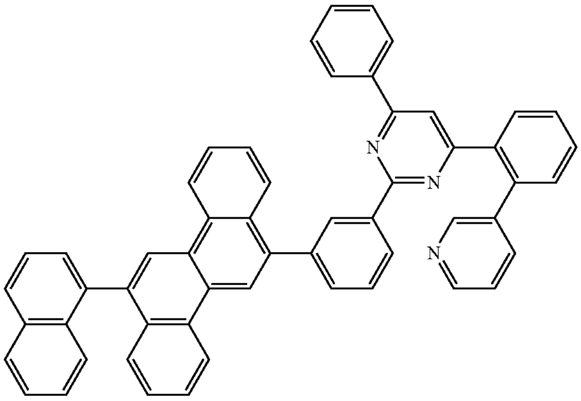
50
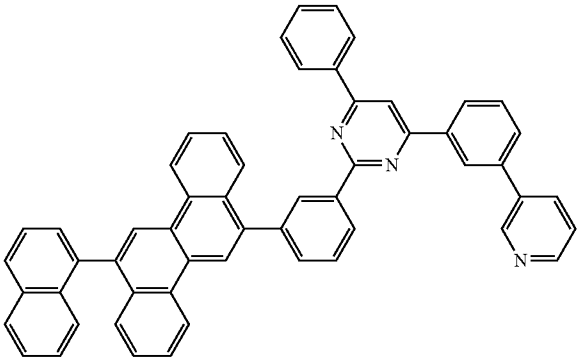

-continued
51
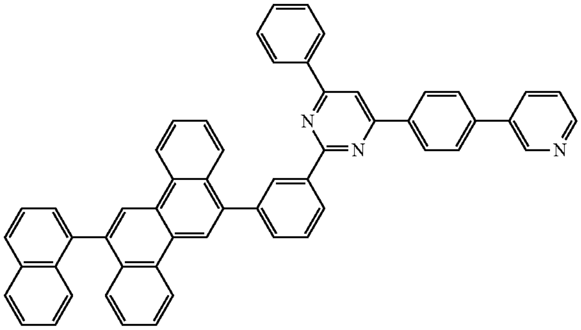
52
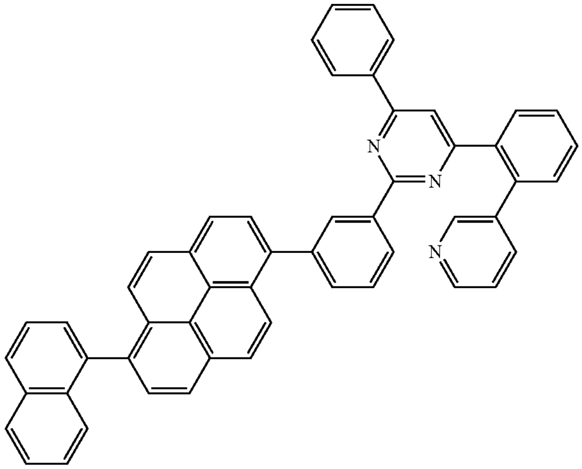
53
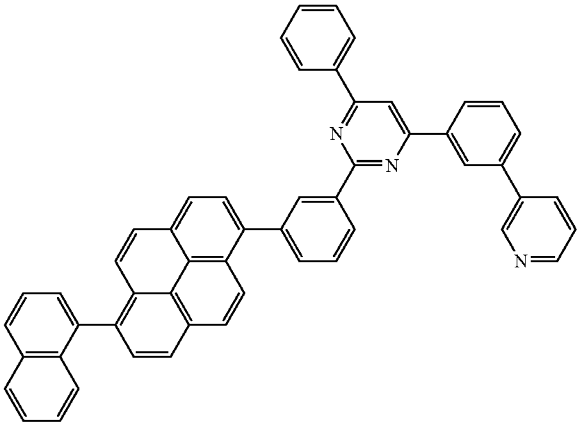
54
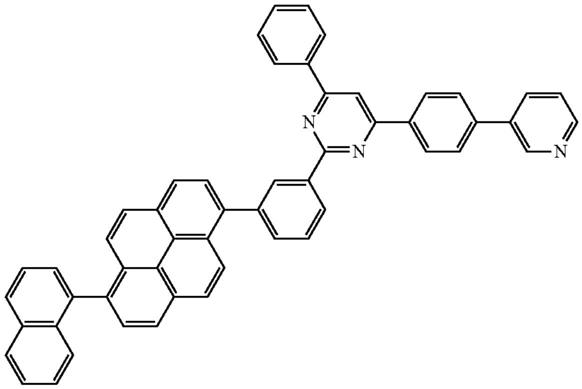
58
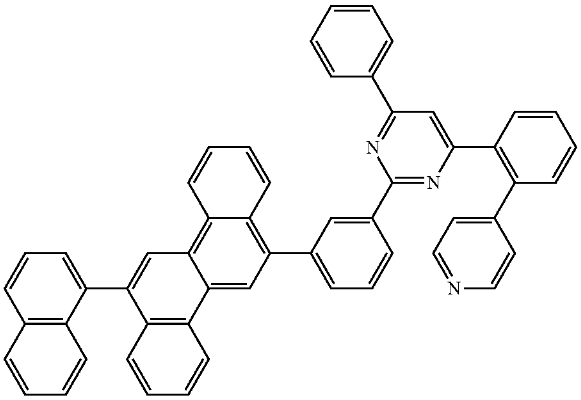
59
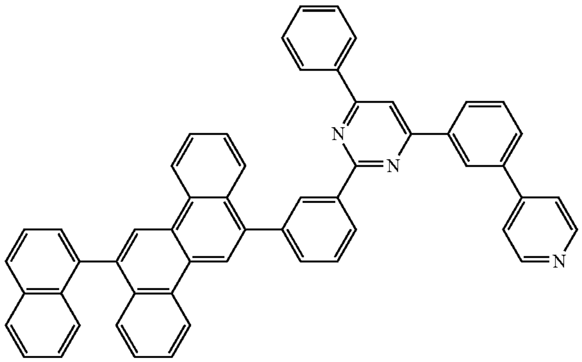

-continued
60
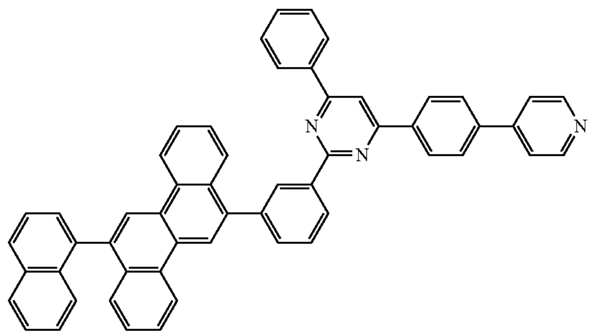
61
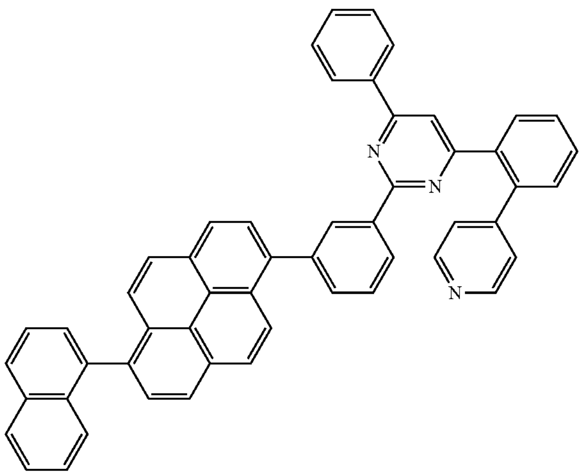
62
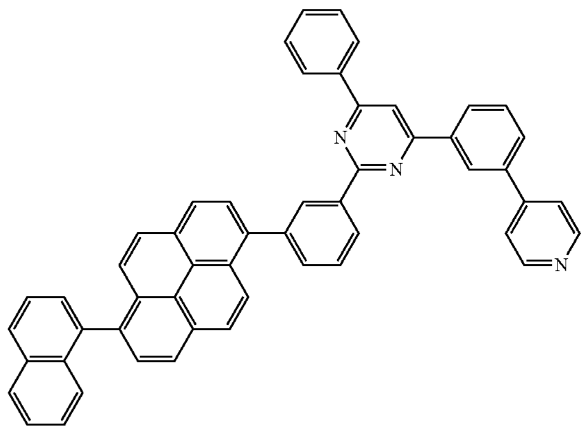
63
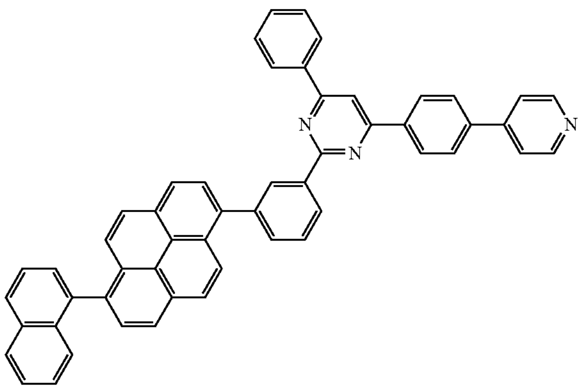
67
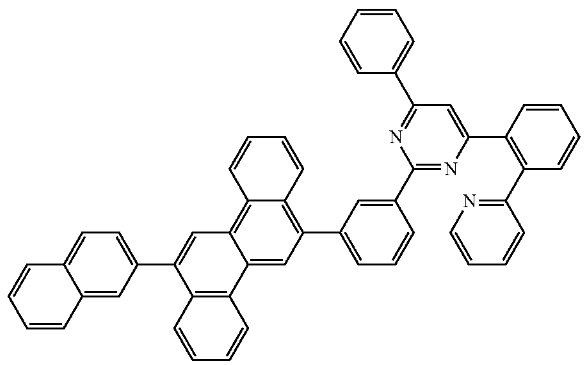
68
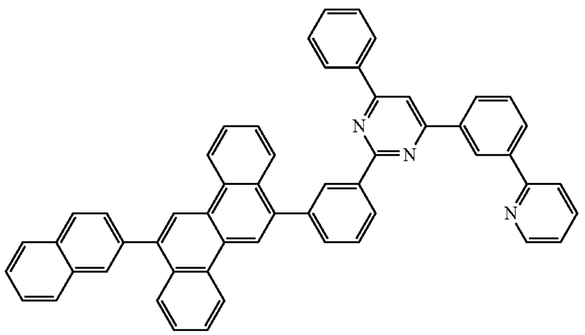

-continued
69
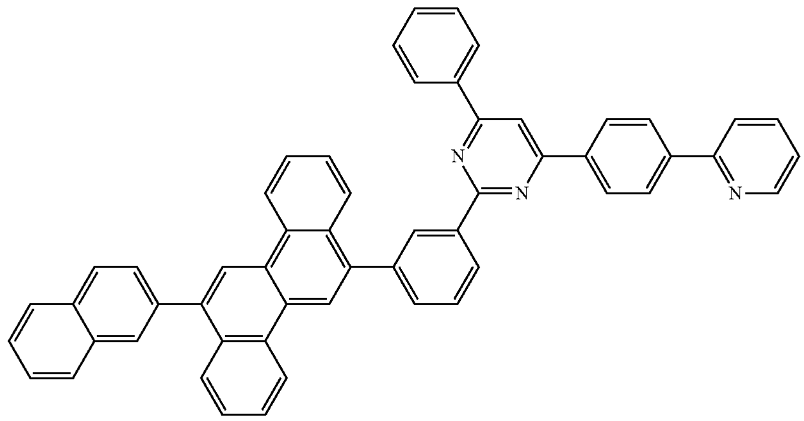
70
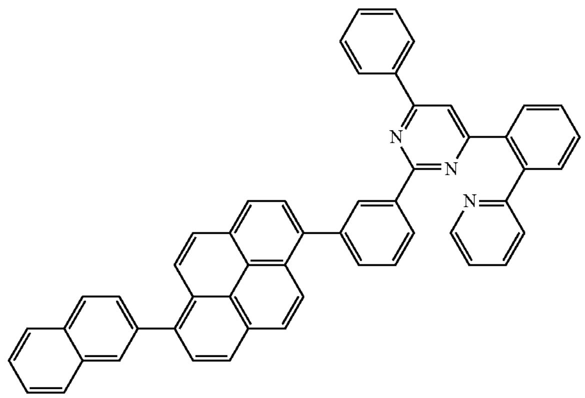
71
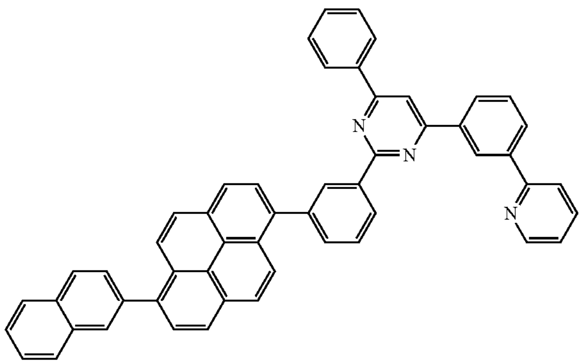
72
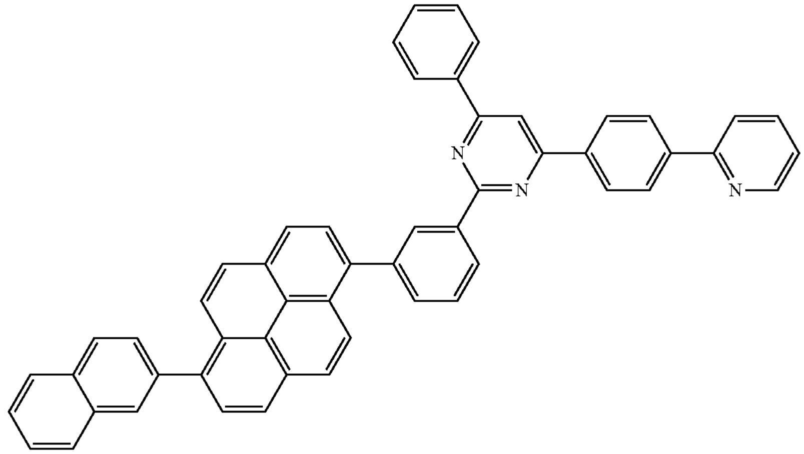

-continued
76
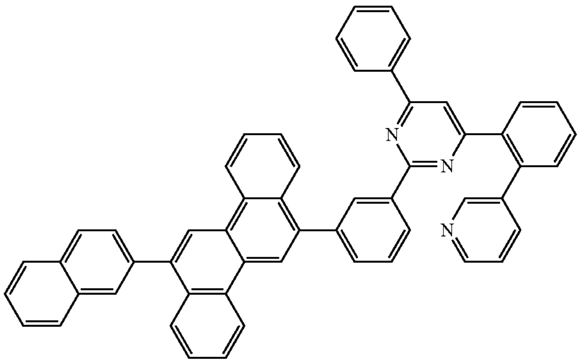
77
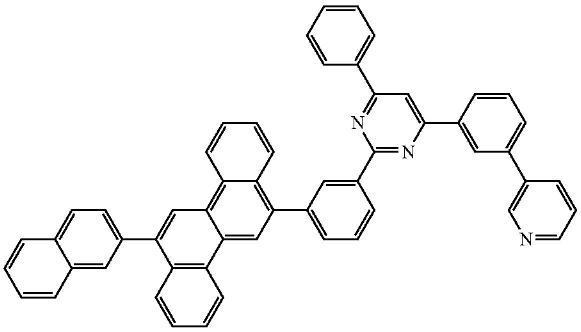
78
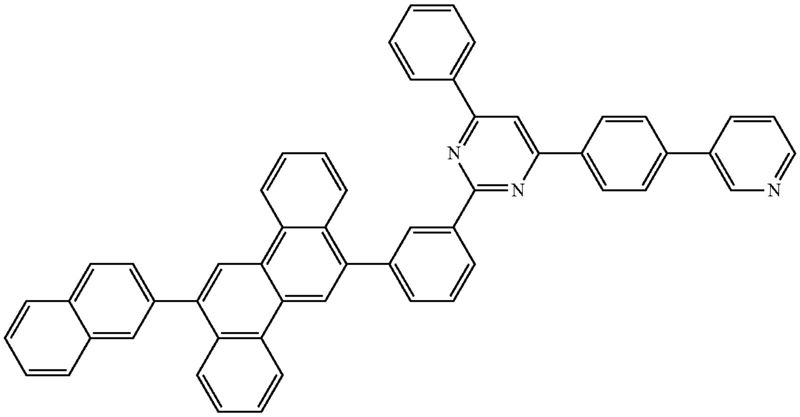
79
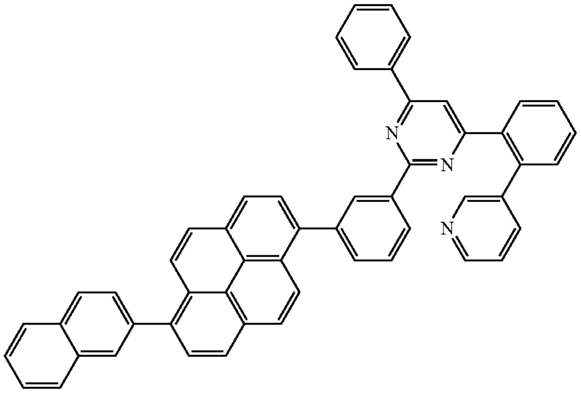
80
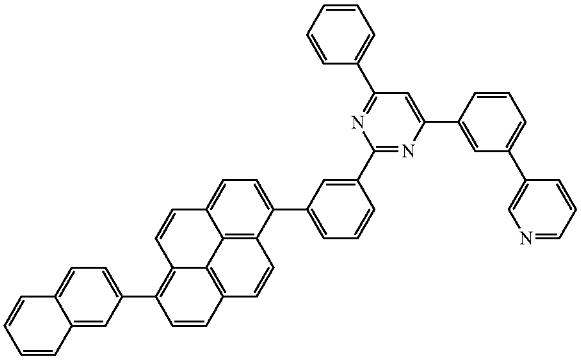

-continued
81
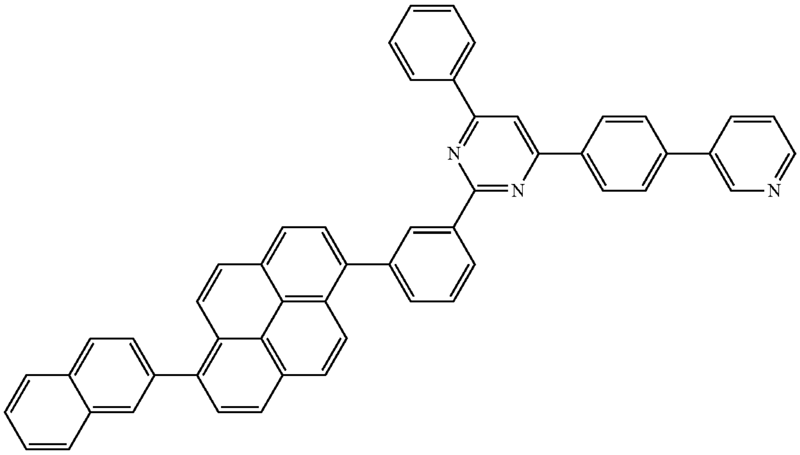
85
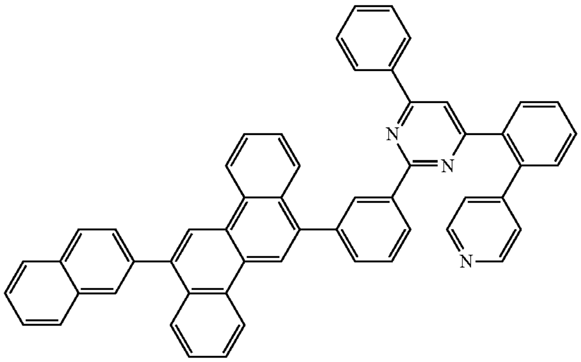
86
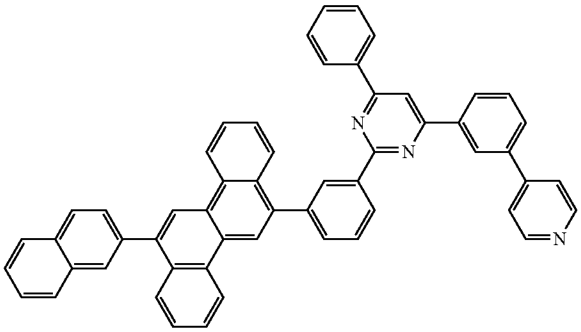
87
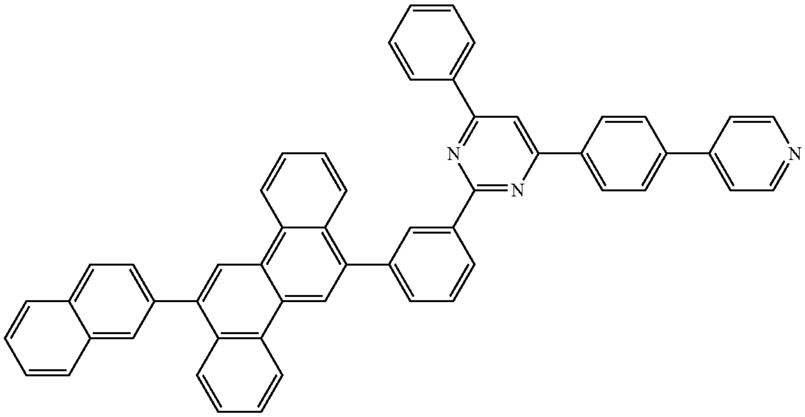

-continued
88
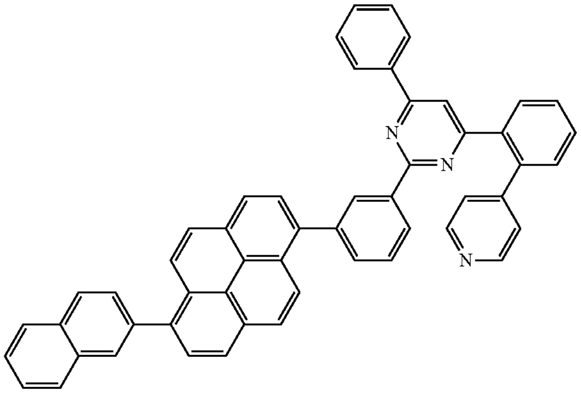
89
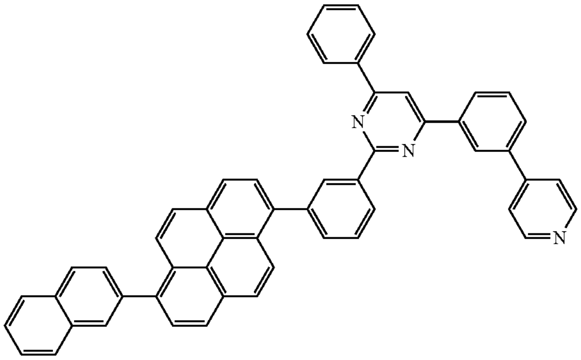
90
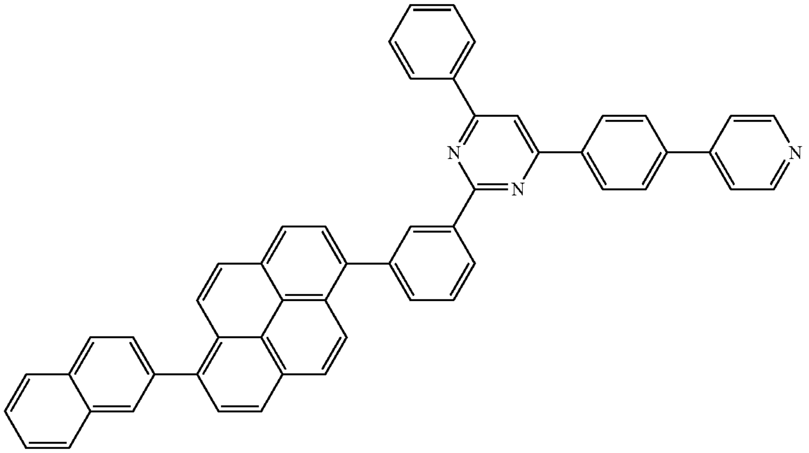
94
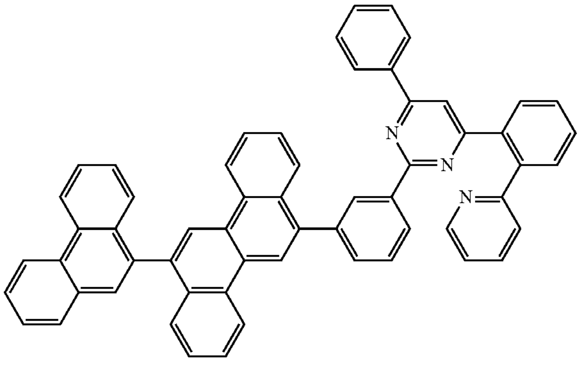
95
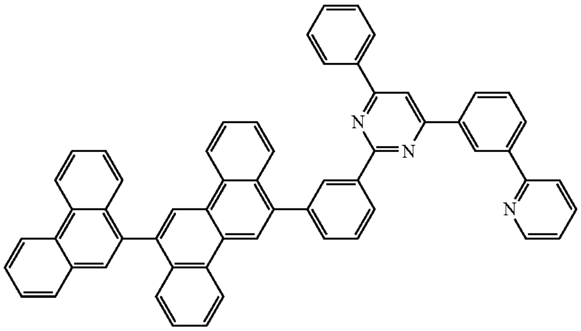

-continued
96
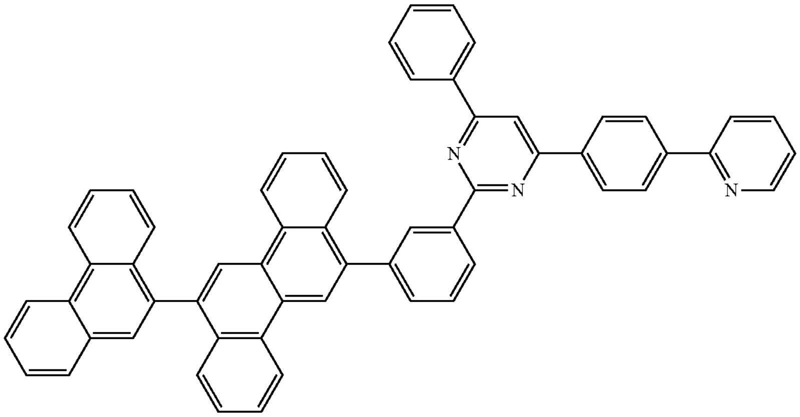
97
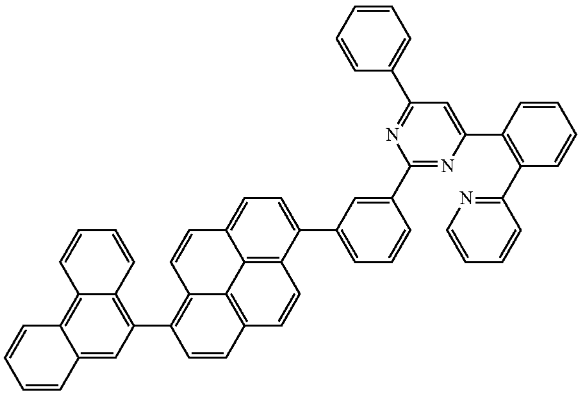
98
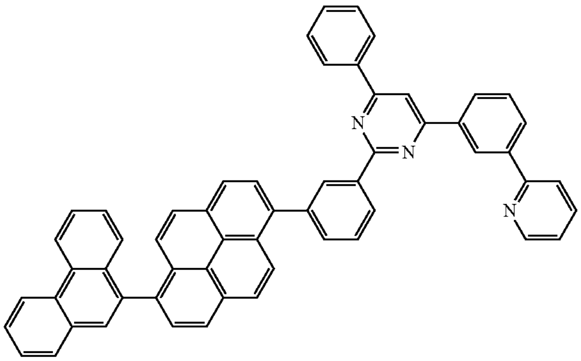
99
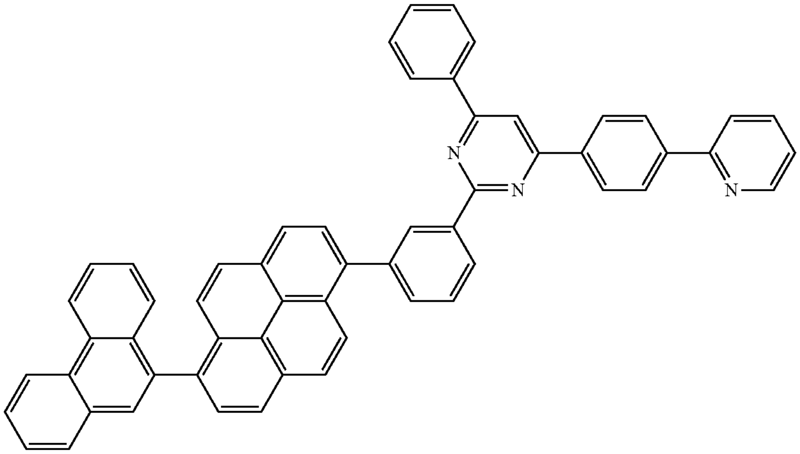

-continued
103
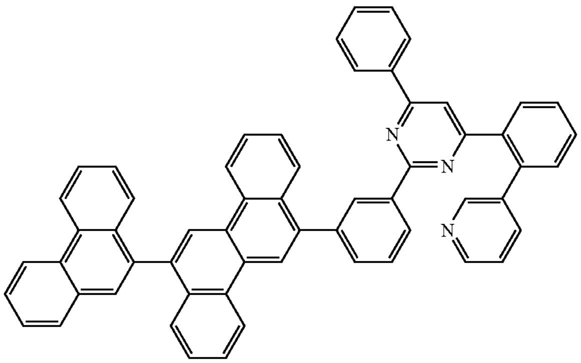
104
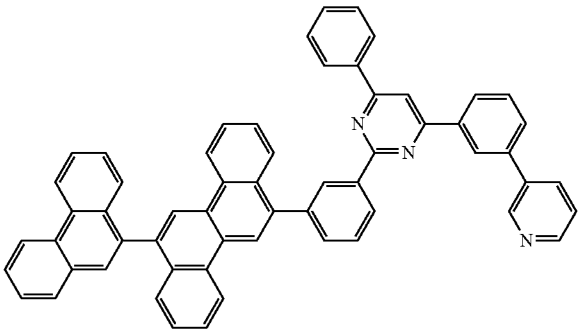
105
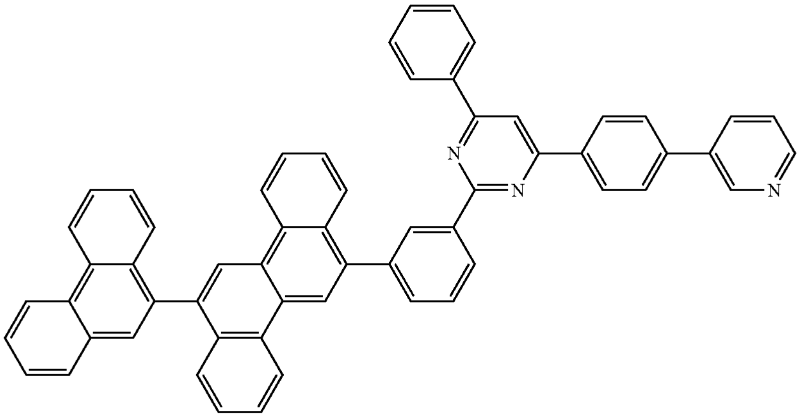
106
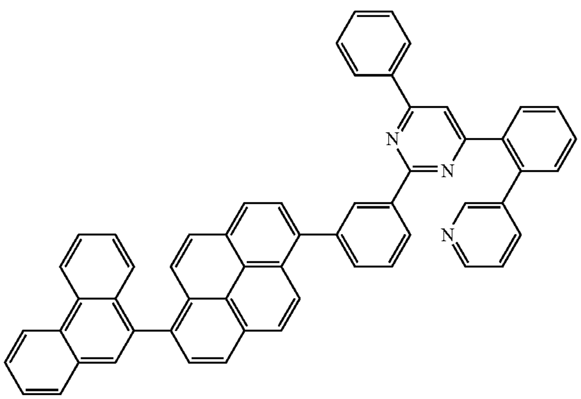
107
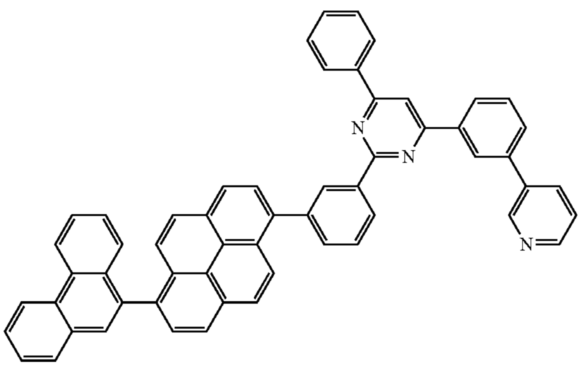

-continued
108
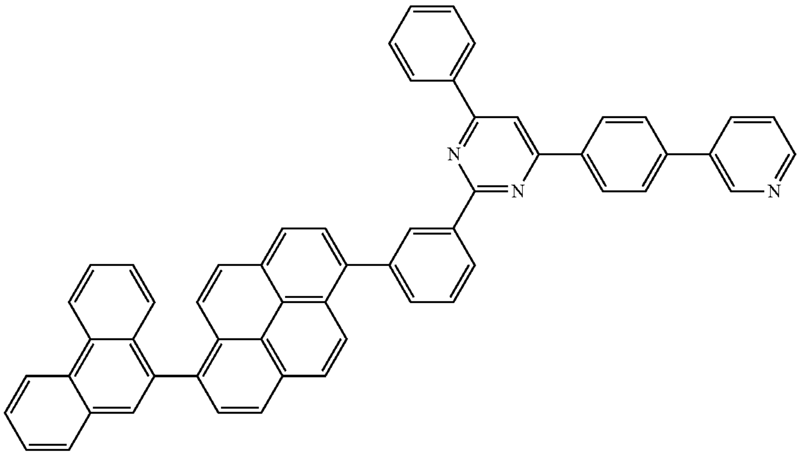
112
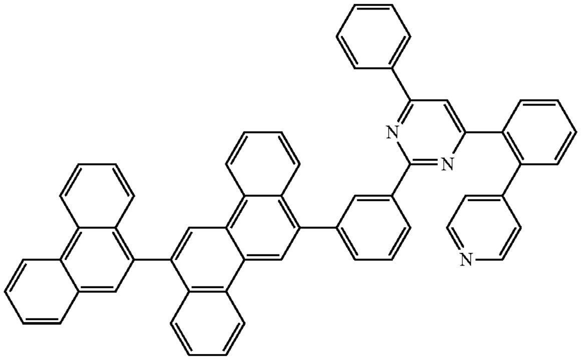
113
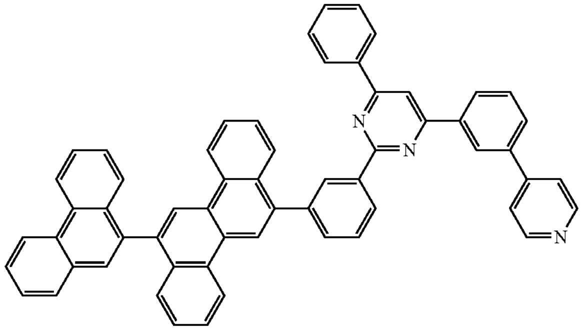
114
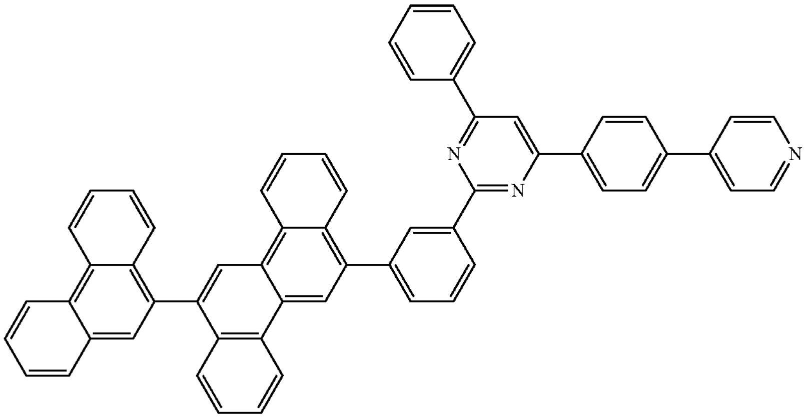

-continued
115
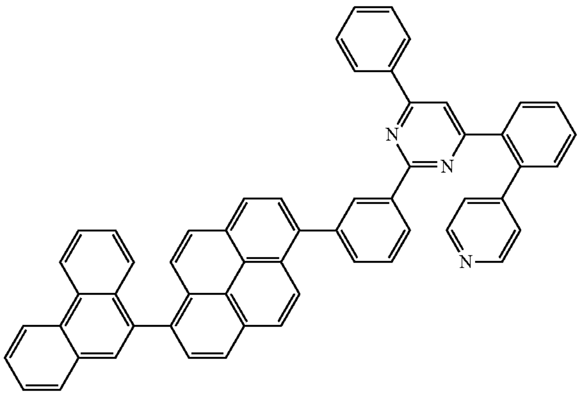
116
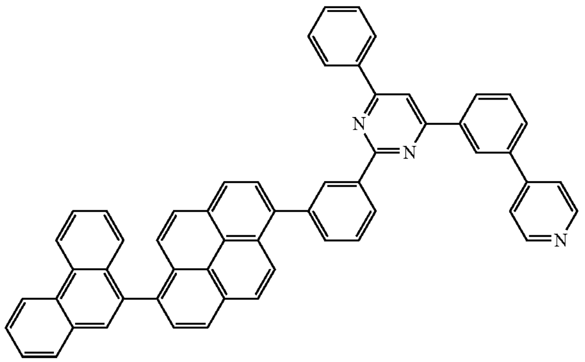
117
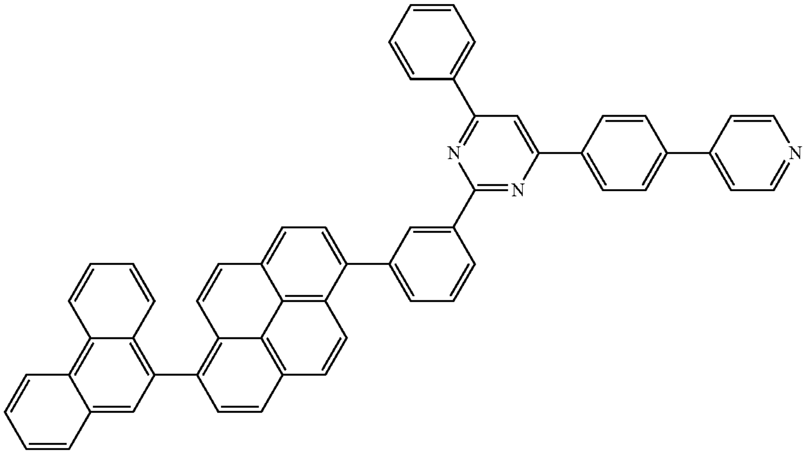
127
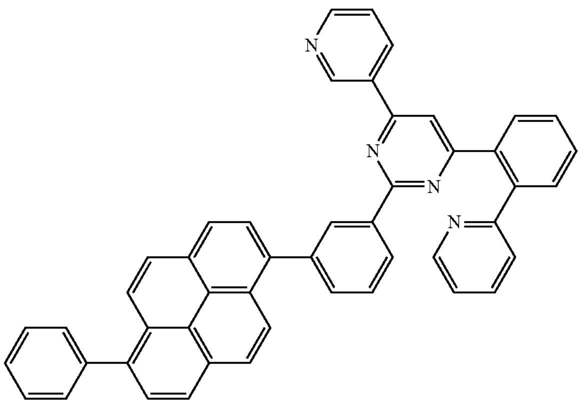
128
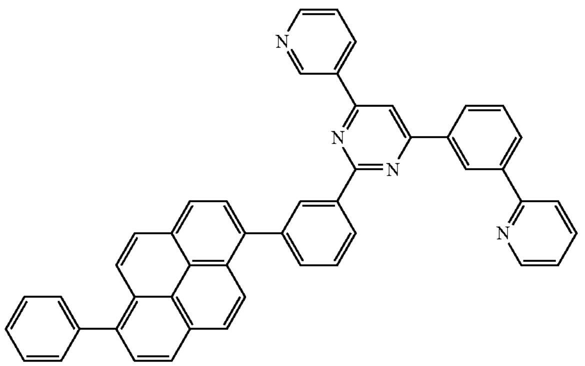

-continued
129
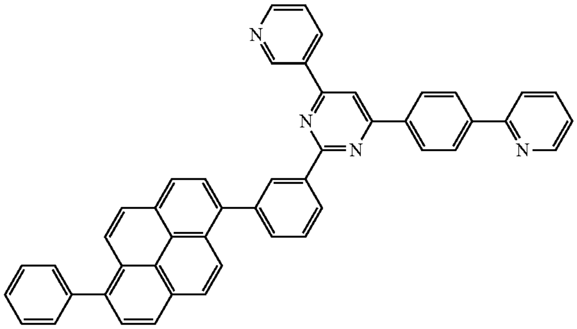
130
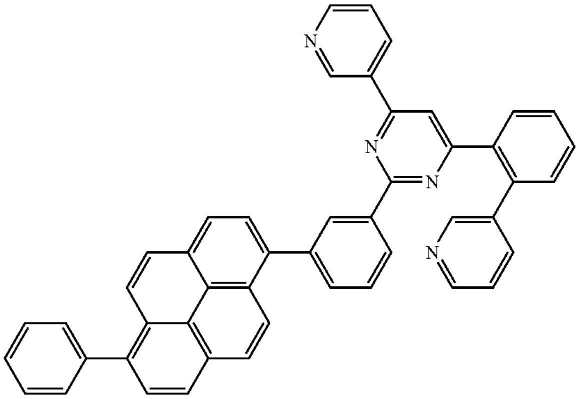
131
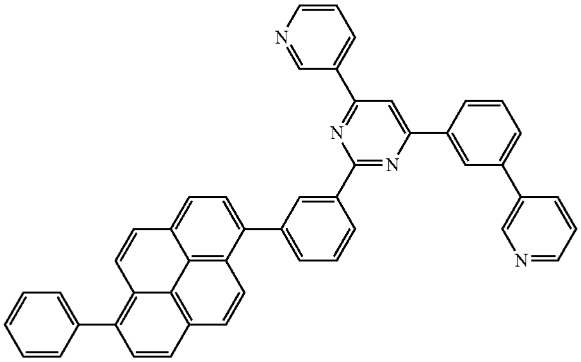
132
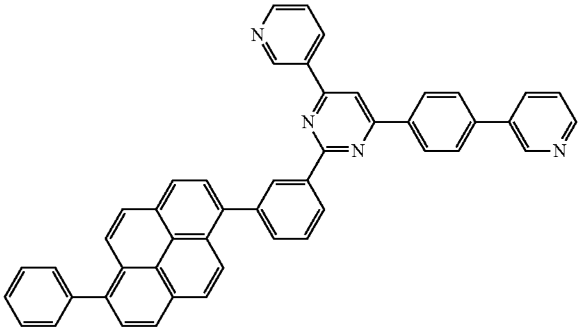
133
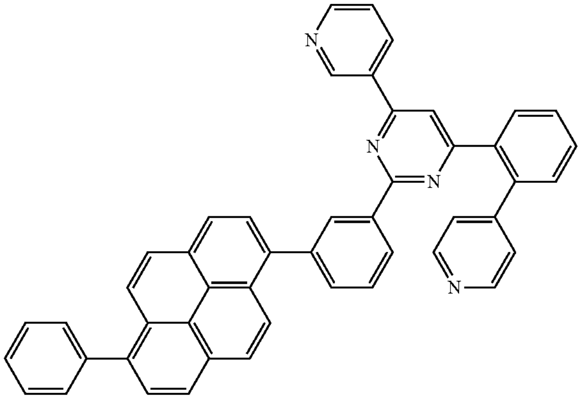
134
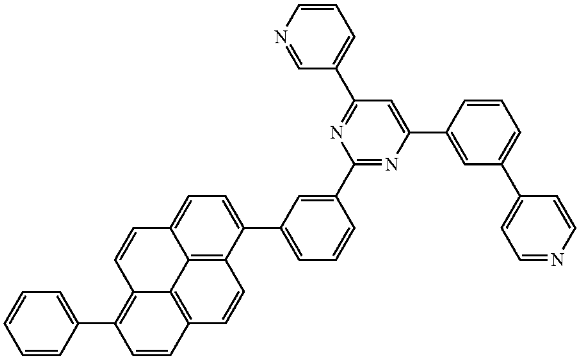

-continued
135
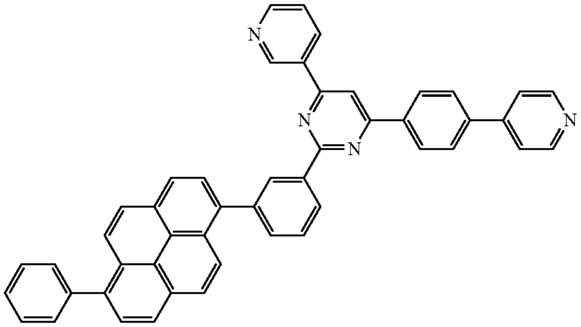
145
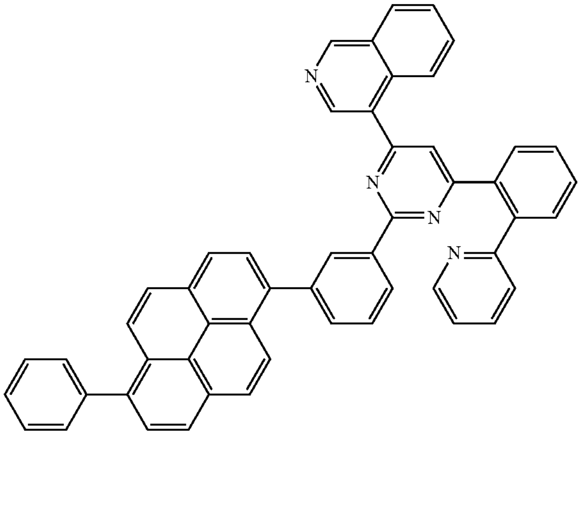
146
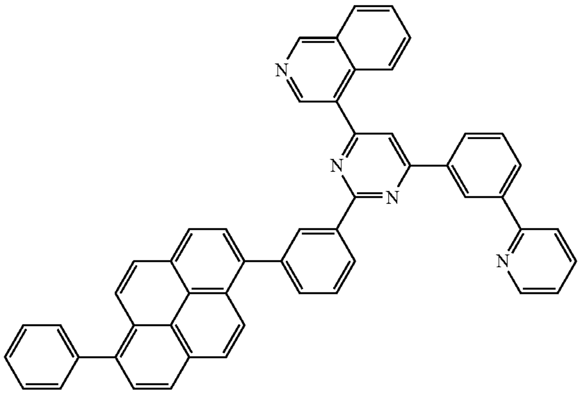
147
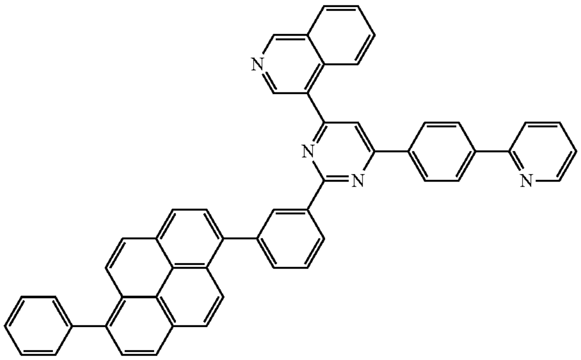
148
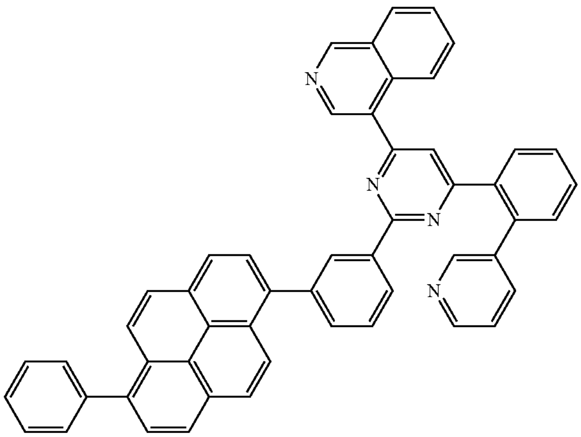
149
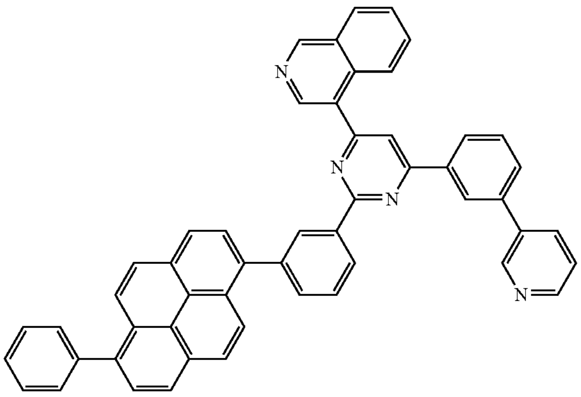

-continued
150
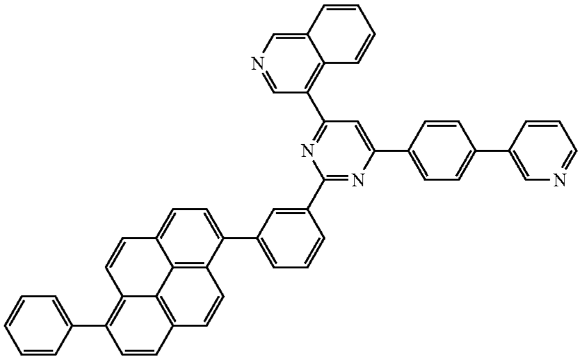
151
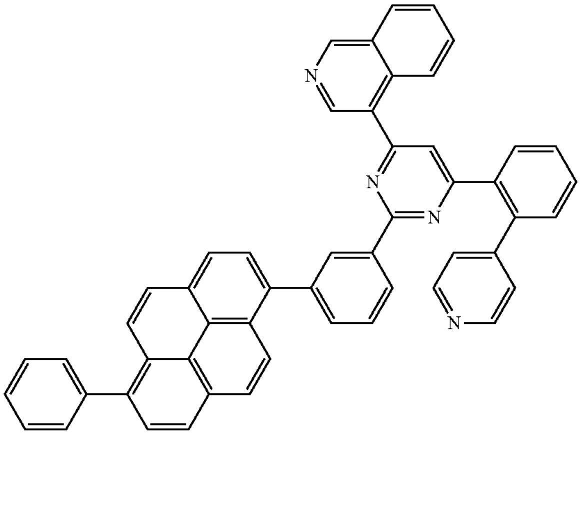
152
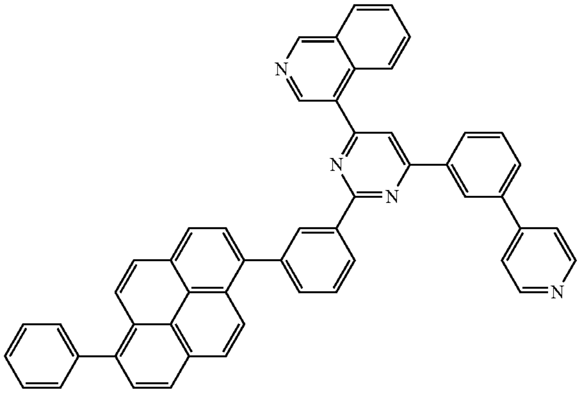
153
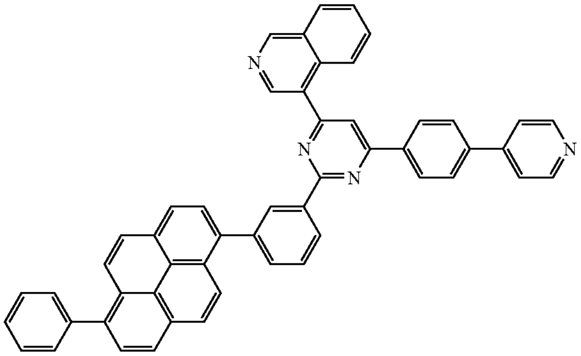
163
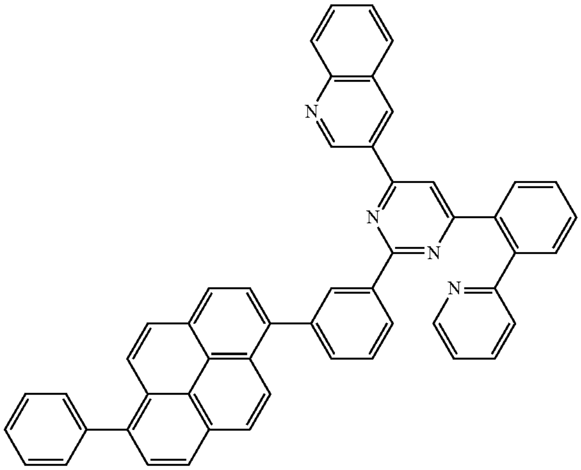
164
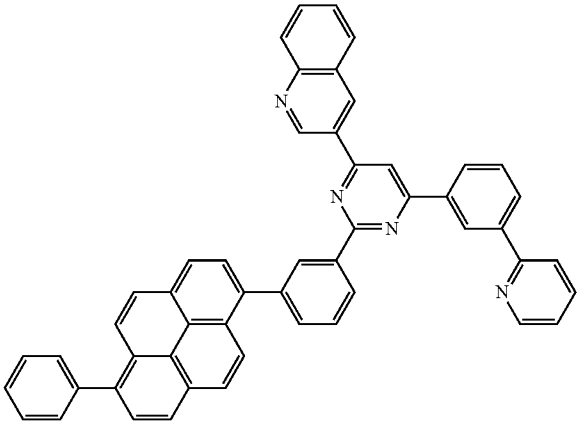

-continued
165
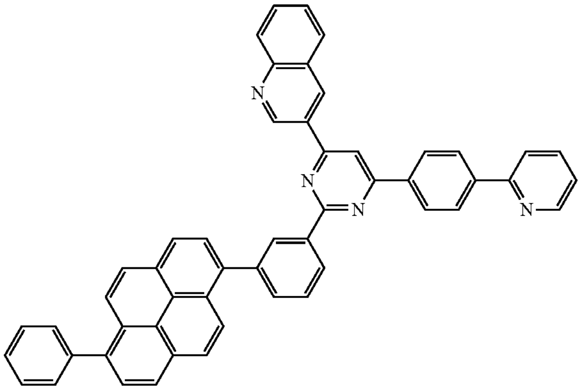
166
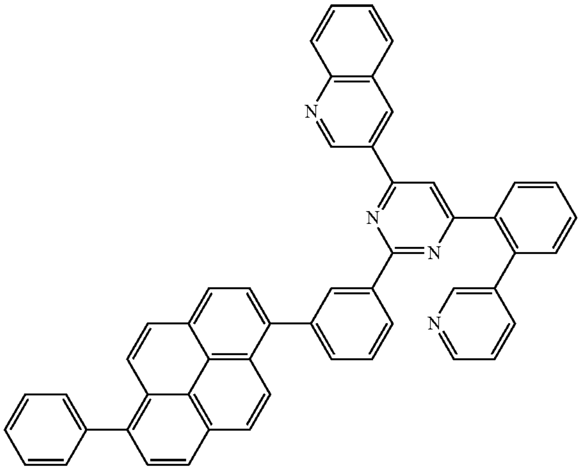
167
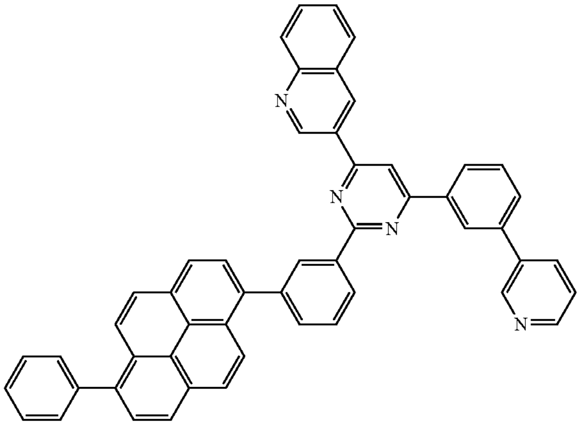
168
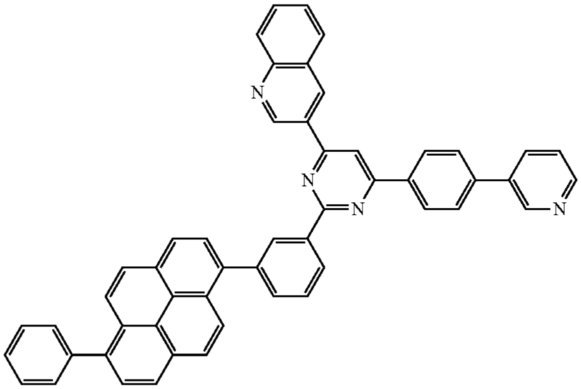
169
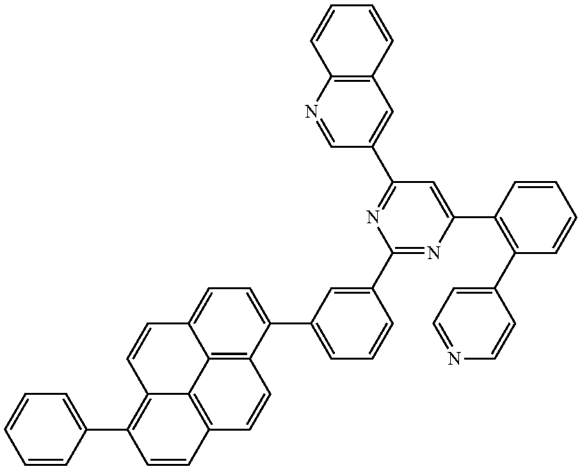
170
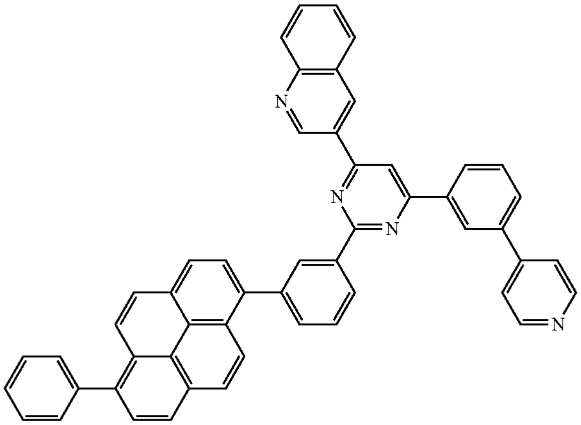

-continued
171
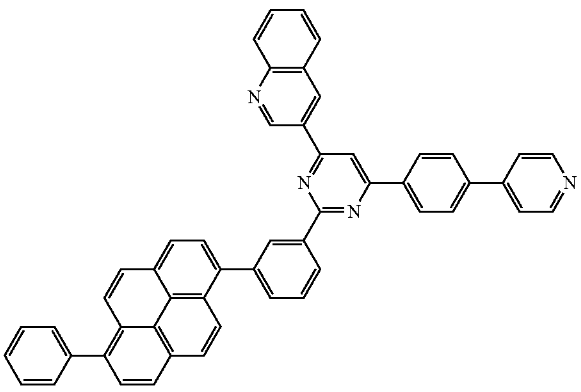
244
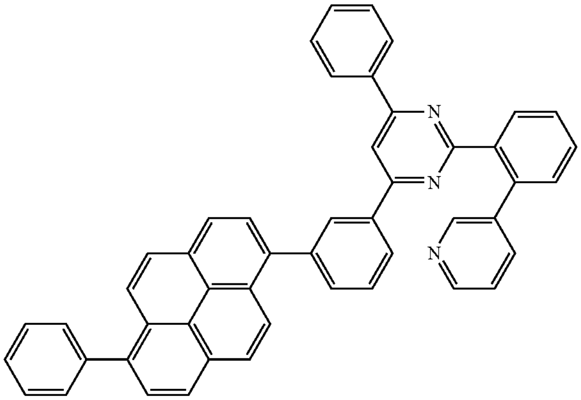
245
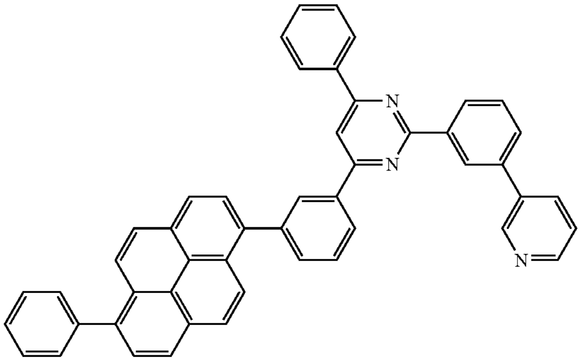
246
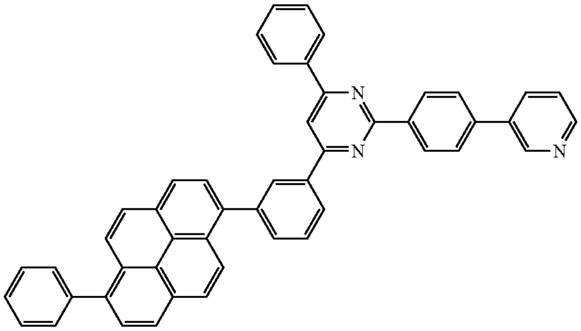
247
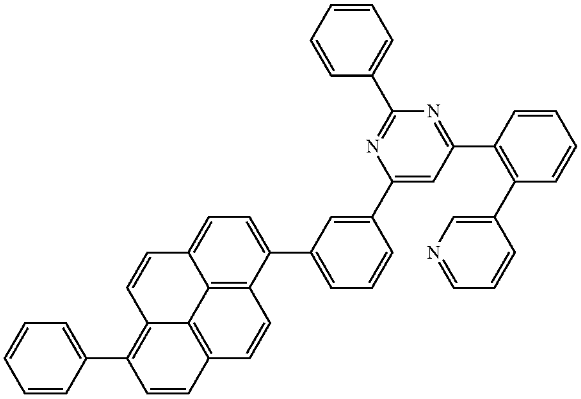
248
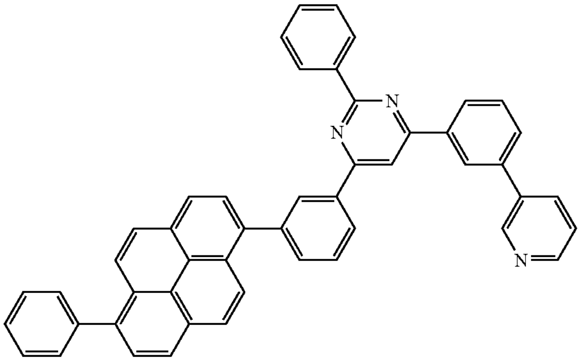
249
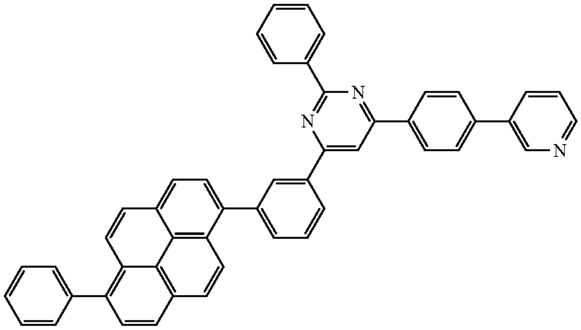
250
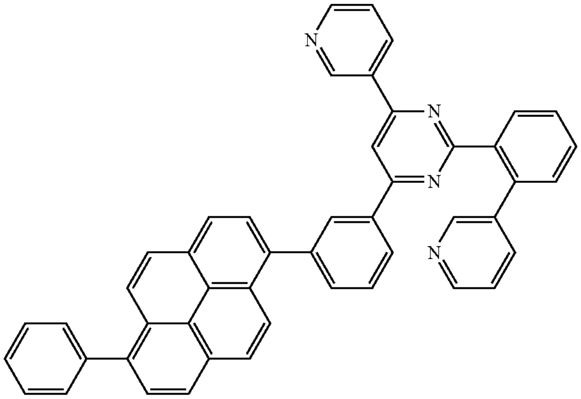

-continued
251
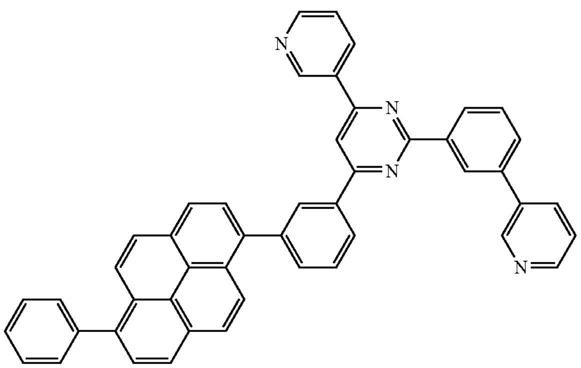
252
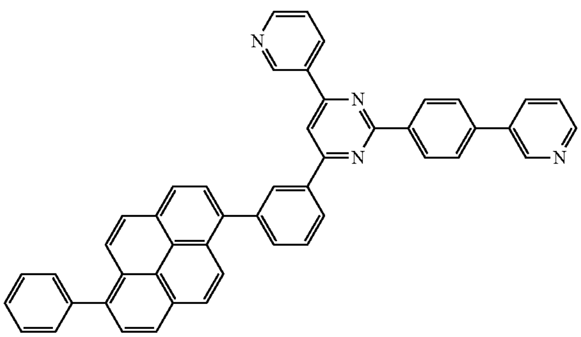
253
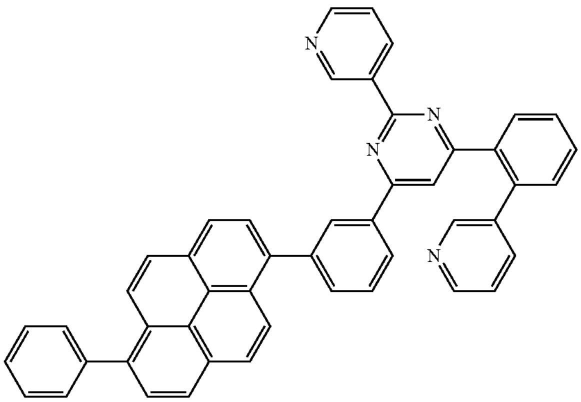
254
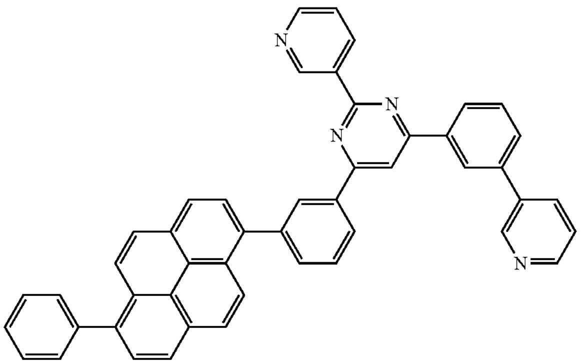
255
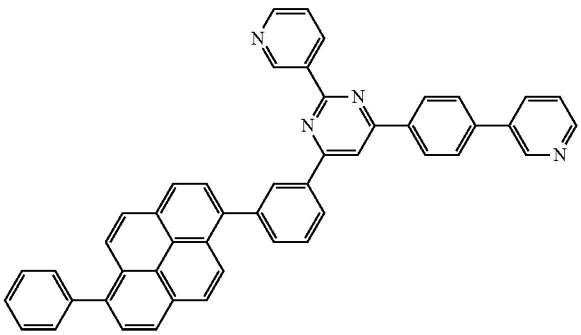
256
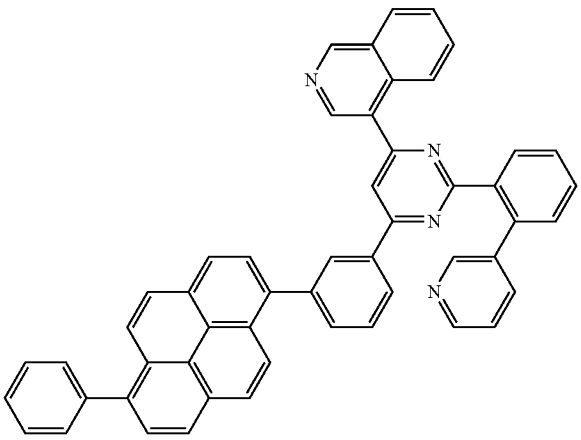

-continued
257
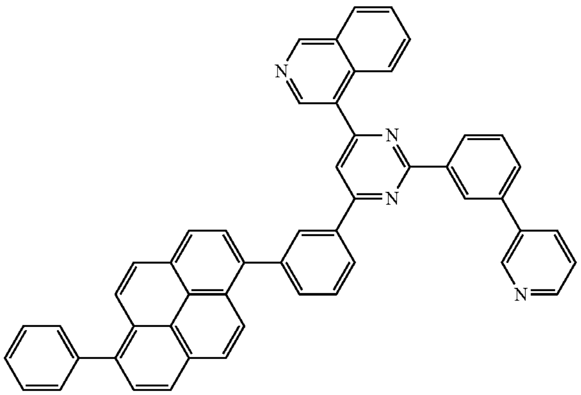
258
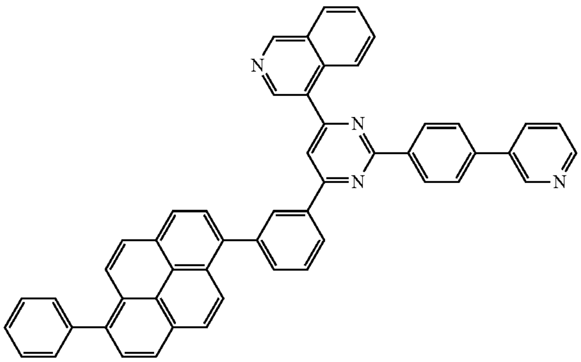
259
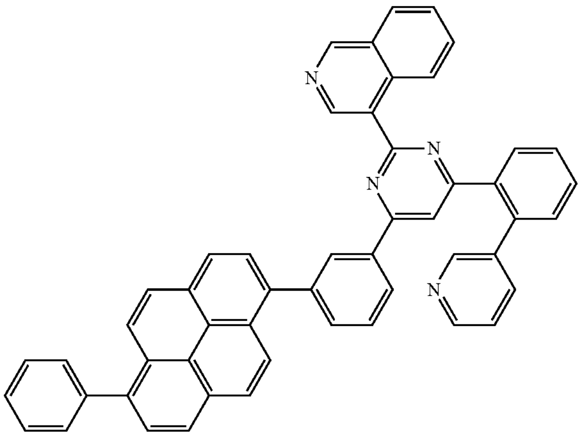
260
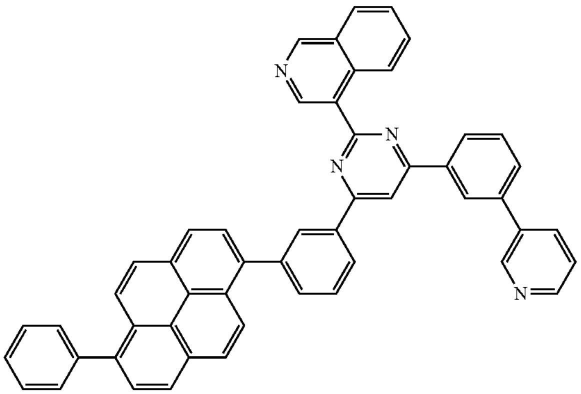
261
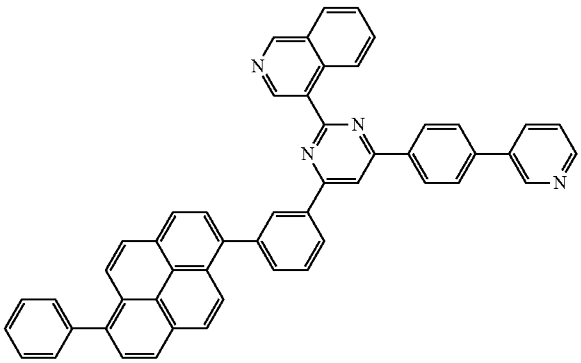
262
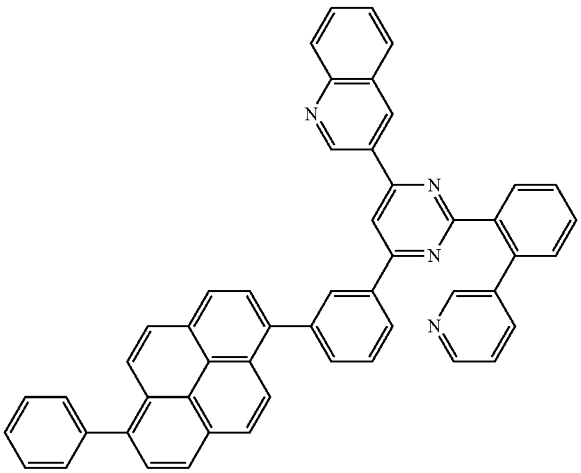

-continued
263
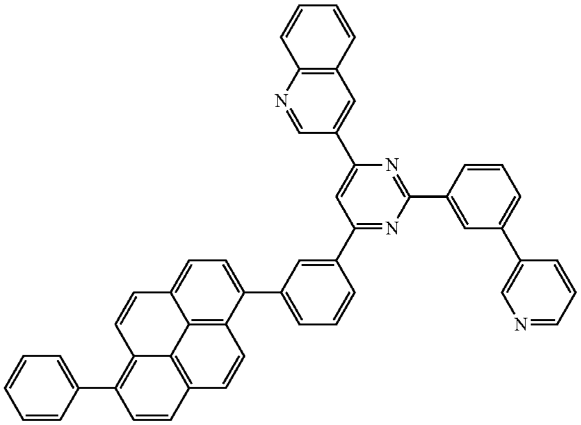
264
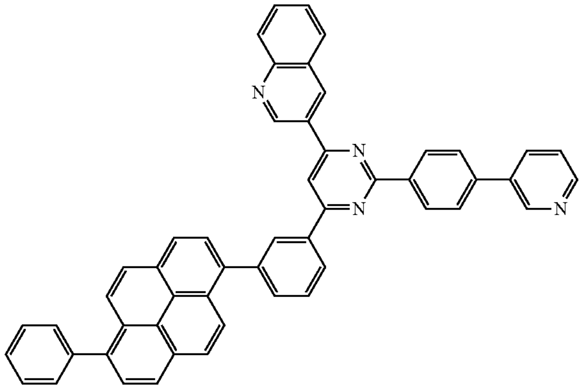
265
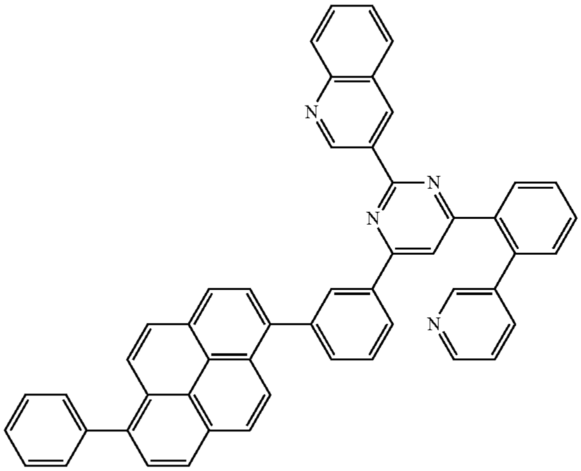
266
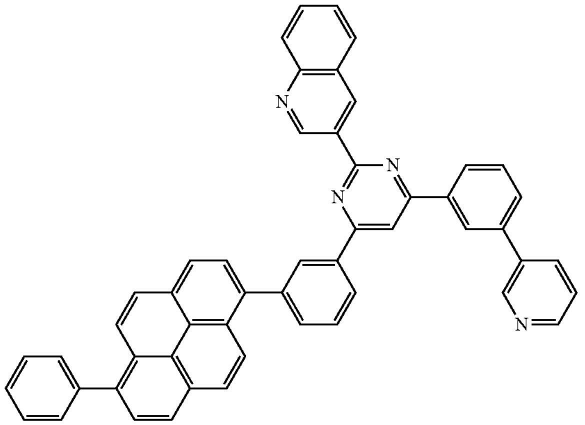
267
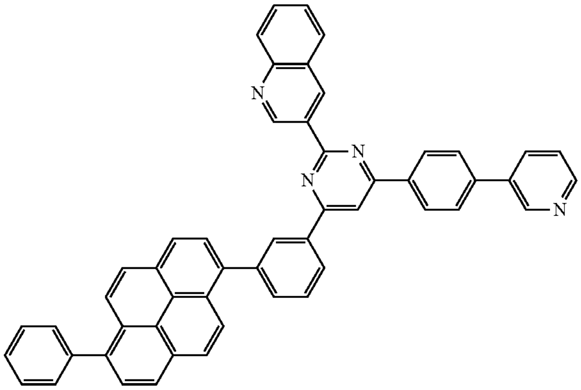
301
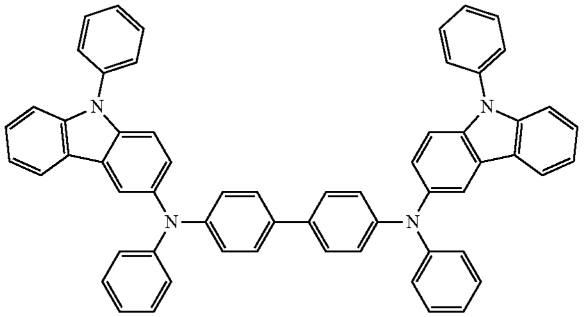

-continued
302
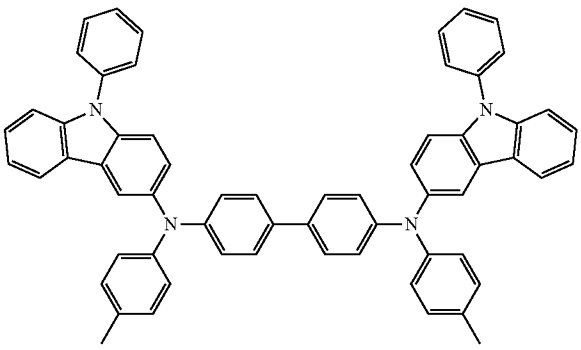
303
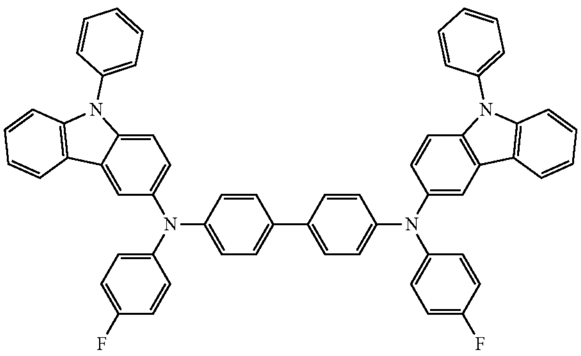
304
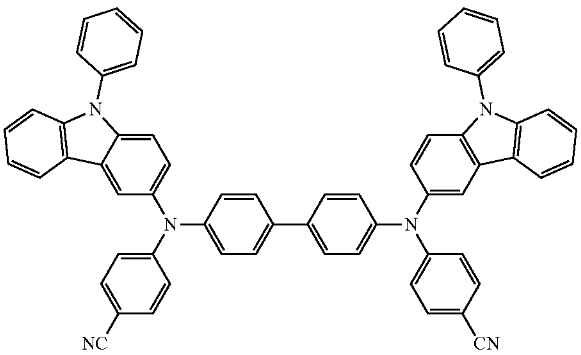
305
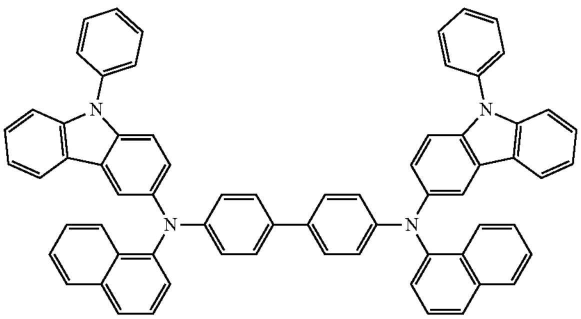
306
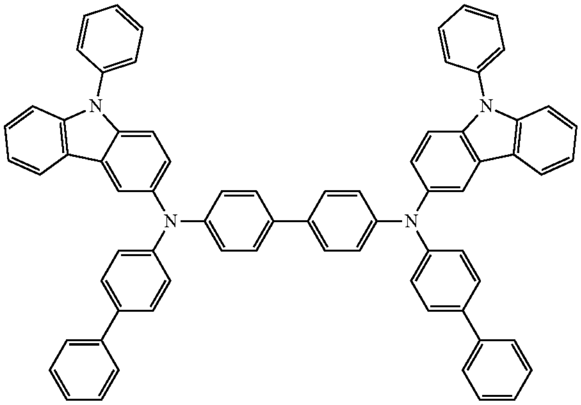
307
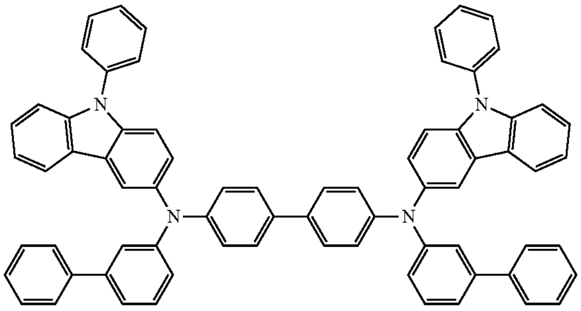

-continued
308
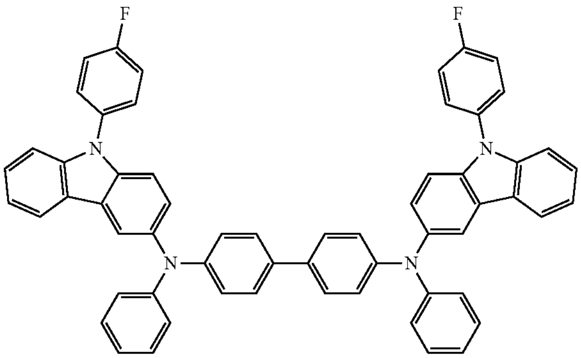
309
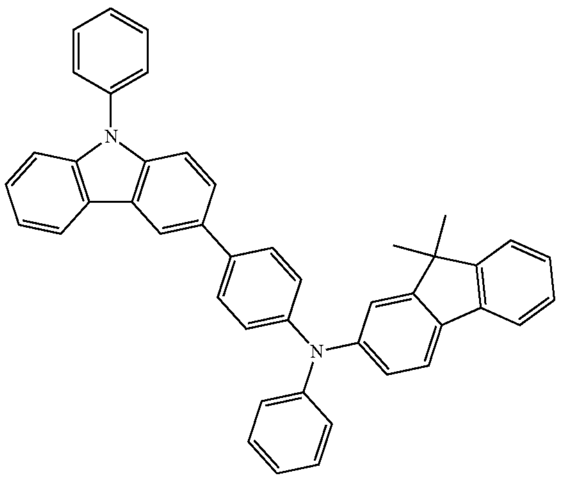
310
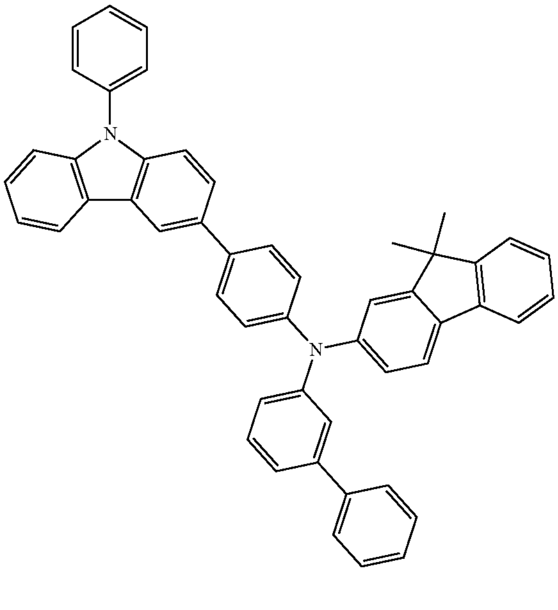
311
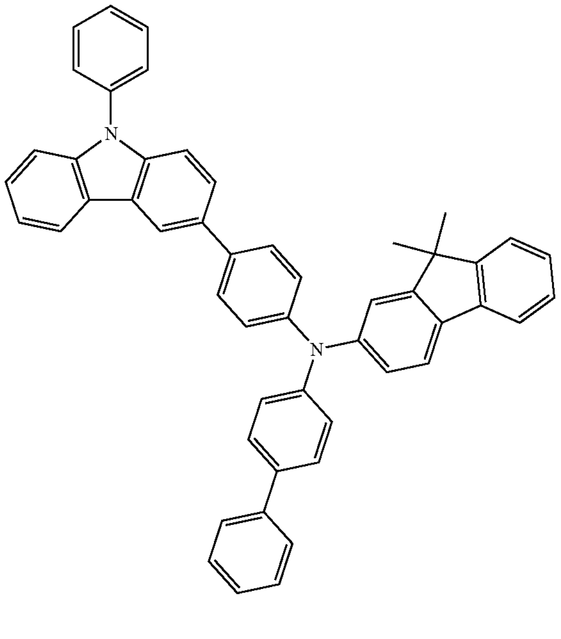

-continued
312
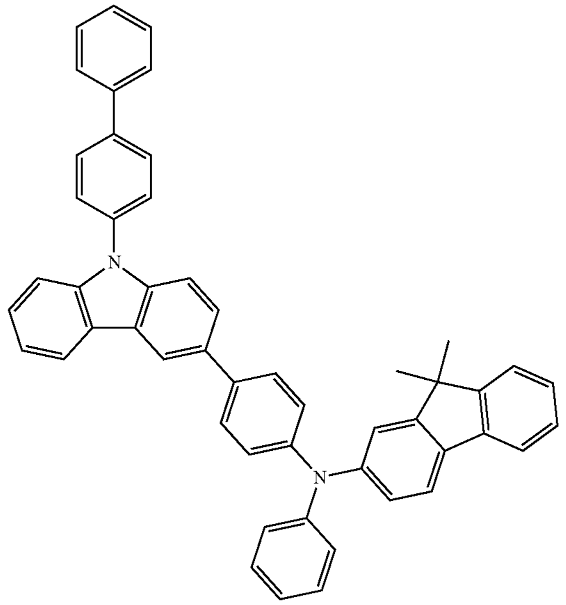
313
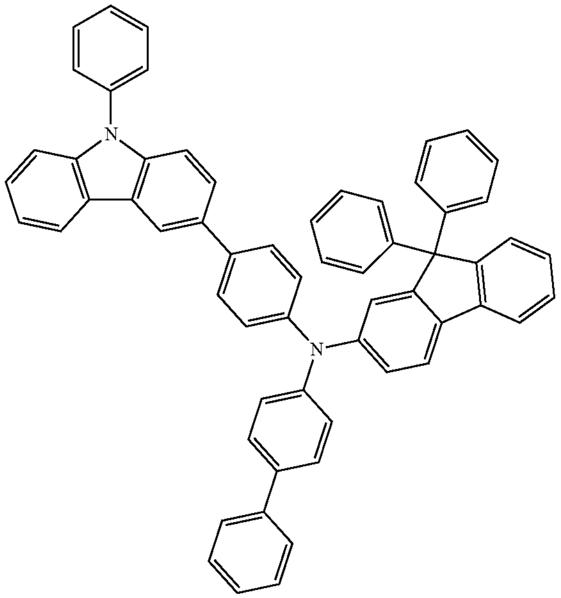
314
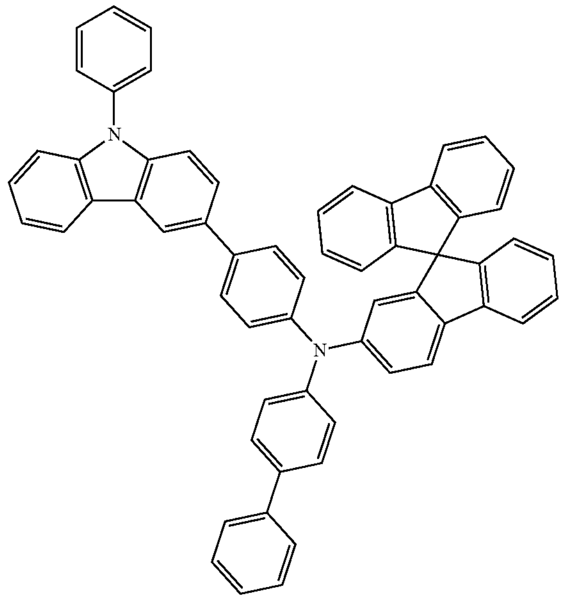
315
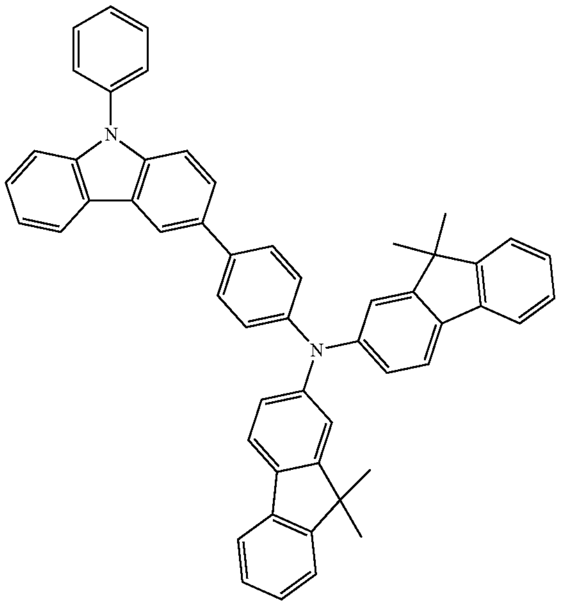

-continued
316
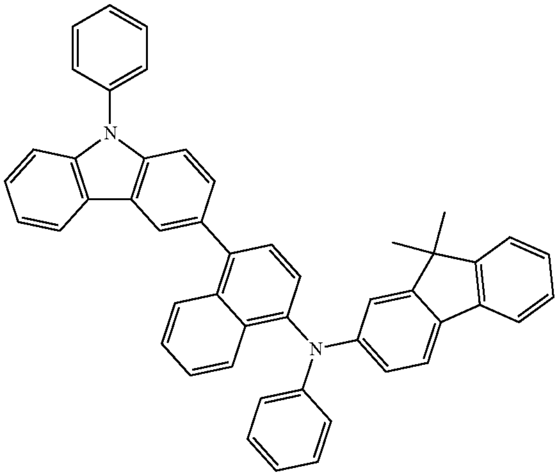
317
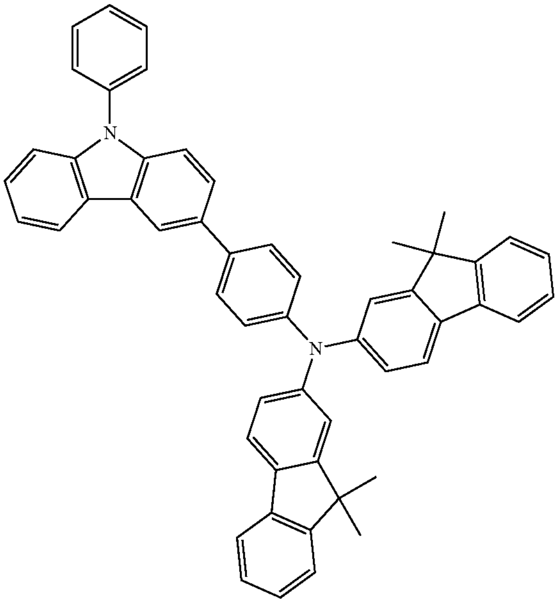
318
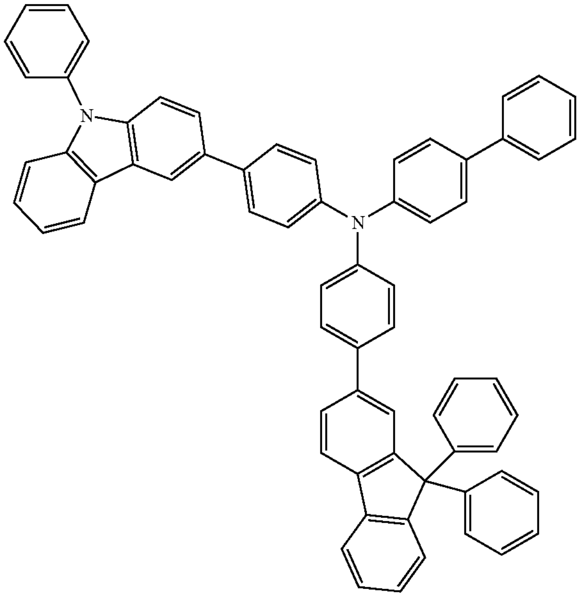
319
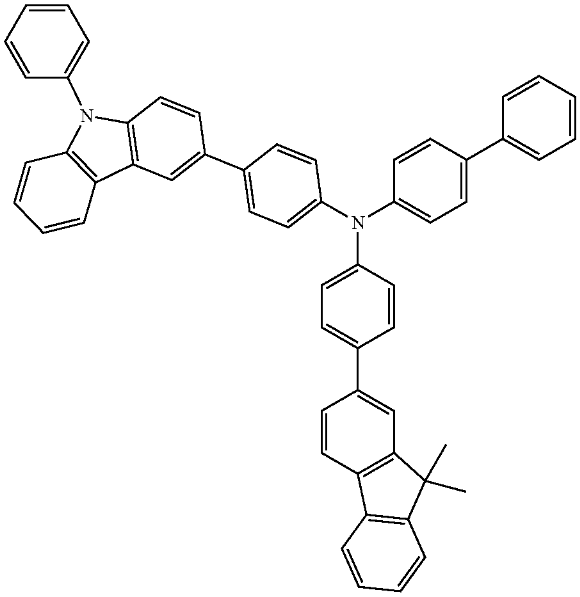

-continued
320
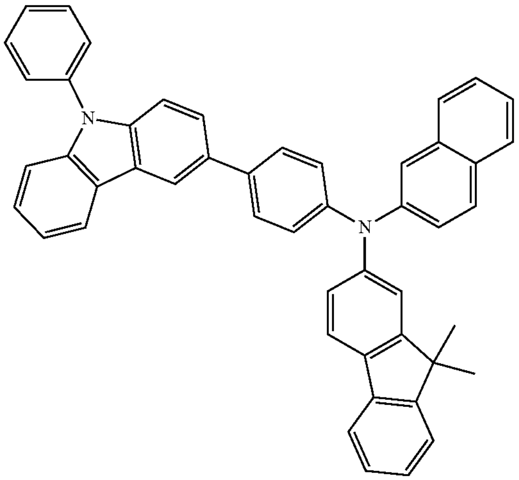
321
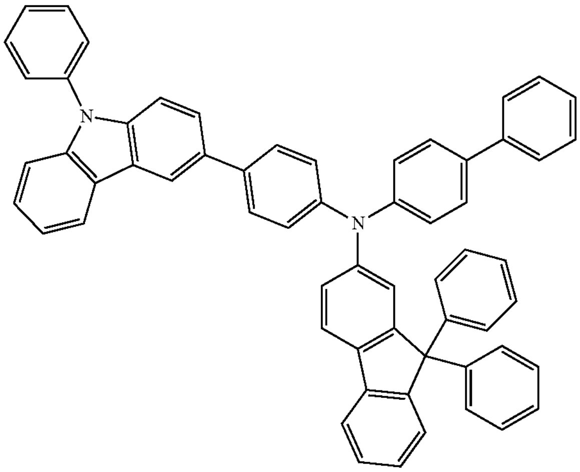
322
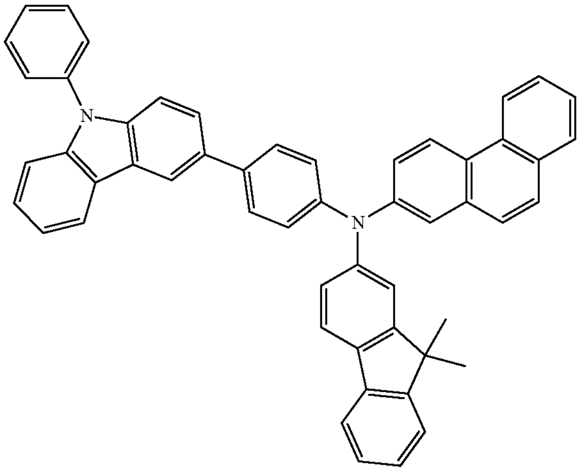
323
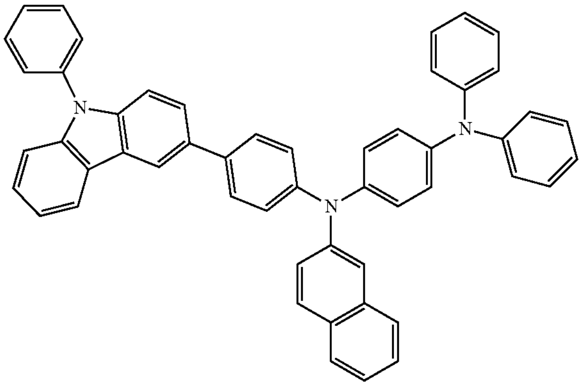
324
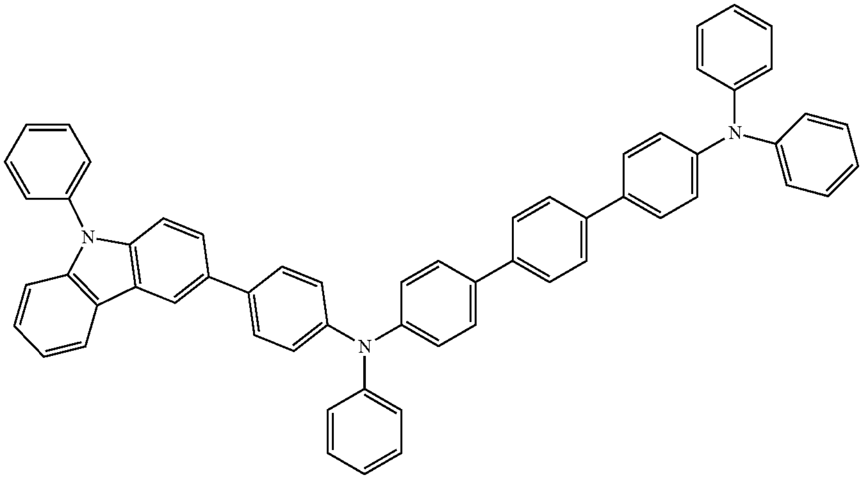

-continued

325

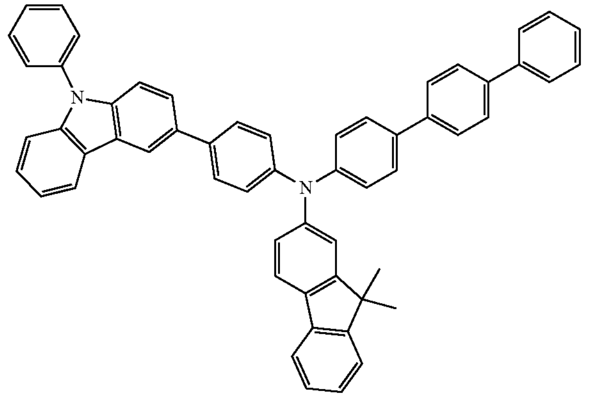

326

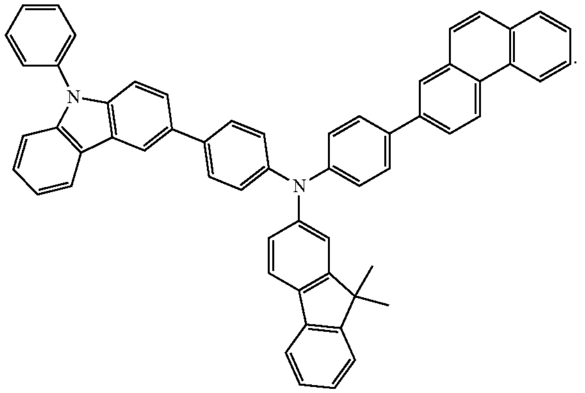

18. The organic light-emitting device of claim 1, wherein the hole transport region comprises a hole transport layer, and the hole transport layer comprises the hole transport material.

19. The organic light-emitting device of claim 1, wherein the electron transport region comprises an electron transport layer, and the electron transport layer comprises the electron transport material.

20. An organic light-emitting device comprising:

a first electrode;

a second electrode facing the first electrode;

an emission layer between the first electrode and the second electrode;

an electron transport region between the emission layer and the second electrode; and a hole transport region between the first electrode and the emission layer, wherein the electron transport region comprises at least one of an electron transport material selected from Compounds 223 to 225 below; and the hole transport region comprises at least one of a hole transport material represented by Formula 2 or 3 below:

Formula 2

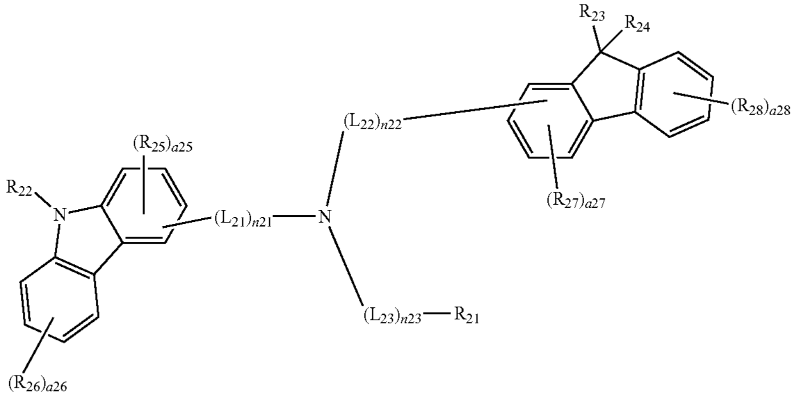

Formula 3

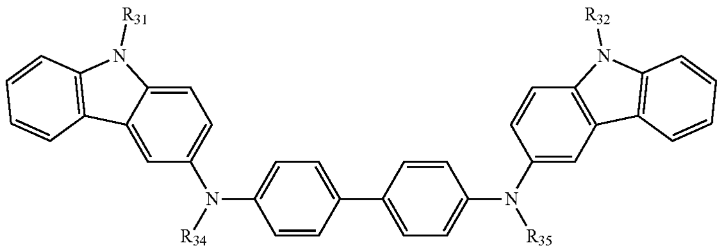

wherein in Formulae 2 to 3, $L_{21}$ to $L_{23}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

n21 to n23 are each independently an integer selected from 0 to 3;

$R_{21}$ to $R_{24}$, $R_{31}$, $R_{32}$, $R_{34}$, and $R_{35}$ are each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_{25}$ to $R_{28}$ are each independently a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, and —$B(Q_6)(Q_7)$;

a25 and a27 are each independently an integer selected from 1 to 3;

a26 and a28 are each independently an integer selected from 1 to 4;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arythio group, the substituted $C_1$-$C_{60}$ heteroaryl group, the substituted monovalent non-aromatic condensed polycyclic group, the substituted monovalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group and the substituted $C_1$-$C_{60}$ alkoxy group is selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{31})(Q_{32})$, —$Si(Q_{33})(Q_{34})(Q_{35})$ and —$B(Q_{36})(Q_{37})$, and $Q_1$ to $Q_7$, $Q_{11}$ to $Q_{17}$, $Q_{21}$ to $Q_{27}$ and $Q_{31}$ to $Q_{37}$ are each independently selected from a hydrogen, a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group;

223

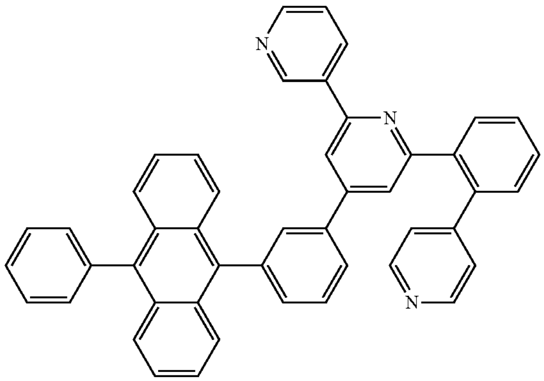

-continued

224

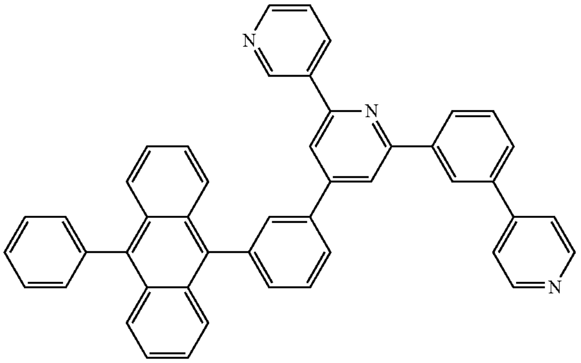

225

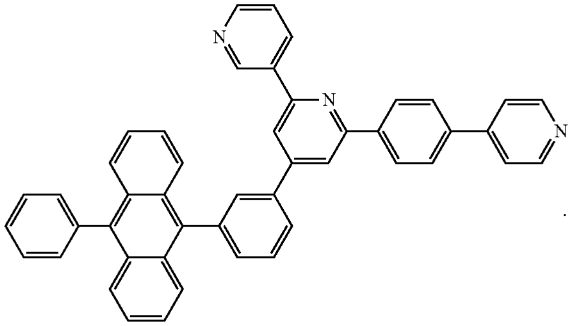

.

* * * * *